United States Patent [19]

Nomura et al.

[11] Patent Number: 5,721,986
[45] Date of Patent: Feb. 24, 1998

[54] CAMERA AND STROBE CHARGING SYSTEM

[75] Inventors: Hiroshi Nomura; Kazuyoshi Azegami; Takamitsu Sasaki; Yasushi Tabata; Norio Numako; Yoshinari Tanimura; Takuma Sato; Masaaki Kishimoto, all of Tokyo, Japan

[73] Assignee: Asahi Kogaku Kogyo Kabushiki Kaisha, Tokyo, Japan

[21] Appl. No.: 777,069

[22] Filed: Dec. 30, 1996

[30] Foreign Application Priority Data

Jan. 26, 1996 [JP] Japan ................................. 8-012317
Feb. 21, 1996 [JP] Japan ................................. 8-058337

[51] Int. Cl.⁶ ........................... G03B 15/05; H05B 41/32
[52] U.S. Cl. ........................... 396/205; 315/241 P
[58] Field of Search ........................... 396/206, 205, 396/203; 315/241 P

[56] References Cited

U.S. PATENT DOCUMENTS

| | | |
|---|---|---|
| 4,196,458 | 4/1980 | Kondo . |
| 4,384,776 | 5/1983 | Takami . |
| 4,630,916 | 12/1986 | Ishiguro et al. ........................ 396/206 |
| 5,068,575 | 11/1991 | Dunsmore et al. ................... 396/206 X |
| 5,083,062 | 1/1992 | Ichihara ................................ 396/206 |
| 5,194,889 | 3/1993 | Ogawa . |
| 5,221,942 | 6/1993 | Ogawa . |

*Primary Examiner*—W. B. Perkey
*Attorney, Agent, or Firm*—Greenblum & Bernstein P.L.C.

[57] ABSTRACT

Disclosed is a camera provided with a strobe system. The strobe system includes a capacitor to be charged. Charging voltage of the capacitor can be detected through an output terminal. The output terminal can be electrically connected and disconnected to and from the capacitor by a switching element. The circuit has an input terminal which receives a control signal. In response to the control signal, charging operation is enabled, and at the same time, the switching element is controlled to connect the output terminal to the capacitor. While, if the charging voltage has reached an upper limit, the charging operation is disabled and the output terminal is disconnected from the capacitor for a predetermined period of time by changing the status of the control signal.

21 Claims, 70 Drawing Sheets

| SHORT-CIRCUITED RESISTOR(S) | ZOOM CODE | $V_O$ | THRESHOLD VOLTAGE |
|---|---|---|---|
| — | 0 | $0.56 \times V_{DD}$ | |
| | | | $0.53 \times V_{DD}$ ($V_a$) |
| R2 | 5 | $0.50 \times V_{DD}$ | |
| | | | $0.48 \times V_{DD}$ ($V_b$) |
| R0 | 4 | $0.45 \times V_{DD}$ | |
| | | | $0.42 \times V_{DD}$ ($V_c$) |
| R1 | 3 | $0.40 \times V_{DD}$ | |
| | | | $0.35 \times V_{DD}$ ($V_d$) |
| R1 AND R2 | 6 | $0.30 \times V_{DD}$ | |
| | | | $0.24 \times V_{DD}$ ($V_e$) |
| R0 AND R1 | 1 | $0.19 \times V_{DD}$ | |
| | | | $0.09 \times V_{DD}$ ($V_f$) |
| R0, R1 AND R2 | 2 | 0.00 | |

CAMERA AND STROBE CHARGING SYSTEM

BACKGROUND OF THE INVENTION

The present invention relates to a strobe charging system and a camera provided with a strobe charging system.

Conventionally, cameras provided with built-in strobe devices are known. In such cameras, charging and flashing of the strobe devices are performed with use of a battery also provided inside the cameras. Generally, such a strobe device has a flash tube, such as a xenon tube, and a charging system including a capacitor which is to be charged up to a predetermined voltage by a charging circuit. By discharging the charged capacitor, a high voltage is induced which is applied to the flash tube. As the high voltage is applied, the flash tube emits light towards an object to be illuminated.

In order to make the strobe device to emit sufficient light, the charging voltage of the capacitor should exceeds a predetermined lower limit. Specifically, the charging voltage of the capacitor should be between the lower limit and an upper limit. The flash tube can emit light when the charging voltage exceeds the lower limit. When the capacitor is fully charged, the charging voltage reaches the upper limit.

In order to enable flashing of the flash tube, and in order to avoid over charging of the capacitor of the strobe circuit, the charging voltage of the capacitor should be checked. Then, in accordance with the checked charging voltage of the capacitor, the strobe circuit is controlled such that:

(1) the charging of the capacitor is terminated when the capacitor is fully charged;

(2) charging of the capacitor is continued if the charging voltage exceeds the lower limit but not exceeds the upper limit; and (3) charging is started when charging is being terminated and the charging voltage is lower than the lower limit.

In order to control the above-described charging operations, the strobe circuit is provided with an input terminal to which the signal for enabling/disabling charging is transmitted, and an output terminal from which a charging voltage of the capacitor is output. If the capacitor is fully charged and charging is disabled, however, current may flow through the charging voltage output terminal and the capacitor may be discharged. In order to avoid the discharge of the fully charged capacitor, a switch circuit is generally provided for electrically connecting and disconnecting the charging voltage output terminal to and from the strobe circuit. In order to control the switch circuit, another terminal for controlling the switch circuit to turn ON and OFF is required.

In order to control such a strobe circuit to emit light, when the capacitor has been charged to a voltage that enables flashing (i.e., when the charging voltage of the capacitor exceeds the lower limit), a flash trigger is transmitted from a control unit of the camera into a flash trigger input terminal of the strobe circuit. Then, a trigger circuit of the strobe circuit discharges the capacitor quickly, thereby a high voltage being induced and strobe flashing is performed as the high voltage as induced is applied to the flash tube.

As described above, in the conventional strobe circuit, the control signal input terminal for receiving the signal for enabling/disabling charging, the voltage output terminal for outputting the charging voltage, another control signal input terminal for receiving a control signal for connecting and disconnecting the charging voltage terminal to and from the circuit, and an input terminal for receiving the flash trigger signal are necessary. The above-described terminals are indispensable in the conventional strobe circuit.

SUMMARY OF THE INVENTION

In recent years, various electronic circuits are built into the electronically controlled cameras. Since the operation of a large number of electronic circuits are to be controlled by a single CPU which has a limited number of ports, in such electronically controlled cameras, reduction of the number of control terminals of such electronic circuits has been desired.

For the above object, according to the invention, there is provided a camera comprising a strobe circuit having a capacitor to be charged, a charging voltage detection system, the charging voltage detection system detects a charging voltage of the capacitor, and a control system, the control system prohibits the charging voltage detection system from detecting the charging voltage for a predetermined period of time when the charging voltage has reached a predetermined value.

Optionally, the capacitor is charged when the charging voltage detection system is allowed to detect the charging voltage of the capacitor, and wherein the control system prohibits the strobe circuit from charging the capacitor for the predetermined period of time when the charging voltage has reached the predetermined value.

Further, the predetermined value is the maximum value of the charging voltage of the capacitor.

Still optionally, the control system judges whether the charging voltage has reached the predetermined value when charging is executed while the camera is not being operated.

Still further optionally, the control system judges whether the charging voltage has reached the predetermined value when charging is executed while a predetermined operable member of the camera is being operated.

Furthermore, the camera comprising a shutter button;
a photometry system, the photometry system performing photometry operation when the shutter button is operated, and a strobe judging system, the judging system judges whether flashing of the strobe during exposure is necessary based on photometry results obtained by the photometry system, and wherein when the strobe judging system judges that strobe flashing is necessary, the charging voltage detection system judges whether the capacitor has been charged to a voltage sufficient for strobe flashing but is less than the predetermined value, and the control system stops charging if the charging voltage exceeds the predetermined value.

According to another aspect of the invention, there is provided a camera comprising a strobe circuit having a capacitor to be charged, a charging voltage detector for detecting the charging voltage of the capacitor, a control system, the control system allowing detection of the charging voltage of the capacitor and effecting the charging of the capacitor simultaneously, the control system prohibiting detection of the charging voltage and charging of the capacitor simultaneously when the charging voltage has reached a predetermined voltage.

Optionally, the strobe circuit comprises a first terminal into which a charging signal that indicates whether charging is to be performed is input, a second terminal which outputs the charging voltage, a switch circuit, which electrically connects and disconnects the strobe circuit to and from the second terminal, a third terminal into which a voltage detection enabling signal for controlling the switch circuit is input, and a fourth terminal into which a trigger signal for starting the flashing of the strobe is input, and wherein a single terminal is used as the first terminal and the third terminal.

According to further aspect of the invention, there is provided a camera, comprises a strobe circuit having a capacitor to be charged, device for electrically connecting an output terminal to the capacitor, device for detecting a charging voltage of the capacitor through the output terminal, an input terminal for receiving a predetermined signal, the predetermined signal having at least two different status, a first status indicating that the capacitor is to be charged and a second status indicating that the capacitor is not to be charged, device for executing charging of the capacitor in response to the first status of the predetermined signal, and device for controlling the connecting device to electrically connects the terminal with the capacitor in response to the first status of the predetermined signal, wherein when the detecting device detects that the charging voltage has reached a predetermined voltage value, the predetermined signal is controlled to be in the second status for a predetermined period of time.

According to another aspect of the invention, there is provided a camera, comprises a strobe circuit having a capacitor to be charged, device for electrically connecting and disconnecting an output terminal to and from the capacitor, through which a charging voltage of the capacitor is detected, device for charging the capacitor, a terminal for receiving a predetermined signal having at least a first status and a second status which is different from the first status, device for controlling the connecting device to connect the output terminal to the capacitor in response to the first status of the predetermined signal, device for charging the capacitor in response to the first status of the predetermined signal, device for controlling the connecting device to disconnect the output terminal from the capacitor in response to the second status of the predetermined signal, and device for prohibiting the charging device from charging the capacitor in response to the second status of the predetermined signal.

According to further aspect of the invention, there is provided a strobe circuit cooperating with a camera, comprising a capacitor to be charged, a charging circuit, a first terminal, a predetermined signal having at least a first status and a second status which is different from the first status being input to the first terminal, a second terminal, charging voltage of the capacitor being output from the second terminal, a first circuit, the first circuit enabling the charging circuit to charge the capacitor, a second circuit, the second circuit electrically connecting and disconnecting the second terminal to and from the capacitor, wherein the first circuit enables the charging circuit to charge the capacitor and the second circuit electrically connects the second terminal to the capacitor when the first status of the predetermined signal is input to the first terminal, and wherein the first circuit disables the charging circuit to charge the capacitor and the second circuit electrically disconnects the second terminal from the capacitor when the second status of the predetermined signal is input to the first terminal.

Optionally, the camera comprises a voltage detector for detecting a charging voltage output through the second terminal, and a controller which outputs the predetermined signal to the first terminal, wherein the controller outputs first status of the predetermined signal when the charging voltage is less than a predetermined value, and wherein the controller outputs the second status of the predetermined signal when the charging voltage has reached the predetermined value for a predetermined period of time.

According to still further aspect of the invention, there is provided a strobe circuit comprising a charging system, the charging system is actuated to charge a capacitor, a charging voltage output terminal, the charging voltage of the capacitor being output through the output terminal, a control system, the control system connecting the output terminal to the capacitor while the charging system charges the capacitor, the control system prohibiting the charging system from charging of the capacitor for a predetermined period of time when the charging voltage of the capacitor has reached a predetermined voltage, the controller disconnecting the output terminal from the capacitor while the charging system is prohibited from charging.

DESCRIPTION OF THE ACCOMPANYING DRAWINGS

DESCRIPTION OF THE EMBODIMENT

The invention will be described with reference to the accompanying drawings.

Figure 1:
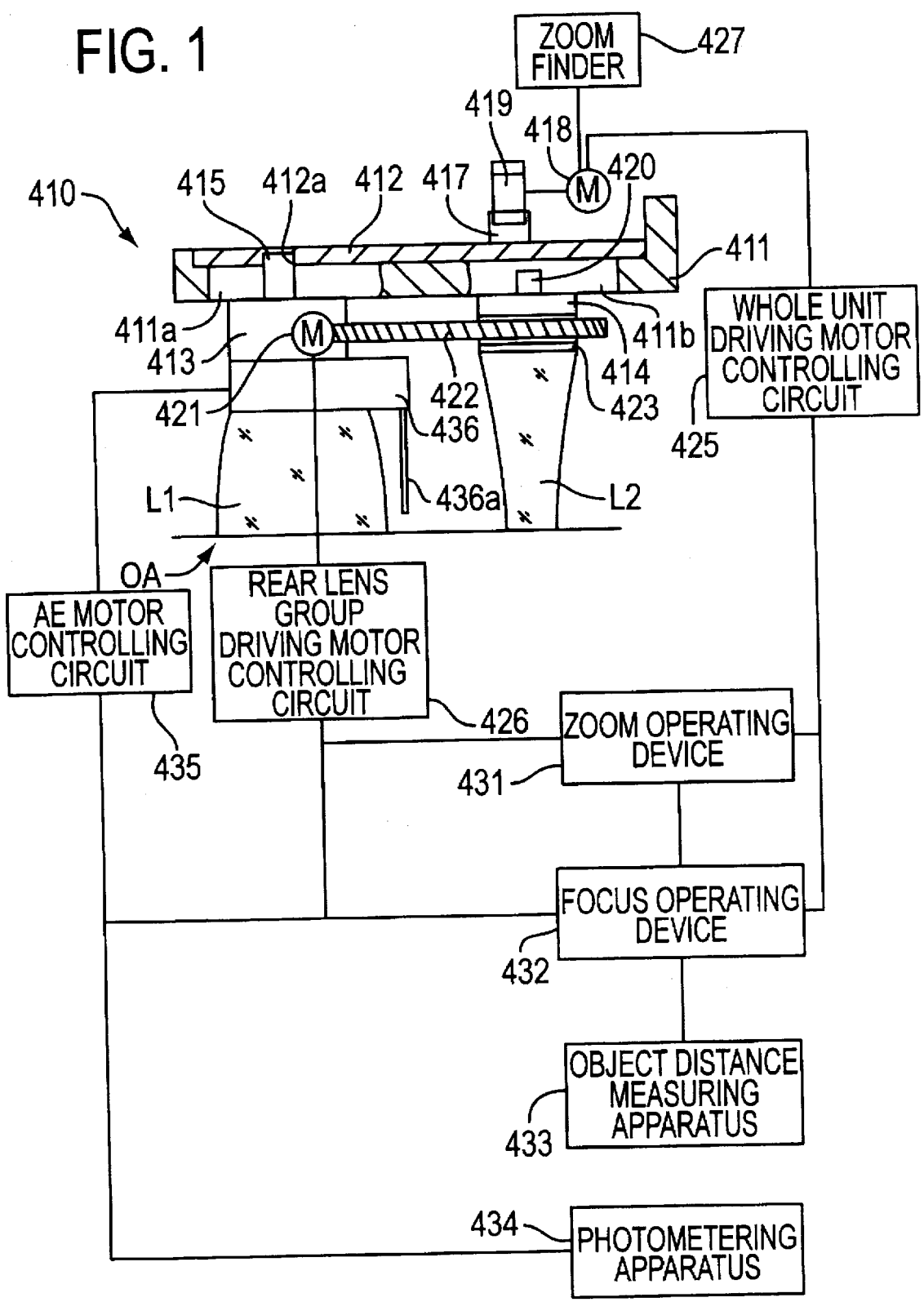
FIG. 1 is a schematic view and a block diagram of an example of a mechanical structure of a camera, to realize a method of focusing for a zoom lens camera of the present embodiment.

FIG. 1 is an (essentially) schematic representation of various elements which comprise a zoom lens camera according to the present embodiment. More specific details of such a camera are described hereinafter with reference to FIGS. 8–103. Thus, although they may describe similar and/or identical parts, the reference numerals used in FIG. 1 are not identical to those used in the other figures.

As shown in FIG. 1, a zoom lens barrel 410 is provided with a front lens group L1 of positive power and a rear lens group L2 of negative power shown in FIG. 1. On an outer periphery of a stationary ring 411, a driving ring 412 is rotatably supported, and on an inner periphery thereof, a front lens group supporting ring 413, which supports the front lens group L1, and a rear lens group supporting ring 414, which supports the rear lens group L2, are engaged. On the stationary ring 411, a linear guide groove 411a is formed parallel to an optical axis OA of the zoom lens barrel 410, and a radial pin 415, provided on the front lens group supporting ring 413, is engaged with a lead groove 412a formed on an inner peripheral surface of the driving ring 412. The radial pin 415 passes through the linear guide groove 411a to engage with the lead groove 412a. On an outer periphery of the driving ring 412, a gear 417 is fixedly engaged with a gear 419 of a whole unit driving (whole unit moving) motor 418.

On the stationary ring 411, a linear guide groove 411b is formed parallel to the optical axis of the zoom lens barrel 410. A radial pin 420, provided on the rear lens group supporting ring 414, engages with the linear guide groove 411b. On the front lens group supporting ring 413, a rear lens group driving (rear lens group moving) motor 421 and a driving screw 422 driven rotatably by the rear lens group driving motor 421, are provided. The driving screw 422 engages with an anti-rotating nut 423 provided on the rear lens group supporting ring 414.

In the above described structural arrangement, when the driving ring 412 is rotatably driven by the whole unit driving motor 418, in accordance with the relationship between the lead groove 412a and the linear guide groove 411a, the front lens group supporting ring 413 (i.e., the front lens group L1) moves in the optical axis direction. Since the rear lens group supporting ring 414 (i.e., the rear lens group L2) is secured to the front lens group supporting ring 413 through the driving screw 422 and the nut 423, the rear lens group supporting ring 414 moves together with the front lens group supporting ring 413 in the optical axis direction. Thus it can be understood that the whole unit driving motor 418 moves both lens groups, i.e., the front and rear lens groups, together as a whole.

On the other hand, when the driving screw 422 is rotatably driven by the rear lens group driving motor 421, the rear lens group supporting ring 414 (i.e., the rear lens group L2) moves relatively to the front lens group supporting ring 413 (i.e., the front lens group L1). Thus it can be understood that the rear lens group driving motor 421 is a motor which varies the distance between the rear lens group L2 and the front lens group L1.

The whole unit driving motor 418 and the rear lens group driving motor 421 are respectively controlled and driven by respective motor controlling circuits 425 and 426. The whole unit driving motor 418 is also connected to a zoom finder 427 so that a field of view of the finder varies when the whole unit driving motor 418 is actuated.

In the main body of the camera, a zoom operating device 431, a focus operating device 432, an object distance measuring device 433 and a photometering apparatus 434 are provided. The zoom operating device 431 provides a zooming command, namely commands to move from a "wide" position to a "tele" position, or vice versa, to the zoom lens barrel 410, i.e., the front lens group L1 and the rear lens group L2. The zoom operating device 431 consists of, for example, a switch according to a momentary mechanical system. The focus operating device 432 consists of, for example, of a release button. When the focus operating device 432 is depressed by a half-depression (half-step), object distance measurement information is input to the object distance measuring device 433 and photometering information is input to the photometering apparatus 434. When the focus operating device 432 is fully depressed (full step), the focusing operation commences, and a shutter 436, mounted to the front lens group supporting ring 413, is operated via a AE motor controlling circuit 435. The shutter 436 opens a shutter blade 436a for a predetermined time according to the photometering information output from the photometering apparatus 434.

In the zoom lens camera as above described, when the zoom operating device 431 is operated, the whole unit driving motor 418 is driven via at least the whole unit driving motor controlling circuit 425, and the front lens group L1 and the rear lens group L2 are moved as a whole. The rear lens group driving motor 421 may also be driven via the rear lens group driving motor controlling circuit 426. With the above structural arrangement, it should be understood that the movement of the front lens group L1 and the rear lens group L2 by the zoom operating device 431 is not operated under the conventional concept of zooming in which the focal point does not move. When the zoom operating device 431 is operated, the following two modes are available, namely:

1. a mode to move the front lens group L1 and the rear lens group L2, in the optical axis direction, without varying the distance therebetween, by driving only the whole unit driving motor 418; and, 2. a mode to move the front lens group L1 and the rear lens group L2, in the optical axis direction, while varying the distance therebetween, by driving both the whole unit driving motor 418 and the rear lens group driving motor 421.

In mode 1, during the zooming operation it is impossible to focus on the subject. However, this is not a problem in a lens-shutter type camera, since the image is not observed through the photographing optical system, and it is sufficient to only be focused when the shutter is released. In mode 2, during the zooming operation, the front lens group L1 and the rear lens group L2 are moved without consideration of whether the focal point moves, and when the shutter is released, focusing (focus adjusting) is carried out by moving both the whole unit driving motor 418 and the rear lens group driving motor 421.

On the other hand, when the whole unit driving motor 418 is actuated by the zoom operating device 431, the zoom finder 427 is driven so that the finder field of view thereof is changed in accordance with the focal length set. Specifically, as the set focal length changes from a short focal length to a longer focal length, the finder field of view (angle) changes from a wider field of view to a narrower field of view. The finder field of view of course corresponds to a photographing image size. This kind of zoom finder is well known and is therefore not shown.

In the present embodiment, as mentioned above, when the zoom operating device 431 is operated to set a focal length, the finder field of view (photographing image area) at the set focal length is observed through the zoom finder 427.

Further when the focus operating device 432 is operated in at least one part of the focal length range set by the zoom operating device 431, the whole unit driving motor 418 and the rear lens group driving motor 421 are driven and subject focusing is performed. The movement of the front lens group L1 and the rear lens group L2 by the whole unit driving motor 418 and the rear lens group driving motor 421 is determined, not only using subject distance information provided from the object distance measuring device 433, but also by using focal length information set by the zoom operating device 431. In such a manner, when the focus operating device 432 is operated, by moving both the whole unit driving motor 418 and the rear lens group driving motor 421, the position of the lenses can be flexibly controlled, i.e., the position of the lenses has a degree of flexibility.

In theory, during an operation of the zoom operating device 431, the magnification of the finder and the focal length information are only varied without driving neither the whole unit driving motor 418 nor the rear lens group driving motor 421, and when the focus operating device 432 is operated, both the whole unit driving motor 418 and the rear lens group driving motor 421 are moved simultaneously according to the focal length information and the subject distance information obtained by the object distance measuring device 433 to move the front lens group L1 and the rear lens group L2 to positions decided according to the focal length and the subject distance information.

Figure 2:
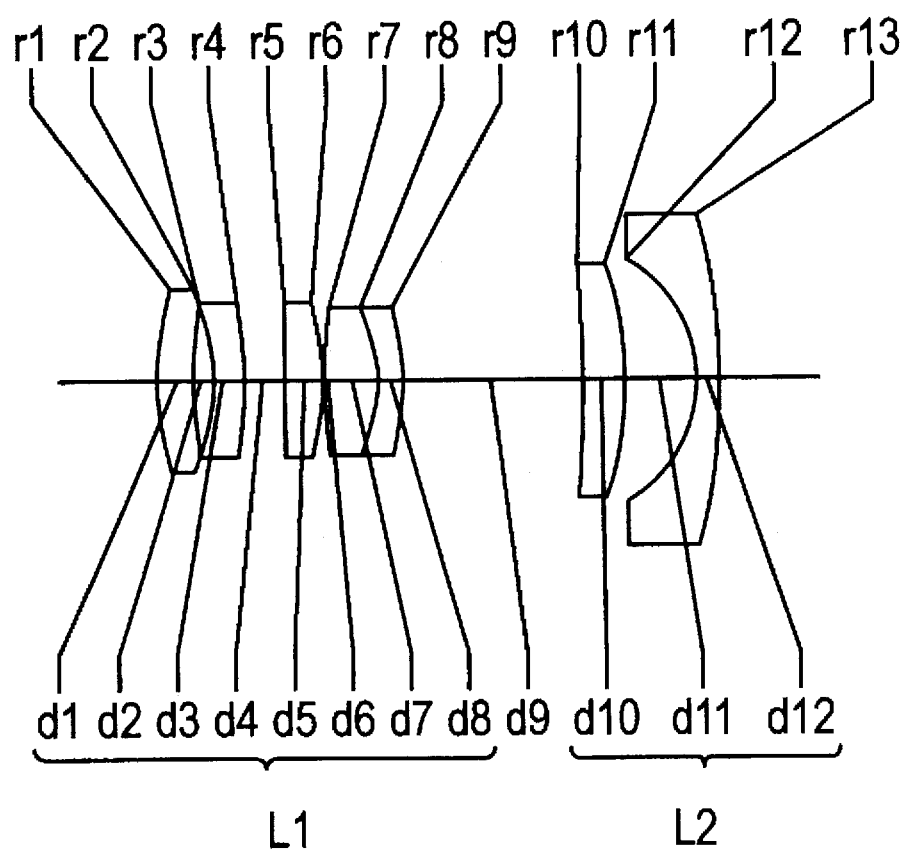
FIG. 2 is a schematic view of a structure of an example of a zoom lens system according to the method of focusing of the present embodiment.

The following discussion will illustrate several examples of a front lens group L1, a rear lens group L2, and a controlling of movement thereof. Table 1 shows lens data regarding the front lens group L1 and the rear lens group L2, and FIG. 2 is a drawing showing the structure of the lens groups. The lens data only shows a concrete example of the optical system which is applicable to a two-lens group type zoom lens according to the present embodiment. The front lens group L1 consists of four lens groups having five lens elements, and the rear lens group L2 consists of two lens groups having two lens elements (duplet).

In the following tables and the drawings (FIGS. 3 through 7), FNO represents the F number, f represents the focal length, ω represents the half angle of view, fB represents the back focal distance, ri represents the curvature of radius of each lens surface, di represents the thickness of a lens or the distance between lenses, n represents the refractive index of the d-line, and ν represents the Abbe number.

TABLE 1

FNO = 1:3.9–10  f = 39–102 (mm)
ω = 28.4–12.0 (degrees)  FB = 9.47–63.1 (mm)

| Surface No. | ri | di | n | ν |
|---|---|---|---|---|
| 1 | 20.550 | 2.10 | 1.48749 | 70.2 |
| 2 | 42.627 | 1.65 | — | — |
| 3 | −15.428 | 1.66 | 1.83400 | 37.2 |
| 4 | −30.458 | 3.06 | — | — |
| 5 | 631.122 | 2.80 | 1.51633 | 64.1 |
| 6 | −16.980 | 0.10 | — | — |
| 7 | 91.952 | 3.42 | 1.53996 | 59.5 |
| 8 | −11.244 | 1.60 | 1.80400 | 46.6 |
| 9 | −23.784 | 12.56–2.59 | — | — |
| 10 | −42.469 | 2.50 | 1.58547 | 29.9 |
| 11 | −26.490 | 5.04 | — | — |
| 12 | −10.416 | 1.50 | 1.71299 | 53.9 |
| 13 | −48.829 | — | — | — |

Surface 10 is an aspherical surface having rotational symmetry

Aspherical Surface Data:

$K=0.0, A4=5.96223 \times 10^{-5}, A6=2.52645 \times 10^{-7}, A8=2.89629 \times 10^{-9}$ The shape of the aspherical surface having rotational symmetry can be generally expressed as follows:

$$x = Ch^2/\{1+[1-(1+K)C^2h^2]^{1/2}\} + A4h^4 + A6h^6 + A8h^8 + A10h^{10} + \ldots$$

wherein, h represents a height above the axis,
X represents a distance from a tangent plane of an aspherical vertex,
C represents a curvature of the aspherical vertex(1/r),
K represents a conic constant,
A4 represents a fourth-order aspherical factor,
A6 represents a sixth-order aspherical factor,
A8 represents an eighth-order aspherical factor,
A10 represents a tenth-order aspherical factor.

Data regarding zooming is shown in Table 2. In Table 2, TL represents the distance from the primary surface to the image surface, $d_{1G-2G}$ represents the distance between the front lens group L1 and the rear lens group L2. The values of TL and $d_{1G-2G}$ represent absolute positions of the first lens group L1 and the second lens group L2 when zooming while keeping the in-focus condition with respect to an object at infinite distance, and the lens positions are realized by a cam mechanism in a conventional zoom compact camera. Specifically, upon setting a focal length by a zoom switch, the first lens group L1 and the second lens group L2 move to positions defined in Table 2 which are determined by the focal length set.

However, according to the zoom lens camera of the present embodiment, upon setting a focal length by the zoom operating device 431, the first lens group L1 and the second lens group L2 do not move to positions defined in Table 2.

In Table 2, XA (f) represents the total movement distance of the first lens group L1 and the second lens group L2 at a respective focal length by the whole unit moving motor 418 from reference positions thereof. The reference positions (XA(f)=0) are defined by the positions of the lens groups L1 and L2 when the lens groups are located at the shortest focal length (39 mm) while focusing on an object at infinity.

In Table 2, XB(f) represents the total movement distance of the second lens group L2 with respect to the first lens group L1 at a respective focal length by the relative moving motor 421 from a reference position of the rear lens group L2. The reference position (XB(f)=0) is defined as the position of the second lens group L2 when the lens groups L1, L2 are located at the longest focal length (102 mm) while focusing on an object at infinity.

The point is that the movement distances XA(f) and XB(f) are not given just by setting a focal length, but are given when the focus operating device 432 is operated. Note that "0" in XA(f) and XB(f) represents reference positions and does not refer to stand-by positions of the lens groups L1, L2 before the motors 418 and 421 are actuated. In other words, "0" in XA(f) and XB(f) does not mean that the motors 418 and 421 are not driven when the focus operating device is operated. Mechanically, to realize a precise position control of the lens groups, it is preferred that the lens groups are positioned at waiting positions which are represented by negative values (positions moved in directions opposite from the reference position) in Table 2 and are moved to positions shown in Table 2 upon operation of the focus operating device from the waiting positions.

TABLE 2

| f | TL | $d_{1G-2G}$ | XA (f) | XB (f) |
|---|---|---|---|---|
| 39 | 47.45 | 12.56 | 0 | 9.97 |
| 45 | 50.36 | 10.44 | 2.91 | 7.85 |
| 70 | 66.66 | 5.42 | 19.21 | 2.83 |
| 95 | 85.56 | 3.05 | 38.11 | 0.46 |
| 102 | 91.11 | 2.59 | 43.66 | 0 |

As described above, in the zoom lens camera according to the present embodiment, the first lens group L1 and the second lens group L2 move to positions determined by set focal length information and detected object distance information by actuating the motors 418 and 421 using the zoom operating device 431 and the focus operating device 432. Accordingly, it is possible to make zooming control and focusing control without using the cam mechanism by storing lens position data, consisting of a combination of stepped focal length information and stepped object distance information, in a memory, and digitally controlling the motors 418 and 421 in accordance with the stored lens position data. Therefore, how to control the motors 418 and 421 in accordance with the information in combination with the set focal length information and the detected object distance information is not within the scope of the main subject of the present application. The following discussion illustrates five advantageous examples of how to control the motors 418 and 421 (lens groups L1 and L2). It is possible to selectively employ these controls in accordance with the zoom lens of the present embodiment.

In the following examples XA represents movement due to the whole unit driving motor, XB represents movement due to the rear lens group driving motor, (f) represents the function of the focal length, (u) represents the function of the subject distance, and XA and XB respectively represent movement during focusing due to the whole unit driving motor and the rear lens group driving motor. Namely, XAmax represents the maximum movement during zooming and additional focusing due to the whole unit driving motor, XA(f)max represents the maximum movement during zooming due to the whole unit driving motor, ΔXF(u) represents the movement based only on subject distance regardless of the focal length, XBmax represents the maximum movement during zooming and additional focusing due to the rear lens group driving motor, and XB(f)max represents the maximum movement during zooming due to the rear lens group driving motor.

[EXAMPLE 1]

Figure 3:
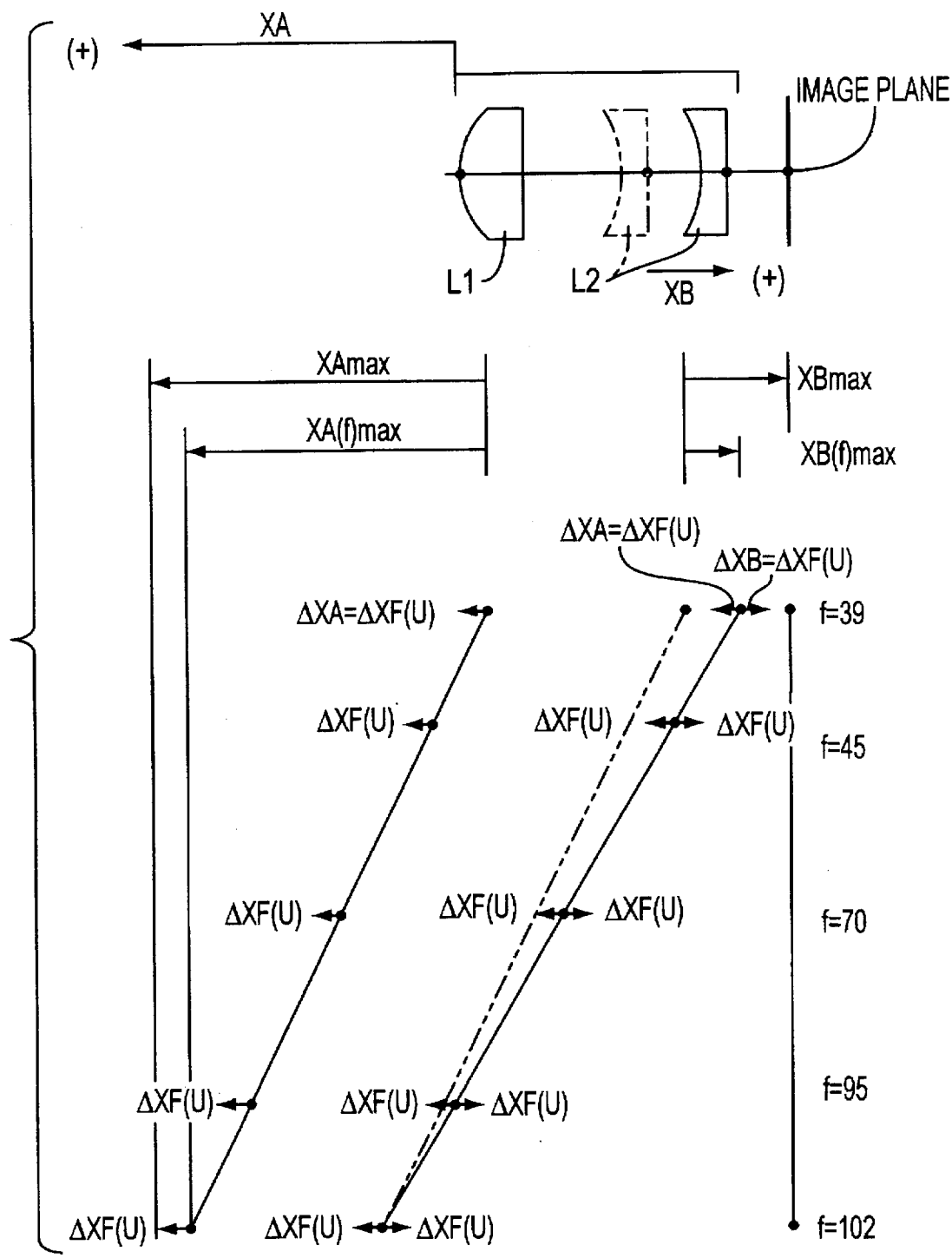
FIG. 3 is a graphic representation of an example of lens movement control according to the method of focusing of the present embodiment.

FIG. 3 is a first example of a front lens group L1 and a rear lens group L2. In FIGS. 3 through 7, the length of the arrows of ΔXA and ΔXB are drawn in a larger scale than the arrows of XA and XB.

In the present example, throughout the whole focal length range, set by the zoom operating device 431, the total movement XA and the relative movement of the rear lens group XB are given by the following relationships:

$XA=XA(f)+\Delta XF(u)$ $XB=XB(f)+\Delta XF(u)$

In other words, XA and XB are defined by the addition of a similar quantity of ΔXF(u), without having any relationship to the focal length. When the same amount of ΔXF(u) is added to XA and XB, in regard to the function of the subject distance (u), the distance of the rear lens group L2 from the image surface does not vary. The position of the rear lens group L2 indicated by the broken line (two-dotted) represents its position without an operation of the rear lens group driving motor.

In the present example, if the shortest subject distance u=700 mm, when f=39 mm, then ΔXF(u)=1.17, and as f increases, the value of ΔXF(u) will increase slightly, but when f=102 mm, then ΔXF(u)=1.25 and therefore the amount of increase is very little. Considering the depth of focus, it is possible to control the movement (i.e., the movement of the lenses to the desired position) of the lenses only by the subject distance information, regardless of the focal length information from the zoom operating device 431.

In the present example, the following relationships are given:

$XA\text{max}=XA(f)\text{max}+\Delta XF(u)\text{max}$ $XB\text{max}=XB(f)\text{max}+\Delta XF(u)\text{max}$

[EXAMPLE 2]

Figure 4:
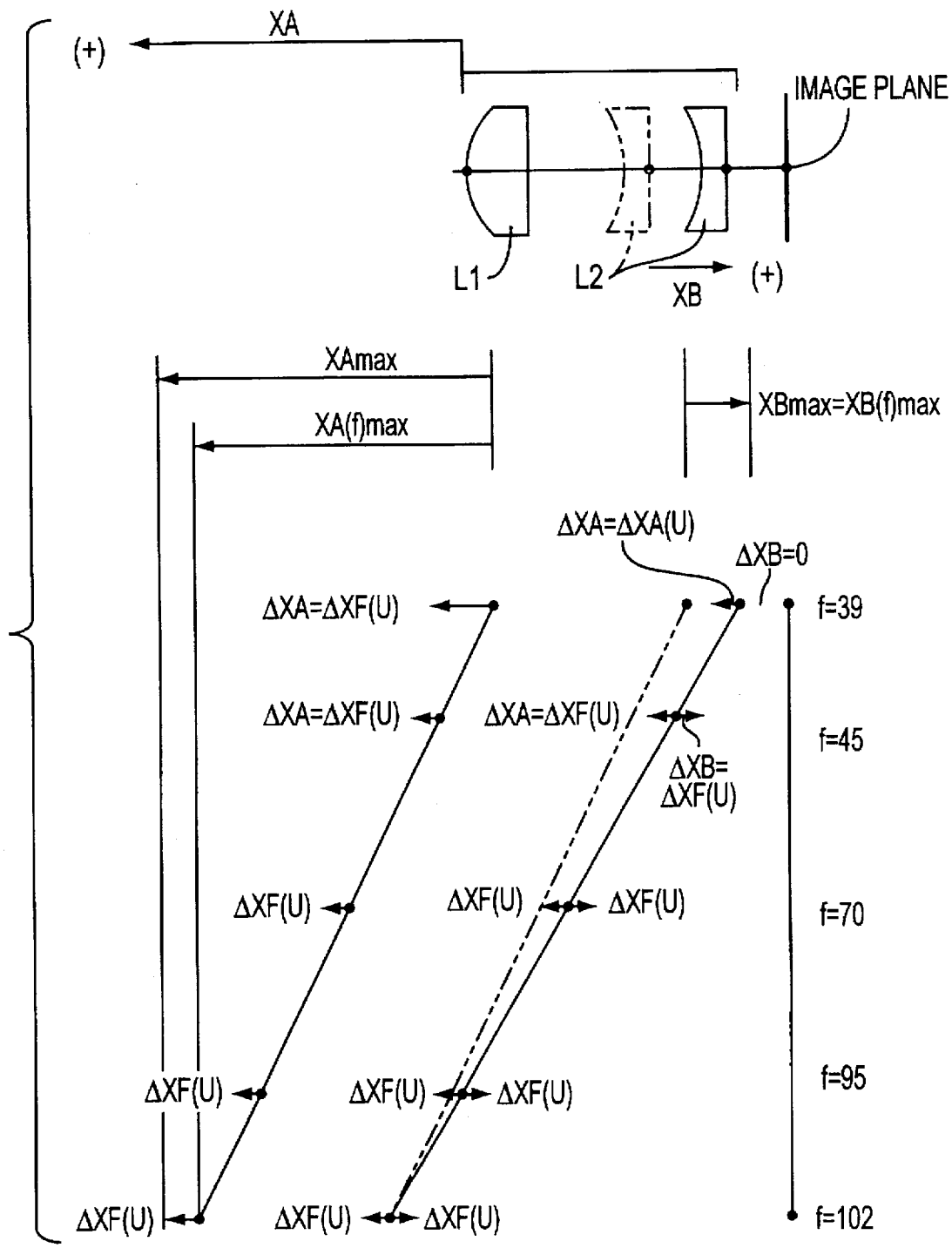
FIG. 4 is a graphic representation of another example of lens movement control according to the method of focusing of the present embodiment.

FIG. 4 shows a second example of a front lens group L1 and a rear lens group L2.

In the present example, around the short focal length end, set by the zoom operating device 431, the following relationships are defined:

$XA=XA(f)+\Delta XA(u)$ $XB=XB(f)+0$ (i.e., regarding subject distance, the rear lens group L2 should not move relative to the front lens group L1)

At other focal lengths, the following relationships are defined:

$XA=XA(f)+\Delta XF(u)$ $XB=XB(f)+\Delta XF(u)$

In the present example, if the shortest subject distance u=700 mm, when f=39 mm, then ΔXA(u)=1.72. Regarding other focal lengths, the values of ΔXF(u) are approximately determined as follows:

when f=45 mm, then ΔXF(u)=1.17;

when f=70 mm, then ΔXF(u)=1.20;

when f=95 mm, then ΔXF(u)=1.24;

and, when f=102 mm, then ΔXF(u)=1.25.

Therefore, at focal lengths other than around the short focal length end, it is possible to control the position of the lenses only by the subject distance information, regardless of the focal length information.

In the present example, the following relationships are defined:

$XA\text{max}=XA(f)\text{max}+\Delta XF(u)\text{max}$ $XB\text{max}=XB(f)\text{max}$ Therefore, the relative movement of the rear lens group can be minimized. In this example, XB(f)max is less than XB(f)max in Example 1.

[EXAMPLE 3]

Figure 5:
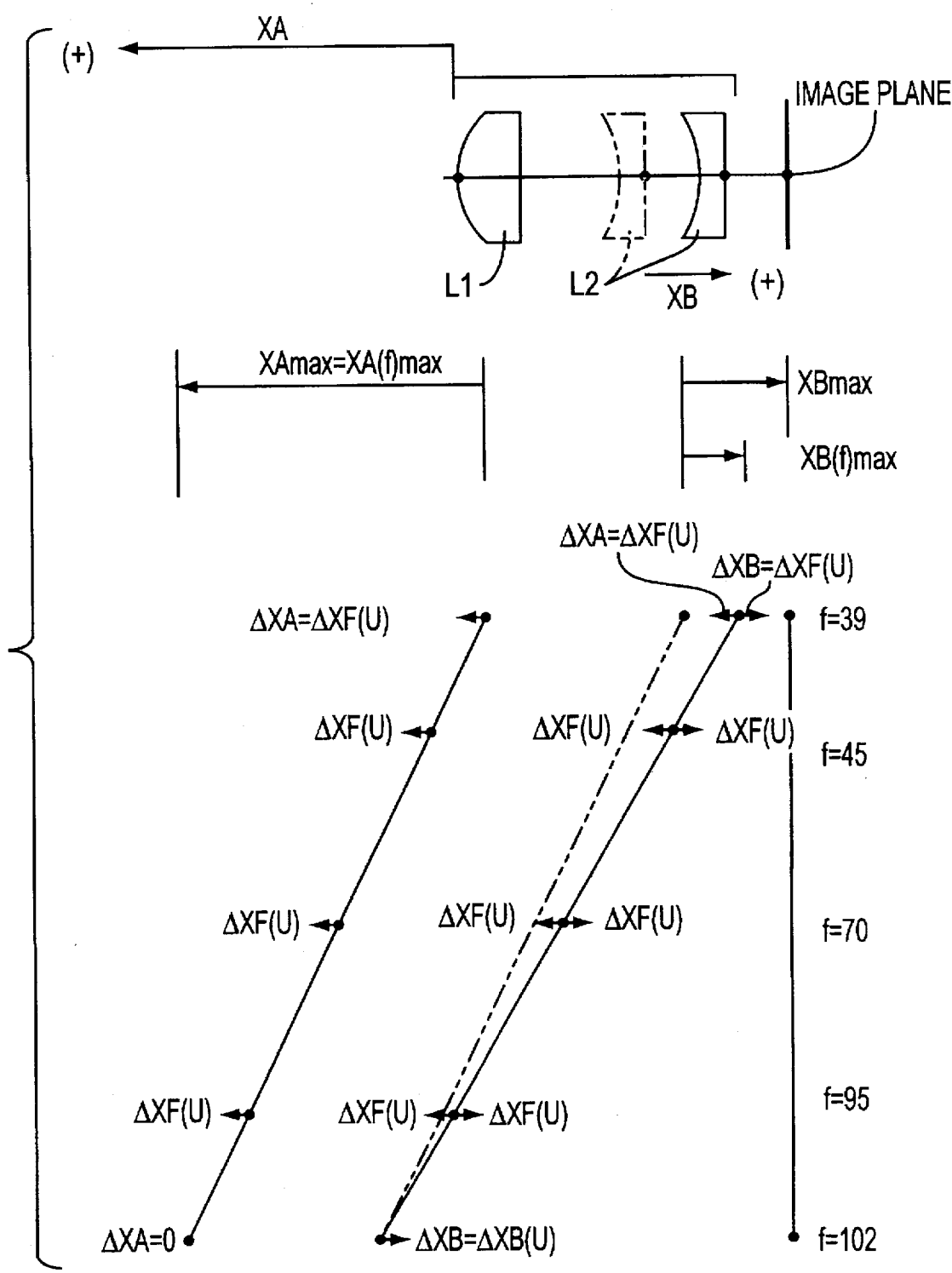
FIG. 5 is a graphic representation of another example of lens movement control according to the method of focusing of the present embodiment.

FIG. 5 shows a third example of a front lens group L1 and a rear lens group L2.

In the present example, around the long focal length end, set by the zoom operating device 431, the following relationships are defined:

$XA=XA(f)+0$ (i.e., regarding subject distance, the front lens group L1 should not move)

$XB = XB(f)+\Delta XB(u)$

At other focal lengths, the following relationships are defined:

$XA=XA(f)+\Delta XF(u)$ $XB=XB(f)+\Delta XF(u)$

In the present example, if the shortest subject distance u=700 mm, the values of ΔXF(u) are approximately determined as follows:

when f=39 mm, then ΔXF(u)=1.17;

when f=45 mm, then ΔXF(u)=1.17;

when f=70 mm, then ΔXF(u)=1.20;

and, when f=95 mm, then ΔXF(u)=1.24.

However, when f=102 mm, then ΔXB (u)=1.35.

Therefore, at focal lengths other than around the long focal length end, it is possible to control the position of the lenses only by the subject distance information, regardless of the focal length information.

In the present example, the following relationships are defined:

$XAmax=XA(f)max$ $XBmax=XB(f)max+\Delta XB(u) max$

Therefore, the total movement by the whole unit driving motor is minimized.

[EXAMPLE 4]

Figure 6:
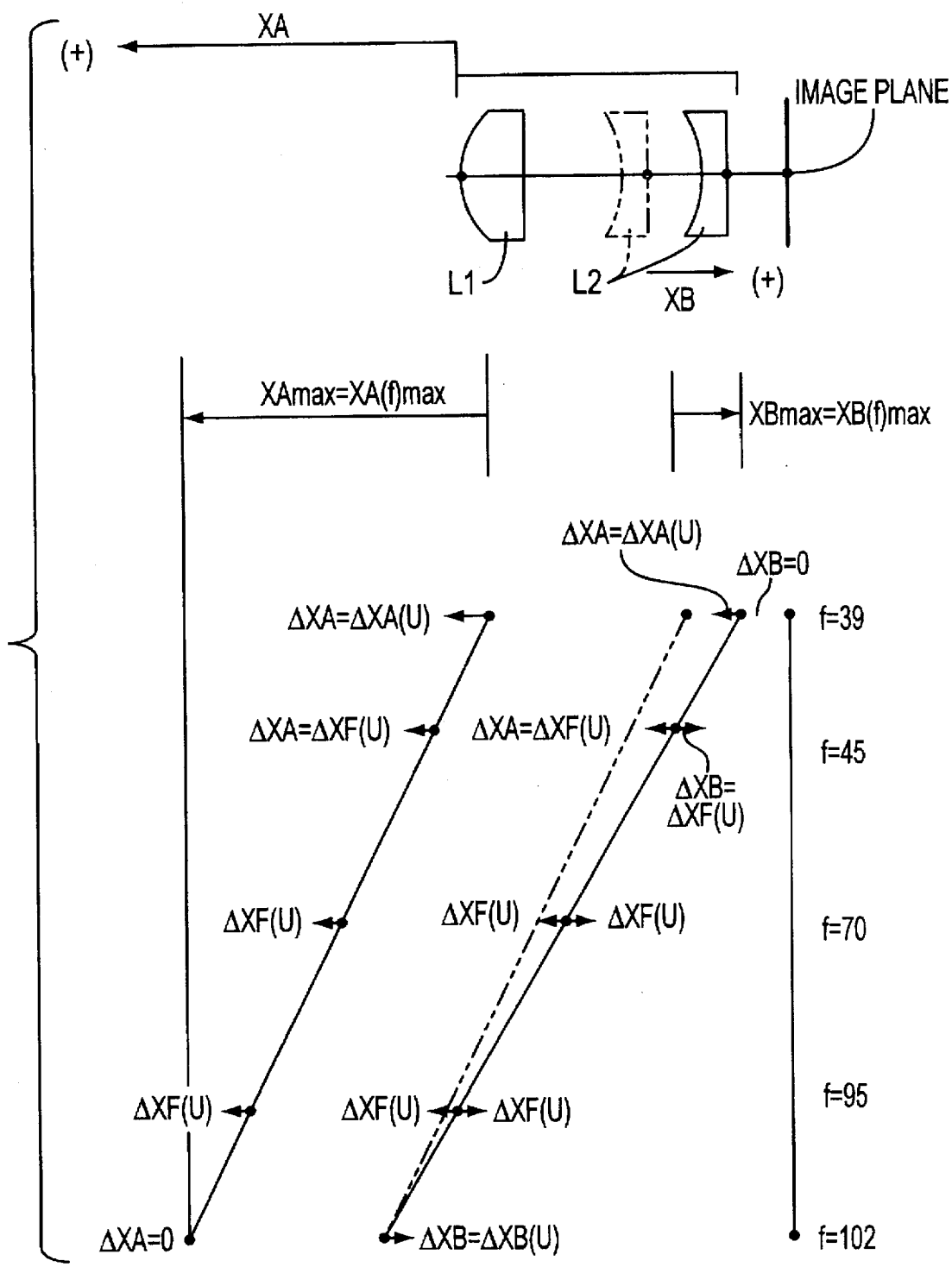
FIG. 6 is a graphic representation of another example of lens movement control according to the method of focusing of the present embodiment.

FIG. 6 shows a fourth example of a front lens group L1 and a rear lens group L2.

In the present example, around the short focal length end, set by the zoom operating device 431, the following relationships are defined:

$XA=XA(f)+\Delta XA(u)$ $XB =XB(f)+0$ (i.e., regarding subject distance, the rear lens group L2 should not move relative to the front lens group L1)

Around the long focal length end, set by the zoom operating device 431, the following relationships are defined:

$XA=XA(f)+0$ (i.e., regarding subject distance, the front lens group L1 should not move)

$XB=XB(f)+\Delta XB(u)$

And at other focal lengths, the following relationships are defined:

$XA=XA(f)+\Delta XF(u)$ $XB=XB(f)+\Delta XF(u)$

In the present example, if the shortest subject distance u=700 mm, the position of the lenses, other than at around the short or long focal length ends, are approximately determined as follows:

when f=39 mm, then ΔXA(u)=1.72;

when f=45 mm, then ΔXF(u)=1.17;

when f=70 mm, then ΔXF(u)=1.20;

when f=95 mm, then ΔXF(u)=1.24;

and, when f=102 mm, then ΔXB(u)=1.35.

Therefore, at focal lengths other than around the short or long focal length ends, it is possible to control the position of the lenses only by the subject distance information, regardless of the focal length information.

In the present example, the following relationships are defined:

$XAmax=XA(f)max$ $XBmax=XB(f)max$

Therefore, the movement of both lens groups is minimized, as well as the relative movement of the rear lens group.

[EXAMPLE 5]

Figure 7:
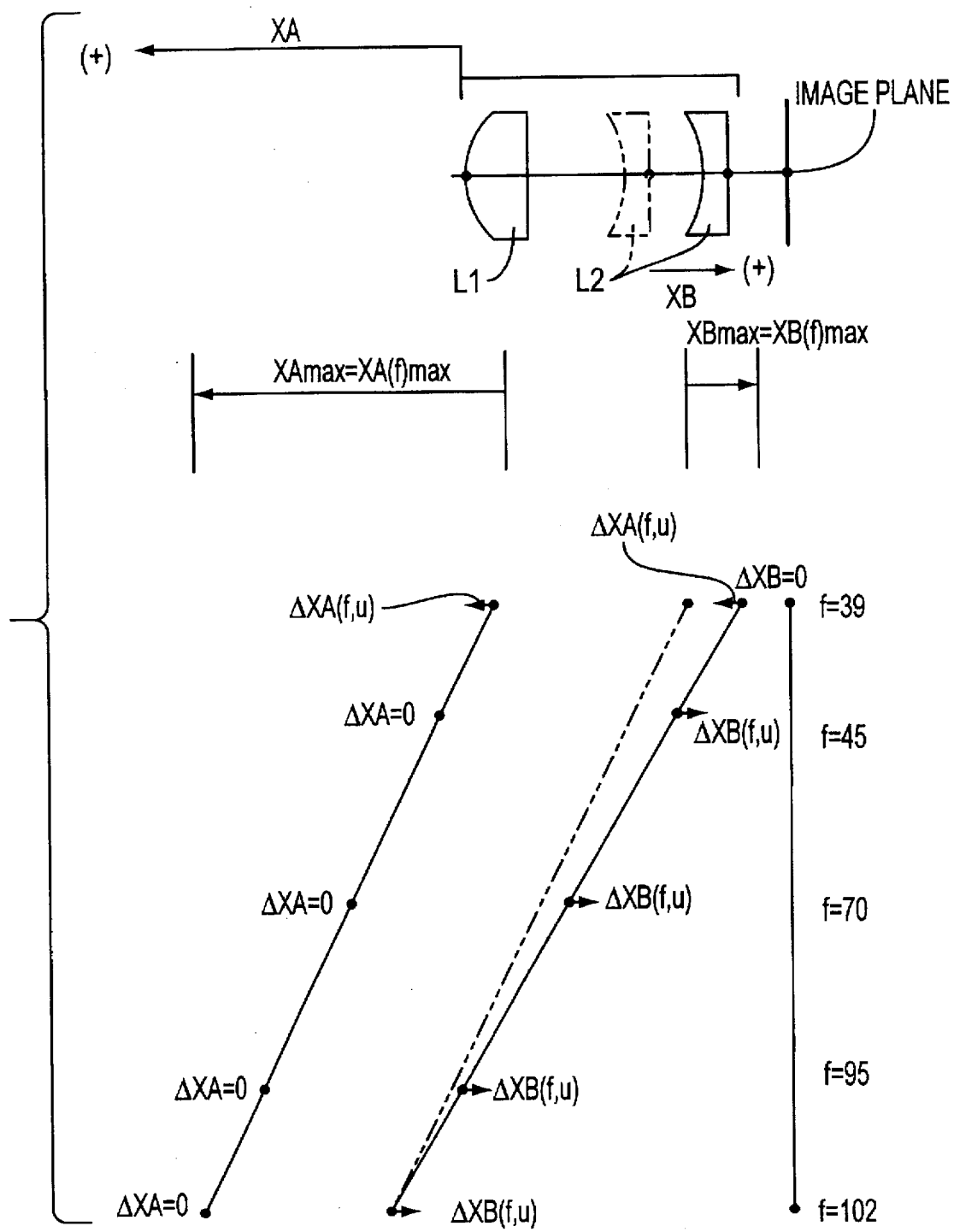
FIG. 7 is a graphic representation of another example of lens movement control according to the method of focusing of the present embodiment.

FIG. 7 shows a fifth example of a front lens group L1 and a rear lens group L2.

In the present example, around the short focal length end, set by the zoom operating device 431, the following relationships are defined:

$XA=XA(f)+\Delta XA(u)$ $XB=XB(f)+0$ (i.e., regarding subject distance, the rear lens group L2 should not move against the front lens group L1)

At other focal lengths, the following relationships are defined:

$XA=XA(f)+0$ (i.e., regarding subject distance, the front lens group L1 should not move)

$XB =XB(f)+\Delta XB(f,u)$

In the present example, if the shortest subject distance u=700 mm, the position of the lenses around the long focal length end is approximately determined as follows:

when f=39 mm, then ΔXA(u)=1.72;

when f=45 mm, then ΔXF(u)=1.90;

when f=70 mm, then ΔXF(u)=1.42;

when f=95 mm, then ΔXF(u)=1.35;

and, when f=102 mm, then ΔXB (u)=1.35.

Therefore, at the short focal length end, it is possible to control the position of the lenses only by the subject distance information, and at other focal lengths it is possible to control the position of the lenses by the focal length information and the subject distance information.

In the present example, the following relationships are defined:

XAmax=XA(f)max

XBmax=XB(f)max

Therefore, the movement of both lens groups is minimized, as well as the relative movement of the rear lens group. The position of the lenses, however, may differ according to the focal length.

The mechanical structure of the zoom lens shown in FIG. 1 illustrates a simple example thereof. Various mechanical structures may actually be made, and thus the present description shall not refer to the mechanical structure itself.

As above described, according to the method of focusing the zoom lens camera in the present embodiment, when the focus operating device is operated, focusing is performed in such a manner that, the whole unit driving motor which drives the front and the rear lens group as a whole, and the rear lens group driving motor which varies the distance between the front lens group and the rear lens group, move together, and thereby flexible control of the lens position will be facilitated.

To realize the zoom lens and the method of lens driving shown in FIGS. 2 through 7, several embodiments will now be described with reference to FIGS. 8 to 23.

Figure 26:
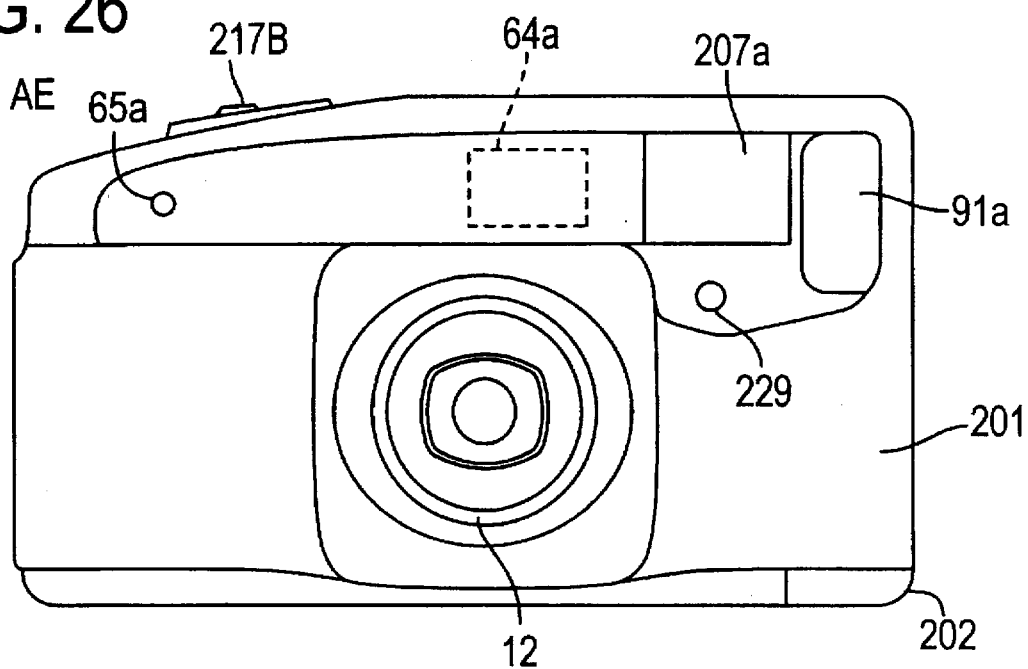
FIG. 26 is a front elevational view of an example of an embodiment of a zoom lens camera according to the present embodiment.

The following embodiments are applied to a lens shutter type of zoom lens camera, as shown in FIG. 26. The concept of the present zoom lens camera will now be described with reference to FIG. 20.

Figure 20:
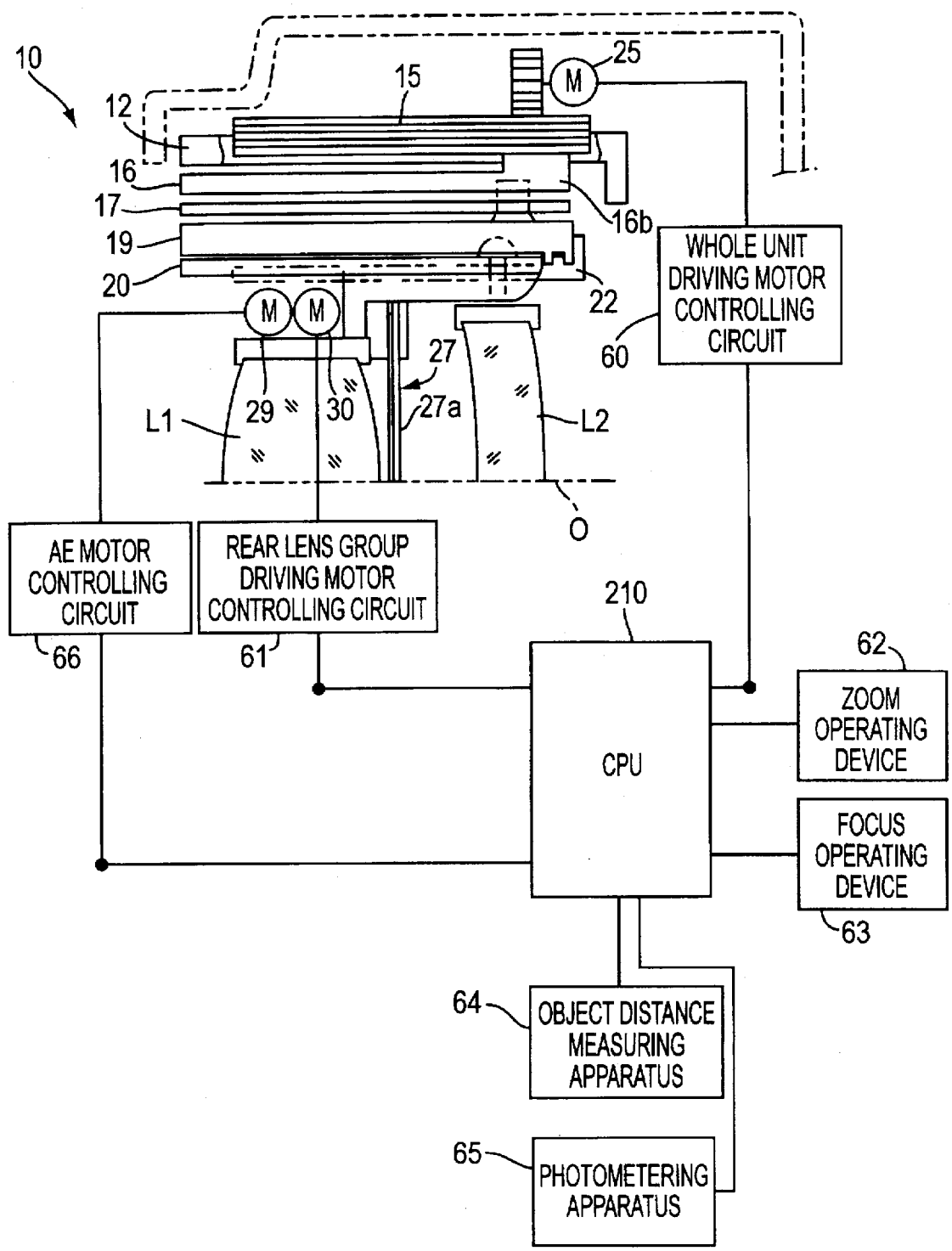
FIG. 20 is a block diagram of a controlling system to control an operation of the zoom lens barrel.

FIG. 20 shows a zoom lens barrel 10, provided in the present zoom lens camera, of a three-stage delivery type having three moving barrels, namely a first moving barrel 20, a second moving barrel 19 and a third moving barrel 16. Two lens groups are provided, namely a front lens group L1 having positive power and a rear lens group L2 having negative power.

In the main body of the camera, a whole unit driving motor controlling circuit 60, a rear lens group driving motor controlling circuit 61, a zoom operating device 62, a focus operating device 63, an object distance measuring apparatus 64, a photometering apparatus 65, an AE (i.e., automatic exposure) motor controlling circuit 66, and a CPU (i.e., central processing unit) 210, are provided. The CPU 210 controls the above devices, circuits and apparatuses. Although the specific object distance measuring apparatus 64 which is used to provide information regarding the object-to-camera distance does not form part of the present invention, one such suitable system is disclosed in commonly assigned U.S. patent application Ser. No. 08/605,759, filed on Feb. 22, 1996, the entire disclosure of which is expressly incorporated by reference herein. Although the systems disclosed in such application are of the so-called "passive" type, other known autofocus systems (e.g., active range finding systems such as those based on infrared light and triangulation) may be used. Similarly, a photometering system as disclosed in the noted U.S. patent application Ser. No. 08/605,579 could be implemented as photometering system 65.

Figure 28:
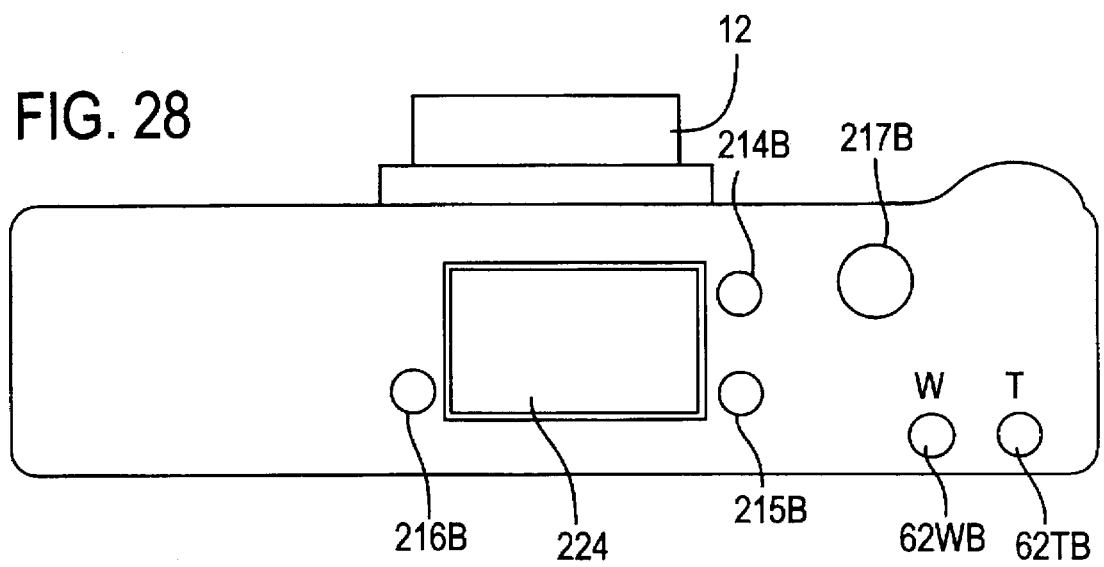
FIG. 28 is a plan view of the zoom lens camera shown in FIG. 26.

When the zoom operating device 62, for example in the form of a zoom lever provided on the camera body (i.e., a "wide" zoom button 62WB and a "tele" zoom button 62TB, as shown in FIG. 28), is operated, the CPU 210 outputs commands to the whole unit driving motor controlling circuit 60 to move the front lens group L1 and the rear lens group L2, rearwardly or forwardly without consideration of the focal length and a focal point thereof.

In the following explanation, forward and rearward movements of the lenses L1 and L2 by the whole unit driving motor control circuit 60 (the motor 25) are referred to as the movement toward "tele" and the movement toward "wide", respectively, since forward and rearward movements of the lenses L1 and L2 occur when the zoom operating device 62 is operated to "tele" and "wide" positions.

The image magnification of the visual field of the finder 427 (FIG. 1), varies sequentially to the variation of the focal length through the operation of the zoom operating device 62. Therefore, the photographer may perceive the variation of the set focal length through the operation of the zoom operating device 62, by observing the variation of image magnification of the visual field of the finder. In addition, the focal length, set by the operation of the zoom operating device 62, may be perceived by a value indicated on an LCD (i.e., liquid crystal display) panel 224, as shown in FIG. 28.

When the focus operating device 63 is operated, the CPU 210 drives the whole unit driving motor 25 driven via the whole unit driving motor controlling circuit 60, and additionally drives a rear lens group driving motor 30 driven via the rear lens group driving motor controlling circuit 61, so that the front and rear lens groups L1 and L2 are moved to a position corresponding to a set focal length and a detected object distance, and whereby the zoom lens is focused on the subject.

Specifically, the focus operating device 63 is provided with a release button 217B. A photometering switch SWS and a release switch SWB are synchronized with the release button 217B.

When the release button 217B is half-depressed (half step), through the CPU 210, the photometering switch SWS is made ON, and the respective object distance measuring and photometering commands are input to the object distance measuring apparatus 64 and the photometering apparatus 65.

When the release button 217B is fully depressed (full step), the CPU 210 causes the release switch SWR to be made ON, and according to the result of the object distance measuring device and a set focal length, the whole unit driving motor 25 and the rear lens group driving motor 30 are driven, and the focusing process, in which the front lens group L1 and the rear lens group L2 move to the focusing position, is executed. Further, an AE motor 29 of an AF/AE (i.e., autofocus/autoexposure) shutter unit 21 (FIG. 21) is driven via the AE motor controlling circuit 66, and a shutter 27 is actuated. During the shutter action, upon the input of the photometering information output from the photometering apparatus 65, the CPU 210 drives the AE motor 29 and opens shutter blades 27a of the shutter 27 for a specified period of time. In the zoom lens camera of the present embodiment, immediately after the shutter blades 27a are closed, by driving the rear lens group driving motor 30, the rear lens group L2 moves forwardly to the initial position thereof. The focus operating device 63, though not shown, includes a switching mechanism to execute the focusing process by the CPU 210.

When the zoom operating device 62 is operated, the CPU 210 drives the whole unit driving motor 25, and the front lens group L1 and the rear lens group L2 move together as a whole in the optical axis direction. Simultaneous with such a movement, the rear lens group driving motor 30 may also be driven via the rear lens group driving motor controlling circuit 61. However, this is not performed under the conventional concept of zooming in which the focal length is varied sequentially without moving the position of the focal point.

Motors 29 and 30 are identical, and comprise DC motors having a minimum torque of 1.5 gram*cm at a rated voltage (i.e., 1.5V); motor 25 comprises a DC motor which has a minimum torque of 12.0 gram*cm. at a rated voltage (i.e., 2.4V). One example of motors 29 and 30 are motors manufactured by Sanyo Seimitsu Co., Ltd. of Japan, under motor code No. M-01166600; and an example of motor 25 is a motor which is also manufactured by Sanyo Seimitsu Co., Ltd. of Japan, under motor code No. M-01154200.

An example of the embodiment of the zoom lens barrel according to the above concept will now be described with reference to FIGS. 18 and 19.

The overall structure of the zoom lens barrel 10 in the present embodiment will firstly be described.

The zoom lens barrel 10 is provided with the first moving barrel 20, the second moving barrel 19, the third moving barrel 16, and a fixed lens barrel block 12. The third moving barrel 16 is engaged with a cylindrical part of the fixed lens barrel block 12, and moves in the optical axis direction upon being rotated. The third moving barrel 16 is provided on an inner periphery thereof with a linear guide barrel 17, which is restricted in rotation. The linear guide barrel 17 and the third moving barrel 16 move together as a whole in the optical axis direction, with the third moving barrel 16 rotating relative to the linear guide barrel 17. The first moving barrel 20 moves in the optical axis direction with rotation thereof being restricted. The second moving barrel 19 moves in the optical axis direction, while rotating relative to the linear guide barrel 17 and the first moving barrel 20. The whole unit driving motor 25 is secured to the fixed lens barrel block 12. A shutter mounting stage 40, on which the AE motor 29 and the rear lens group driving motor 30 are mounted, is secured to the first moving barrel 20. The front lens group L1 and the rear lens group L2 are respectively supported by a lens supporting barrel 34 and a lens supporting barrel 50.

On the inner periphery of the fixed lens barrel block 12, a female helicoid 12a, and a plurality of linear guide grooves 12b formed parallel to an optical axis O, are provided. An aperture plate 14 having an aperture 14a which defines a portion of the film to be exposed, is provided, as shown in FIG. 18.

Figure 14:
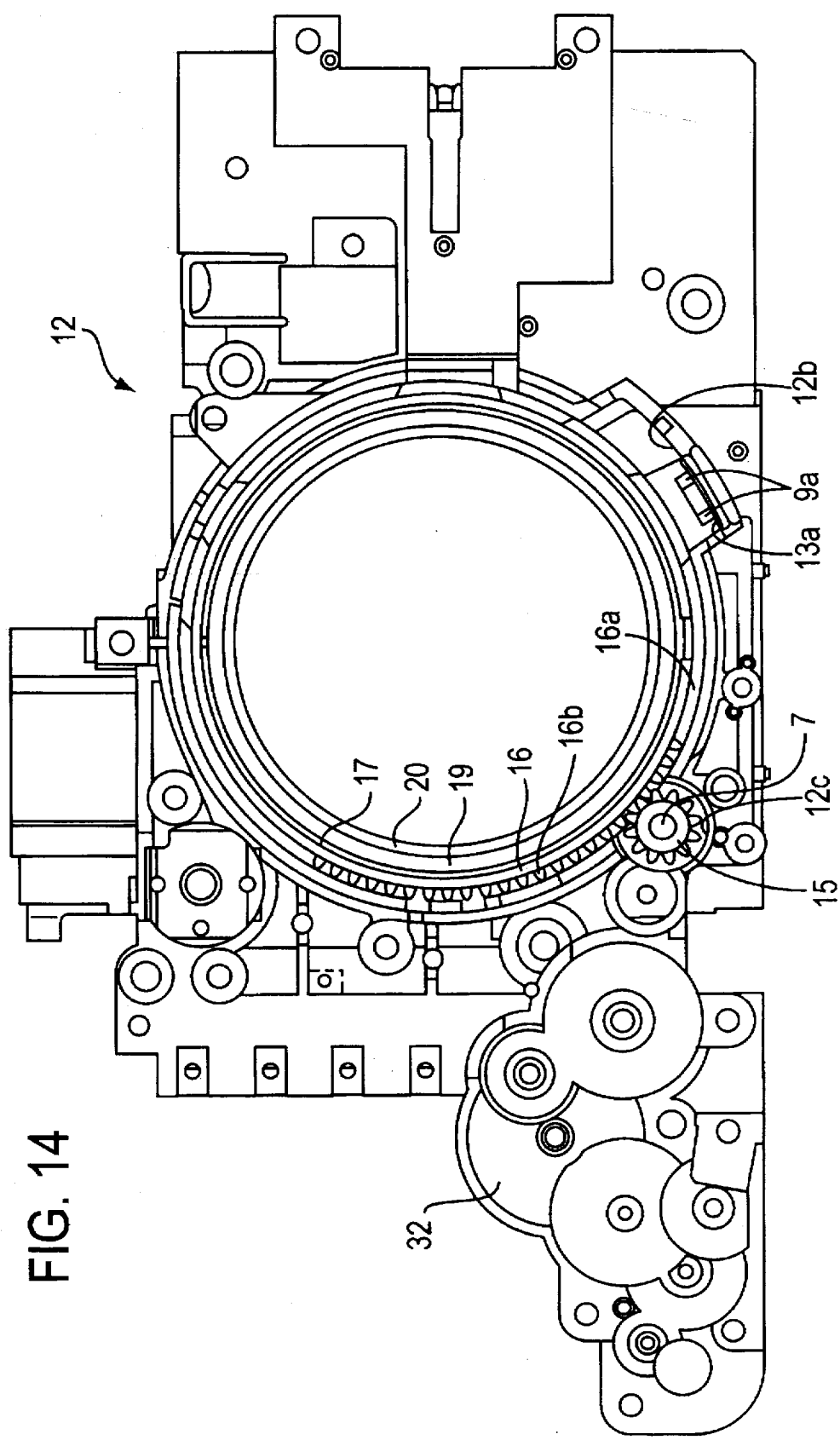
FIG. 14 is a front elevational view of a fixed lens barrel block of the zoom lens barrel.

In the fixed lens barrel block 12, a gear housing 12c, expanding in the radial direction, and extending in the optical axis direction, is provided as shown in FIG. 14. In the gear housing 12c, a driving pinion 15, extending in the optical axis direction, is rotatably held. The ends of a shaft 7 of the driving pinion 15 are rotatably supported, by a supporting hollow 4 provided in the fixed lens barrel block 12, and by a supporting hollow 31a provided on a gear supporting plate 31, respectively. The teeth of the driving pinion 15 project into the inner periphery of the fixed lens barrel block 12.

At the bottom part of one of the linear guide grooves 12b, namely 12b', the code plate 13a having a predetermined pattern is fixed, as shown in FIG. 14. The linear guide groove 12b' is provided so that it may be positioned at an approximate diagonal position of the photographing plane in regard to the fixed lens barrel block 12. The code plate 13a is provided along substantially the whole of the length of the fixed lens barrel block 12 (i.e., in the optical axis direction). The code plate 13a is part of a flexible printed circuit board 13 positioned outside the fixed lens barrel block 12. On the flexible printed circuit board 13, a photointerrupter 1 is secured, which in combination with a rotating plate 2 comprises an encoder for detecting a rotation of the whole unit driving motor 25. The rotating plate 2 is fixed on a shaft of the whole unit driving motor 25 as shown in FIG. 19.

Figure 13:
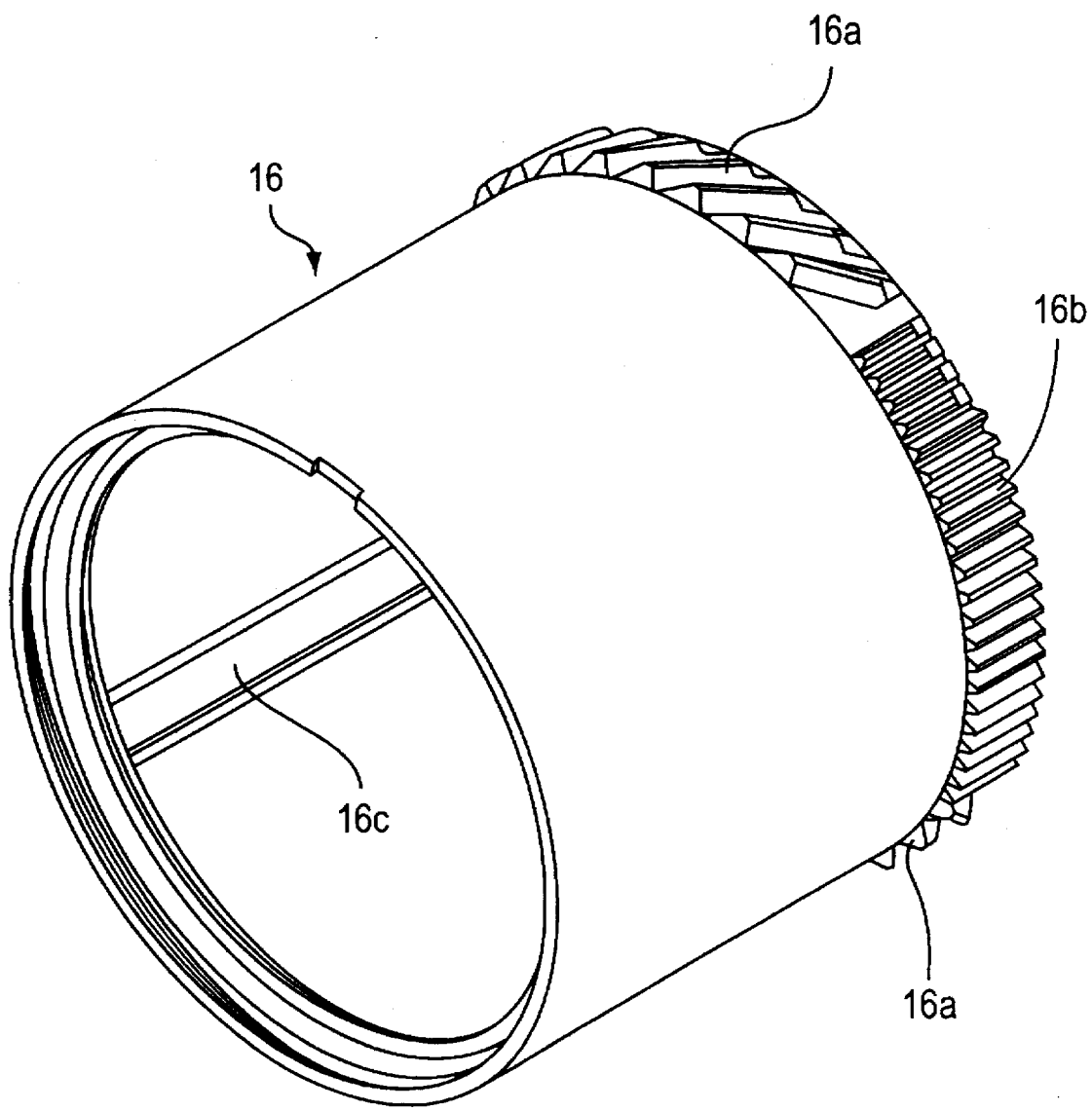
FIG. 13 is a schematic perspective view of an outline of a third moving barrel of the zoom lens barrel.

On an inner periphery of the third moving barrel 16, a plurality of linear guide grooves 16c, formed parallel to the optical axis, are provided. At an outer periphery of the rear end of the third moving barrel 16, a male helicoid 16a, which engages with the female helicoid 12a of the fixed lens barrel block 12, and an outer peripheral gear 16b, which engages with the driving pinion 15, are provided as shown in FIG. 13. The driving pinion 15 has an axial length sufficient to be capable of engaging with the outer peripheral gear 16b throughout the entire range of movement of the third moving barrel 16 in the optical axis direction.

The linear guide barrel 17 is provided, on a rear part of an outer periphery thereof, with a rear end flange 17d. The rear end flange 17d has a plurality of engaging projections 17c projecting away from the optical axis in the radial direction. An anti-dropping flange 17e is provided just in front of the rear end flange 17d. The anti-dropping flange 17e has a radius smaller than the rear end flange 17d. In the circumferential direction of the anti-dropping flange 17e, a plurality of notches 17f are formed. On an inner periphery of the rear end of the third moving barrel 16, a plurality of engaging projections 16d, projecting towards the optical axis in a radial direction are provided, as shown in FIG. 18. By inserting the engaging projections 16d into the notches 17f, the engaging projections 16d are positioned between the flanges 17d and 17e, and by the relative rotation of the linear guide barrel 17, the engaging projections 16d are engaged with the linear guide barrel 17. On the rear end surface of the linear guide barrel 17, an aperture plate 23 having an aperture 23a approximately the same shape as the aperture 14a, is fixed.

The relative rotation of the linear guide barrel 17, with respect to the fixed lens barrel block 12, is restricted by the slidable engagement of the plurality of engaging projections 17c with the corresponding linear guide grooves 12b, formed parallel to the optical axis O. One of the engaging projections 17c, namely 17c' (a linear guide key), is fixed to a contact terminal, i.e., a brush 9, which is in slidable contact with the code plate 13a, fixed to the bottom of the linear guide groove 12b', to generate signals corresponding to focal length information during zooming. The engaging projection 17c' is positioned approximately diagonal to the photographing plane.

The contacting terminal 9 is provided with a pair of brushes (electric armatures) 9a, which are approximately perpendicular to a fixing part 9b and in slidable contact with the code plate 13a, and a pair of positioning holes 9d (see FIG. 103). The pair of brushes 9a are electrically continuous with each other via the fixing part 9b.

Figure 30:
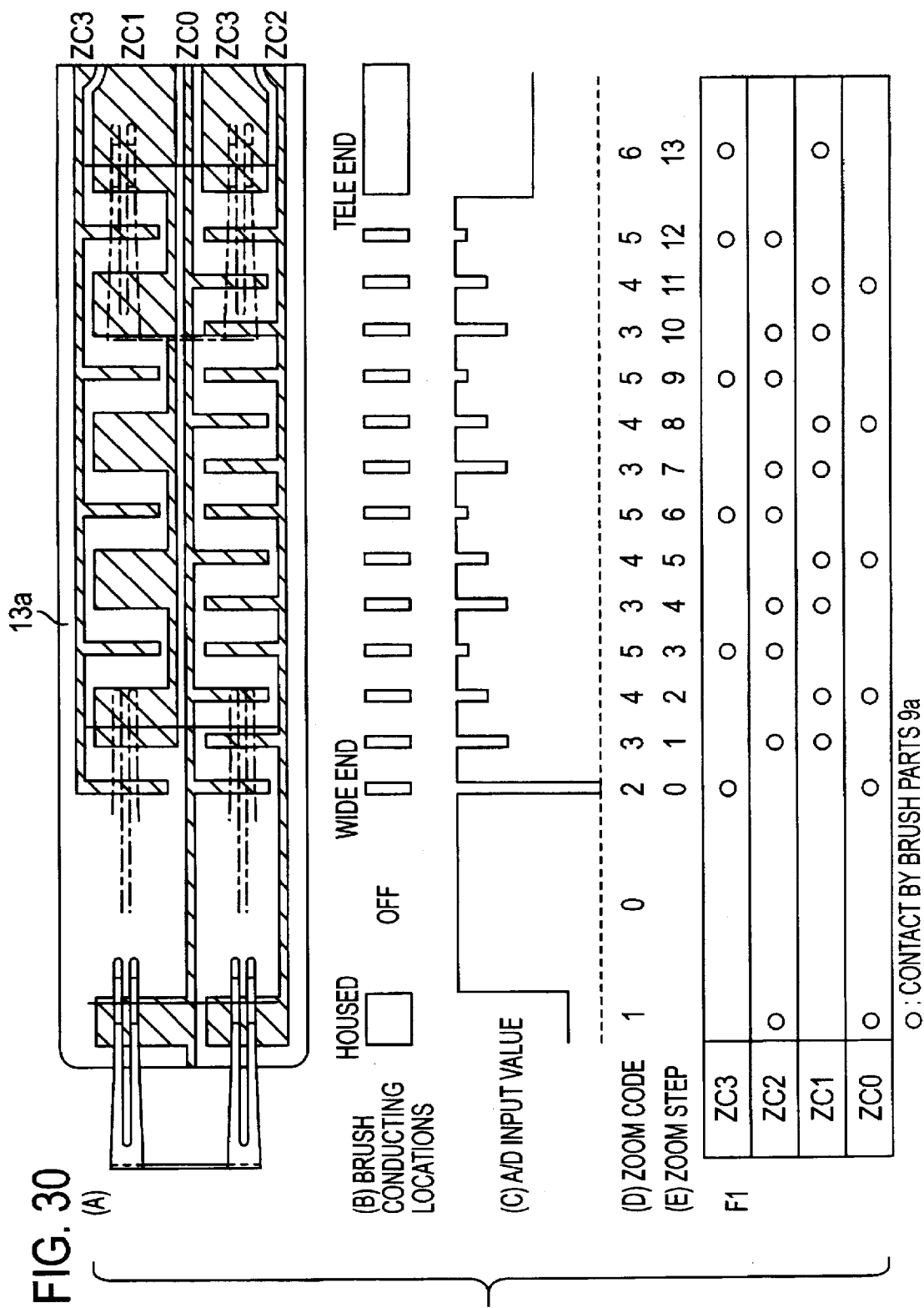
FIG. 30 is a schematic view of a structure of a zoom code plate and brushes, and a structure of detection of a position of a zoom code in contact with the brushes to detect a position of the lenses of the zoom lens camera.

As illustrated in FIG. 30, on the code plate 13a, four types of electrode patterns ZC0, ZC1, ZC2 and ZC3 are provided aligned in a direction perpendicular to the longitudinal direction of the code plate 13a. The electrode patterns ZC0, ZC1, ZC2 and ZC3 form a predetermined pattern in combination, so that a predetermined signal (i.e., voltage) may be output, when the pair of brushes 9a slide along the longitudinal direction of the code plate 13a, conducting through the electrode patterns ZC0, ZC1, ZC2 and ZC3 designated in advance corresponding to the slide position.

On the inner periphery of the linear guide barrel 17 a plurality of linear guide grooves 17a are formed parallel to the optical axis O. A plurality of lead grooves 17b are formed on the linear guide barrel 17 to extend through, and pass through, the peripheral wall of the linear guide barrel 17. The lead grooves 17b are formed oblique (inclined) to the optical axis.

The second moving barrel 19 engages with the inner periphery of the linear guide barrel 17. On the inner periphery of the second moving barrel 19, a plurality of lead grooves 19c are provided in a direction inclined oppositely to the lead grooves 17b. On the outer periphery of the rear end of the second moving barrel 19 a plurality of follower projections 19a, having a trapezoidal cross-sectional shape projecting away from the optical axis in a radial direction, are provided. Follower pins 18 are positioned in the follower projections 19a. Each follower pin 18 consists of a ring member 18a, and a center fixing screw 18b which supports the ring member 18a in the follower projection 19a. The follower projections 19a are in slidable engagement with the lead grooves 17b of the linear guide barrel 17, and the follower pins 18 are in slidable engagement with the linear guide grooves 16c of the third moving barrel 16. With such an arrangement, when the third moving barrel 16 rotates, the second moving barrel 19 moves linearly in the optical axis direction, while rotating.

Figure 8:
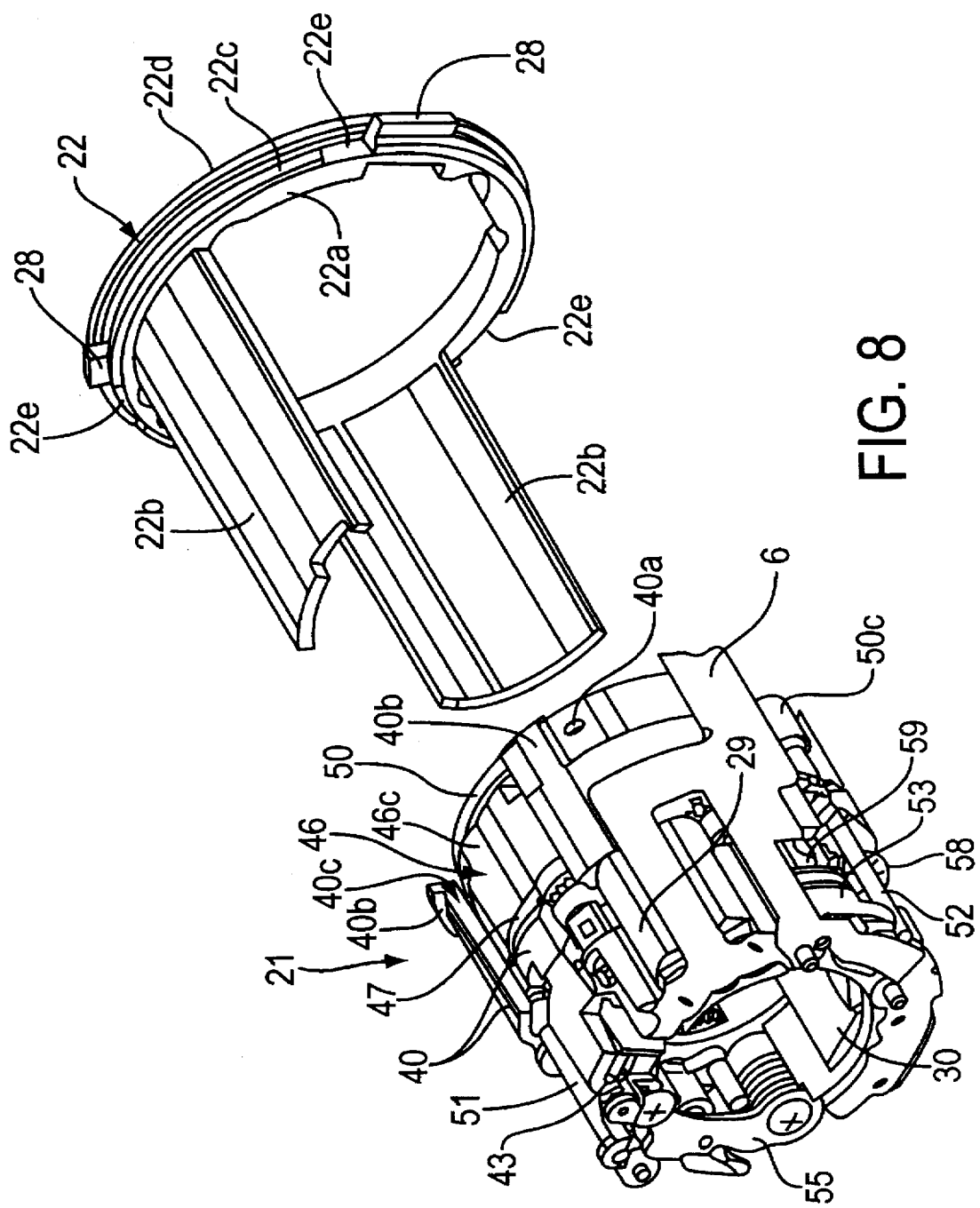
FIG. 8 is an enlarged schematic perspective view which shows part of a zoom lens barrel according to the present embodiment.
Figure 9:
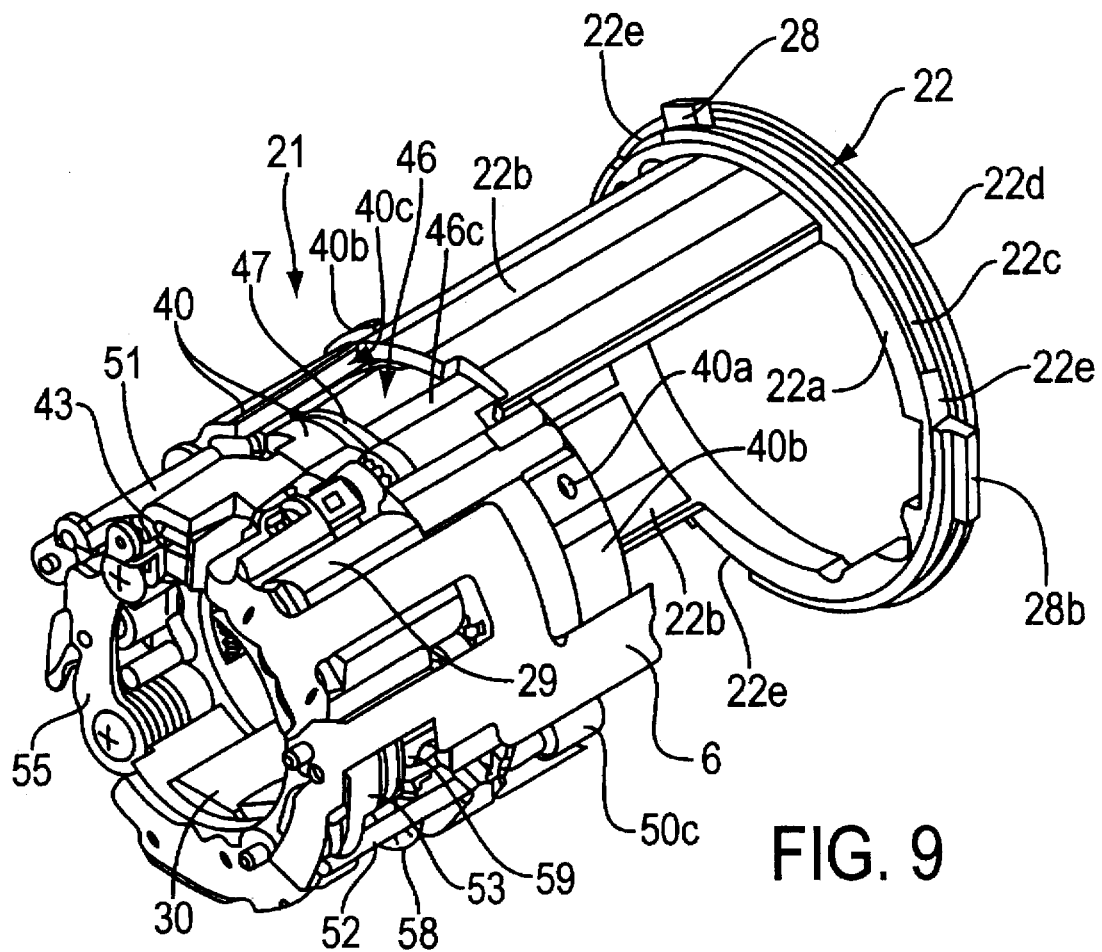
FIG. 9 is a schematic perspective view of the zoom lens barrel shown in FIG. 8, in a different condition.

On the inner periphery of the second moving barrel 19, the first moving barrel 20 is engaged. In the first moving barrel 20, a plurality of follower pins 24, provided on an outer periphery of the rear thereof, are engaged with the corresponding inner lead grooves 19c, and at the same time the first moving barrel 20 is guided linearly by a linear guide member 22. As shown in FIGS. 8 and 9, the linear guide member 22 is provided with an annular member 22a, a pair of guide legs 22b, which project from the annular member 22a in the optical axis direction, and a plurality of engaging projections 28 which project from the annular member 22a away from the optical axis in a radial direction. The engaging projections 28 slidably engage with the linear guide grooves 17a. The guide legs 22b are inserted between the inner peripheral face of the first moving barrel 20 and the AF/AE shutter unit 21.

The annular member 22a of the linear guide member 22 is connected to the rear of the second moving barrel 19, such that the linear guide member 22 and the second moving barrel are capable of moving along the optical axis direction as a whole, and in addition are capable of relative rotation around the optical axis. On the outer periphery of the rear of the linear guide member 22 a rear end flange 22d is provided having a plurality of engaging projections 28b which project away from the optical axis in the radial direction. In front of the rear end flange 22d there is provided an anti-dropping flange 22c, having a radius smaller than the rear end flange 22d. Along the circumferential direction of the anti-dropping flange 22c, a plurality of notches 22e are formed, as shown in FIG. 8. On the inner periphery of the rear of the second moving barrel 19, a plurality of engaging projections 19b, projecting towards the optical axis in a radial direction, are provided as shown in FIG. 18, and by inserting the engaging projections 19b into the notches 22e, the engaging projections 19b are positioned between the flanges 22c and 22d, and by relative rotation of the linear guide member 22, they are engaged with the linear guide member 22. With the above structure, when the second moving barrel 19 rotates clockwise or counterclockwise, the first moving barrel 20 moves linearly, forwardly and rearwardly in the optical axis direction, but is restricted from rotating.

Figure 10:
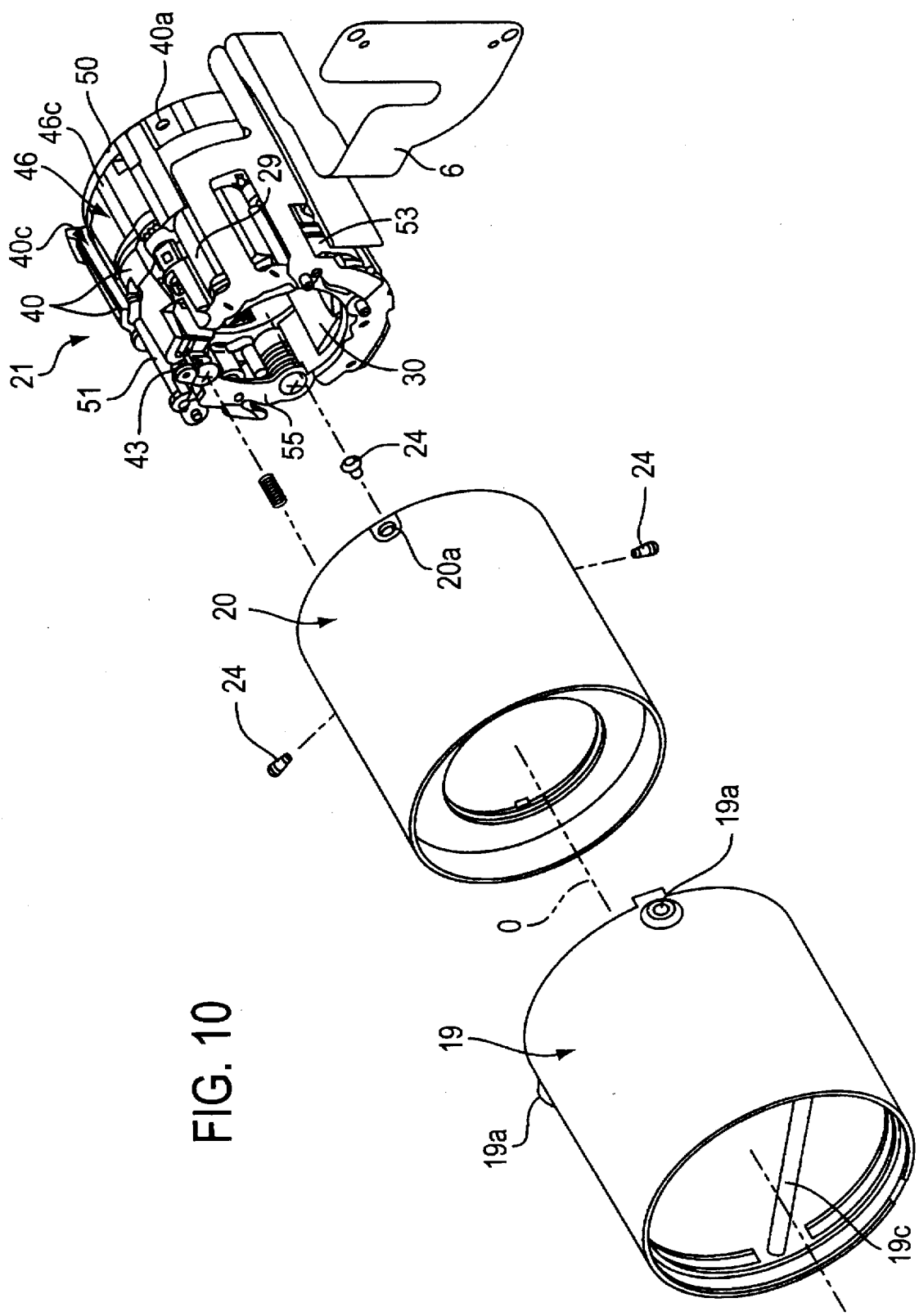
FIG. 10 is an enlarged exploded perspective view of a part of the zoom lens barrel.
Figure 11:
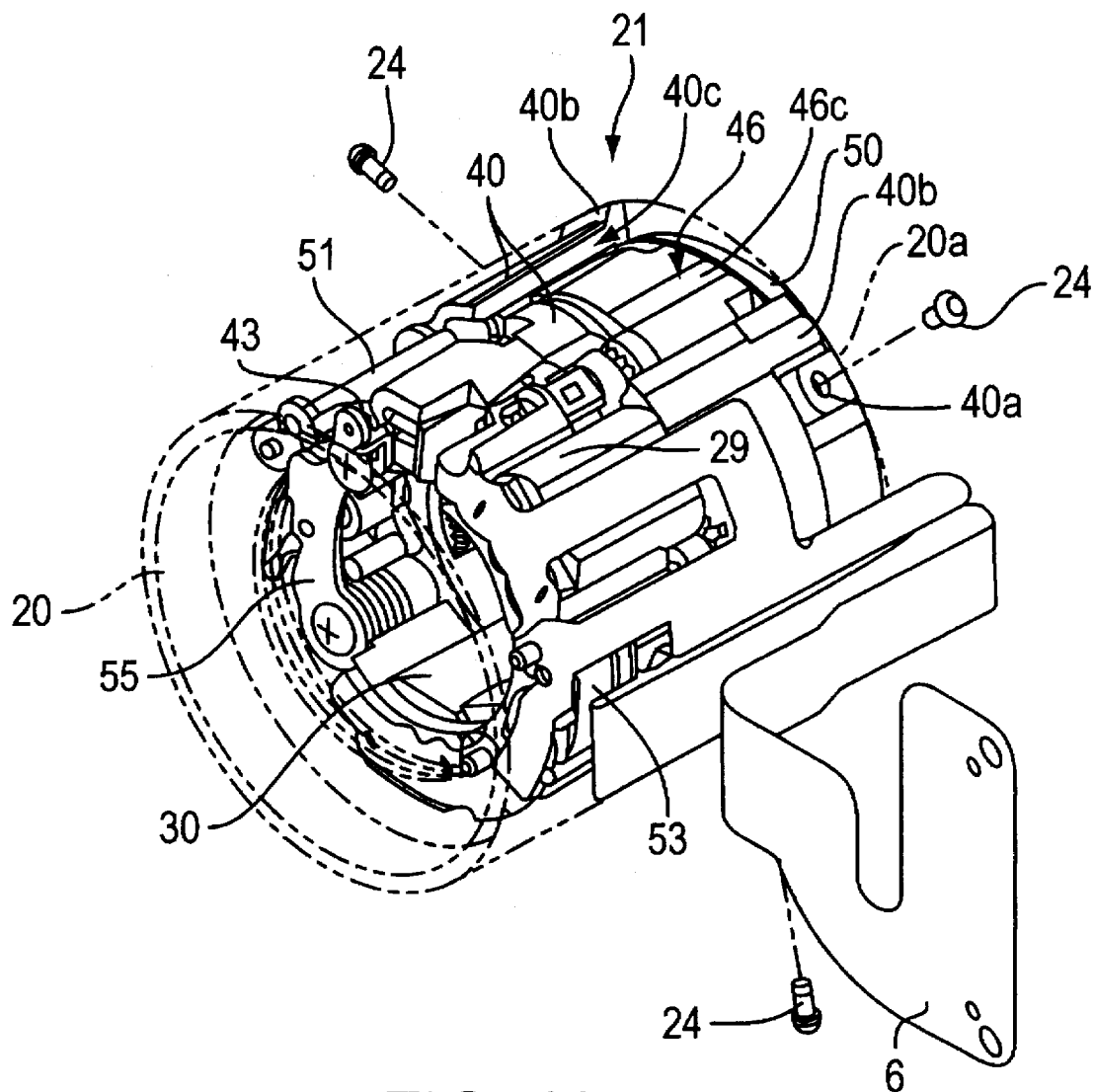
FIG. 11 is a schematic perspective view illustrating a state where an AF/AE shutter unit of the zoom lens barrel is mounted to a first moving barrel.
Figure 12:
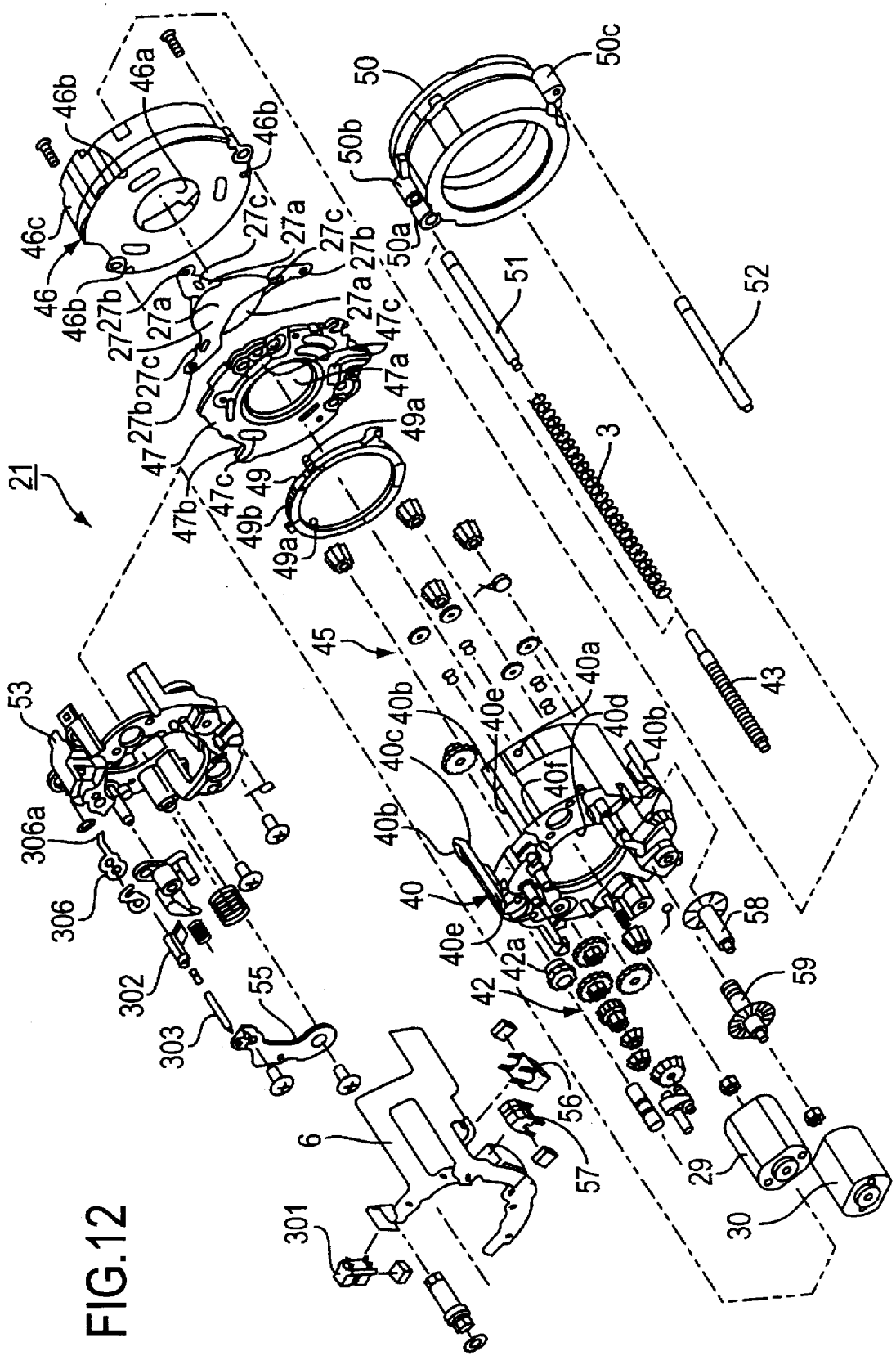
FIG. 12 is an exploded perspective view illustrating main parts of the AF/AE shutter unit of the zoom lens barrel.

At the front of the first moving barrel 20, a barrier apparatus 35 having barrier blades 48a and 48b is mounted, and on an inner peripheral face of the first moving barrel 20 the AF/AE shutter unit 21 having the shutter 27, consisting of three shutter blades 27a, is engaged and fixed as shown in FIG. 12. The AF/AE shutter unit 21 is provided with a plurality of fixing hollows 40a formed at even angular intervals on the outer periphery of the shutter mounting stage 40 as shown in FIG. 10. The plurality of follower pins 24 serve to fix the AF/AE shutter unit 21. The follower pins 24 are inserted and fixed in hollows 20a, formed on the first moving barrel 20, and in the fixing hollows 40a. With this arrangement the shutter unit 21 is secured to the first moving barrel 20 as shown in FIG. 11. The follower pins 24 may be fixed by an adhesive or by screws for example. For reference, numeral 41 is a decorative plate secured to the front of the first moving barrel 20.

Figure 19:
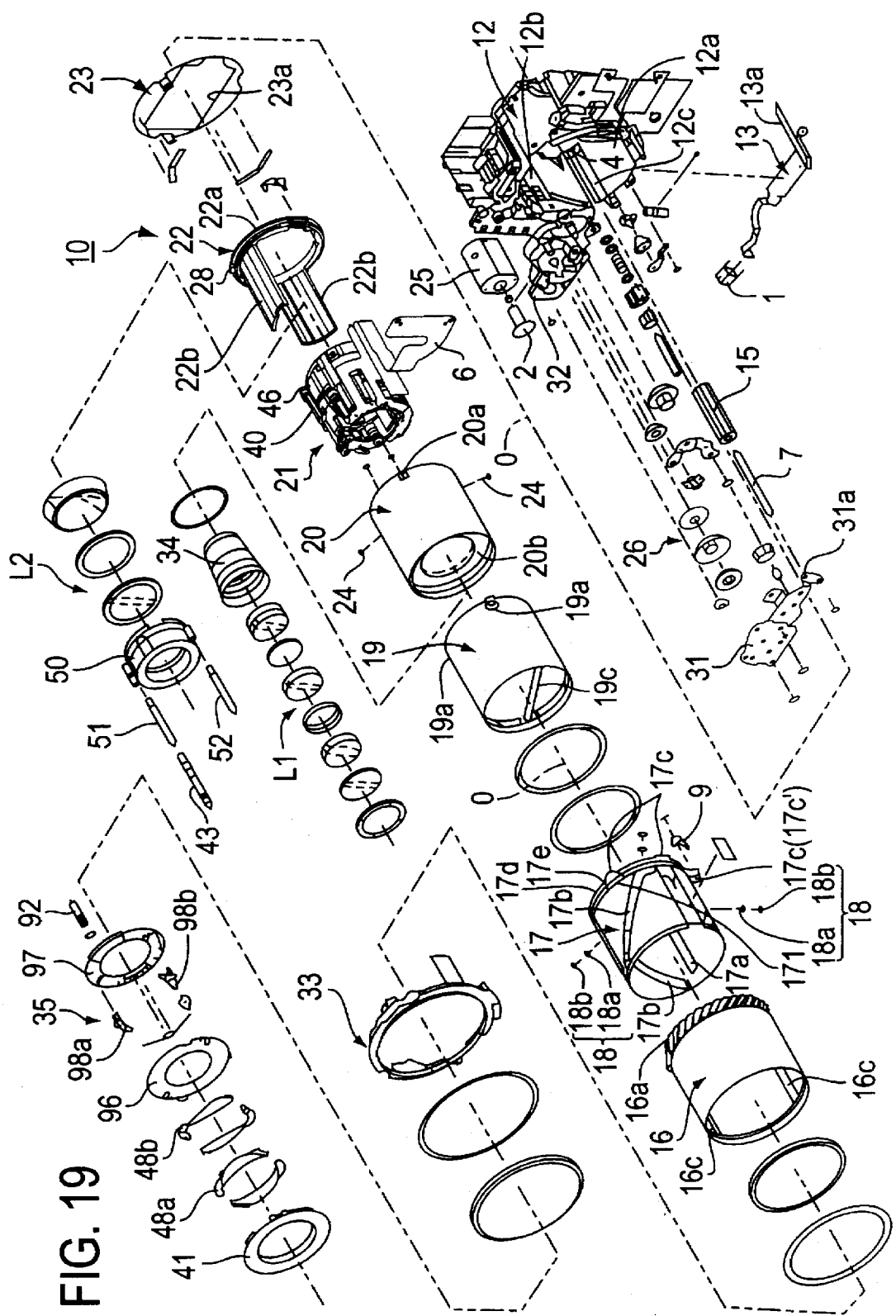
FIG. 19 is an exploded perspective view of the overall structure of the zoom lens barrel.

As illustrated in FIGS. 12 and 19, the AF/AE shutter unit 21 is provided with the shutter mounting stage 40, a shutter blade supporting ring 46 fixed on the rear of the shutter mounting stage 40, and the lens supporting barrel 50 (i.e., for the rear lens group L2) supported in a state of being capable of movement relative to the shutter mounting stage 40. On the shutter mounting stage 40, the front lens group L1, the AE motor 29, and the rear lens group driving motor 30, are supported. The shutter mounting stage 40 is provided, with an annular member 40f having a photographing aperture 40d. The shutter mounting stage 40 is also provided with three legs 40b which project rearwards from the annular member 40f. Three slits are defined between the three legs 40b, and two of the slits comprise linear guides 40c, which slidably engage with the respective pair of guide legs 22b of the linear guide member 22, so as to guide the movement of the linear guide member 22.

The shutter mounting stage 40 supports an AE gear train 45, which transmits rotation of the AE motor 29 to the shutter 27, a lens driving gear train 42, which transmits rotation of the rear lens group driving motor 30 to a screw shaft 43, photointerrupters 56 and 57, connected to the flexible printed circuit board 6, and rotating plates 58 and 59, having a plurality of radially formed slits provided in the circumferential direction. An encoder for detecting a rotation of the rear lens group driving motor 30 consists of the photointerrupter 56 and the rotating plate 58, and an encoder for detecting a rotation of the AE motor 29 consists of the photointerrupter 57 and the rotating plate 59.

The shutter 27, a supporting member 47 which pivotally supports the three shutter blades 27a of the shutter 27, and a circular driving member 49, which gives rotative power to the shutter blades 27a, are positioned between the shutter mounting stage 40 and a shutter blade supporting ring 46, secured to the shutter mounting stage 40. The circular driving member 49 is provided with three operating projections 49a at even angular intervals, which respectively engage with each of the three shutter blades 27a. As shown in FIG. 12, the shutter blade supporting ring 46 is provided, at a front end thereof, with a photographing aperture 46a and with three supporting hollows 46b positioned at even angular intervals around the photographing aperture 46a. On an outer periphery of the shutter blade supporting ring 46 there is provided a deflection restricting member 46c, which is exposed from the linear guides 40c and which slidable supports the inner peripheral faces of the pair of guide legs 22b.

The supporting member 47 positioned in front of the shutter blade supporting ring 46 is provided with a photographing aperture 47a, aligned with the photographing aperture 46a, and with three shafts 47b (only one of which is illustrated in FIG. 12) at respective positions opposite the three supporting hollows 46b. Each of the three shutter blades 27a are respectively provided with a shaft hole 27b into which one end of each respective shaft 47b is inserted, with a blocking part (not shown) which prevents unwanted light from entering the photographing apertures 46a and 47a at the other end, and with a slot 27c, through which the operating projection 49a is inserted, between the one end and the other end thereof. The supporting member 47 is fixed to the shutter blade supporting ring 46 in such a manner that, each shaft 47b which supports a corresponding shutter blade 27a, is engaged with a corresponding supporting hollow 46b of the shutter blade supporting ring 46.

On the outer periphery of the circular driving member 49, gears 49b are provided to receive the rotation from the gear train 45. The supporting member 47 is provided, at the position close to the three shafts 47b, with three arc grooves 47c, which are arched in the circumferential direction. The three operating projections 49a of the circular driving ring 49 engage with the slots 27c of the respective shutter blades 27a through the three arc grooves 47c. The shutter blade supporting ring 46 is inserted from the rear of the shutter mounting stage 40, to support the circular driving ring 49, the supporting member 47 and the shutter 27, and is fixed on the shutter mounting stage 40 by screws.

At the rear of the shutter blade supporting ring 46, the lens supporting barrel 50, supported to be able to move relative with respect to the shutter mounting stage 40 via slide shafts 50 and 51, is positioned. The shutter mounting stage 40 and the lens supporting barrel 50 are urged to move, by a coil spring 3 fitted to the slide shaft 51, in opposite directions away from each other, and therefore play between the two is reduced. In addition, a driving gear 42a provided at the gear train 42 is restricted to move in the axial direction, and on the inner periphery thereof, an internal thread (not shown) is formed. The screw shaft 43, one end of which is fixed to the lens supporting barrel 50, engages with the internal thread, and a feed screw structure is provided consisting of the driving gear 42a and the screw shaft 43. In such a manner, when the driving gear 42a rotates clockwise or counterclockwise due to driving by the rear lens group driving motor 30, the screw shaft 43 respectively moves forwardly or rearwardly with respect to the driving gear 42a and the lens supporting barrel 50, namely, the rear lens group L2 supported by the lens supporting barrel 50, moves relative to the front lens group L1.

At the front of the shutter mounting stage 40, pressers 53 and 55, which press against respective motors 29 and 30, are screwed to the shutter mounting stage 40. The motors 29, 30 and the photointerrupters 56, 57 are connected to the flexible printed circuit board 6. One end of the flexible printed circuit board 6 is fixed to the shutter mounting stage 40. When the first, second and third moving barrels 20, 19 and 16, and the AF/AE shutter unit 21 and the like are assembled, the aperture plate 23 is fixed to the rear of the linear guide barrel 17. At the front of the fixed lens barrel block 12, an anti-dropping member 33, having a circular shape, is engaged.

At the front of the first moving barrel 20 positioned at the front most part of the zoom lens barrel 10, the barrier apparatus 35, having pairs of barrier blades 48a and 48b, serving respectively as follower barrier blades and main barrier blades, are provided. Towards the rear of the decorative plate 41, an annular plate 96 is fixed, and between the decorative plate 41 and the annular plate 96, the barrier blades 48a and 48b are connectively engaged. In addition, at the front of the first moving barrel 20, between a front surface 20b and the annular plate 96, a barrier driving ring 96, having a pair of barrier driving levers 98a and 98b, is rotatably provided. The barrier driving ring 97, is rotated clockwise or counterclockwise, by a barrier interlocking gear 92 which drives rotatably upon receiving a rotation of the rear lens group driving motor 30, and via the barrier driving levers 98a and 98b opens or closes the main barrier blades 48b together with the follower barrier blades 48a.

While in the above description of the present embodiment, the zoom lens consisted of two groups, namely the front lens group L1 and the rear lens group L2, it should be understood that the structure is not limited to the present embodiment disclosed above. In addition, in the above embodiment, the front lens group L1, and the rear lens group L2, supported by the lens supporting barrel 50, are provided as components of the AF/AE shutter unit 21, and the rear lens group driving motor 30 is mounted to the shutter unit 21. With such a structure, although the supporting structure and the driving structure of the rear lens group L2 are simplified, the present zoom lens may also be realized in such a manner by making the rear lens group L2 a member apart from the AF/AE shutter unit 21, which is provided with the shutter mounting stage 40, the circular driving member 49, the supporting member 47, the shutter blades 27, the shutter blade supporting ring 46 and the like, and that the rear lens group L2 is supported by any supporting member other than the shutter unit 21.

In the zoom lens camera of the present embodiment, the operation by rotation of the whole unit driving motor 25 and the rear lens group driving motor 30 will now be described.

Figure 16:
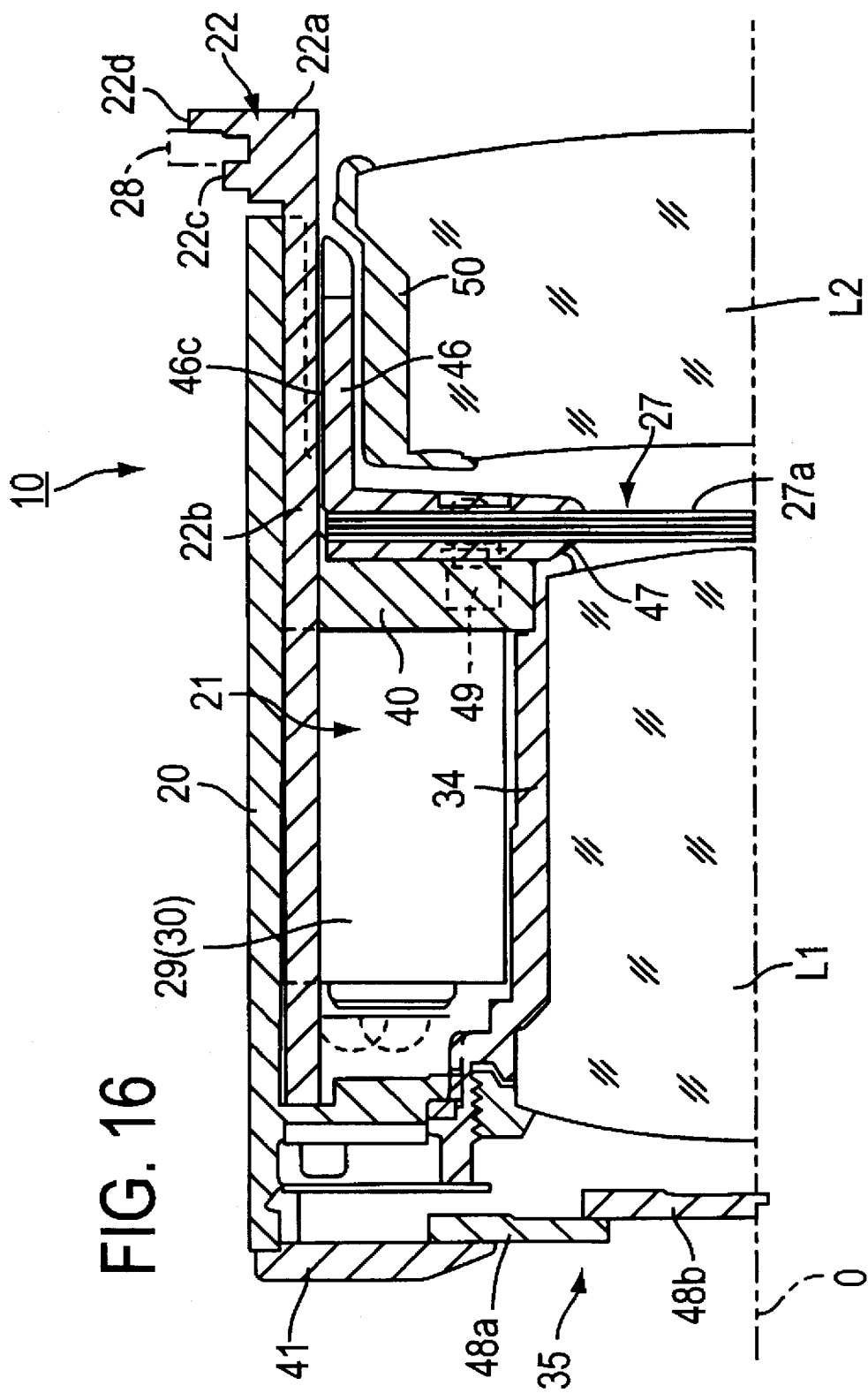
FIG. 16 is a sectional view of an upper part of the zoom lens barrel, when in a housed state, illustrating essential parts.
Figure 17:
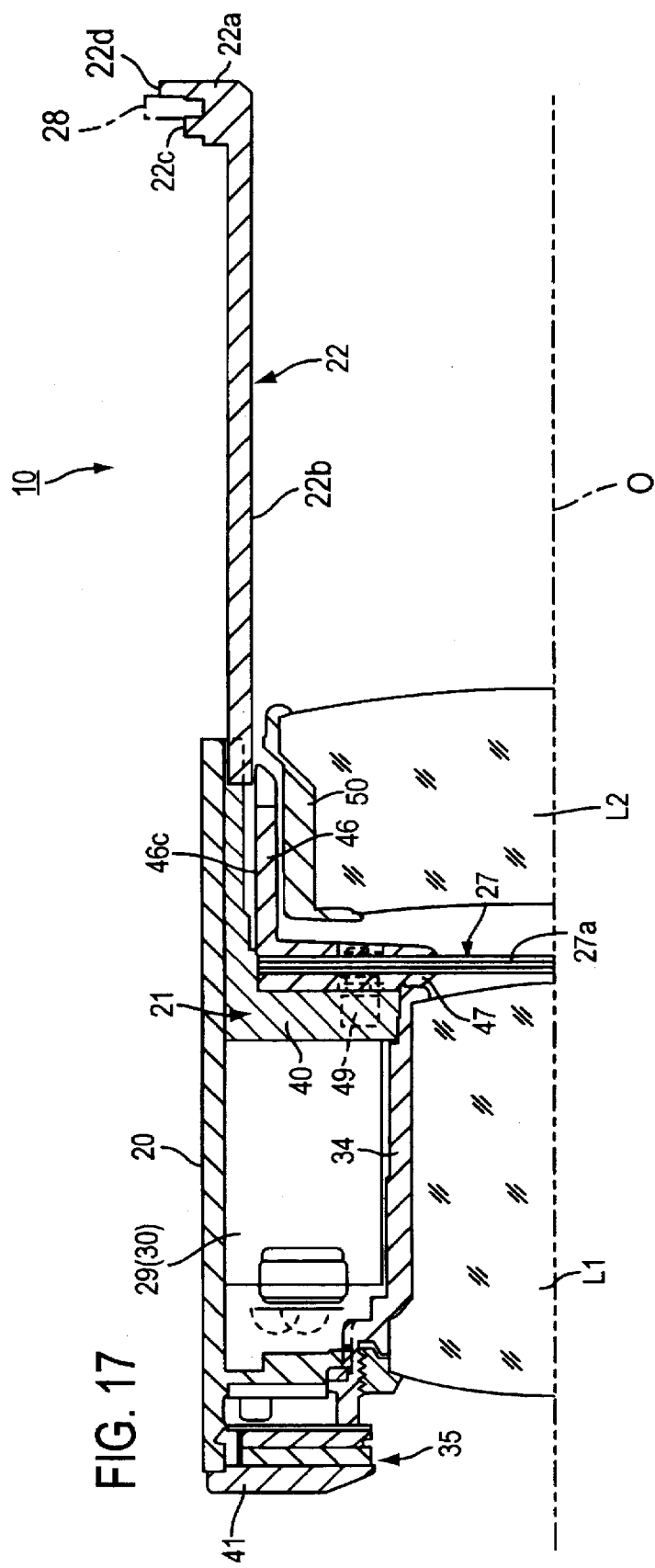
FIG. 17 is a sectional view of an upper part of the zoom lens barrel, illustrating essential parts in a maximum extended state.

As shown in FIG. 16, when the zoom lens barrel 10 is at the most retracted (withdrawn) position, i.e., the lens-housed condition, when the power switch is turned ON, the whole unit driving motor 25 rotates by a small amount in the forward (clockwise) direction. This rotation is transmitted, via a gear train 26, supported by a supporting member 32, to the driving pinion 15, and since the third moving barrel 16 is rotated in the optical axis direction (i.e., is extended), the second moving barrel 19 and the first moving barrel 20 are extended by a small amount in the optical axis direction, along with the third moving barrel 16, and therefore the camera is in a state capable of photographing, with the zoom lens positioned at the widest position, i.e., the wide end. At this time, due to the fact that the amount of movement of the linear guide barrel 17, with respect to the fixed lens barrel block 12, is detected through the relative slide between the code plate 13a and the contacting terminal 9, the focal length of the zoom lens, i.e., the front and rear lens group L1 and L2, is detected.

In the photographable state as above described, when the zoom "tele" switch is made ON, the whole unit driving motor 25 drives forward (clockwise), and rotates the third moving barrel 16 in the direction in which it is extended via the driving pinion 15 and the outer peripheral gear 16b. Therefore, the third moving barrel 16 is extended from the fixed lens barrel block 12, according to the relationship between the female helicoid 12a and the male helicoid 16a, and at the same time, the linear guide barrel 17, without relative rotation to the fixed lens barrel block 12, according to the relationship between the engaging projections 17c and the linear guide grooves 12b, moves forwardly in the optical axis direction together with the third moving barrel 16. At this time, the simultaneous engagement of the follower pins 18 with the lead groove 17b and the linear guide groove 16c causes the second moving barrel 19 to move forward relative to the third moving barrel 16 in the optical axis direction, while rotating relative to and in the same direction as the third moving barrel 16. The first moving barrel 20, because of the state of being guided linearly by the linear guide member 22 and also of the state that movement of the follower pins 24 are guided by the lead grooves 19c, moves forwardly in the optical axis direction together with the AF/AE shutter unit 21, from the second moving barrel 19, without relative rotation to the fixed lens barrel block 12. During such movements, according to the fact that the moving position of the linear guide barrel 17 with respect to the fixed lens barrel block 12 is detected through the relative slide between the code plate 13a and the contacting terminal 9, the focal length set by the zoom operating device 62, is detected.

When the zoom "wide" switch is made ON, the whole unit driving motor 25 drives in reverse (counterclockwise), and the third moving barrel 16 is rotated in the direction in which it is retracted and is retracted into the fixed lens barrel block 12 together with the linear guide barrel 17. At the same time, the second moving barrel 19 is retracted into the third moving barrel 16, while rotating in the same direction as that of the third moving barrel 16, and the first moving barrel 20 is retracted into the rotating second moving barrel 19 together with the AF/AE shutter unit 21. During the above retraction driving, like the case of extending driving as above described, the rear lens group driving motor 30 is not driven.

Figure 15:
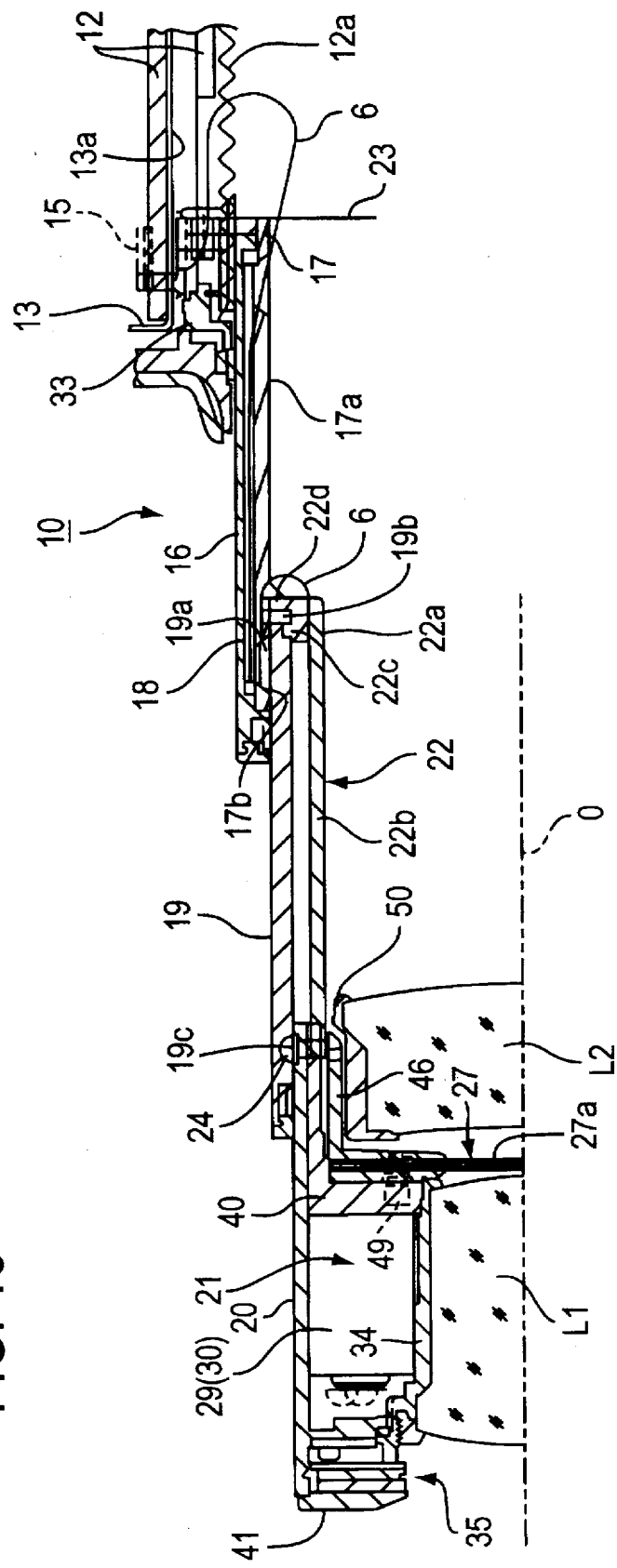
FIG. 15 is a sectional view of an upper part of the zoom lens barrel in a most extended state.

While the zoom lens 10 is driven during the zooming operation, since the rear lens group driving motor 30 is not driven, the front lens group L1 and the rear lens group L2 move as a whole, maintaining a constant distance between each other, as shown in FIG. 15. The focal length inputted via the zoom code plate 13a is indicated on the LCD panel 224.

At any focal length set by the zoom operating device 62, when the release button 217B is depressed by a half-step, the CPU 210 obtains focusing information from the object distance measuring apparatus 64 and photometering information from the photometering apparatus 65. In such a state, when the release button 217B is fully depressed, CPU 210 moves the whole unit driving motor 25 and the rear lens group driving motor 30 by an amount corresponding to the focal length information set in advance and by the subject distance information from the object distance measuring apparatus 64, to the specified focal length, and brings the subject into focus. Further, via the AE motor controlling circuit 66, the AE motor 29 drives the circular driving member 49 according to subject luminance information obtained from the photometering apparatus 65, and drives the shutter 27 in order to satisfy the required exposure. After such a shutter release, the whole unit driving motor 25 and the rear lens group driving motor 30 are both driven immediately, and the front lens group L1 and the rear lens group L2 are moved to the position prior to shutter release.

Figure 18:
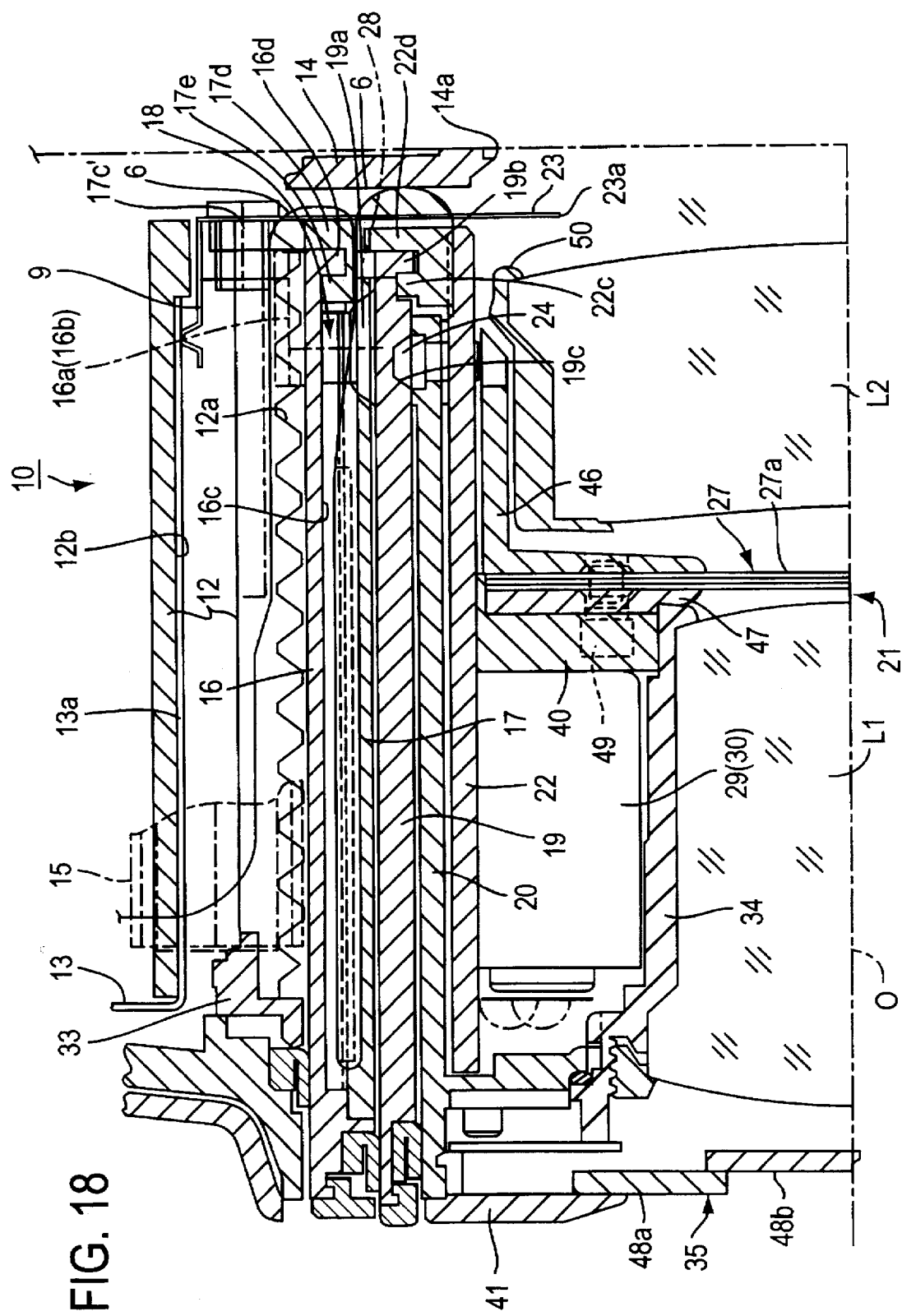
FIG. 18 is a sectional view of an upper part of the zoom lens barrel in a housed state.

When a power switch 212 is made OFF and the electric power is cut, the zoom lens 10 is retracted to the lens housed position as shown in FIG. 18 by the whole unit driving motor 25. Before such a withdrawal movement, the whole unit driving motor 25 is driven, and the rear lens group L2 moves to the home position.

In regard to the movement control of the front lens group L1 and the rear lens group L2 performed when the release button 217B is fully depressed, the rear lens group driving motor 30 moves the rear lens group L2 rearwardly away from the front lens group L1, by an amount corresponding to the subject distance information obtained from the object distance measuring apparatus 64 and the focal length information set by the zoom operating device 31. At the same time, the whole unit driving motor 25 moves the front lens group L1 by an amount corresponding to the subject distance information obtained from the object distance measuring apparatus 64 and the focal length information set by the zoom operating device 31. Due to the movement of the front lens group L1 and the rear lens group L2, the focal length is set and subject focusing is performed. After completion of the shutter release, the rear lens group driving motor 30 and the whole unit driving motor 25 are driven immediately, so that both lens groups L1 and L2 are returned to the position they were at prior to the shutter release.

When the zoom operating device 62 is operated to the "wide" position, the whole unit driving motor 25 drives in reverse (counterclockwise), and the third moving barrel 16 is rotated in the retraction direction, and is retracted into a cylinder 11 of the fixed lens barrel block 12, together with the linear guide barrel 17. At the same time, the second moving barrel 19 is retracted into the third moving barrel 16, with a rotation similar to that of the third moving barrel 16, and the first moving barrel 20 is retracted into the rotating second moving barrel 19 together with the AF/AE shutter unit 21. During the above retraction driving, likewise the case of extension driving as above mentioned, the rear lens group driving motor 30 is not driven. When the power switch is OFF, the zoom lens 10 is retracted to the housed position as shown in FIG. 18, by driving the whole unit driving motor 25 accordingly.

A detailed description in regard to lens drive control, which is one of the characteristics of the zoom lens barrel of the zoom lens camera of the present embodiment, will now be described with reference to FIGS. 24 and 25.

Figure 24:
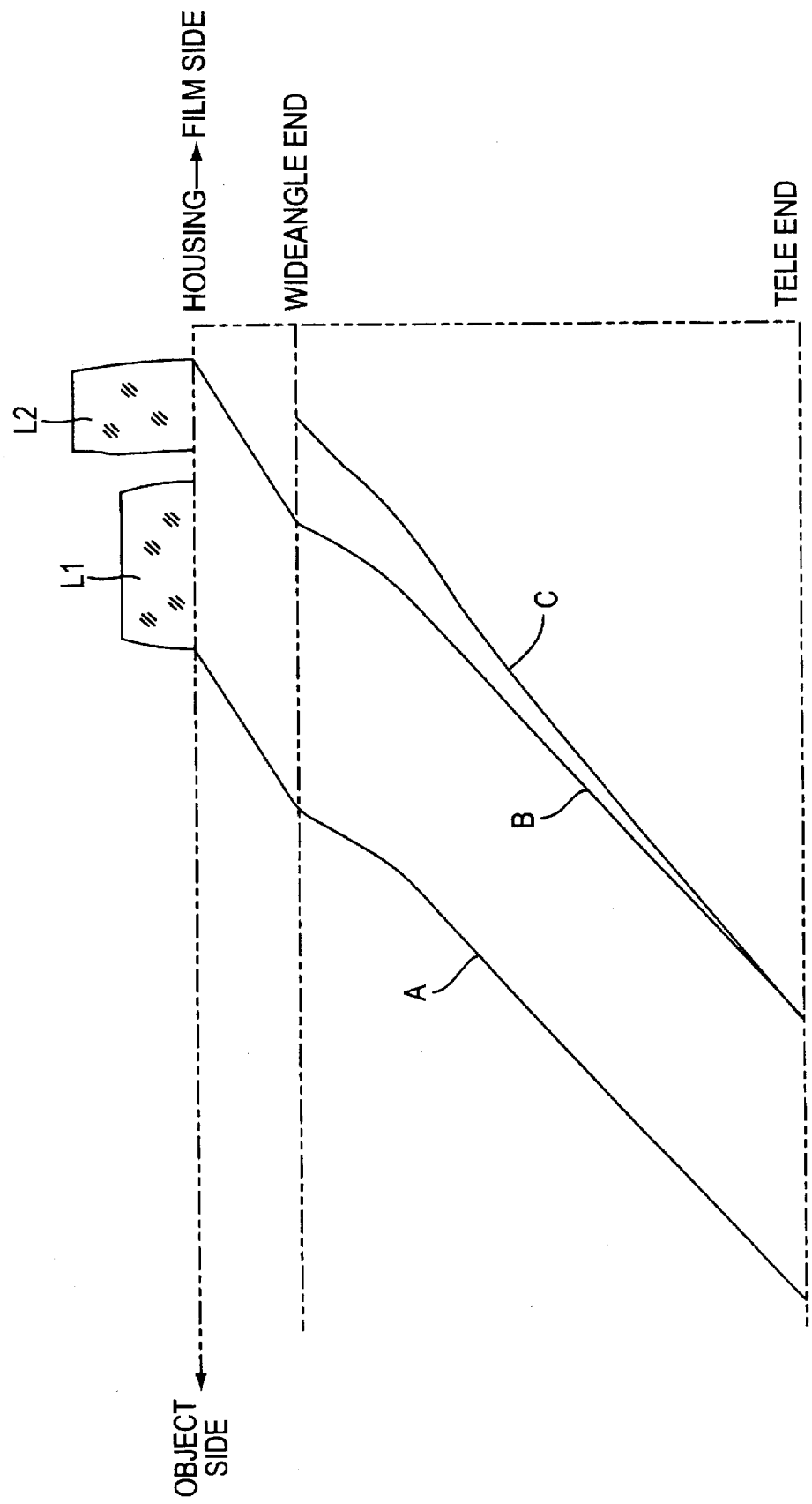
FIG. 24 is a schematic view illustrating loci of movements of the front lens group and the rear lens group.
Figure 25:
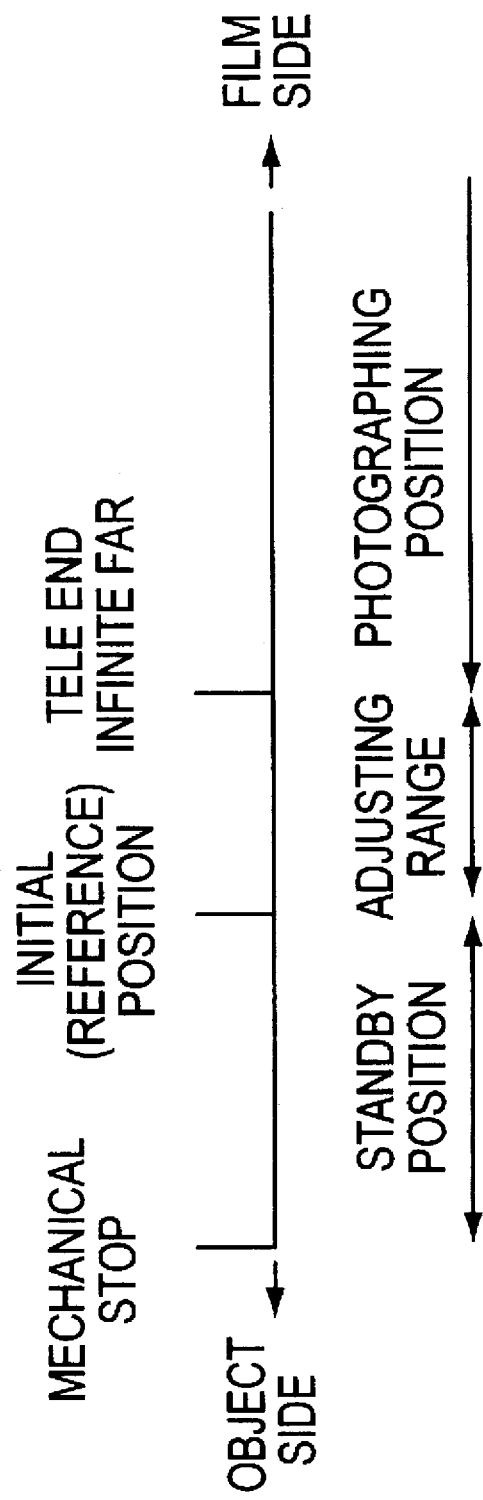
FIG. 25 is a schematic view illustrating movements of the rear lens group with respect to the front lens group.

FIG. 24 illustrates the loci of the movements of the front lens group L1 and the rear lens group L2, and FIG. 25 illustrates the range of movement of the rear lens group L2 compared to the front lens group L1.

In FIG. 24, line A represents the locus of the front lens group L1, line B represents the locus of the rear lens group L2 before the release button is fully depressed, and line C represents the locus of the rear lens group L2 when the release button is fully depressed. As can be understood from FIG. 24, during focusing, the distance between the front lens group L1 and the rear lens group L2 is wider at the "wide" end (i.e., "W" end) position, and is shorter at the "tele" end (i.e., "T" end) position.

Before and during an operation of the zoom operating device 62, the rear lens group L2 is positioned at the standby position as shown in FIG. 25, and the constant distance to the front lens group L1 is maintained. When the release button is fully depressed, the rear lens group L2 moves rearwardly, namely to the right in FIG. 25, and moves to the photographing position and focusing is performed. When the rear lens group L2 moves rearwardly, the initial position (i.e., the reference position) of the rear lens group L2 (i.e., the rear lens supporting barrel 50) is detected via a photo sensor (not shown), and from the initial moment of position detecting, pulse counting is commenced. When the pulse counting reaches a value corresponding to an amount of movement, corresponding to the subject distance information obtained from the object distance measuring apparatus 64 and the focal length information set by the zoom operating device 62, the rear lens group driving motor 30 is stopped.

In FIG. 25, the range indicated as "Adjusting Range", equals the range corresponding to the minimum value of the pulse counting from the initial position, when the zoom lens barrel 10 is positioned at the "tele" end and at the same time the focused subject is at infinity. Therefore, the rear lens group L2 is moved rearwardly with respect to the front lens group L1, by an amount, such as the adjusting quantity, from the initial position.

Figure 21:
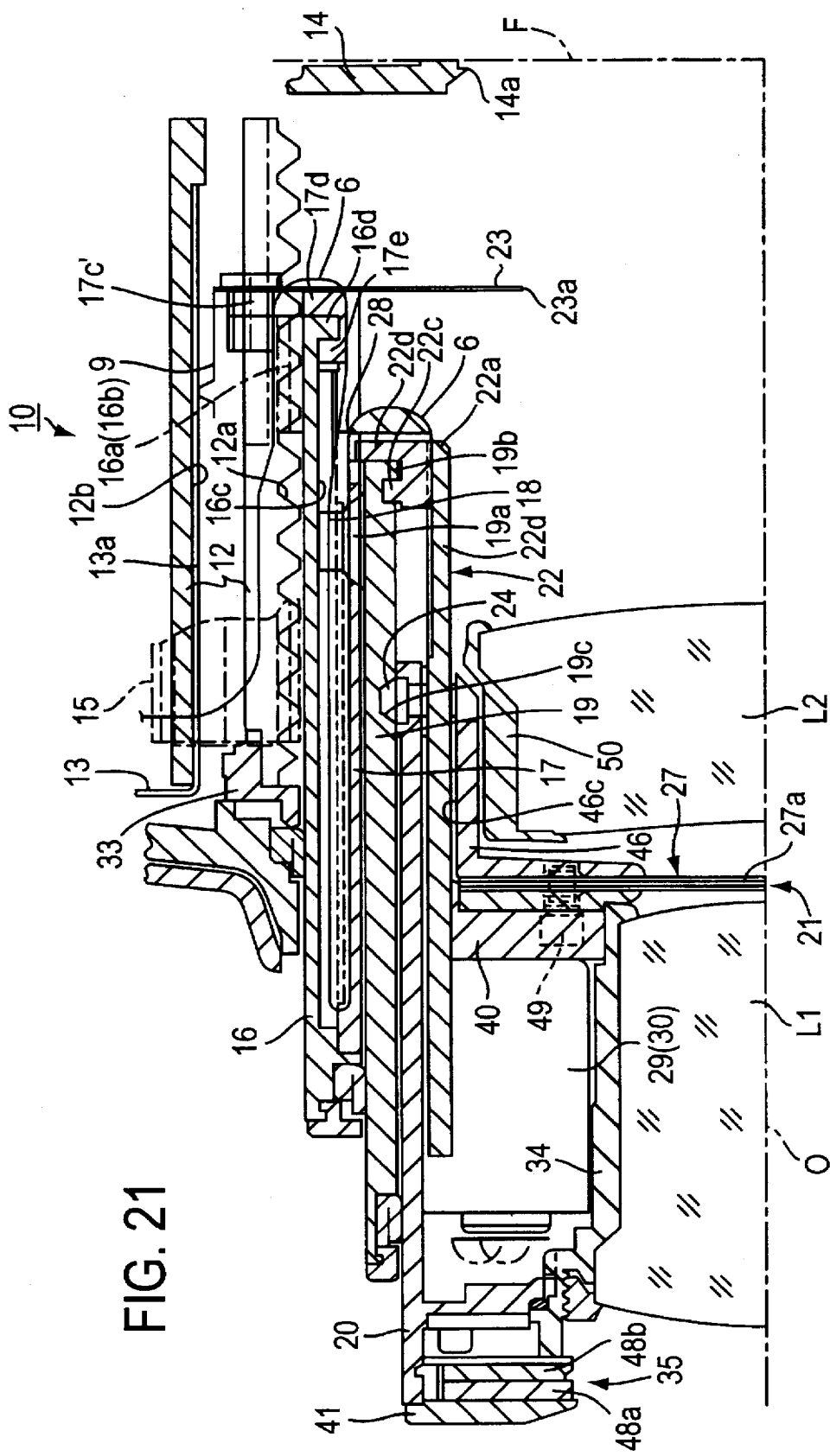
FIG. 21 is a sectional view illustrating a state when the zoom lens barrel is positioned close to a "wide" end, and further a state before a release button is released.
Figure 22:
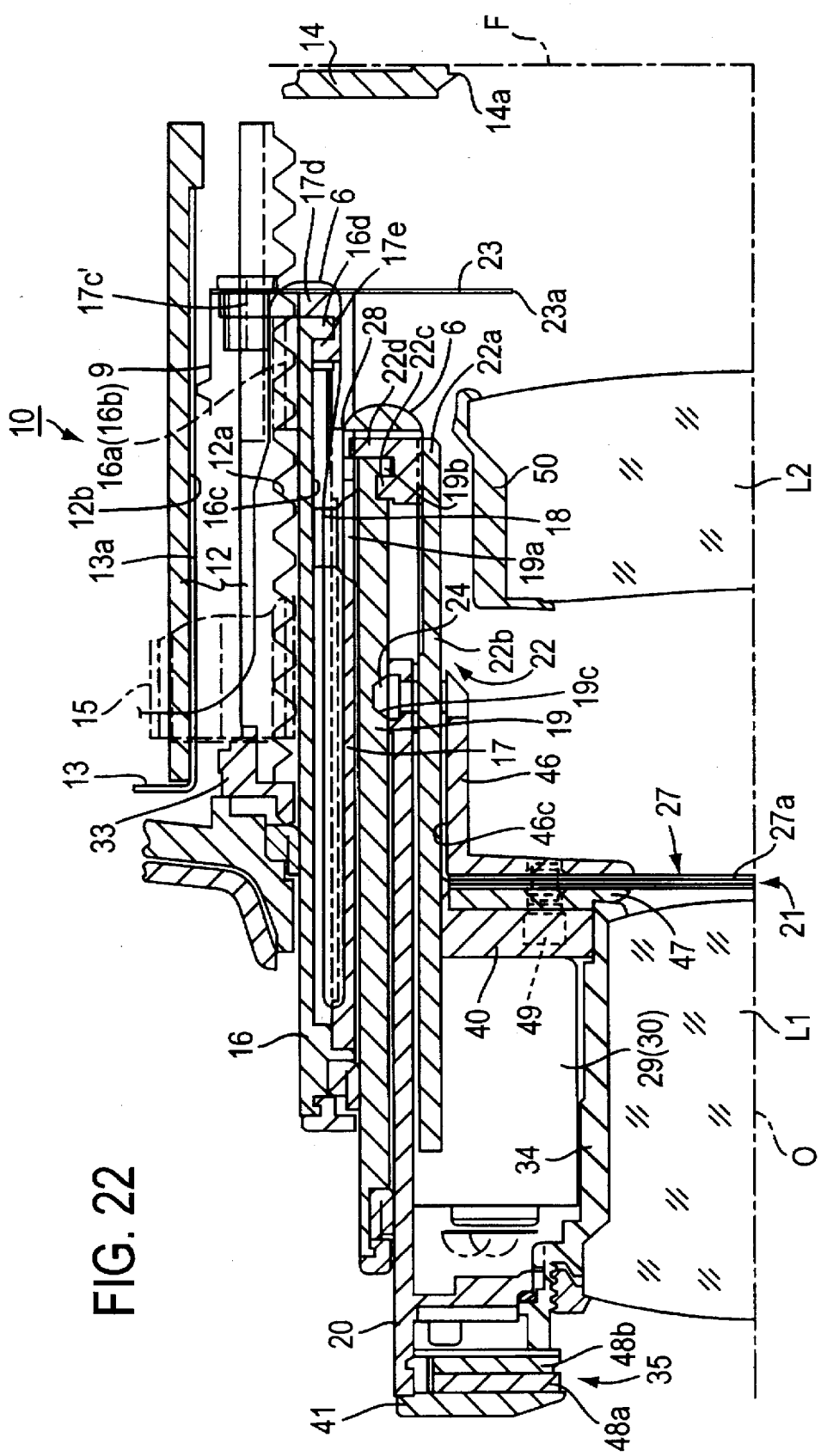
FIG. 22 is a sectional view illustrating a state when the zoom lens barrel is positioned close to a "wide" end, and further a state immediately after the release button is released.

FIG. 21 illustrates the state when the zoom lens barrel 10 is around the "wide" end position, before the release button has been fully depressed, while FIG. 22 illustrates the state when the zoom lens barrel 10 is around the "wide" end position, immediately after the release button has been fully depressed. As above described, from the state as shown in FIG. 22, after the shutter release is complete, the rear lens group driving motor 30 drives immediately and the rear lens group L2 moves towards the front lens group L1, and returns to the state as shown in FIG. 21.

Figure 23:
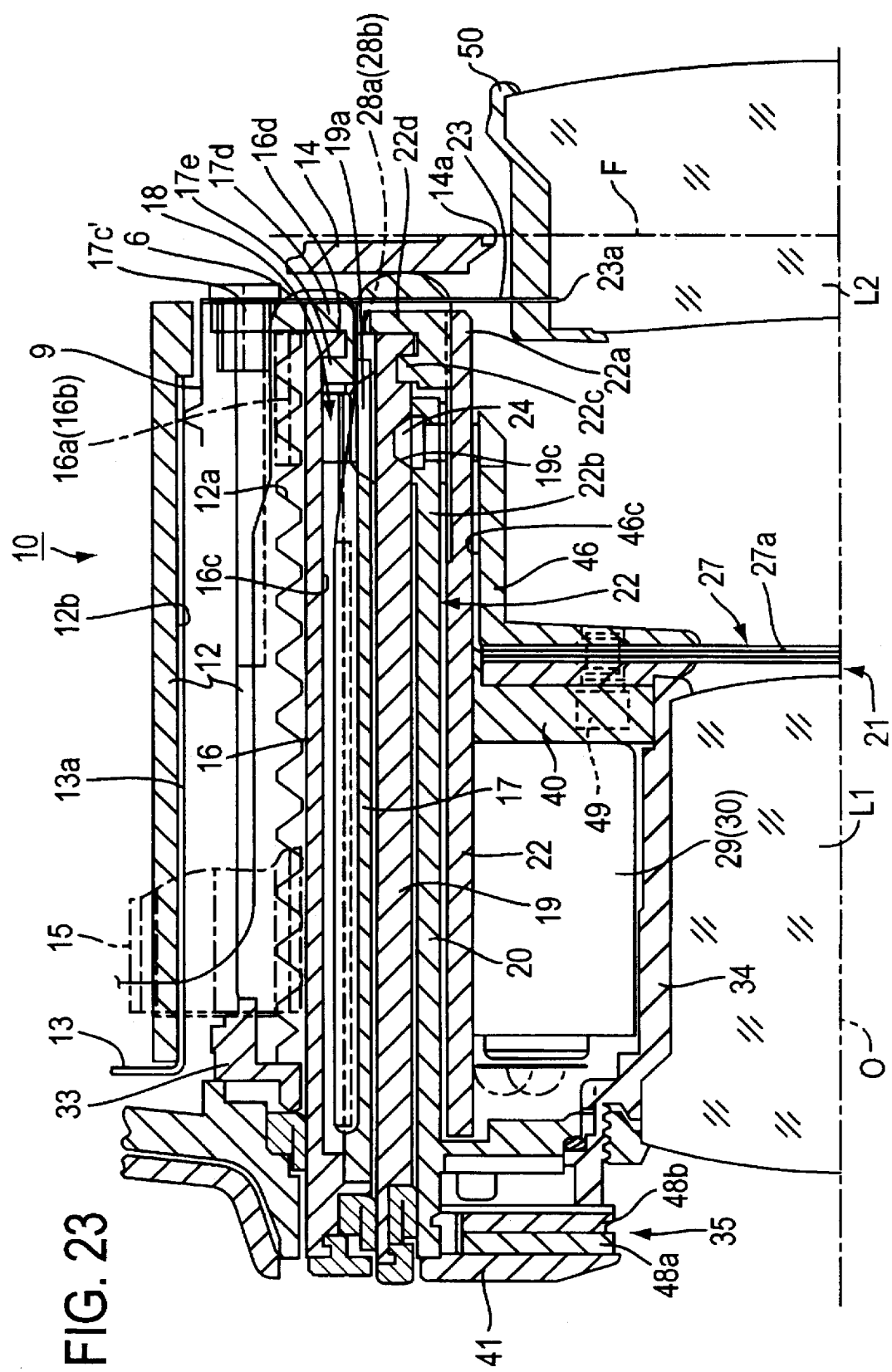
FIG. 23 is a sectional view illustrating a state when an external force in the direction of the camera body is made to the front of the first moving barrel, and a whole lens barrel unit is retracted into the camera body, and the a rear lens group collides with a film F.

After completion of the shutter release from the state as shown in FIG. 22, if the rear lens group driving motor 30 is not immediately driven, and therefore the rear lens group L2 remains in the photographing position as shown in FIG. 22, if a serious external force or impact is made towards the front of the first moving barrel 20, in a direction towards the main body of the camera, namely to the right in FIG. 22, all the moving barrels, namely, the first moving barrel 20, the second moving barrel 19 and the third moving barrel 16, will be forced to be withdrawn into the main body of the camera, and in such a case, the rear lens group L2 may collide with a film F. Therefore, there may be a possibility that not only the film F or the rear lens group L2, but also other apparatus or devices may be damaged. Such a state is illustrated in FIG. 23.

However, according to the lens drive control of the zoom lens barrel provided in the camera of the present embodiment, after completion of the shutter release from the state as shown in FIG. 22, the rear lens group driving motor 30 is immediately driven and the rear lens group L2 is moved towards the front lens group L1 and is returned to the position as shown in FIG. 21. Thus, the above problem is unlikely to occur.

The above embodiment refers to a three-stage delivery zoom lens barrel, however, it should be understood that the structure is not limited to such a lens barrel, and can be equally applied to a one-stage, two-stage or more than three-stage delivery zoom lens barrel.

As above described, in accordance with the lens driving method of the zoom lens and the zoom lens barrel in the present embodiment, during the zoom operation, the front lens group and the rear lens group move as a whole without varying the distance between the two lens groups, and during the release operation, the rear lens group moves rearwardly with respect to the front lens group, and after completion of release, the rear lens group moves towards the front lens group, so that both lens groups are returned to the initial position that they were at during the zoom operation. Therefore, in a state that the lens barrel is extended from the main body of the camera, if a serious external force or impact is made to the front of the lens barrel in a direction towards the main body of the camera, and the lens barrel is forced to be retracted accordingly, it is unlikely that the rear lens group might collide with the film, and therefore the film, the rear lens group or the lens driving apparatus will not be damaged.

Figure 27:
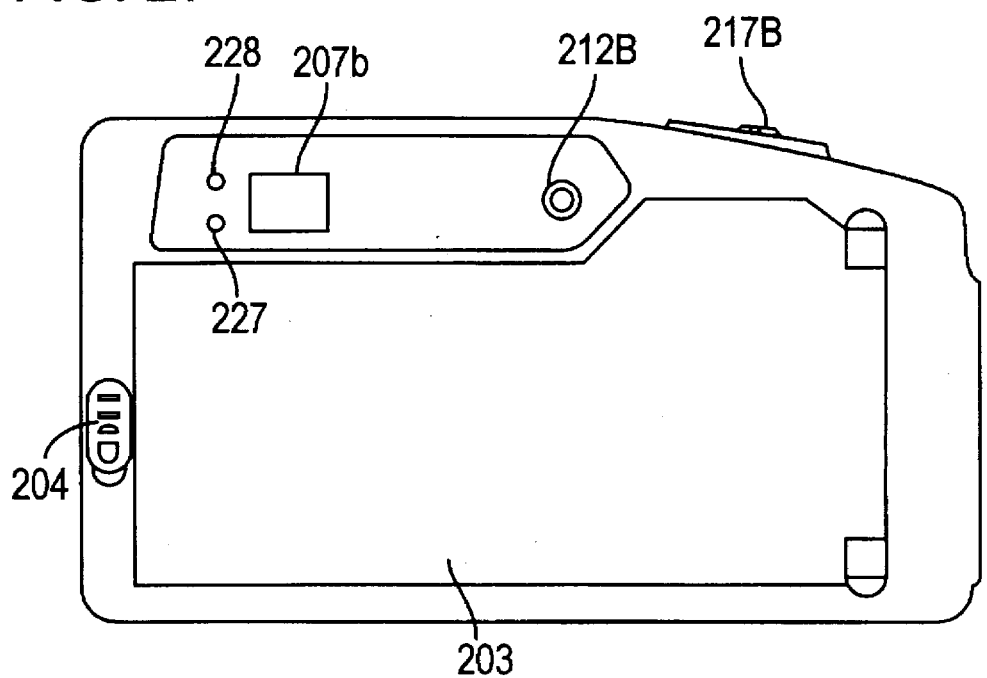
FIG. 27 is a rear elevational view of the zoom lens camera shown in FIG. 26.

FIGS. 26 through 28 respectively illustrate a front elevational view, a rear elevational view and a plan view of the lens shutter type camera of the present embodiment, provided with the zoom lens barrel as shown in FIGS. 1 through 25.

At approximately a center of the front of a camera body 201, the zoom lens barrel 12 is mounted. On the front surface of the camera body 201, a light receiving element 65a for photometering, an AF sensor window 64a, a finder window 207a of a finder optical system, a stroboscopic lamp 209, and a self-timer indicating lamp 229, are all provided. At the bottom of the camera body 201, a battery cover 202 is provided.

On the rear surface of the camera body 201, a rear cover 203, opening and closing for the purpose of loading or removing a film cartridge, a rear cover opening lever 204, used to unlock the locking device to open the rear cover 203, a green lamp 228, which indicates the result of focusing, a red lamp 227, which indicates the state of strobe charging, an eyepiece 207b, and a power (ON/OFF) button 212B, are provided.

On the top surface of the camera body 201, as viewed from the left of the drawing, a rewind button 216B, the LCD panel 224, a mode button 214B, a driving button 215B, the release button 217B, the "wide" button 62WB, and the "tele" button 62TB, are provided.

Figure 29:
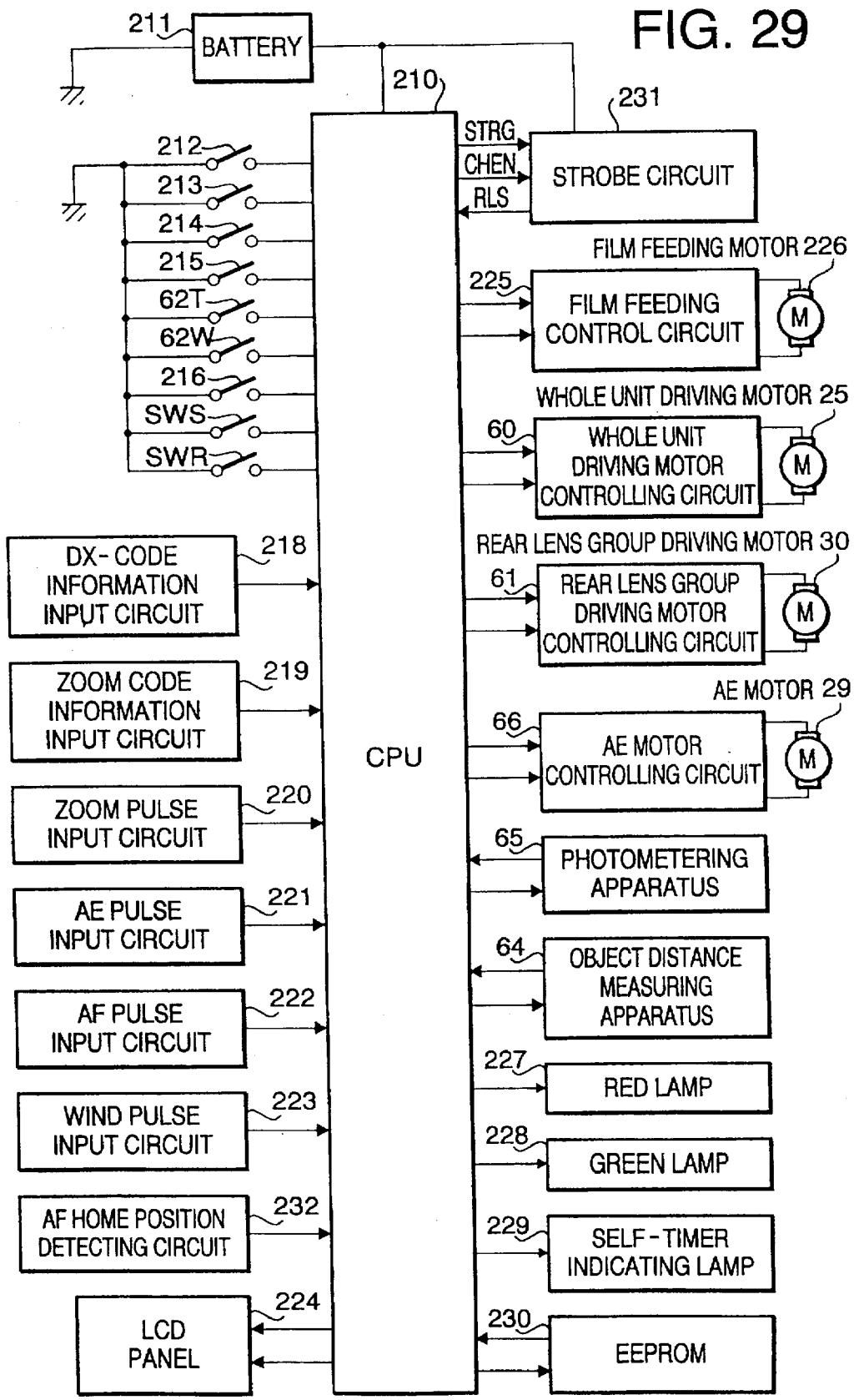
FIG. 29 is a block diagram of the main parts of a control system of the zoom lens camera of the present embodiment.

FIG. 29 illustrates a structure of the main internal components of the zoom lens camera of the present embodiment. The camera is provided with the CPU 210 that controls the overall functions of the camera.

The CPU 210 drives and controls the whole unit driving motor 25, via the whole unit driving motor controlling circuit 60, the rear lens group driving motor 30, via the rear lens group driving motor controlling circuit 61, and the AE motor 29, via the AE motor controlling circuit 66. The CPU 210 also controls, via a film feeding control circuit 225, a film feeding motor 226 which performs loading, winding and rewinding of film. The CPU 210 further controls flashing of a strobe (i.e., an electronic flash) via a strobe device 231.

The CPU 210 is capable of operation when a battery 211 is loaded, and executes the functions according to the i/o state (i.e., ON/OFF) of each switch, namely the state of the power switch 212, a rear cover switch 213, a mode switch 214, a driving switch 215, a "tele" switch 62T, a "wide" switch 62W, a rewind switch 216, the photometering switch SWS, and the release switch SWR.

The power switch 212 is connected to the power button 212B, and when the power switch 212 is "ON" when the electric power is "OFF" (i.e., the electric power of the battery 211 is cut), the power switch 212 turns the electric power "ON" (i.e., the electric power of the battery 211 is supplied), and when the power switch 212 is "OFF" when the electric power is "ON", the power switch 212 turns the electric power "OFF".

The rear cover switch 213 is connected to the opening or closing of the rear cover 203, and according to variations in the state of the rear cover 203, the rear cover switch 213 executes film loading processing by driving the film feeding motor 226, or makes a film counter reset.

The mode switch 214 is used to change photographing modes, and is connected to the mode button 214B. Every time the mode switch 214 is "ON", photographing modes are changed, such as an auto strobe flashing mode, a forced strobe flashing mode, a strobe flashing forbidding mode, a long exposure mode, or a bulb mode etc.

The driving switch 215 changes between various driving modes, and is connected to the driving button 215B. Every time the driving switch 215 is "ON", driving modes are changed, such as a frame photographing mode, a self-timer mode, a continuous photographing mode, or a multiple exposure mode etc.

The "tele" switch 62T is connected to the "tele" button 62TB. When the "tele" switch 62T is "ON", the whole unit driving motor 25 drives toward the "tele" end.

The "wide" switch 62W is connected to the "wide" button 62WB. When the "wide" switch 62W is "ON", the whole unit driving motor 25 drives toward the "wide" end.

The photometering switch SWS and the release switch SWR are connected to the release button 217B. When the release button 217B is half depressed, the photometering switch SWS is made "ON", and when the release button 217B is fully depressed, the release switch SWR is made "ON". During the time that the release button 217B is between being half depressed and being fully depressed, the photometering switch SWS is maintained in the "ON" state. When the photometering switch SWS is "ON", photometering and object distance measuring are executed. When the release switch SWR is "ON", and according to the result of the object distance measurement, the whole unit driving motor 25 and the rear lens group driving motor 30 are driven so that the front lens group L1 and the rear lens group L2 may be moved to a position at which the subject is brought into focus, and the AE motor 29 is driven and the exposure processing is executed according to the photometer value. After exposure is complete, the whole unit driving motor 25 and the rear lens group driving motor 30 drive, and the front lens group L1 and the rear lens group L2 return to the positions they were at before such a movement. The film feeding motor 226 is driven and the film is wound by one frame.

The CPU 210 inputs an output from a DX-code information input circuit 218, which reads information regarding the ISO speed of film, a zoom code information input circuit 219, which reads information regarding the present lens position from the code plate 13a, a zoom pulse input circuit 220, an AE pulse input circuit 221, an AF pulse input circuit 222, a wind pulse input circuit 223, which detects driving of the film and the amount of driving thereof, and an AF home position detecting circuit 232, are input.

A number of indicators, namely, the LCD panel 224, which indicates a current focal length, the number of frames photographed, the exposure mode or the like, the red lamp 227, which indicates the state of strobe charging, the green lamp 228, which indicates the result of focusing from the object distance measuring apparatus 64, and the self-timer indicating lamp 229, which indicates the operation of the self-timer, are connected to the CPU 210.

In an EEPROM 230, data inherent to the camera at the time of assembling, such as regarding AE adjustment thereof, or data set by a photographer, such as the exposure mode or the number of frames photographed, are stored.

Figures 31, 32:
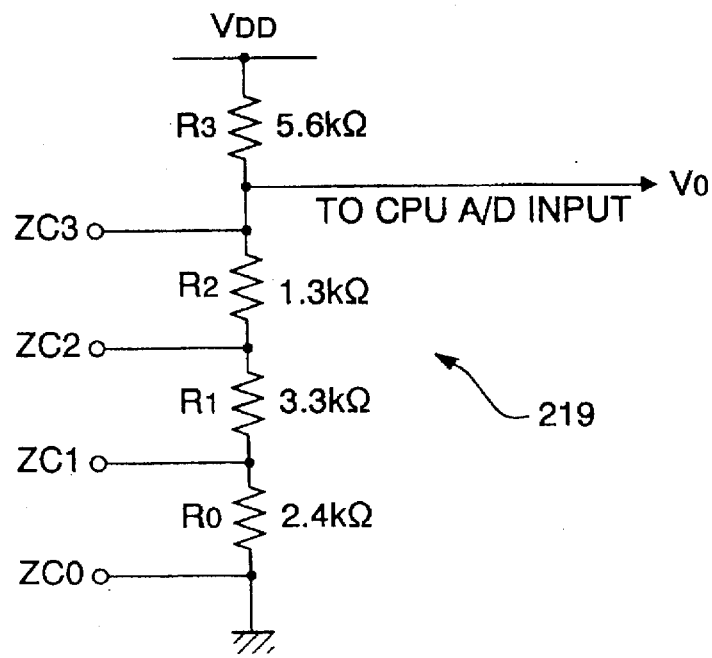
FIG. 31 is a schematic view illustrating an example of an electronic circuit to detect the zoom code, in contact with the brushes, as a voltage.
FIG. 32 is a table illustrating conversions of voltage, obtained through contact with the brushes, into a code.

As shown in FIG. 31, the zoom code information input circuit (electrical circuit) 219 is provided with four resistors (R0, R1, R2, R3) connected in series. The resistor R0 is grounded while a reference voltage $V_{DD}$ is applied to the resistor R3. Between the resistor R0 and ground the electrode pattern ZC0 is connected, and between resistors R0 and R1 the electrode pattern ZC1 is connected, between resistors R1 and R2 the electrode pattern ZC2 is connected, and between resistors R2 and R3 the electrode pattern ZC3 is connected. In addition, the output $V_O$ of the zoom code information input circuit 219 is connected between the resistors R2 and R3. The output $V_O$ is connected to an A/D conversion input port of the CPU 210.

As shown in FIG. 30(A), the code plate 13a is provided with four independent electrode patterns (zoom codes) ZC0, ZC1, ZC2 and ZC3 formed on an insulating substrate 13b. The electrode patterns, namely conducting plates, ZC0, ZC1, ZC2 and ZC3 are connected respectively between the resistors R0, R1, R2 and R3. The contacting terminal 9 is provided with a pair of brushes 9a conducting with each other via a conductive part 9b. The brushes 9a are formed to move in slidable contact along the code plate 13a, so that any two patterns among the electrode patterns ZC0, ZC1, ZC2 and ZC3 may conduct with each other. Therefore, if any two patterns among the electrode patterns ZC0, ZC1, ZC2 and ZC3 conduct with each other, according to the combination of conduction, the output voltage of the zoom code information input circuit 219 will vary, as shown in FIG. 30(C) and FIG. 30(E). The CPU 210 makes an A/D conversion and whereby the output voltage is converted into a digital value. The CPU 210 further converts the converted digital value into a corresponding zoom code. The CPU 210 then detects the position of the zoom lens according to the zoom code.

In the present embodiment, as shown in FIG. 30(D), the voltages corresponding to the contacting positions of the brushes 9a are converted into seven zoom codes, namely 0, 1, 2, 3, 4, 5 and 6. Each of the seven codes represents a position, i.e., the zoom code 1 represents the housed position, the zoom code 2 the "wide" position, the zoom code 6 the "tele" position, the zoom codes 3 through 5 represent the intermediate positions between the "wide" position and the "tele" position, and the zoom code 0 represents the position between the housed position and the "wide" position. At the intermediate positions, the zoom codes 3, 4 and 5 are repeated four times in that order, and the zoom range is divided and coded into fourteen zoom step codes. In the present embodiment, the zoom step 0 is assigned to the "wide" end position, and the zoom step 13 at the "tele" end position, and the zoom steps 1 through 12 are assigned to positions between the "wide" end and the "tele" end positions.

FIG. 31 shows the zoom code information input circuit 219 with exemplary values for the resistors R0, R1, R2 and R3. FIG. 32 is a table showing an example of the relationship among the short-circuiting of resistors R0, R1, R2, R3; the zoom code; the output $V_O$ of the zoom code information input circuit 219; and the threshold voltages.

The zoom pulse input circuit 220 is provided with an encoder consisting of the photointerrupter 1 and the rotating plate 2. The input of the photointerrupter 1, varied according to the passage of the slit of the rotating plate 2 which rotates in accompaniment to the rotation of the driving shaft of the whole unit driving motor 25, is output as a zoom pulse.

The AE pulse input circuit 221 is provided with an encoder consisting of the photointerrupter 57 and the rotating plate 59. The input of the photointerrupter 57, varied according to the passage of the slit of the rotating plate 59 which rotates in accompaniment to the rotation of the driving shaft of the AE motor 29, is output as an AE pulse. The rotating plate 59 having the slit is arranged so as to rotate by less than one full turn.

The AF pulse input circuit 222 is provided with an encoder consisting of the photointerrupter 56 and the rotating plate 58. The input of the photointerrupter 56, varied according to passage of the slit of the rotating plate 58 which rotates in accompaniment to the rotation of the driving shaft of the rear lens group driving motor 30, is output as an AF pulse.

The AF home position detecting circuit 232 detects whether the rear lens group L2 is positioned at the reference position, namely the position closest to the front lens group L1 (i.e., the AF home position). In the present embodiment, the position of the rear lens group L2 is controlled by the AF pulse number, with respect to the AF home position. The AF home position detecting circuit 232 is provided with a photointerrupter 301, and the position at which a chopper 302 (i.e., a chopper plate 302a), which moves integrally with the rear lens group L2, blocks the light path of the photointerrupter 301, is set as the AF home position, and according to the variation of output of the photointerrupter 301, the rear lens group L2 is detected to be at the AF home position.

Figure 33:
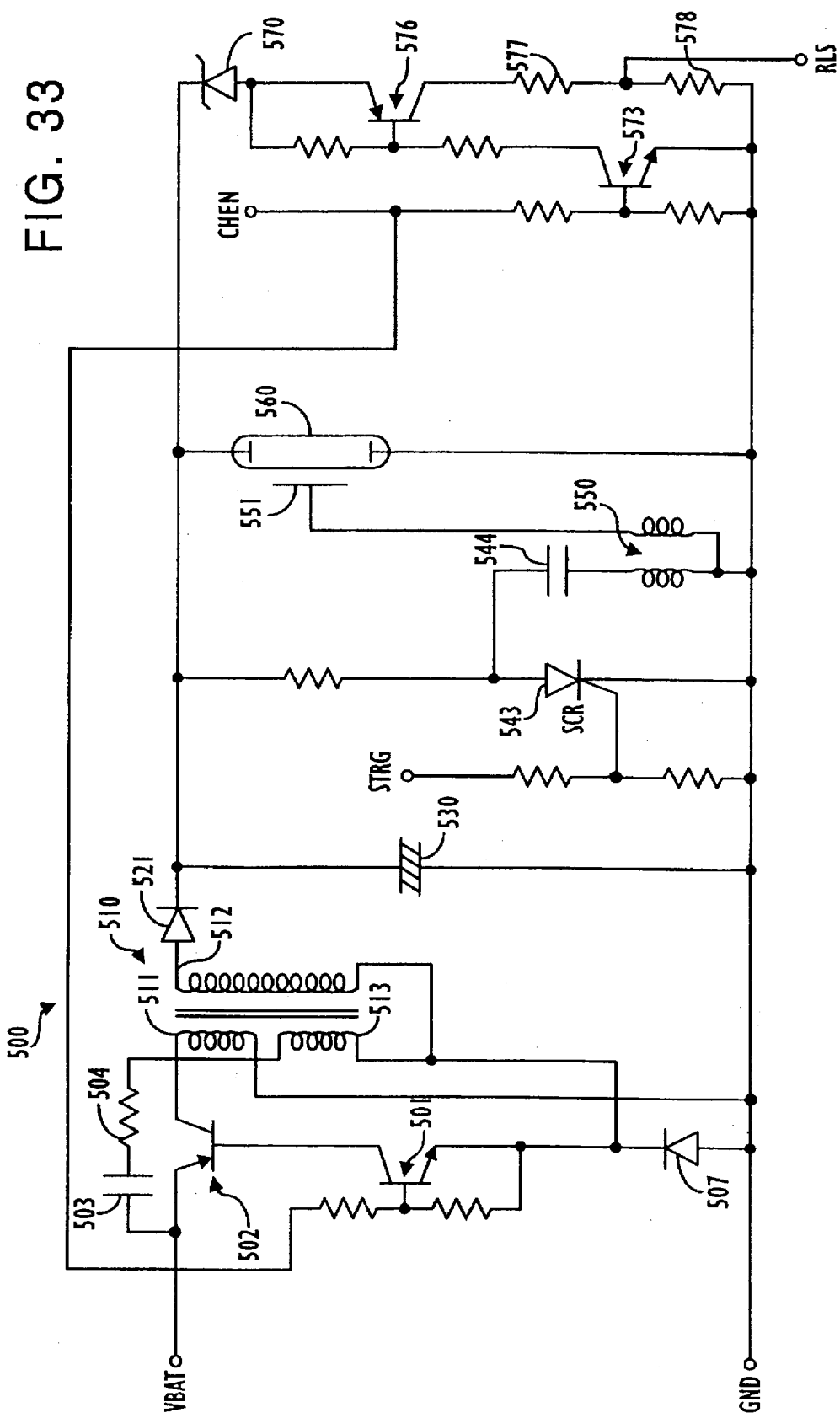
FIG. 33 is a schematic view illustrating an example of an electronic circuit of a strobe.

FIG. 33 illustrates an electrical circuit of the strobe device 231.

A strobe circuit 500 is provided with a ground terminal GND, a voltage input terminal VBAT, and three strobe controlling terminals STRG, CHEN and RLS.

The battery voltage of the camera is supplied to the terminals VBAT and GND. The controlling terminals STRG, CHEN and RLS are respectively connected to the CPU 210.

The terminal STRG is a strobe flashing signal (strobe trigger) input terminal, and in an normal state the terminal STRG is set to the level L (i.e., low), and on occasion of strobe flashing, a signal at the level H (i.e., high) is input. To the terminal CHEN the charging signal is input. At the state L, charging is not performed, while at the state H, charging is performed. The terminal RLS is a charging voltage output terminal and outputs the voltage corresponding to the charging voltage to the A/D converter of the CPU 210.

The battery charging and the monitoring of the charging voltage will now be described.

As above described, the charging is performed by making the level of the terminal CHEN H (i.e., the charging signal "ON"). When the terminal CHEN is at the level H, the level of the base of a transistor 501 becomes H and transistor 501 turns ON. When the transistor 501 is ON, a voltage transforming circuit (i.e., a DC-DC converter), consisting of a transistor 502, a primary winding 511 and a secondary winding 512 of a transformer 510, and a diode 521, is activated, and charging of a capacitor 530 is performed.

In addition, since the signal at the level H is supplied to the terminal CHEN when charging is performed, transistors 573 and 576 also turn ON, and a Zener diode 570 becomes connected to each terminal of the capacitor 530 via a transistor 576 and resistors 577 and 578.

In the present embodiment, the capacitor 530 is charged up to 300 volts, and the break down voltage of the Zener diode 570 is 230 volts. As the capacitor 530 is charged and the voltage applied to the Zener diode 570 becomes higher than the Zener voltage (i.e., the break down voltage) of the Zener diode 570, the Zener current flows.

As the Zener current flows, voltage corresponding to the charged voltage of the capacitor 530, but divided by the resistors 577 and 578 is applied to the terminal RLS.

As described above, when the terminal CHEN is at the level H in order to charge the capacitor 530, the Zener diode 570 and the resistors 577 and 578 are connected, in series, to each terminal of the capacitor 530. Until the charged voltage of the capacitor 530 exceeds the break down voltage of the Zener diode 570, current does not flow. As charging of the capacitor 530 is continued, and when the voltage applied to the Zener diode 570 reaches the break down voltage (i.e., 230 V), a difference between the charged voltage of the capacitor 530 and the break down voltage of the Zener diode 570 is divided by the resistors 577 and 578, and the divided voltage value, which corresponds to the voltage across the resistor 778 is applied to the terminal RLS.

As shown in FIG. 29, the voltage applied to the terminal RLS is input to the CPU 210. Specifically, the voltage applied to the terminal RLS is applied to an A/D converter built in the CPU 210, and then, based on the converted value, the CPU 210 is capable of detecting the charged voltage of the capacitor 530. For reference, a diode 507 is a protecting diode for preventing the transistor 501 from exceeding the withstanding voltage, and a circuit consisting of a capacitor 503, a resistor 504 and a coil 513 stabilizes the transforming operation of the voltage.

If the CPU 210 detects that the charged voltage of the capacitor 530 has reached the maximum charged voltage (i.e., 300 volts), the CPU 210 disables the charging operation by outputting the level L signal to the terminal CHEN. When the terminal CHEN is at the level L, the transistors 501 and 502 are OFF, and accordingly, charging of the capacitor 530 is not performed. In addition, when the terminal CHEN is at the level L (i.e., the charging signal "OFF"), the transistors 573 and 577 are also OFF, and in that condition, the resistors 577 and 578 are disconnected from the capacitor 530. Accordingly, the charging voltage of the capacitor 530 can not be detected from the terminal RLS. As described above, since charging and detection of the charged voltage of the capacitor 530 are simultaneously enabled/disabled by the signal applied to the terminal CHEN.

The strobe flashing operation will now be described.

When the charging voltage of the capacitor 530 is more than or equal to the level necessary for flashing, by inputting the strobe trigger to the terminal STRG, strobe flashing is performed.

When the strobe trigger is input to the terminal STRG, in other words, when the signal at the level H is input to the terminal STRG, an SCR (i.e., a thyristor) becomes in a conductive state. At that time, in accordance with the sudden discharge of a capacitor 544 connected to the primary winding 511 of a transformer 550, a high voltage is induced in the secondary winding 512 of the transformer 550. The high voltage in the secondary winding 512 is applied to a trigger electrode 551 of a xenon tube 560, and flashing of the xenon tube 560 is performed.

FIGS. 37 through 40 illustrate the structure to detect the AF home position as the initial position of the rear lens group L2. The AF home position is the initial position of the rear lens group L2, close to the front lens group L1. By making this position the reference position for focusing, the rear lens group L2 moves along the optical axis away from the front lens group L1. When the power is "ON", when the shutter release has completed, when the lens is housed, and at the zoom step positions other than the zoom steps 0 through 4, the rear lens group L2 is controlled to maintain the AF home position with respect to the front lens group L1, and at the zoom steps 0 through 4, the rear lens group L2 is moved to the rearward position from the AF home position by an amount corresponding to the specified pulse value AP1.

The rear lens supporting barrel 50 is supported, via the pair of slide shafts 51 and 52, so as to be capable of moving towards the shutter mounting stage 40 along the optical axis. One end of the slide shafts 51 and 52 are fixed on shaft supporting bosses 50b and 50c projecting from the outer periphery of the lens supporting barrel 50. The slide shaft 51 is inserted to be slidably supported by a slide bearing 51a fixed to the shutter mounting stage 40.

One end of the screw shaft 43 is fixed to a shaft supporting boss 50a projecting from the outer peripheral face of the lens supporting barrel 50, close to the shaft supporting boss 50b. The screw shaft 43 is engaged with the driving gear 42a, which is supported by the shutter mounting stage 40 and the shutter 27, such as to be rotatable, but not movable in the axial direction. When the driving gear 42a is driven by the rear lens group driving motor 30, the screw shaft 43 moves forwardly and rearwardly with respect to the driving gear 42a, and the lens supporting barrel 50, namely the rear lens group L2 supported by the lens supporting barrel 50, is moved relative to the front lens group L1. In order to prevent backlash between the screw shaft 43 and the driving gear 42a, the rear lens group urging coil spring 3 is tilted to the slide shaft 51 and is engaged with the slide bearing 51a and the shaft supporting boss 50b. The rear lens group urging coil spring 3 forces the lens supporting barrel 50 in the direction away from the shutter mounting stage 40, in other words, towards the rear of the shutter mounting stage 40. Thus backlash is prevented.

At the front of the shutter mounting stage 40, namely the presser 55, the photointerrupter 301 and the chopper 3302 which comprise the AF home position detecting circuit 232, are mounted. The photointerrupter 301 is mounted to the flexible printed circuit board 6, and is fixed on the shutter mounting stage 40. The chopper 302 is slidably supported by a chopper guide shaft 303 and has its front end supported by the presser 55, while being urged towards the shutter mounting stage 40, in other words, rearwards in the optical axis direction, by a chopper urging spring 304 mounted between the chopper 302 and the presser 55. The chopper 302 is provided with the chopper plate 302a, which is inserted in the slit of the photointerrupter 301, and when the chopper 302 is at the rearward position owing to the force of the chopper urging spring 304, the optical path of the photointerrupter 301 is open, and when the chopper 302 moves to the specified position against the force of the chopper urging spring 304, the optical path of the photointerrupter 301 is blocked.

At the ends of the screw shaft 43 and one of the slide shaft 51, a stopper plate 306 is fixed via a lock washer 305. Provided integrally on the stopper plate 306, a chopper presser 306a, which is contacted with the chopper 302 and moves the chopper 302 forwardly against the force of the chopper presser urging 304 when the lens supporting barrel 50 moves forwardly, is formed. The chopper presser 306a is also contacted with a projection 302b of the chopper 302 when the lens supporting barrel 50 (i.e., the rear lens group L2) reaches a predetermined position closer to the shutter mounting stage 40, and owing to the further forward movement of the lens supporting barrel 50, the chopper presser 306a moves the chopper 302 against the force of the chopper urging spring 304. When the lens supporting barrel 50 moves to the AF home position close to the shutter mounting stage 40, the chopper plate 302a of the chopper 302 blocks the optical path of the photointerrupter 301. By checking the output of the photointerrupter 301, the CPU 210 detects whether the rear lens group L2, namely the lens supporting barrel 50, is at the AF home position or not.

In regard to the function of the present zoom lens camera, the following discussion will be made with reference to flow charts shown in FIGS. 41 through 73. The processes are executed by the CPU 210 based on the program memorized in the internal ROM of the CPU 210.

[The Main Process]

Figure 41:
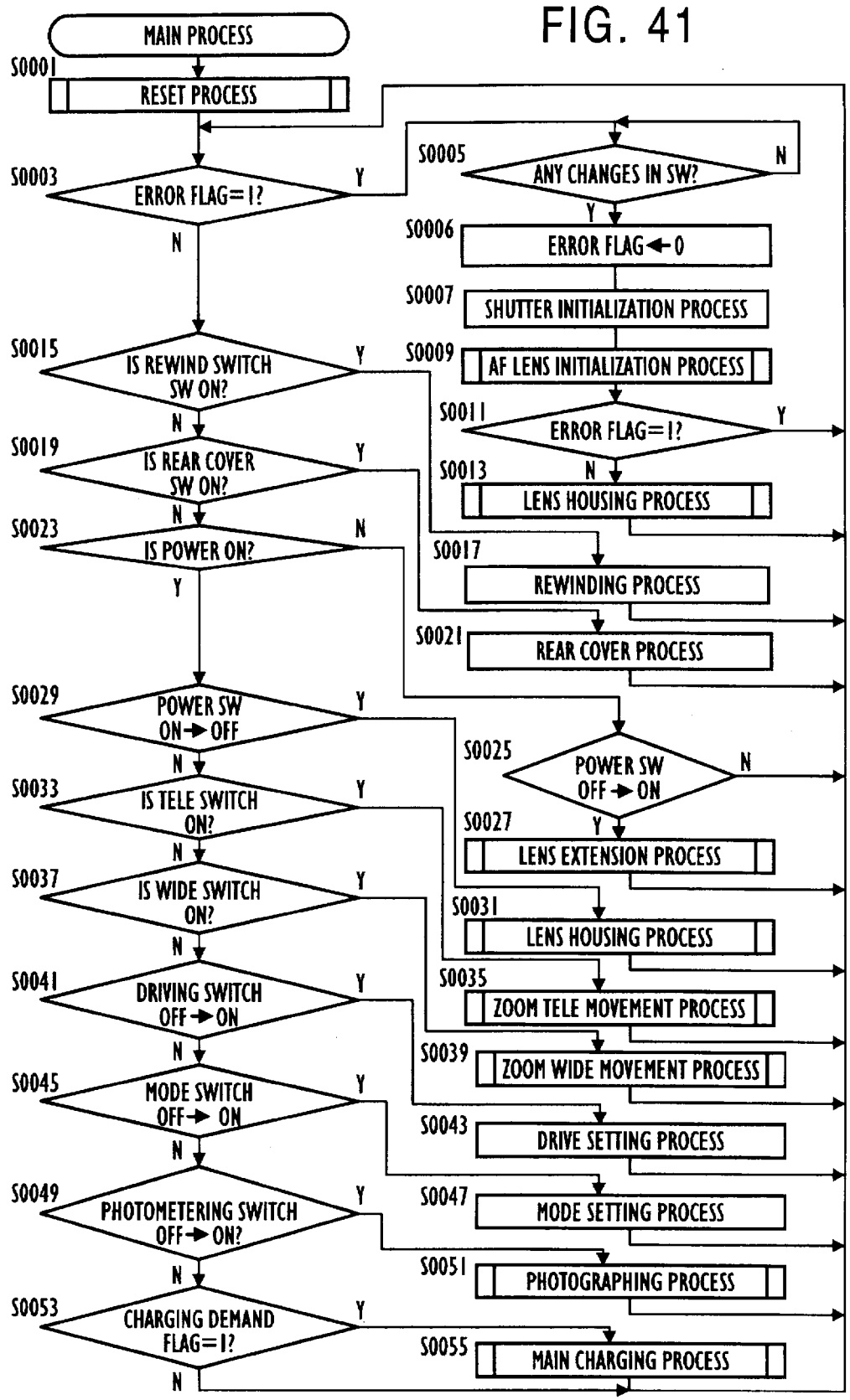
FIG. 41 is a flow chart of a main process of the zoom lens camera.

FIG. 41 is a flow chart showing the main process of the camera. When the battery is loaded into the camera, the CPU 210 commences the main process, and then enters a standby state and waits for an operation to be performed by the photographer.

In the main process, the reset process (FIG. 42), indicated at step S0001, is executed. In the reset process, hardware initialization, such as each port of the CPU 210, RAM initialization, test function process, reading of adjustment data, shutter initialization, AF lens initialization, and lens housing processing, are executed.

After completion of the reset process, at step S0003 through step S0053, checks are executed to check whether the error flag is set, whether the rewind switch 216 is ON, whether the state of the rear cover switch 213 changes, whether the power is ON, whether the state of the power switch 212 changes from OFF to ON, whether the "tele" switch 62T is ON, whether the "wide" switch 62W is ON, whether the driving switch 215 is changed from OFF to ON, whether the mode switch 214 is changed from OFF to ON, whether the photometering switch SWS is changed from OFF to ON, and whether the charging demand flag is set, and the processes according to the result of the checks are executed.

At step S0003, if the error flag is set (i.e., error flag is set to 1), it indicates that an error has occurred at least one of the above processes in the reset process. To clear the error flag, error initialization processes from steps S0005 through S0013 are repeated until the error flag has cleared. At step S0005 the CPU 210 waits for a variation of any of the switches, and after a variation, at steps S0006 through S0009, the error flag is reset, a shutter initialization process (FIG. 51) and an AF lens initialization process (FIG. 43) are executed. Then at step S0011 it is checked as to whether the error flag has been set during the above processes (S0006–S0009), and if the error flag is set, control returns to step S0003 and the processes from step S0005 are repeated. If the error flag is not set at step S0011, it means that the error state has been resolved, and control returns to step S0003 after a lens housing process (FIG. 44) has been executed at step S0013.

When the error flag is cleared, and when the power is OFF, at step S0015, step S0019, step S0023, step S0025 and step S0029, the above-mentioned checks are repeated, namely it is checked whether the rewind switch 216 is ON, whether the state of the rear cover switch 213 has changed, whether the power is ON, and whether the power switch 212 is changed from OFF to ON. When the rewind switch 216 is turned ON, or when the state of the rear cover switch 213 is changed, or when the power switch 212 is changed from OFF to ON, the following processes are executed.

At step S0015, if the rewind switch 216 is ON, the rewind motor is driven and the film rewind is executed at step S0017.

At step S0019, if the state of the rear cover switch 213 changes, namely the rear cover is closed or opened, the rear cover processes, such as resetting of the film counter or the film loading process, are executed at step S0021.

At steps S0023 and S0025, if the power switch 212 is changed from OFF to ON, the power is made ON, and the lens extension process is executed at step S0027. Each time the power switch is turned ON, the CPU 210 turns the power ON if the power is OFF, and turns the power OFF if the power is ON.

When the power is ON, control proceeds from step S0023 to step S0029, and the processes from steps S0029 to S0053 are executed. In the processes from steps S0029 to S0053, checks are made as to whether the power switch 212 is varied from OFF to ON, whether the "tele" switch 62T is ON, whether the "wide" switch 62W is ON, whether the driving switch 215 is varied from OFF to ON, whether the mode switch 214 is varied from OFF to ON, whether the photometering switch SWS is varied from OFF to ON, and whether the charging demand flag is set.

At step S0029, if the power switch 212 is varied from ON to OFF, the power is made OFF, and the lens housing process (FIG. 44) is executed at step S0031. In the lens housing process the lens barrel is withdrawn to the housing position.

At step S0033, if the "tele" switch 62T is turned ON, a zoom "tele" movement process (FIG. 47) is executed at step S0035. In the zoom "tele" movement process the whole unit driving motor 25 is driven in the lens extension direction.

At step S0037, if the "wide" switch 62W is turned ON, a zoom "wide" movement process (FIG. 48) is executed at step S0039. In the zoom "wide" movement process the whole unit driving motor 25 is driven in the lens retraction direction.

At step S0041, if the driving switch 215 is varied from OFF to ON, a drive setting process is executed at step S0043. Though not shown in detail, the drive setting process is a process to select the driving mode from amongst the frame photographing mode, the continuous photographing mode, the multiple exposure mode, the self-timer mode, or the like.

At step S0045, if the mode switch 214 is varied from OFF to ON, a mode setting process is executed at step S0047. Though not shown in detail, the mode setting process is a process to select the exposure mode from amongst the strobe autoflashing mode, the forced strobe flashing mode, the strobe flashing prevention mode, the red-eye reduction mode, the long exposure mode, the bulb mode, or the like.

At step S0049, if the photometering switch SWS is varied from OFF to ON, a photographing process (FIG. 49) is executed at step S0051.

At step S0053, if the charging demand flag is set, a main charging process (FIG. 50) is executed at step S0055, and the charging process of the strobe device 231 is executed.

When the power is ON, the above processes from steps S0003 through S0055 are repeated according to the operation of the photographer, and when no operation is being undertaken, the standby state is maintained, i.e., a state ready for photographing.

[The Reset Process]

Figure 42:
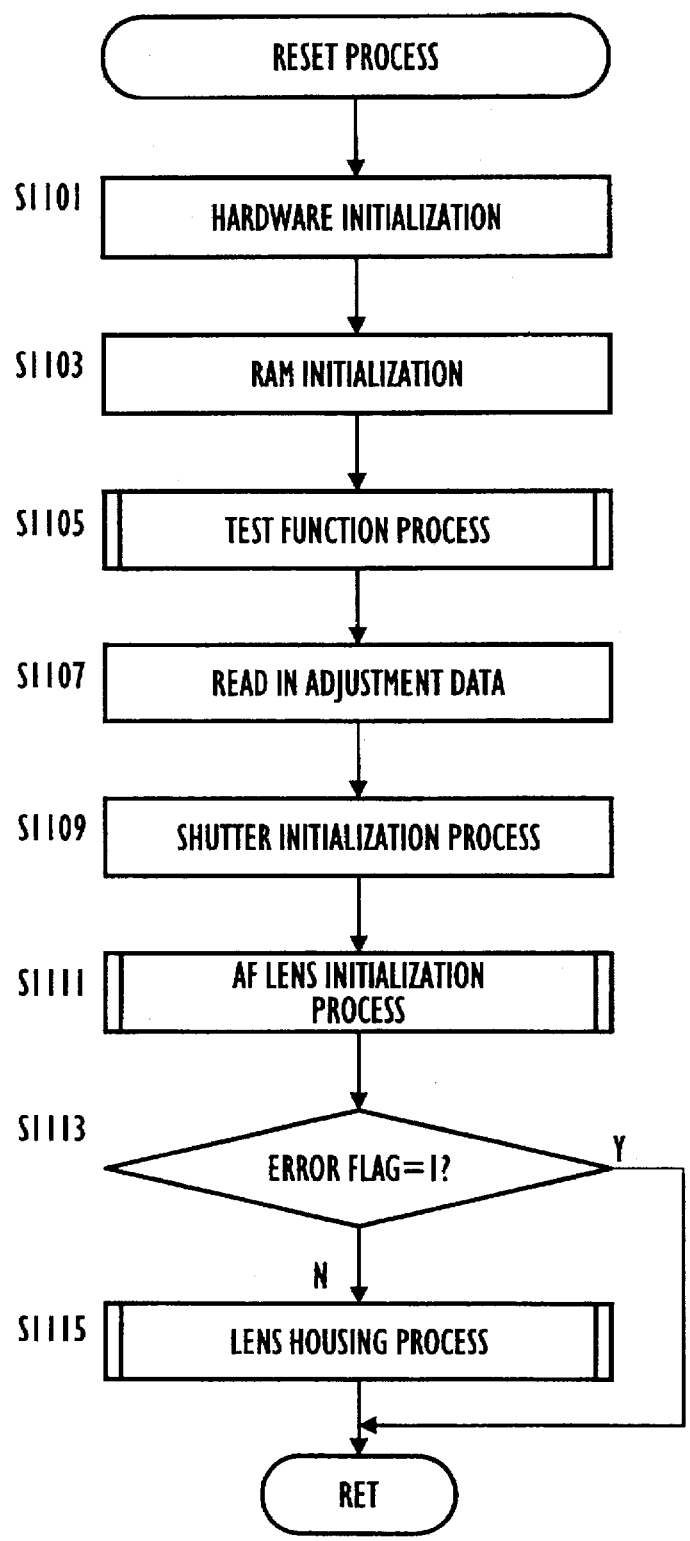
FIG. 42 is a flow chart of a reset process of the zoom lens camera.

FIG. 42 is a flow chart showing the reset process at step S0001 of the main process. In the reset process the following processes are executed, namely, hardware initialization, such as each port of the CPU 210, RAM initialization, the calling of the test function, the reading of adjusting data, the initialization of the shutter, the initialization of the AF lens, and lens housing processing.

At step S1101, the initialization of hardware, i.e., initialize the levels of each port of the CPU 210, is executed, and at S1103 the initialization of RAM, i.e., to clear the RAM in the CPU 210, is executed.

At step S1105 the test function process (FIG. 68) is executed, namely each function of the camera is tested by an external measuring apparatus, such as a computer, during or after assemble. In the test function process of the present embodiment, although commands regarding the function to be tested are output from the external measuring apparatus, the actual process is executed by the CPU 210.

At step S1107, adjusting data is read from the EEPROM 230. The adjusting data includes exposure adjusting value data, focus adjusting value data, and diaphragm adjusted data. The exposure adjusting value data adjusts for an error between a design diaphragm value and the actual diaphragm value, or adjusts for differences due to different lenses having different transmittances, and is stored before shipment of the camera. The diaphragm adjusted data detects whether or not the difference between the designed degree of opening of the shutter blade and the actual degree of opening thereof, has been adjusted for with respect to the number of AE pulses detected by the AE encoder upon driving of the AE motor 29. If the adjustment has been performed, the diaphragm adjusted value is stored in the EEPROM 230, as part of the adjusting data.

At step S1109, the shutter initialization process is executed to completely close the shutter blades 27a. In the present embodiment, since the opening of the shutter blades 27a is operated by the AE motor 29, there is a possibility that the battery may be removed while the shutter is open, and additionally a possibility exists that the battery is loaded while the shutter is open. Therefore, the AE motor 29 is driven in a direction to close the shutter blades 27a (shutter closing direction), and sets the closed condition wherein the shutter blades 27a are in contact with an initial position stopper (not shown).

At step S1111, the AF lens initialization process (FIG. 43) is executed, namely, the rear lens group L2 is moved to the initial position at which it is extended furthest. In the present embodiment, the rear lens group driving motor 30 is driven to move the rear lens group L2 forwardly to the furthest extended position, close to the front lens group L1, namely an initial position.

At step S1113, it is checked whether the error flag has been set, and if the error flag has been set, control returns without executing any further process, while if the error flag has not been set, control returns after executing a lens housing process (FIG. 44), at step S1115.

In the lens housing process, the barrier blades 48a and 48b are closed by moving the lens barrel rearwardly to the housed position within the camera body 201, by driving the whole unit driving motor 25. Since the error flag will be cleared during normal usage, the lens housing process will be executed. If the error flag is set to 1, the housing (withdrawing) of the lens is stopped since it can not be guaranteed that the rear lens group L2 is at the initial position (i.e., the AF home position) in the AF initialization process, and if the lens housing process is executed in such a state, a possibility exists that the rear lens group L2 may collide with the aperture plate 14, so the lens housing process is canceled.

[The AF Lens Initialization Process]

Figure 43:
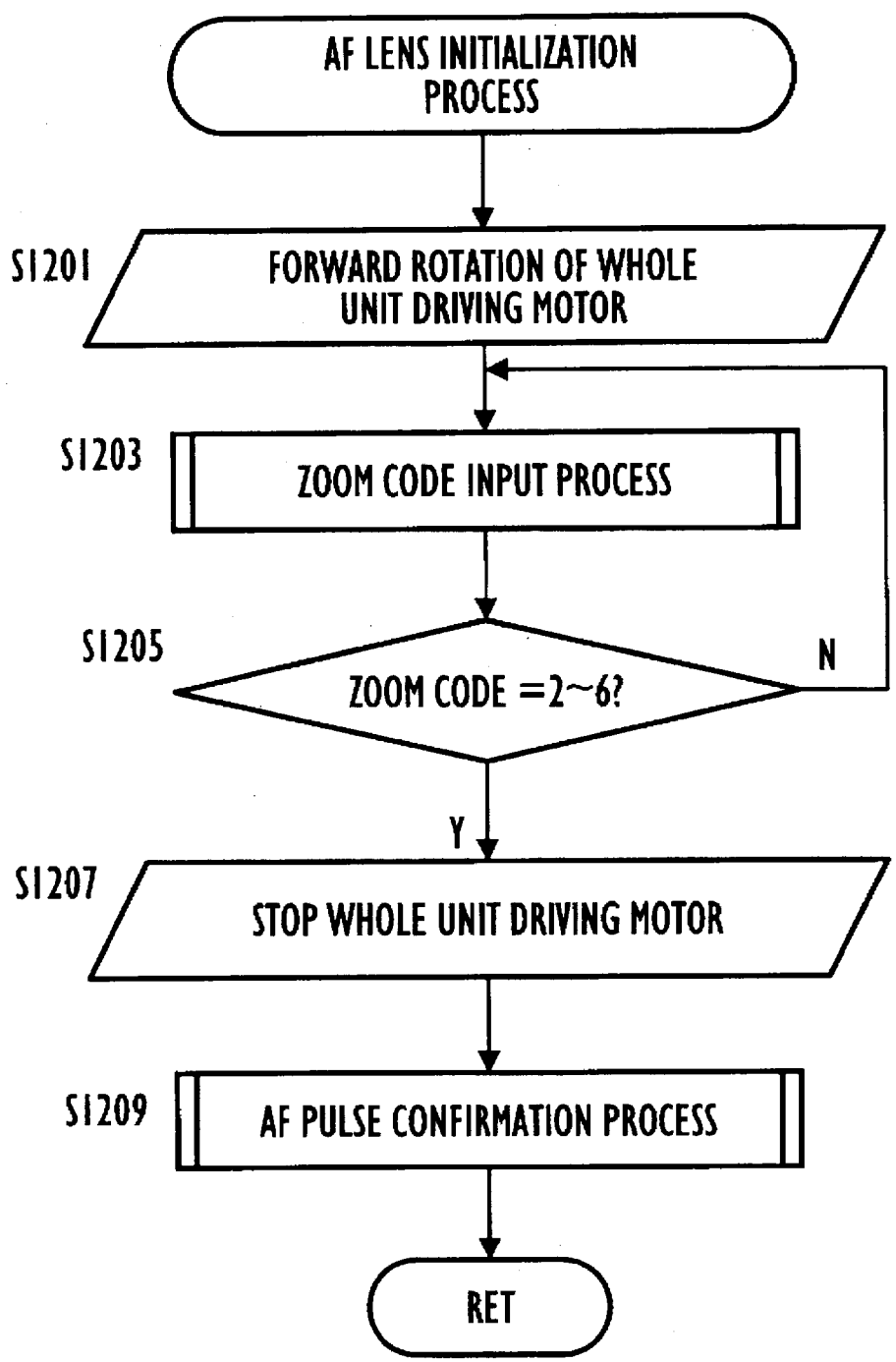
FIG. 43 is a flow chart of an AF lens initialization process of the zoom lens camera.

FIG. 43 is flow chart showing the AF lens initialization process. In the AF lens initialization process, if the lenses are housed, the whole unit driving motor 25 drives forward (clockwise), and the rear lens group driving motor 30 is connected to a barrier driving gear device (not shown), and the front lens group L1 and the rear lens group L2 are moved as a whole to the "wide" position by the whole unit driving motor 25, and then the rear lens group L2 is moved to the AF home position, namely the position at which it will be closest to the front lens group L1, by driving the rear lens group driving motor 30.

If the lenses are at any position other than the housed position, the whole unit driving motor 25 is driven forward (clockwise), and if one of the zoom codes is detected, the rear lens group driving motor 30 is driven and the rear lens group L2 is moved to the AF home position, namely the position closest to the front lens group L1.

However, since the rear lens group driving motor 30 is connected to the barrier driving gear device at the housed position, and is connected to the rear lens driving gear device at positions other than the housed position, the whole unit driving motor 25 must be driven to move the front lens group L1 and the rear lens group L2 to a position other than the housed position (i.e., to the "wide" position or further) when the rear lens group L2 is to be driven.

At step S1201, the whole unit driving motor 25 is firstly driven forward (clockwise), namely in the direction for extending the lenses. If the lenses are housed, the barrier driving device is detached from the barrier driving gear and engaged with the lens driving gear, so that the rear lens group L2 is in a state capable of be driven.

At step S1203, the CPU 210 performs an A/D conversion of the voltage input from the zoom code information input circuit 219 and converts the obtained digital value into a zoom code. At step S1205, the CPU 210 checks the converted zoom code, and if the code is in the range 2 through 6 at step S1205, the whole unit driving motor 25 is stopped immediately at step S1207. In the present embodiment, zoom code 1 indicates the housed position, zoom code 2 indicates the "wide" end position, zoom code 6 indicates the "tele" end position, zoom codes 3, 4 and 5 indicate intermediate zoom positions, and zoom code 0 indicates the "OFF" state. In the processes of steps S1201 through S1207 the lens barrels 16, 19 and 20 are extended until a zoom code in the range 2 to 6 is detected.

At step S1209, when the whole unit driving motor 25 is stopped, an AF pulse confirmation process (FIG. 53) is executed and the rear lens group L2 is moved to the AF home position. The AF pulse confirmation process is characterized in that the rear lens group driving motor 30 is driven to rotate in forward and reverse directions to remove so-called "biting" of the mechanical components, such as the cam follower pin into the cam groove. After the rear lens group L2 is moved to the AF home position, control is returned.

[The Lens Housing Process]

Figure 44:
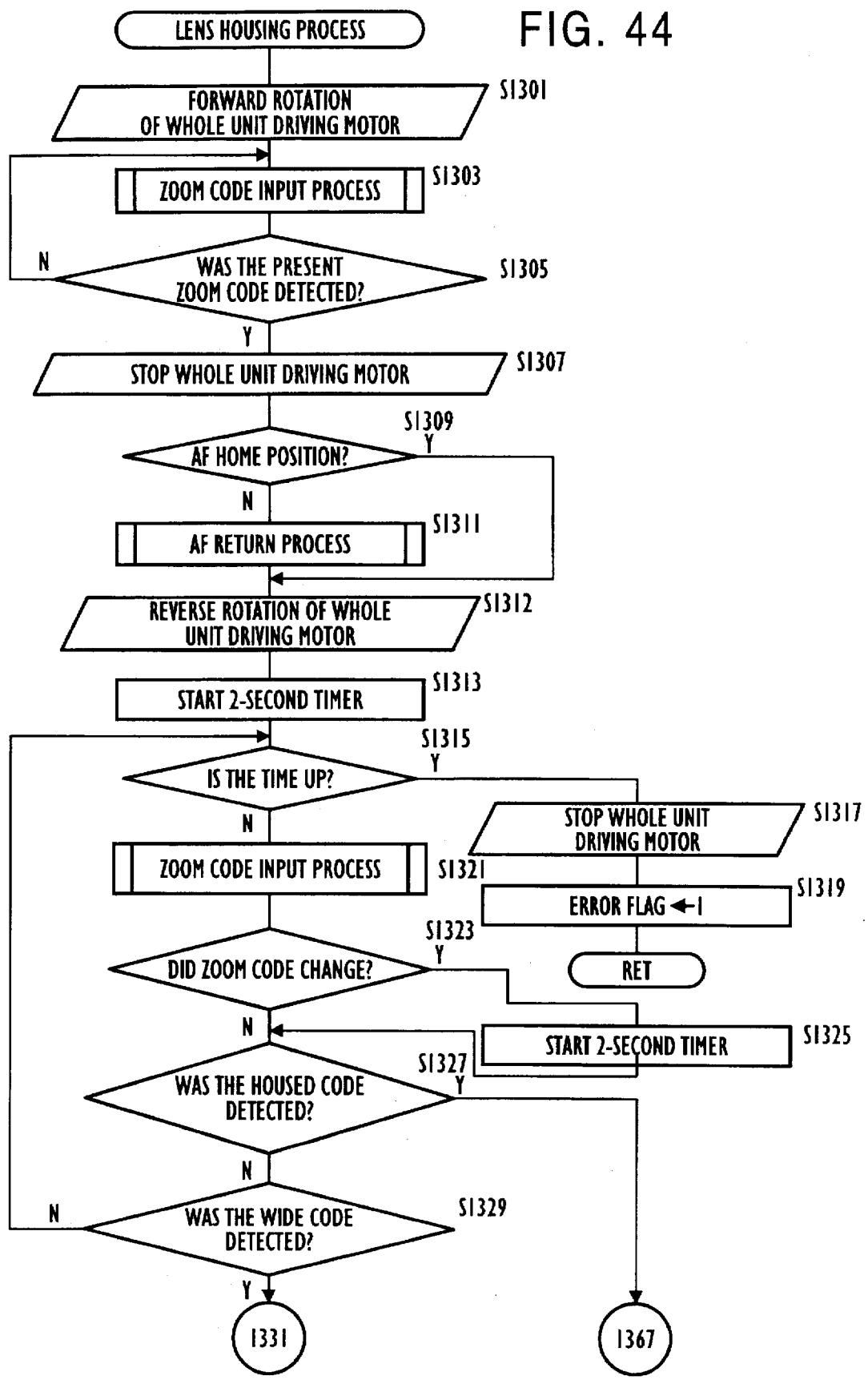
FIGS. 44 and 45 show a flow chart of a lens housing process of the zoom lens camera.
Figure 45:
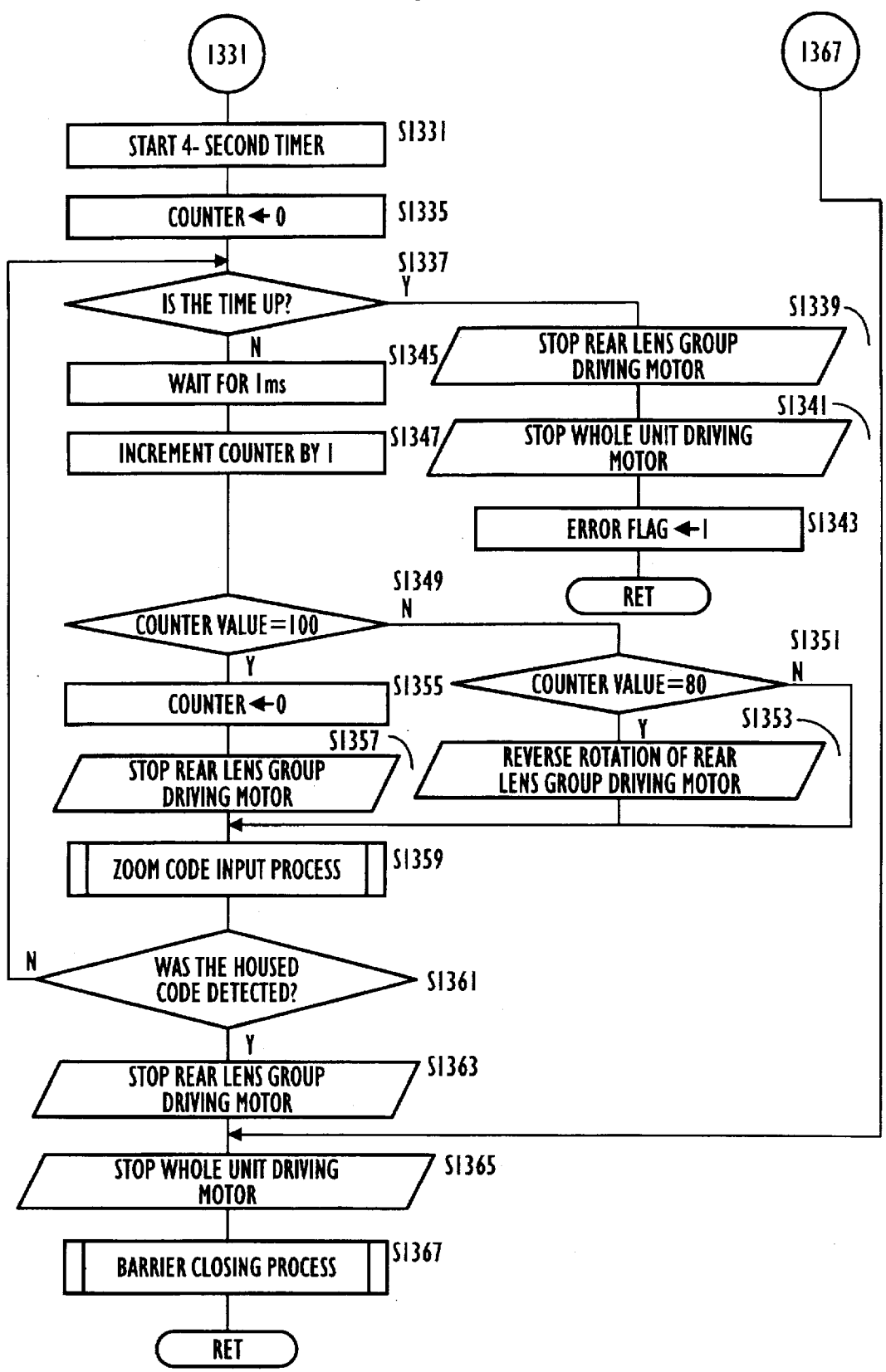

FIGS. 44 and 45 show a flow chart of the lens housing process. In the lens housing process the front lens group L1 and the rear lens group L2 are returned to the housed position. That is, the process is one in which the rear lens group L2 is returned to the AF home position by the rear lens group driving motor 30, and the lenses, i.e., the front lens group L1 and the rear lens group L2, are driven to the housed position by the whole unit driving motor 25, and then the lens barrier is closed.

At step S1301, when the lens housing process is called, the whole unit driving motor 25 is driven in the forward (clockwise) direction, namely in the "tele" zoom direction. At step S1303 the zoom code input process (FIG. 52) is executed until the present zoom code, namely the zoom code corresponding to the lens position at the time at which the lens housing process is called, is detected. If the zoom code is detected at step S1305, then at step S1307 driving of the whole unit driving motor 25 is stopped. Subsequently, at step S1309, it is judged whether or not the rear lens group L2 is at the AF home position. If the rear lens group L2 is not at the AF home position at step S1309, the AF return process (FIG. 54) is executed and the rear lens group L2 is moved to the AF home position.

If the lens housing process is performed when the rear lens group L2 is not at the AF home position, namely the rear lens group L2 is projecting towards the film, the rear lens group L2 may collide with the aperture plate 14 of the camera body before the lenses reach the housed position. For the purpose of avoiding such an occurrence, the rear lens group L2 is returned to the AF home position before the lenses are housed, namely before the reverse (counterclockwise) driving of the whole unit driving motor 25.

When the lens housing process is called, if the lenses are positioned at the "wide" end position, there exists a possibility that the rear lens group driving motor 30 may not be connected to the movement device of the rear lens group L2, but instead connected to the barrier opening device. If the rear lens group driving motor 30 is connected to the barrier opening device, and if at the same time the rear lens group L2 is extended from the AF home position, the rear lens group L2 will not move to the AF home position even when the rear lens group driving motor 30 is driven.

Figure 34:
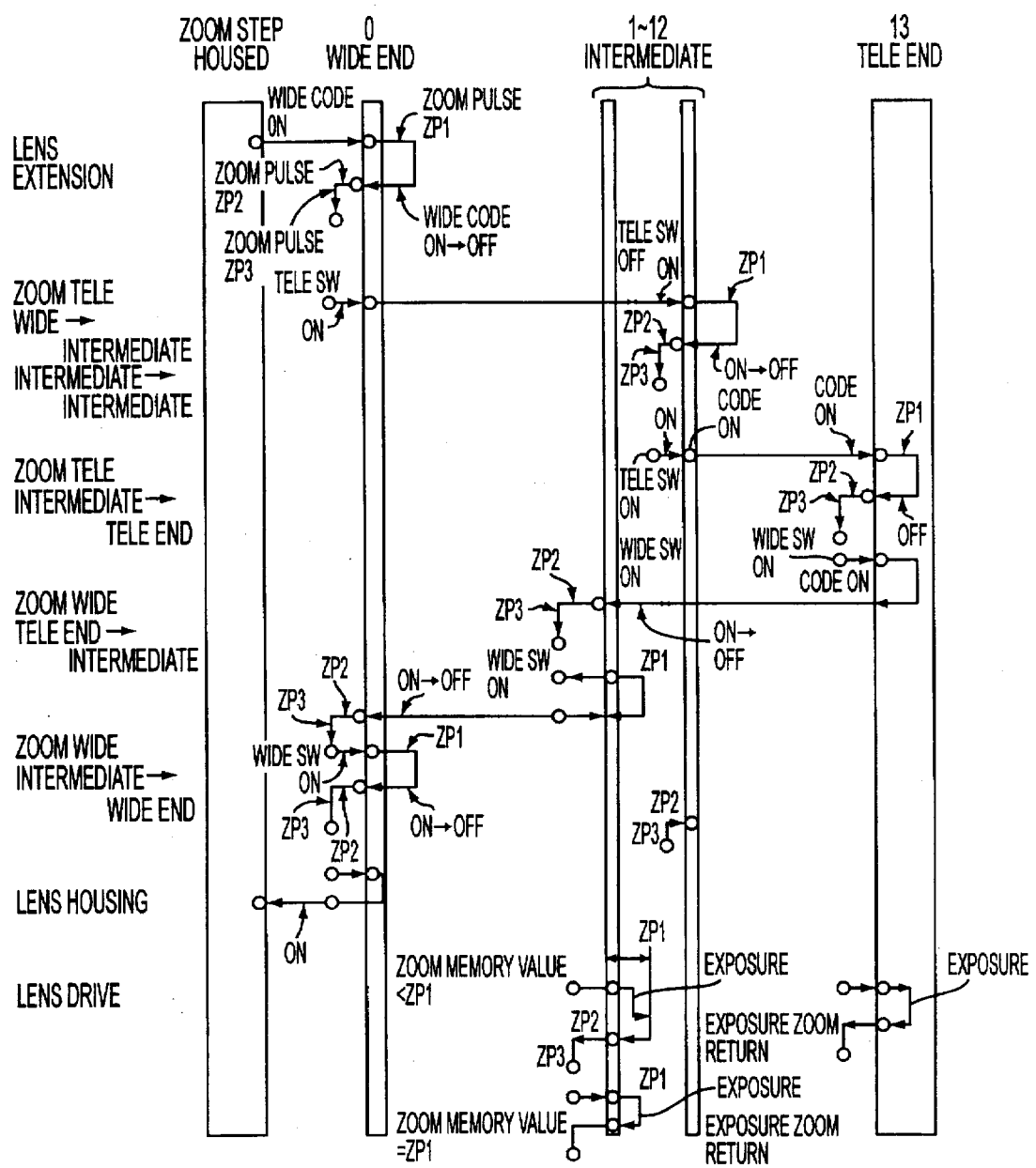
FIG. 34 is a schematic view illustrating movement of the front lens group and the rear lens group of the zoom lens camera.

In the processes of steps S1301 through S1307, the lenses are driven once beyond the "wide" end position, to the "tele" side, as shown in FIG. 34, so that the rear lens group driving motor 30 will definitely be connected to the driving device of the rear lens group L2 after S1307. By driving the rear lens group driving motor 30 in the AF return process at step S1311, after it has been judged at step S1309 that the rear lens group L2 is not positioned at the AF home position, the rear lens group L2 can be surely be moved.

At step S1309, if the rear lens group L2 is judged to be positioned at the AF home position, the CPU 210 skips the AF return process (step S1311), and proceeds to the movement process for housing the lenses at step S1312.

At step S1312, the movement of the lenses to the "wide" end is started by driving the whole unit driving motor 25 in reverse (counterclockwise), and at step S1313 a two-second timer is started. Subsequently, at steps S1315 through S1329, before the end of the two-second timer, the zoom code, which varies according to the movement of the lenses, is input to detect the lenses reaching the "wide" end position.

At step S1315, the CPU judges whether the time of the timer is up or not. The phrase "time is up" refers to the case in which the variation of the zoom code is not detected within two seconds and where the movement of the lenses is stopped. If the time is not up, at step S1321 the zoom code input process is called, and the zoom code is input. Whether the zoom code has changed is judged at step S1323, and if the zoom code has changed, the two-second timer is reset. If it is judged that the zoom code has not changed at step S1323, it is then judged at step S1327 whether the lenses have reached the housed position. If the lenses have not reached the housed position, it is judged whether or not the lenses have reached the "wide" end position at step S1329. If neither the housed code nor the "wide" code is detected, the CPU 210 repeats the processes from step S1315.

If the time becomes up while repeating the above processes, at step S1317 the CPU 210 stops the whole unit driving motor 25, and sets the error flag to 1 to indicate the occurrence of an error (step S1319), and the lens housing process is ended, and control returns to the position at which the present process was called.

If at step S1329, the "wide" code was detected during the above process, then a four-second timer is set at step S1331, and the counter is reset to 0 (step S1335), and the processes from steps S1337 to S1361 are repeated until the four-second timer is up. Here, a process is executed in which the rear lens group driving motor 30 is driven intermittently while the whole unit driving motor 25 is driven continuously, namely the lenses are moved beyond the "wide" end position towards the housed position.

In the camera 1 of the present embodiment, as already described, the movement of the rear lens group L2 and the opening and closing of the barrier are executed by the rear lens group driving motor 30. When the lenses are positioned on the "tele" side of the "wide" end position, the rear lens group driving motor 30 is connected to the driving device of the rear lens group L2 and is not connected to the barrier opening device. However, when the lenses are positioned toward the housed position from the "wide" end position, when the lenses are being housed, the barrier/lens switching gear device must be switched so that the rear lens group driving motor 30 is connected to the barrier opening device.

Although the switching of the gears is designed to be executed through the cam device according to the movement of the lenses, in order to ensure that the barrier/lens switching gear device will surely be engaged with the teeth of the barrier driving gear without fail at this time, the rear lens group driving motor 30 is driven while the lenses are being moved from the "wide" end position to the housed position, namely after step S1311 where the reverse (counterclockwise) driving of the whole unit driving motor 25 is commenced, the rear lens group driving motor 30 is designed to be driven intermittently.

At step S1337, it is judged whether or not the time of the four-second timer is up. The time of the four-second timer will not be up as long as an error has not occurred, and an N (NO) judgment is normally made at step S1337. At step S1345, after waiting 1 ms, the counter is incremented at step S1347, and it is judged whether or not the value of the counter has reached 100 at step S1349. If the value of the counter is less than 100, an N judgment is made at step S1349, and then at step S1351, it is judged whether or not the value of the counter has reached 80 at step S1351.

If the value of the counter is less than 80 at step S1351, the zoom code input process is called and the zoom code is input at step S1359. If the housed code is not detected at step S1361, control returns to step S1337 and the processes are repeated. At step S1351, when the value of the counter reaches 80, the reverse (counterclockwise) driving of the rear lens group driving motor 30 is executed at step S1353. If the value of the counter reaches 100, the counter is reset to 0, and the rear lens group driving motor 30 is stopped, at steps S1355 and S1357.

Since the waiting time of 1 ms is set at step S1345, the above processes are repeated at a 100 ms cycle. Therefore, when the value of the counter is between 0 and less than 80, namely, until 80 ms passes after the detection of the "wide" end code, only the whole unit driving motor 25 is driven. When the value of the counter is 80 or more and less than 100, namely, 80 ms or more and less than 100 ms have passed since the detection of the "wide" end code, both the whole unit driving motor 25 and the rear lens group driving motor 30 are driven. When the value of the counter reaches 100, namely, 100 ms have passed, the driving of the rear lens group driving motor 30 is stopped and only the whole unit driving motor 25 is driven continuously. Since the above processes are repeated, during the driving of the whole unit driving motor 25, the rear lens group driving motor 30 is driven for 20 ms in each 100 ms period.

If the housed code is not detected before the time of the four-second timer is up, the time is judged to be up at step S1337. The housed code will not be detected within four seconds if the movement of the lens is obstructed for some reason, and in such a case, at steps S1339 and S1341, the rear lens group driving motor 30 and the whole unit driving motor 25 are stopped, and the process is ended upon setting the error flag to 1 to indicate the occurrence of an error.

During the above process, when the housed code is detected, the CPU 210 stops the rear lens group driving motor 30 at step S1363, and further stops the whole unit driving motor 25 at step S1365, and after closing the barrier by calling the barrier closing process, the lens housing process is completed. The barrier closing process is the process to close the lens barrier by the rear lens group driving motor 30.

[The Lens Extension Process]

Figure 46:
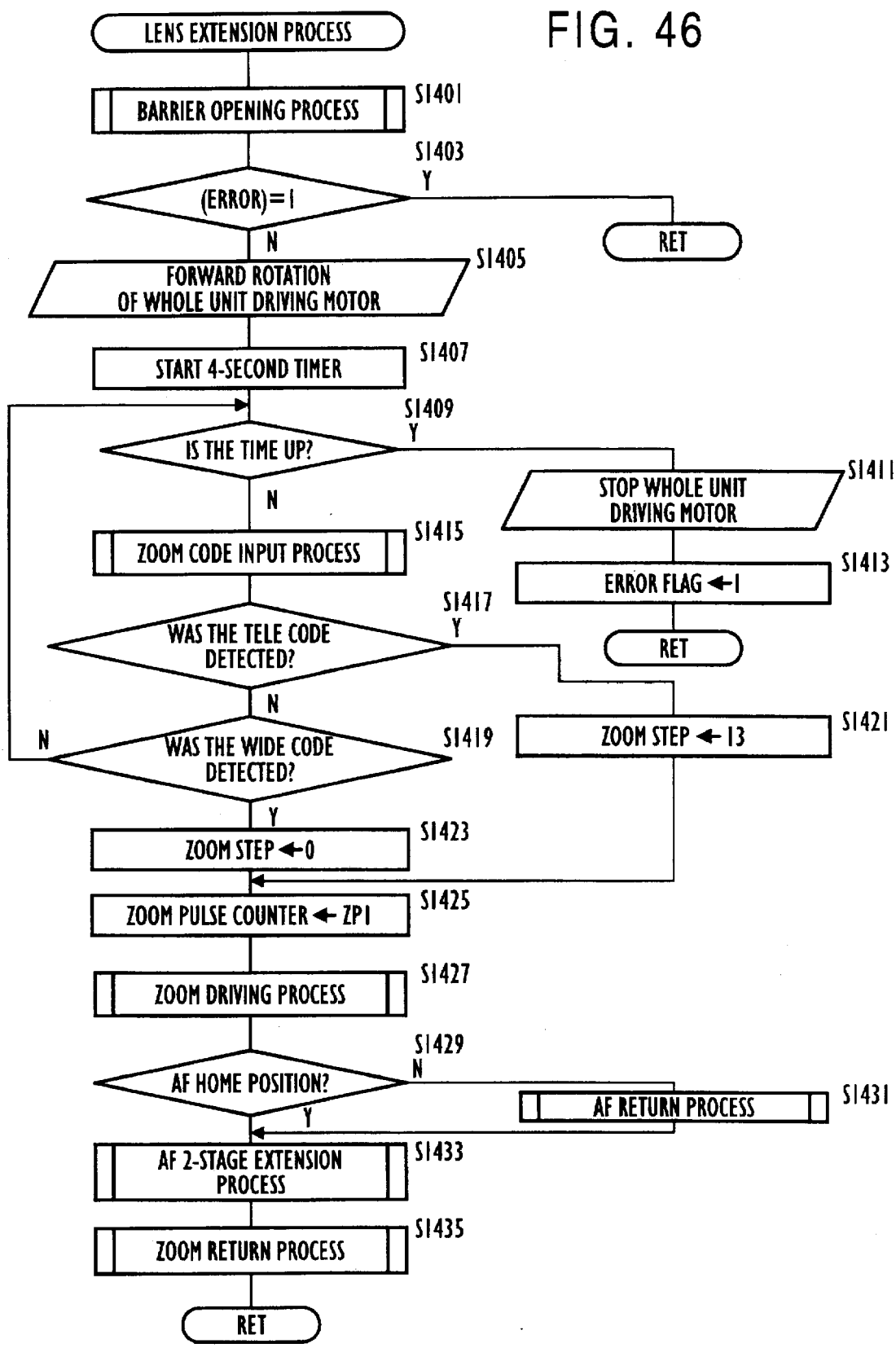
FIG. 46 is a flow chart of a lens extension process of the zoom lens camera.

FIG. 46 shows a flow chart of the lens extension process. In the lens extension process, when the state of the camera changes from being in the standby state to the power "ON" state (i.e., the operation state), the lens barrier is opened and the lenses (i.e., the front lens group L1 and the rear lens group L2) are extended from the housed position to the "wide" end position.

When the lens extension process is called, at step S1401 the barrier opening process is called, and the barrier is opened by driving the rear lens group driving motor 30. In the barrier opening process, if a pulse is not output from the AF pulse input circuit 222, namely, if the rear lens group driving motor 30 is not driven, the error flag is set to 1.

At step S1403, it is judged whether or not the error flag has been set to 1 in the barrier opening process. The error flag will be set to 1 if the barrier opening process does not end normally, and in this case, the lens extension processes after step S1405 are not executed and control returns. The error flag will be set to 0 if the barrier opening process is ended normally, and in this case, at step S1405 the whole unit driving motor 25 is driven forward (clockwise) and the movement of the rear lens group L2 and the front lens group L1 in the "tele" direction is started.

With the commencement of driving of the whole unit driving motor 25, the CPU 210 starts the four-second timer at step S1407, and monitors whether or not the "wide" end code (i.e., whether or not the lenses reach the "wide" end position) is detected before the time of the timer is up.

At step S1409, the CPU 210 judges whether the time of the timer is up or not. Normally, since the lenses reach the "wide" end position within four seconds from starting of the lens extension, the judgment at step S1409 is "N". At step S1415 the zoom code input process is called, and at step S1417 it is judged whether or not the input code, namely, the zoom code corresponding to the lens position, is the "tele" end code, and if the input code is not the "tele" end code, at step S1419 it is judged whether or not the input code is the "wide" end code.

The lens moves from the housed position to the "tele" end position within four seconds. Accordingly, before the time of the four-second timer is up, if neither the "tele" end code nor the "wide" end code is detected, it will mean, for example, that the movement of the lens is obstructed. Therefore, if at step S1409 the time is judged to be up during the lens movement, at step S1411 the driving of the whole unit driving motor 25 is stopped, and at step S1413 the error flag is set to indicate that an error has occurred, and the lens extension process is ended.

In the normal lens extension process, when the lenses are extended, the "wide" end code is firstly detected. At step S1419, if the "wide" end code is detected, then at step S1423 the zoom step, which is an indicator of the lens position, is set to 0, corresponding to the "wide" position. From step S1425, the processes for stopping the lenses are executed.

If the lens extension process is continued without detecting the "wide" end code, the lenses will eventually reach the end of the range of capable movement, and will become immovable. In the camera 1 of the present embodiment, during the lens extension process, the lenses will continue to move even without the "wide" end being detected, and when the "tele" end code is detected at step S1417, the movement of the lenses, namely, the processes after step S1425, will be stopped. When the lenses reach the "tele" end position, the zoom step is set to 13, corresponding to the "tele" end position, at step S1421. Therefore, during the lens extension process, the zoom step will be set to the correct value corresponding to the lens position even when the lenses have moved to the "tele" end.

As described above, when the lenses have been extended and the zoom step has been set to correspond to the lens position, from steps S1425 to S1435 the processes to stop the lenses are executed. In the camera of the present embodiment, in order to obtain the position of the lens, the zoom step is set upon detecting the zoom code, but when the lenses are stopped, for the purpose of detecting the zoom code, the brush 9a is designed so as to stop at a position that is shifted towards the "wide" end position by a predetermined amount, namely, "the standby position". When the lenses are moved for the purpose of zooming or focusing, the lenses are moved once towards the "tele" side, regardless of whether the direction of movement is towards the "wide" end or the "tele" end, in order for the brush 9a to contact the zoom code. The zoom code is then input to the CPU 210, which then controls the amount of movement of the zoom lens based on the position at which the zoom code is input, i.e., by making the position at which the zoom code is input a reference position.

Figure 57:
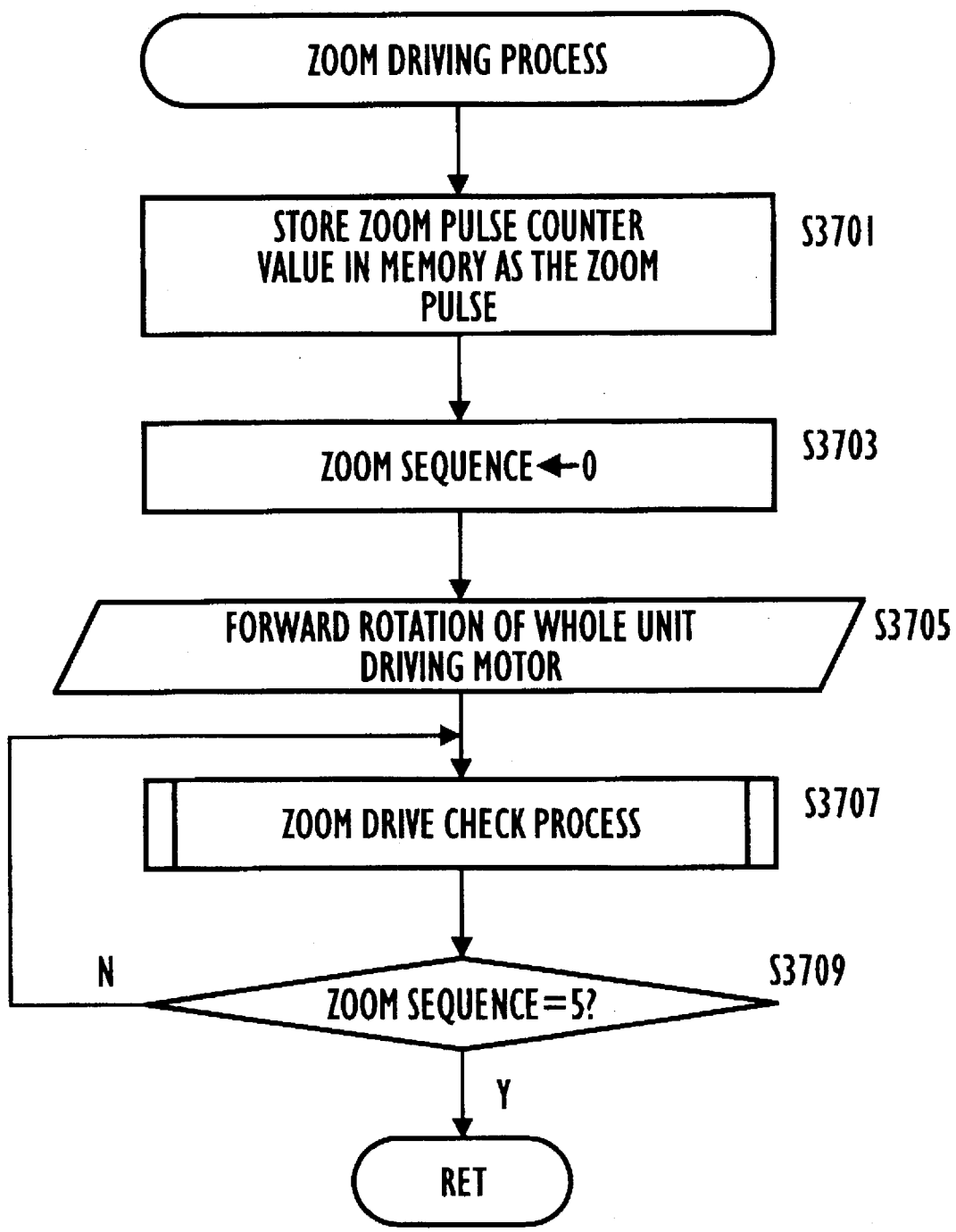
FIG. 57 is a flow chart of a zoom driving process of the zoom lens camera.

At step S1425, a first zoom pulse ZP1 having a predetermined value, is set in the zoom pulse counter and the zoom driving process is called, as shown in FIG. 57. In the zoom driving process, the whole unit driving motor 25 is driven forward (clockwise), namely, in the direction in which the lenses are moved toward the "tele" side, until the number of pulses output to the CPU 210 by the zoom pulse input circuit 220, in synchronization with the rotation of the whole unit driving motor 25, becomes equal to the value of the counting set in the zoom pulse counter. Thus, the lenses will be stopped upon being moved further towards the "tele" position by a predetermined amount from the position at which the zoom code detecting terminal detects the zoom code.

The value, by which the brush for zoom code detection will be moved past the zoom code and will be positioned without fail at a non-continuous part on the "tele" side, when the lenses are moved by the zoom driving process, is used as the first zoom pulse ZP1, to be set at the zoom pulse counter at step S1425. The value of the first zoom pulse ZP1 also satisfies the following conditions. In the camera of the present embodiment, the magnification of the finder optical system varies according to the movement of the lenses. Accordingly, the first zoom pulse ZP1 is set so that the magnification of the finder will not be affected even if the lenses are moved by an amount corresponding to this value of the pulse. In the present embodiment, though the lenses move when the shutter button is pressed, the number of zoom pulses, corresponding to the amount of movement of the lenses at that time, is set to a value which will not exceed that of the first zoom pulse ZP1.

After the lenses are moved by an amount corresponding to the zoom pulse ZP1, at step S1429 it is judged whether or not the rear lens group L2 is positioned at the AF home position, and if the rear lens group L2 is not positioned at the AF home position, namely, if the rear lens group L2 is extended from the AF home position at step S1429, the AF return process is called at step S1431 and the rear lens group L2 is moved to the AF home position. With the rear lens group L2 being positioned at the AF home position, the AF two-stage extension process at step S1433, and the zoom return process at step S1435, are executed and control returns.

The AF two-stage extension process is the process in which the rear lens group L2 is extended by a certain amount from the AF home position. In the camera, when photography is performed (when the shutter button is depressed fully), after the front lens group L1 and the rear lens group L2 have been moved simultaneously for zooming, in addition to the movement of the front lens group L1 and the rear lens group L2 by the whole unit driving motor 25, the movement of only the rear lens group L2 by the rear lens group driving motor 30 is also performed for the purpose of focusing and adjustment of the focal length.

At photographing, since the amount of movement of the rear lens group L2 is relatively large when the lenses are at the "wide" end side, the release time lag, which is the time difference between the point at which the shutter button is pressed and the point at which exposure is actually performed, becomes rather long. In order to shorten the release time lag, in the camera of the present embodiment, when the lenses are positioned at the "wide" side, where the movement of the rear lens group L2 is relatively large, the rear lens group L2 is extended by a predetermined amount in advance. The AF two-stage extension process is performed for this purpose, and is the process by which the rear lens group L2 is extended by a predetermined amount, only when the lenses are positioned on the "wide" side. In the present embodiment, the judgment as to whether the lenses are on "wide" side or not, is made according to whether or not the zoom step is less than or equal to 4, which will be described later (see below). In step S1434, the zoom return process moves the lenses toward the "wide" direction by a predetermined amount corresponding to zoom pulse ZP2 (described hereinafter).

[The Zoom "tele" Movement Process]

Figure 47:
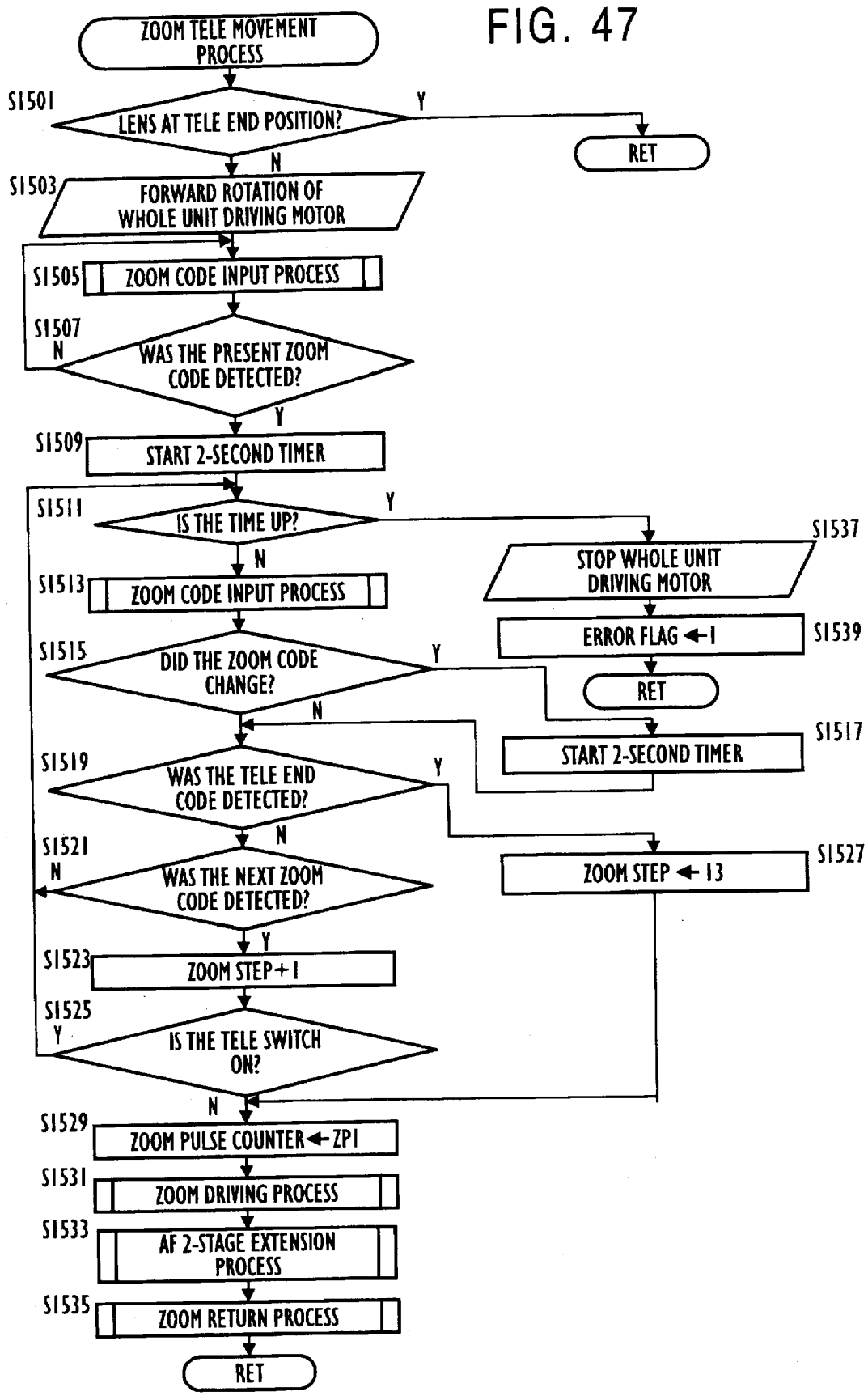
FIG. 47 is a flow chart of a zoom "tele" movement process of the zoom lens camera.

FIG. 47 shows a flow chart of the zoom "tele" movement process. This process will firstly be described with reference to FIG. 34, which shows the relationship between the zoom code plate 13b and the positions of the front lens group L1 and the rear lens group during the zoom "tele" movement process. The zoom "tele" movement process is a process to drive the whole unit moving motor 25 in a direction in which the lens barrels 16, 19 and 20 extend (i.e., in the direction in which the focal length is made long), namely the front lens group L1 and the rear lens group L2 are advanced as a whole without changing the relative distance therebetween.

In the zoom "tele" movement process, the zoom code corresponding to the present position of the lens is detected by driving the whole unit driving motor 25 forward (clockwise). The point at which the zoom code turns "ON" is used as a reference point when the whole unit driving motor 25 is to be stopped. After the whole unit moving motor 25 is driven forward (clockwise) to advance the lenses by the predetermined first zoom pulse value ZP1 with respect to this reference point, the whole unit driving motor 25 is driven in reverse (counterclockwise). After the whole unit driving motor 25 has been driven to rotate in reverse (counterclockwise) by the second zoom pulse value ZP2 with respect to the point at which the zoom code turns "ON/OFF" again, the whole unit driving motor 25 is driven forward (clockwise) by a backlash eliminating zoom pulse value ZP3, and the whole unit driving motor 25 is stopped. By this zoom "tele" movement process, the zoom lens is stopped between zoom codes with backlash in the forwarding (advancing) direction being removed to some extent.

Furthermore, in the present embodiment, when the whole unit driving motor 25 stops, if the zoom step is not more than 4, the rear lens group L2 is retracted by an amount corresponding to the predetermined AF pulse value AP1. In the present embodiment, the present lens position is controlled by dividing the focal length range, from the "wide" end to the "tele" end, into fourteen parts, and assigning the zoom step 0 to the "wide" end, the zoom step 13 to the "tele" end, and zoom steps 1 through 12 to the focal lengths in between.

In the zoom "tele" movement process, at step S1501 it is checked whether or not the lenses are at the "tele" end position, and if the lenses are at the "tele" end position, control returns since there is no need for tele-zooming.

If the lenses are not at the "tele" end position at step S1501, at step S1503 the whole unit driving motor 25 is driven forward (clockwise), namely, in the tele-zoom direction, and the zoom code input process is executed at step S1505, and waiting is performed until the present zoom code corresponding to the zoom step is detected at step S1507. When the present zoom code corresponding to the zoom step is detected, at step S1509 a two-second timer is started to detect a state in which the whole unit driving motor 25 is incapable of driving for a predetermined period of time (i.e., two seconds).

When the two-second timer is started, at step S1511 it is checked whether or not the time is up. In the case of normal operations the time will not be up, and therefore at step S1513 the zoom code input process is executed. Then at step S1515 it is checked whether or not the zoom code has changed, and if the zoom code has not changed, a "tele" end code detecting check is directly executed at step S1519, while if the zoom code has changed, the "tele" end code detecting check is executed at step S1519 only after restarting the two-second timer at step S1517.

If the zoom code does not change even after the whole unit driving motor 25 has driven for the predetermined period of time, it is assumed that an abnormal condition, such as the lens barrel has contacted some object, has occurred. Therefore at steps S1511, S1537 and S1539, after starting the two-second timer, if the two seconds have elapsed and the time of the two-second timer is up without any variation of the zoom code, the whole unit driving motor 25 is stopped, and the error flag is set, and control is returned.

If the "tele" end code is not detected at step S1519, it is judged whether or not the next zoom code is detected at step S1521, and if the next code is not detected, the processes of steps S1511 through S1519 are repeated. Upon detection of the next zoom code, the zoom step is incremented by 1 at step S5123, and if the "tele" switch 62T is ON at step S1525, control is returned to step S1511 and the above processes are repeated, while if the "tele" switch is OFF, a jump to step S1525 is performed. That is, once this process is entered, tele-zooming is performed by one zoom step even when the zoom switch 62T is turned OFF before tele-zooming is performed by one zoom step.

A jump to step S1529 is performed when the lenses reach the "tele" end or when the "tele" switch 62T is turned OFF (steps S1525, S1529 or S1519, S1527, S1529). If the jump is performed upon reaching the "tele" end, the zoom step is set to 13 at step S1527.

At step S1529, the predetermined first zoom pulse value ZP1 is set in the zoom pulse counter. Then after the zoom driving process at step S1531, the AF two-stage delivery process (step S1533) and the zoom return process (step S1535) are executed, and control is returned.

In the zoom driving process, the whole unit driving motor 25 is driven forward (clockwise) (i.e., in the direction in which the lenses are extended) by an amount corresponding to the value of the zoom pulse counter, namely, that of the first zoom pulse value ZP1.

In the AF two-stage extension process, when the whole unit driving motor 25 is stopped, if the zoom step is not more than 4, the rear lens group L2 is retracted by an amount corresponding to the predetermined AF pulse value (i.e., AP1). Then the whole unit driving motor 25 is driven in reverse (counterclockwise), by an amount corresponding to the second zoom pulse value ZP2, with respect to the point at which the zoom code turns ON/OFF, and after that, the whole unit driving motor 25 is driven forward (clockwise) by an amount corresponding to the backlash eliminating third zoom pulse value ZP3, and then the whole unit driving motor 25 is stopped. By this zoom "tele" movement process, the zoom lens is stopped between zoom codes with the backlash in the advancing direction being somewhat eliminated.

In the zoom return process, the whole unit driving motor 25 is driven in reverse (counterclockwise), and is further driven in reverse (counterclockwise) by an amount corresponding to the second zoom pulse value ZP2 with respect to the point at which the zoom code turns ON/OFF. After that, the motor is driven forward (clockwise) by an amount corresponding to the backlash eliminating third zoom pulse value ZP3, and then the whole unit driving motor 25, is stopped to thereby stop the front lens group L1 and the rear lens group L2 at the standby position between the zoom codes.

[The Zoom "wide" Movement Process]

Figure 48:
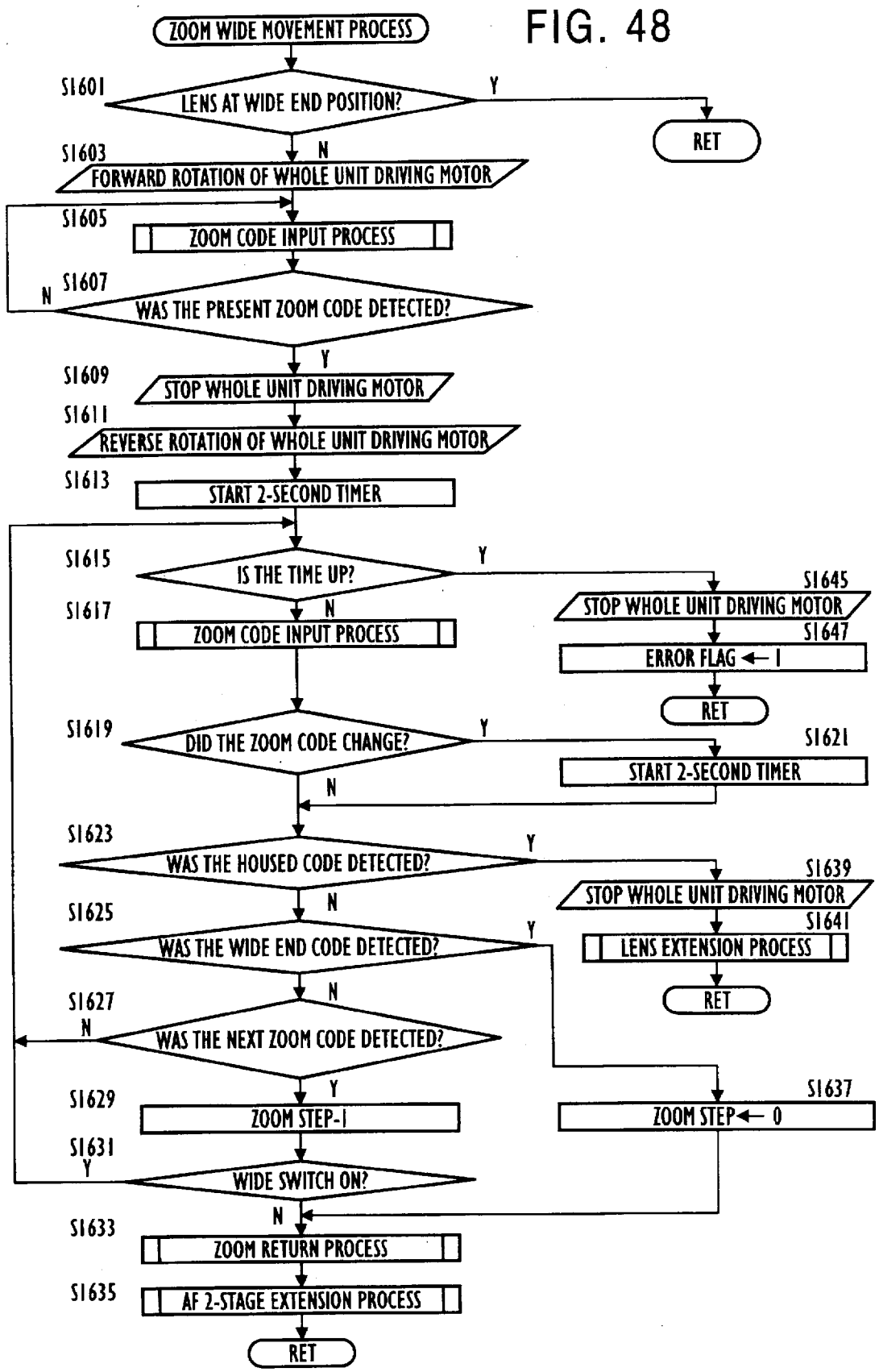
FIG. 48 is a flow chart of a zoom "wide" movement process of the zoom lens camera.

FIG. 48 shows a flow chart for the zoom "wide" movement process. This process shall be firstly described with reference to FIG. 34, which shows the relationship between the zoom code plate 13b and the positions of the front lens group L1 and the rear lens group L2 during the zoom "wide" movement process. In the zoom "wide" movement process the whole unit driving motor 25 is driven in the direction in which the lens barrels 16, 19 and 20 are retracted (i.e., the direction in which the focal length is made shorter), namely, the front lens group L1 and the rear lens group L2 are retracted as a whole without changing the distance therebetween.

In the zoom "wide" movement process, the whole unit driving motor 25 is first driven forward (clockwise) and after being driven forward further by an amount corresponding to the first zoom pulse value ZP1 from the point at which the zoom code corresponding to the present lens position is detected, is driven in reverse (counterclockwise). When the whole unit driving motor 25 is stopped in the intermediate zoom region, the motor 25 is further driven in reverse (counterclockwise) by an amount corresponding to the second zoom pulse value ZP2 from the point at which the zoom code turns "ON/OFF", and then the motor 25 is driven in reverse (counterclockwise) by an amount corresponding to the backlash eliminating zoom pulse value ZP3, and then the whole unit driving motor 25, is stopped. By this zoom "wide" movement process, the zoom lens is stopped between zoom codes with the backlash in the forwarding (advancing) direction being somewhat eliminated.

In the present embodiment, when the whole unit driving motor stops, if the zoom step is not more than 4, the rear lens group L2 is retracted by an amount corresponding to the predetermined AF pulse value AP1. The motor 25 is then driven in reverse (counterclockwise) by an amount corresponding to the second zoom pulse value ZP2 with respect to the point at which the zoom code turns "ON/OFF", and then the motor 25 is driven forward (clockwise) by an amount corresponding to the zoom pulse value ZP3 for backlash elimination, and then the whole unit driving motor 25 is stopped. By this zoom "wide" movement process, the zoom lens is stopped between zoom codes with the backlash in the advancing direction being eliminated to some extent.

When the zoom "wide" movement process is entered, at step S1601 it is checked whether or not the lens is at the "wide" (i.e., "wide" end) position, and if the lens is at the "wide" position, control returns since there is no need for zooming.

If at step S1601, the lens is not at the "wide" position, the whole unit driving motor 25 is driven forward (clockwise), i.e., tele-zooming direction, at step S1603 since there is a possibility that the lenses may have been moved past the next zoom code owing to the backlash when the lenses were retracted. At step S1605 the zoom code input process is executed and waiting is performed until the present zoom code corresponding to the zoom step is detected at step S1607. When the present zoom code corresponding to the zoom step is detected, the whole unit driving motor is stopped (step S1609) and then is driven in reverse (counterclockwise) (step S1611), and the two-second timer is started at step S1613.

When the two-second timer is started, it is checked whether or not the time is up at step S1615. In the case of normal operations the time will not be up, and therefore at step S1617 the zoom code input process is executed. It is then checked whether or not the zoom code has changed at step S1619, and if the zoom code has changed, the two-second timer is restarted (step S1621) and it is checked whether or not the housed code has been detected at step S1623. If the zoom code has not changed at step S1619 control proceeds to step S1623. If the housed code is not detected at step S1623, it is checked whether or not the "wide" end code is detected at step S1625, and if the "wide" end code is also not detected, it is checked whether or not the next zoom code has been detected at step S1627. If the next zoom code has not been detected, control returns to step S1615, and the process from steps S1615 to S1627 are repeated until the next zoom code is detected.

When the next zoom code is detected at step S1627, the zoom step is decremented by 1 at step S1629, and if the "wide" switch 62W is ON at step S1631, control returns to step S1615 and the above processes of steps S1615 through S1631 are repeated. If the "wide" end code is detected at step S1625, or if the "wide" switch is OFF, control jumps to step S1633 and the zoom return process is called (steps S1625, S1633, S1635, S1637 or S1631, S1635, S1637). At step S1637, when the jump is performed upon detection of the "wide" end code, the zoom step is set to 0.

In the zoom return process at step S1633, the front lens group L1 and the rear lens group L2 are returned to the standby position at which they were positioned before the lens driving process in the photographing process.

In the AF two-stage delivery extension at step S1635, the rear lens group L2 is retracted to the AF home position, or to the position retracted from the AF home position by an amount corresponding to the value AP1 in accordance with the present zoom step.

Although the above description is directed to a normal operation, in cases where the lens barrel is forcibly pushed etc., it is checked at step S1623 that the housed code has been detected and then the whole unit driving motor 25 is stopped at step S1639, and the lens extension process is executed at step S1641 before the control is returned. In addition, if the time becomes up at the two-second timer, for example when the lens barrel is pressed and is incapable of movement, the whole unit driving motor 25 is stopped at step S1645, and control returns after setting the error flag to 1.

In the present zoom "wide" process, since the "wide" switch check is executed after detecting the present zoom code and the next zoom code, wide zooming is performed by one zoom step once this process is entered, even when the zoom "wide" switch 62W is OFF before zooming is performed by one step.

[The Photographing Process]

Figure 49:
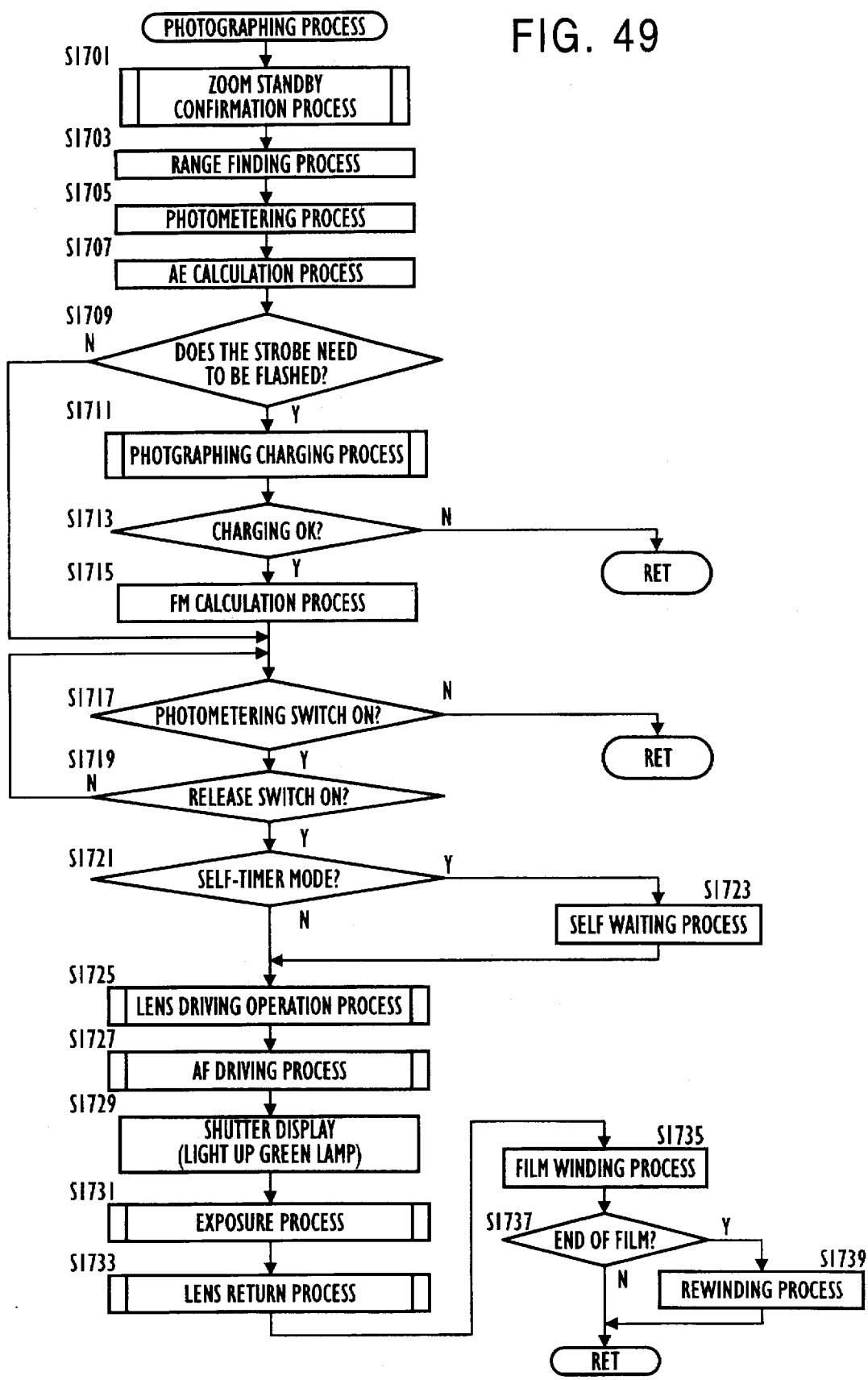
FIG. 49 is a flow chart of a photographing process of the zoom lens camera.

FIG. 49 shows a flow chart for the photographing process. The photographing process, of the present embodiment, is called when the photometering switch SWS is turned ON, and is characterized in that it is first checked that the front lens group L1 is at the standby position, and that the front lens group L1 and the rear lens group L2 are moved to positions, at which the focus will be set on the subject, at the preset focal length, after the release switch SWR is turned ON.

In the photographing process, at step S1701, the zoom standby confirmation process is executed, and the front lens group L1 is moved to the standby position corresponding to the present focal length.

Then at steps S1703, S1705 and S1707, the object distance measuring process is executed and the focal length is obtained, the photometering process is executed and the luminance of the subject is obtained, and the AE calculation process is executed to determine the shutter speed, the aperture value, and whether or not strobe flashing is necessary. Strobe flashing will be necessary when the luminance of the subject is at the strobe flashing level in the auto strobe flashing mode, or when the forced strobe flashing mode is set, etc. If it is judged that strobe flashing is necessary at step S1709, the photographing charging process is executed at step S1711, and during the photographing charging process, if the photometering switch SWS is turned OFF or if the time of the charging timer becomes up (step S1713), control returns, while if sufficient charging has been completed, after executing the flashmatic (FM) operation at step S1715, control proceeds to step S1717. If strobe flashing is not necessary at step S1709, control proceeds to step S1717, skipping steps S1711 through S1715.

At step S1717, it is checked whether the photometering switch SWS is turned ON, and if the photometering switch SWS is turned OFF, control returns. If the photometering switch SWS is ON at step S1717, the turning ON of the release switch SWR (step S1719) is waited for while the photometering switch SWS remains ON.

When the release switch SWR is ON (step S1719) and if the self-timer mode is not set at step S1721, the lens drive calculation process is executed at step S1725. If the self-timer mode is set, the lens drive calculation process is executed after a self-waiting process at step S1723, in which waiting is performed for a predetermined amount of time.

In the lens drive calculation process, the amount of movement, i.e., the zoom pulse value, of the front lens group L1 with respect to the ON/OFF switching point of the zoom code and the amount of movement, i.e., the AF pulse value, of the rear lens group L2 with respect to the switching point of the AF home signal (AF home position) are calculated according to the result of focusing and the present focal length.

Then at steps S1725 and S1727, according to the amount of movement of the front lens group L1 and the rear lens group L2 obtained through the lens drive calculation process, the lens driving process is executed. In the lens driving process, the rear lens group L2 is driven together with the front lens group L1, and control is performed to bring the subject into focus.

When the movement of the lens is completed, at step S1729 the green lamp 228 is lit (i.e., current is passed through the green lamp) to notify the photographer that the shutter will be released, and the exposure process is executed at step S1731. The green lamp 228 only stays lit for a small amount of time and then is turned OFF.

After the exposure process has completed, at step S1733, the lens return process is executed, in which the front lens group L1 and the rear lens group L2 are returned to the positions they were at prior to movement at step S1727.

Then at steps S1735, S1737 and S1739, the film winding process is executed, and if the film is not at its end, control is returned, while if the end of the film has been reached, the rewinding process is executed and control returns.

[The Main Charging Process]

Figure 50:
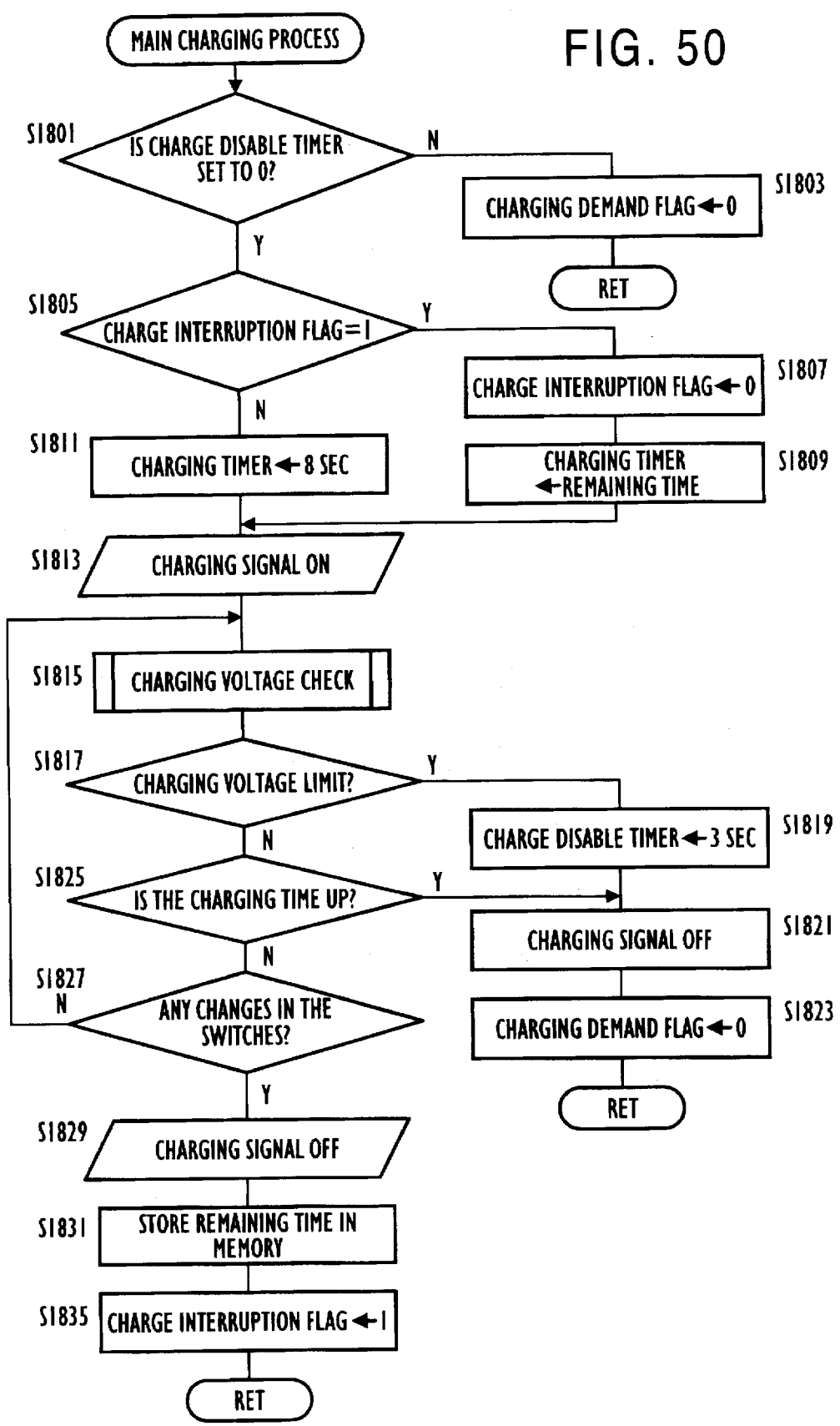
FIG. 50 is a flow chart of a main charging process of the zoom lens camera.

FIG. 50 shows a flow chart for the main charging process. The main charging process is the charging process that is called in the main process (FIG. 41) when the charging demand flag equals 1.

At step S1801, the CPU 210 judges whether or not the value of the charge disable timer is set 0. The charge disable timer is a timer in which the time during which charging is disabled is set. A charge disable time of three seconds is set when the flash capacitor 530 of the strobe device 231 is fully charged. If the time is not up at the charge disable timer at step S1801, at step S1803 the charging demand flag is set to 0, and the process is ended. In such a manner, while the charge disable timer is counting the three seconds during which charging is to be disabled, the CPU 210 prohibits charging unconditionally without checking the charging voltage. The charging can be interrupted (disabled) by setting the level of the terminal CHEN of the strobe device 231 to L.

If the time at the charge disable timer is up, at step S1805 the CPU 210 judges whether or not the charge interruption flag is set to 1. As will be described later, the charge interruption flag is set to 1 when the charging process is canceled before the completion thereof. In the present main charging process and in the photographing charging process, which will be described later, the charging process is deemed to have been completed normally when the charging voltage reaches a predetermined value, or when the charging time reaches a predetermined time (in the present camera, eight seconds). During charging, if the charging is interrupted owing to the operation of another switch, etc., the time spent on charging prior to interruption is deducted from the predetermined time, namely from eight seconds, and the remaining time is stored in the memory, and when charging is resumed, it is judged whether or not the charging voltage will reach the predetermined value within the remaining time.

Therefore, if the charge interruption flag is set to 1, the charge interruption flag is cleared, in other words set to 0, and a resumed charging process is performed by setting the charging timer to the remaining time which has been stored in the memory. If the charge interruption flag is not 1, namely if the charging process has not been interrupted at step S1805, charging is performed upon setting the charging timer to the predetermined charging, i.e., eight seconds.

In order to start charging, the CPU 210 turns ON the charging signal at step S1813. In other words, charging is started by setting the level of terminal CHEN of the strobe device 231 to be high (H). While the level at the terminal CHEN on the strobe device 231 is H, an A/D conversion is performed on the output of terminal RLS of the strobe device 231, and the converted output is input to the CPU 210. At step S1815, the CPU 210 checks the charging voltage based on the A/D converted voltage value. If the charging voltage has reached the upper limit at step S1817, then at step S1819, the CPU 210 disables charging for three seconds, by setting three seconds as the charge disable time in the charge disable timer, and then at step S1821, the CPU 210 stops the charging by making the voltage at the terminal CHEN of the strobe device 231 as low (L). Then the charging demand flag is set to 0 at step S1823 and the main charging process is completed.

If at step S1817, the CPU judges that the charging voltage has not reached the upper limit, at step S1825 it is judged whether or not the time is up at the charging timer. If the time is up at the charging timer, at step S1821 the charging is stopped by making the level at the terminal CHEN of the strobe device 231 as L, and at step S1823 the charging demand flag is set to 0 to indicate the completion of the charging process. For reference, if the main charging process is completed after the time of the charging timer is up, the charge disable time of three seconds is not set.

If the time of the charging timer is not up at step S1825, then at step S1827, the CPU judges whether the state of any of the switches has changed. If any change of state amongst the switches is detected, the charging process is interrupted, and the process corresponding to the operated switch is performed with priority. Therefore, upon detecting a change in the state of the switches, the CPU 210 sets the charging signal to OFF at step S1829 (i.e., sets the level at the terminal CHEN of the strobe device 231 to be low), and at step S1831 the remaining time indicated by the charging timer is stored in the memory, and at step S1835 the charge interruption flag is set 1 to indicate the interruption of charging, and the main charging process is completed. The remaining time stored in the memory at step S1831, and the charge interruption flag set at step S1835, are referred to at the time of execution of the next main charging process or the next photographing charging process.

[The Shutter Initialization Process]

Figure 51:
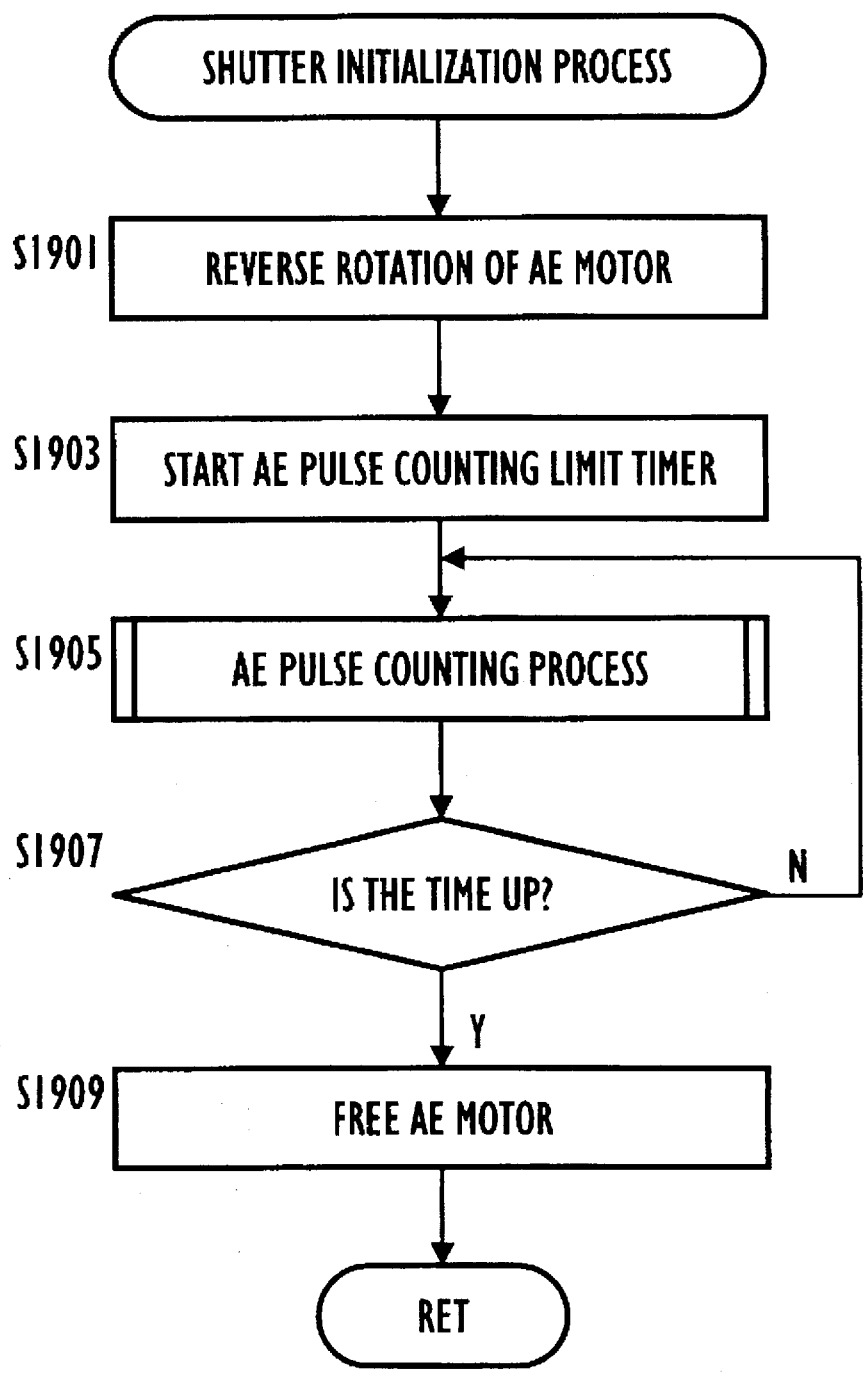
FIG. 51 is a flow chart of a shutter initialization process of the zoom lens camera.

FIG. 51 shows a flow chart for the shutter initialization process. In the shutter initialization process of the present embodiment, the AE motor 29, which drives the shutter 27, is driven in the shutter closing direction to fully close the shutter blades until the shutter blades come into contact with the stoppers.

At step S1901, the AE motor 29 is firstly driven in reverse (counterclockwise) to drive the shutter blades 27a in the closing direction. Then at step S1903 the AE pulse counting limit timer is started, and the AE pulse count process is called to wait for the time to be up at the AE pulse counting limit timer, while detecting the AE pulse (steps S1905, S1907). The AE pulse counting process is performed by the CPU 210 in combination with the AE pulse inputting circuit 221.

At steps S1907 and S1909, when the shutter blades 27a are completely shut and the AE motor 29 becomes incapable of driving, since the time will become up at the AE pulse counting limit timer, the AE motor 29 is freed when the time is up, and control is returned.

By the above process, the shutter 27 is set to the initial position at which the shutter blades 27a are completely shut.

[The Zoom Code Input Process]

Figure 52:
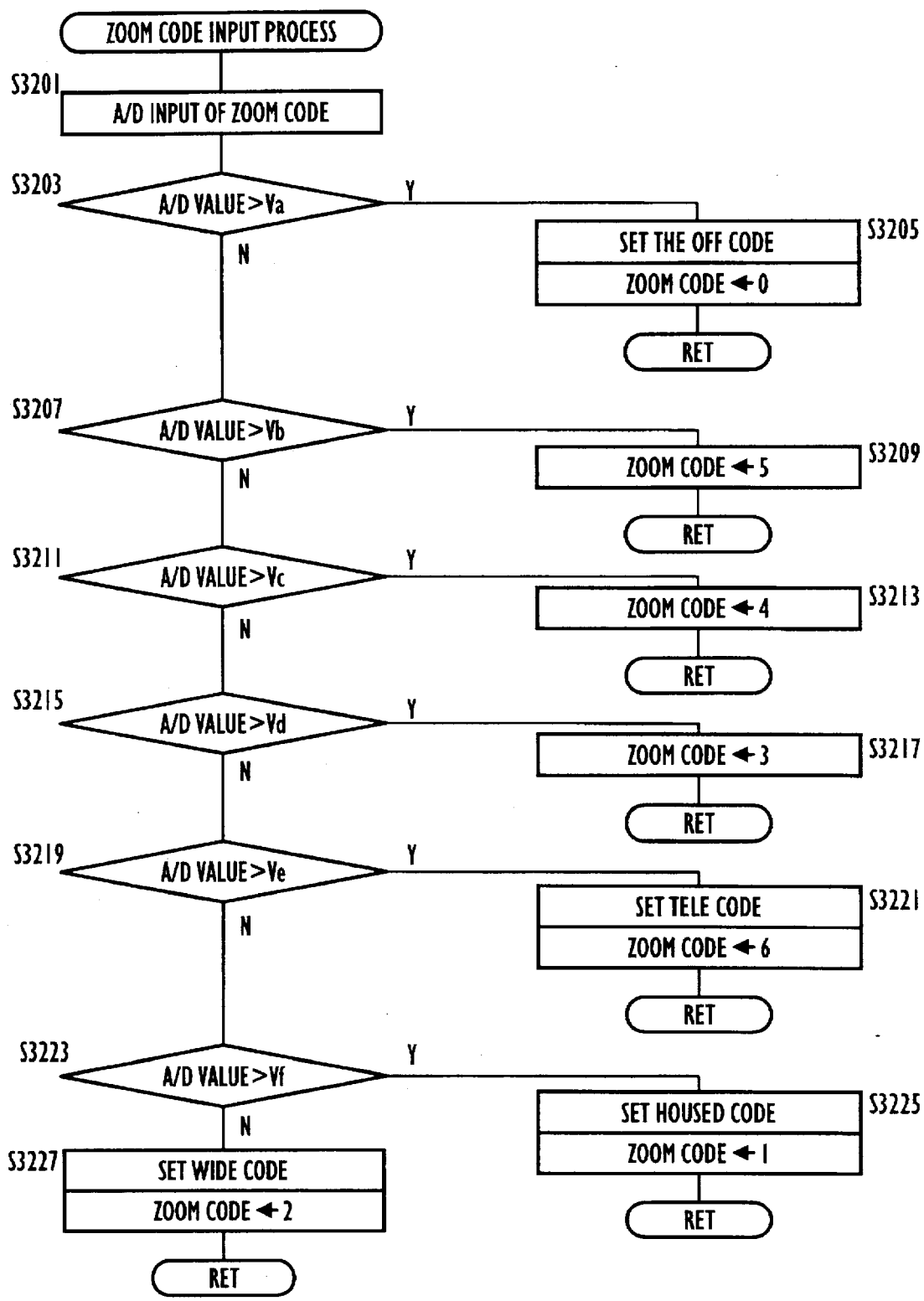
FIG. 52 is a flow chart of a zoom code input process of the zoom lens camera.

FIG. 52 shows a flow chart of the zoom code input process. In the zoom code input process, the zoom code is set based on the A/D converted value of the voltage input into the A/D conversion terminal of the CPU 210 from the zoom code information input circuit 219.

At step S3201, the output $V_O$ of the zoom code information input circuit 219 is input into the A/D terminal of the CPU 210. The CPU 210 compares the A/D converted value of the input voltage with the threshold voltages Va through Vf, and sets the zoom code corresponding to the input voltage. The setting of the zoom code is executed as follows.

At step S3203, the CPU 210 compares the A/D converted value with the threshold voltage Va. If the A/D converted value of the input voltage is greater than the threshold voltage Va at step S3203, the zoom code is set to 0 at step S3205, and control is returned.

If the A/D converted value of the input voltage is less than or equal to Va at step S3203, and greater than Vb at step S3207, the zoom code is set to 5 at step S3209.

If the A/D converted value of the input voltage is less than or equal to Vb at step S3207, and greater than Vc at step S3211, the zoom code is set to 4 at step S3213.

If the A/D converted value of the input voltage is less than or equal to Vc at step S3211, and greater than Vd at step S3215, the zoom code is set to 3 at step S3217.

If the A/D converted value of the input voltage is less than or equal to Vd at step S3215, and greater than Ve at step S3219, the zoom code is set to 6 at step S3221.

If the A/D converted value of the input voltage is less than or equal to Ve at step S3219, and greater than Vf at step S3223, the zoom code is set to 1 at step S3225.

If the A/D converted value of the input voltage is less than or equal to Vf at step S3223, the zoom code is set to 2 at step S3227.

Here, the codes identified by Vd, Ve and Vf, for which the interval between the threshold voltages is relatively large, are respectively assigned to the lens housed position (the zoom code=1), the "wide" end position (the zoom code=2) and the "tele" end position (the zoom code=6), which become reference points for the lens position. In such a manner, the correct zoom code will be set at least for the reference points even when the voltage input into the CPU 210 varies somewhat due to voltage fluctuations.

[The AF Pulse Confirmation Process]

Figure 53:
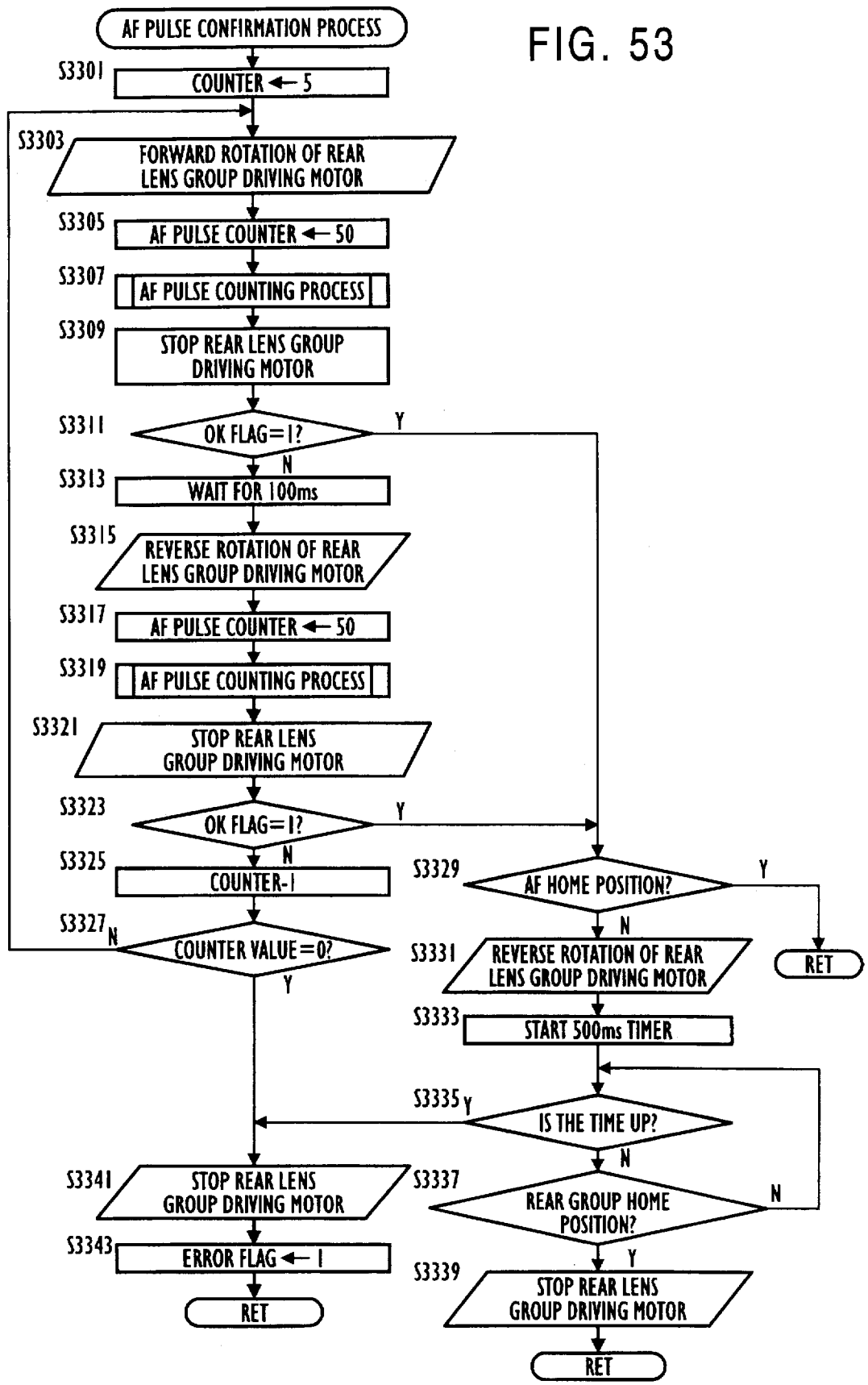
FIG. 53 is a flow chart of an AF pulse confirmation process of the zoom lens camera.

FIG. 53 shows a flow chart for the AF pulse confirmation process. In the AF pulse confirmation process the rear lens group driving motor 30 is driven alternately in the forward (clockwise) and reverse (counterclockwise) directions. For example, during driving of the rear lens group driving motor 30, if the rear lens group driving motor 30 is unable to rotate for some reason, by alternately driving the rear lens group driving motor 30 forward and in reverse, the cause of the obstruction of rotation of the rear lens group driving motor 30 may be removed, thus allowing the rear lens group L2 to move. In the present embodiment, the rear lens group driving motor 30 alternately rotates forward and in reverse, and after confirming that the rear lens group driving motor 30 has rotated more than a predetermined amount, the rear lens group L2 is moved to the AF home position. If this confirmation has not been made within five operations of alternate forward and reverse driving, or even if such a confirmation is made, if the rear lens group L2 does not move to the AF home position within the predetermined time, the rear lens group driving motor 30 is stopped, and the error flag is set to 1.

At step S3301, the value of the counter which defines the maximum number of times that the rear lens group driving motor 30 is driven alternately in the forward (clockwise) and reverse (counterclockwise) directions is set to 5.

Then at steps S3303, S3305 and S3307, the rear lens group driving motor 30 is firstly driven forward (clockwise), namely in the direction in which the rear lens group is retracted, the AF pulse counting process is performed upon setting the value of the AF pulse counter to 50, and waiting is performed until 50 AF pulses are output. When the value of the AF pulse counter becomes 50, at step S3309 the rear lens group driving motor 30 is stopped.

At step S3311 it is checked whether the OK flag is set, and if the OK flag is set, in other words if 50 AF pulses have been output, it is checked whether or not the rear lens group L2 is at the AF home position. If the rear lens group L2 is at the AF home position, control returns, while if the rear lens group L2 is not at the AF home position, at step S3331 and step S3335 the rear lens group driving motor 30 is driven in reverse (counterclockwise), namely in the direction in which the rear lens group L2 is moved towards the AF home position, and a 500 ms timer is started. Since the rear lens group L2 will normally reach the AF home position before the time of the 500 ms timer is up, the rear lens group driving motor 30 is stopped and control is returned when the rear lens group L2 reaches the AF home position (steps S3335, S3337, S3339). Here, if the rear lens group L2 does not reach the AF home position before the time of the 500 ms timer is up, at steps S3335, S3341 and S3343, the rear lens group driving motor 30 is stopped, and control is returned upon setting the error flag to 1.

Although the above is directed to a normal case, if the rear lens group L2 does not move easily the following processes are executed.

In the AF pulse counting process at step S3307, if the AF pulse is not output for a predetermined amount of time even though the rear lens group driving motor 30 is being driven, since this will mean that a condition is occurring in which the rear lens group driving motor 30 cannot move due to biting, etc., the OK flag is cleared. In this case, control proceeds to the rolling process, from steps S3311 to S3313. When control is at step S3313, after waiting for 100 ms, the rear lens group driving motor 30 is driven in reverse (counterclockwise) at step S3315. Then at steps S3317, S3319 and S3321, the value of the AF pulse counter is set to 50, and the AF pulse counting process is executed, and then the rear lens group driving motor 30 is stopped. In the AF pulse counting process, when 50 AF pulses are detected, the OK flag is set, and if 50 AF pulses are not detected within a predetermined time, the OK flag is cleared. Thus, if the rear lens group L2 moves during such reverse (counterclockwise) rotation of the rear lens group driving motor 30, control proceeds to the process at step S3329, while if the rear lens group L2 does not move, control proceeds to the process at step S3325.

At step S3325, the counter is decremented by one, and if the value of the counter is not 0, control returns to step S3303, and the processes from step S3303 are repeated. If the value of the counter becomes 0, namely if the rear lens group L2 is not moved even upon repeating the forward (clockwise) and reverse (counterclockwise) driving of the rear lens group driving motor 30 five times, since this will indicate that some form of trouble may be occurring with the lens driving system, at steps S3341 and S3343, the rear lens group driving motor 30 is stopped, and the error flag is set to 1, and control is returned.

[The AF Return Process]

Figure 54:
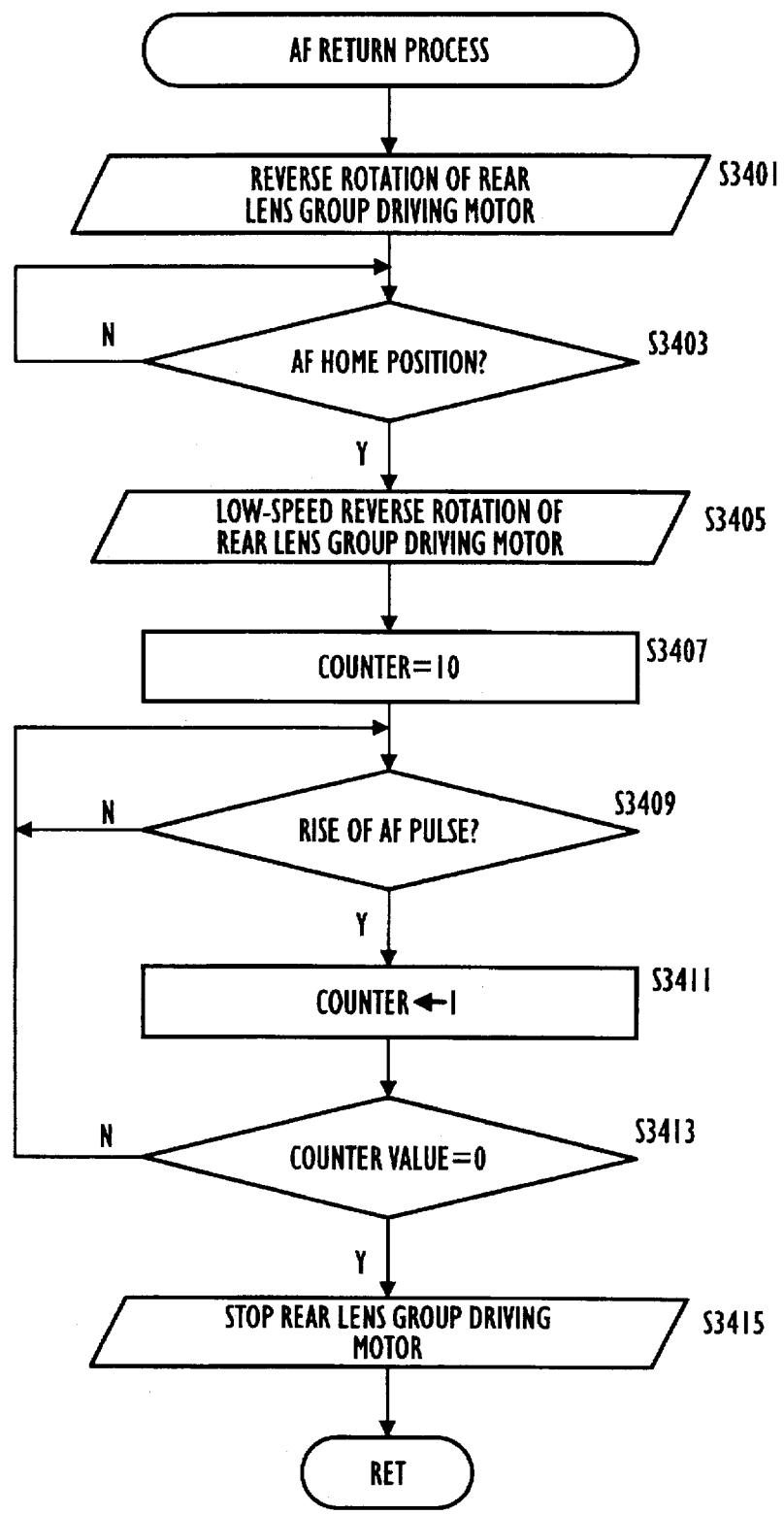
FIG. 54 is a flow chart of an AF return process of the zoom lens camera.

FIG. 54 shows a flow chart for the AF return process. In the AF return process the rear lens group L2 is returned to the AF home position.

At steps S3401 and S3403, the rear lens group driving motor 30 is driven in reverse (counterclockwise), namely in the direction in which the rear lens group is advanced, to advance the rear lens group L2 towards the AF home position and waiting is performed until the rear lens group L2 reaches the AF home position.

At steps S3405, S3407, S3409, S3411 and S3413, when the arrival of the rear lens group L2 at the AF home position is detected, via the photointerrupter 301, the driving of the rear lens group driving motor 30 is switched to low-speed reverse (counterclockwise) driving, and a value of 10 is set in the counter. The rise of the AF pulse is then counted and the counter is decremented by one on each count and waiting is performed until the value at the counter becomes 0.

At steps S3413 and S3415, when the value at the counter becomes 0, the rear lens group driving motor 30 is stopped, and control is returned. In such a manner, the rear lens group L2 surely stops at the AF home position.

In the present embodiment, after the rear lens group L2 reaches the AF home position, the driving of the rear lens group driving motor 30 is continued for another ten pulses. This is done since the driving pulse count for the rear lens group L2 is based on the switching of the AF home signal and so that the rear lens group L2 will definitely be at the AF home position in the standby condition.

[The Barrier Closing Process]

Figure 55:
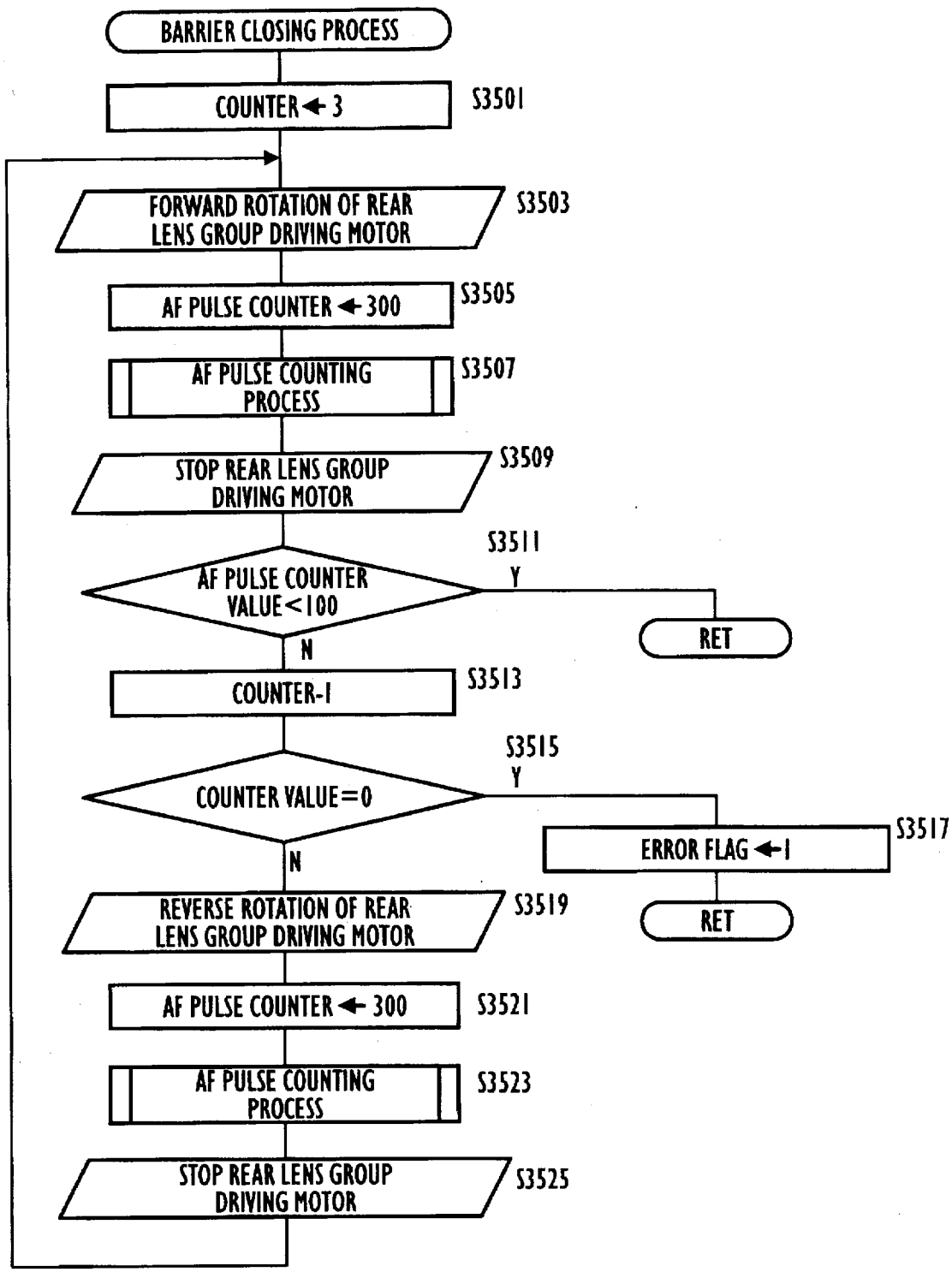
FIG. 55 is a flow chart of a barrier closing process of the zoom lens camera.

FIG. 55 shows a flow chart for the barrier closing process. In the barrier closing process the barrier is closed upon housing of the lenses.

Firstly, a value 3, which is the number of times the opening/closing process (described later) is to be repeated when a fault occurs, is set in the counter. In the present embodiment, the judgment whether the barrier closing process is completed normally, is made according to whether the rear lens group driving motor 30 has driven forward (clockwise) by a predetermined amount, namely, whether a predetermined number of AF pulses have been counted upon driving the rear lens group driving motor 30.

During forward (clockwise) driving of the rear lens group driving motor 30, if the predetermined number of AF pulses is not input from the AF pulse input circuit 222, it can be suspected that the barrier could not be closed due to some reason, or that the barrier closing process was executed with the barrier closed already.

Therefore, in the present embodiment, when the predetermined number of AF pulses is not counted upon forward (clockwise) driving of the rear lens group driving motor 30, the rear lens group driving motor 30 is once driven reverse (counterclockwise) by a predetermined amount, namely by an amount sufficient for opening the closed barrier, and then the rear lens group driving motor 30 is driven forward (clockwise) again. The number of times set at step S3501 is the value for restricting the number of times of execution of the process in which the rear lens group driving motor 30 is once driven reverse (counterclockwise) and then driven forward (clockwise) again (described above).

At step S3503, the rear lens group driving motor is driven forward (clockwise), namely, driven in the direction by which the barrier will close, and at step S3505 a value of 300 is set in the AF pulse counter, and at step S3507 the AF pulse counting process is called. In the AF pulse counting process the AF pulse counter, set at step S3505, is decremented based on the pulse signals output to the CPU 210 from the AF pulse input circuit 222 in synchronization with the rotation of the rear lens group driving motor 30.

The AF pulse counting process is ended when the pulse is not output within a predetermined time, or when the count value at the decremented AF pulse counter becomes 0.

After completion of the AF pulse counting process, at step S3509 the rear lens group driving motor 30 is stopped, and at step S3511, it is judged whether or not the AF pulse count remaining after being decremented in the AF pulse counting process is less than 100.

At step S3511, if the value of the AF pulse counter is less than 100, namely, if the value was decremented by 200 or more in the AF pulse counting process, it is judged that the barrier was closed normally, and the barrier closing process is ended. If the value of the AF pulse counter is 100 or more at step S3511, it is considered that the rear lens group driving motor 30 cannot rotate due to some reason and the elimination of the obstruction is attempted by once rotating the rear lens group driving motor 30 in reverse (counterclockwise), and then again forward (clockwise). In such a manner, the obstacle can be removed.

The control proceeds to step S3519, as long as the counter value does not become zero upon decrementing of the counter at step S3513. At step S3519, the rear lens group driving motor 30 is driven in reverse (counterclockwise), and a value of 300 is set in the AF pulse counter, and the AF pulse counting process is called. After completion of the AF pulse counting process at step S3523, the rear lens group driving motor 30 is stopped at step S3525, and the control returns to step S3503. Then at steps S3503, S3505, S3507 and S3509, the forward (clockwise) driving of the rear lens group driving motor 30, the setting of the AF pulse counter, the execution of the AF pulse counting process, and stopping of the rear lens group driving motor 30 are made. It is then judged at step S3511, whether or not the barrier has closed, based on the value of the AF pulse counter. In the present embodiment, since a value of 3 is set at the counter at step S3501, if the barrier is not closed, the above retrial process is repeated twice.

During the above process, if the barrier closes, at step S3511 the value of the AF pulse counter will be less than 100, and the barrier closing process is completed. In addition, after repeating the process, if the value of the AF pulse counter does not become less than 100, after the last of the repetitions, the barrier is judged not to be closed, and the barrier closing process is ended upon setting the error flag to 1 to indicate an occurrence of a fault.

[The Barrier Opening Process]

Figure 56:
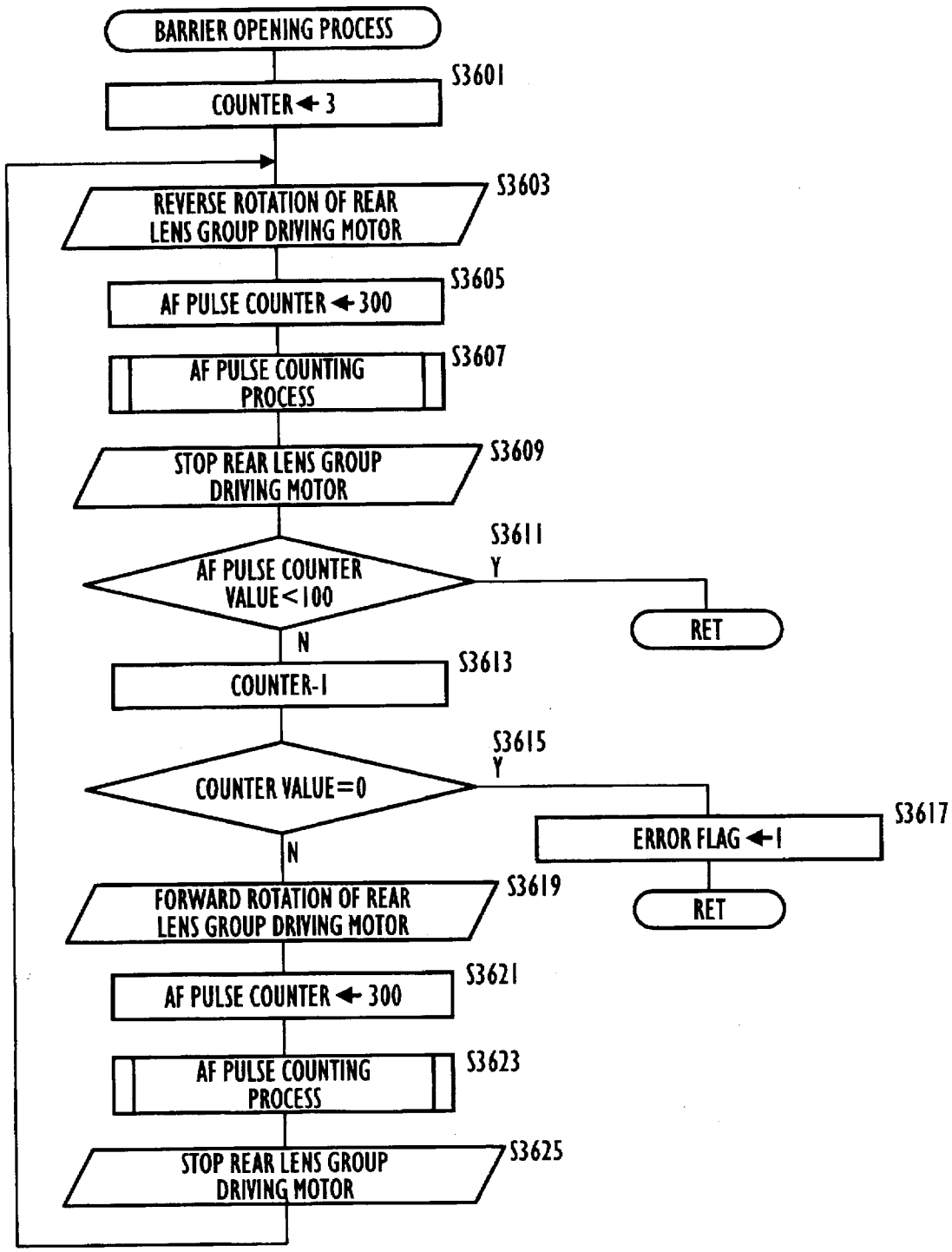
FIG. 56 is a flow chart of a barrier opening process of the zoom lens camera.

FIG. 56 shows a flow chart for the barrier opening process. In the barrier opening process the barrier is opened when the lenses are extended from the housed position.

First, a value of 3, which is the number of times of repetition of the process, is set at the counter at step S3601. Normally, the barrier opening process is called with the barrier being closed. However, the barrier opening process will be executed with the barrier open when, for example, the battery of the camera is changed with the lens being extended, i.e., the barrier is open. The barrier opening process may also be called when the lenses are housed without the barrier being closed because of some obstruction. If the rear lens group driving motor 30 is driven to open the barrier when the barrier is already open, the rear lens group driving motor 30 will not rotate because the barrier is open, and the AF pulse input circuit 222 will therefore not generate any pulses.

Therefore, in the present process, the rear lens group driving motor 30 is firstly driven in order to open the barrier, and if the opening of the barrier is not confirmed, in other words, if the AF pulse input circuit 222 does not output pulses to the CPU 210, the rear lens group driving motor 30 is once driven in the direction to close the barrier, and is again driven in the direction to open the barrier. The number of times set at the counter at step S3601 is the value for restricting the number of times of execution of the above-described process in which the barrier is opened again after closing it once, which is executed when it cannot be confirmed that the barrier was opened upon driving the rear lens group driving motor 30 for the first time.

At step S3603, the rear lens group driving motor is firstly driven in reverse (counterclockwise), namely, in the direction in which the barrier opens, and at step S3605 a value of 300 is set in the AF pulse counter, and at step S3607 the AF pulse counting process is called. In the AF pulse counting process the AF pulse counter is decremented based on the pulse signals output to the CPU 210 from the AF pulse input circuit 222 in synchronization with the rotation of the rear lens group driving motor 30.

The AF pulse counting process is ended when the pulses are not output to the CPU 210 from the AF pulse input circuit 222 within a predetermined time, or when the count value of the decremented AF pulse counter becomes 0.

After completion of the AF pulse counting process, at step S3609 the rear lens group driving motor 30 is stopped, and at step S3611, it is judged whether or not the AF pulse count remaining after being decremented in the AF pulse counting process is less than 100.

At step S3611, if the value of the AF pulse counter is less than 100, namely, if the value was decremented by 200 or more in the AF pulse counting process, it is judged that the barrier was opened normally, and the barrier opening process is ended. If the value of the AF pulse counter is 100 or more at step S3611, it is considered that the rear lens group driving motor 30 cannot rotate due to some reason and the elimination of the obstruction is attempted by once rotating the rear lens group driving motor 30 forward (clockwise), namely, in the direction in which the barrier closes, and then again in reverse (counterclockwise). In such a manner, the obstacle shall be removed.

At step S3613, the counter is decremented, and as long as the counter does not become 0 at step S3615, control proceeds to step S3619. At step S3619, the rear lens group driving motor 30 is driven forward (clockwise), a value of 300 is set in the AF pulse counter, and the AF pulse counting process is called. After completion of the AF pulse counting process at step S3623, the rear lens group driving motor 30 is stopped at step S3625, and control is returned to step S3603. Then the reverse (counterclockwise) driving of the rear lens group driving motor 30, the setting of the AF pulse counter, the execution of the AF pulse counting process, and the stopping of the rear lens group driving motor 30 are made, and it is judged whether or not the barrier is closed, according to the value of the AF pulse counter.

In the present embodiment, since the value of 3 is set in the counter at step S3601, if the barrier is not opened at step S3611, the processes from steps S3613 to S3609 via S3625 are repeated twice. If the barrier opens in this process, the AF pulse counter will be less than 100 at step S3611, and the barrier opening process is ended. If the value of the AF pulse counter does not become less than 100 after the last of the repetitions, it is judged that the barrier did not open and the barrier opening process is ended upon setting the error flag to 1 to indicate the occurrence of a fault.

[The Zoom Driving Process]

FIG. 57 shows a flow chart for the zoom driving process. The zoom driving process is a process to drive and control the whole unit driving motor 25 forward (clockwise) (i.e., in the direction in which the lenses are extended) by the amount corresponding to the value of the zoom pulse counter, in order to cause the front lens group L1 and the rear lens group L2 to become focused at the subject distance, as shown in FIG. 34.

In the zoom driving process, at step S3701 the value of the zoom pulse counter is firstly stored in memory as the number of zoom pulses. Then at steps S3703, S3705, S3707 and S3709, the zoom sequence is then set to 0 and the whole unit driving motor 25 is driven forward (clockwise), namely, in the advancing direction, the zoom drive check process is executed, and waiting is performed until the zoom sequence becomes 5, and control is returned when the zoom sequence becomes 5.

The zoom sequence is an identifier for identifying the operation sequence condition of the whole unit driving motor controlling circuit 60. A zoom sequence of 0 indicates that the switching of the zoom code, which serves as the reference point for the counting of the zoom pulses, has been detected, a zoom sequence of 1 or 2 indicates the condition where the zoom pulses are being counted, a zoom sequence of 3 indicates the activation of the reverse rotation brake, a zoom sequence of 4 indicates the short-circuit braking condition, and a zoom sequence of 5 indicates the open terminal condition (inactive condition) and thus the ending of the series of the zoom drive sequences.

[The AF Two-stage Extension Process]

Figure 58:
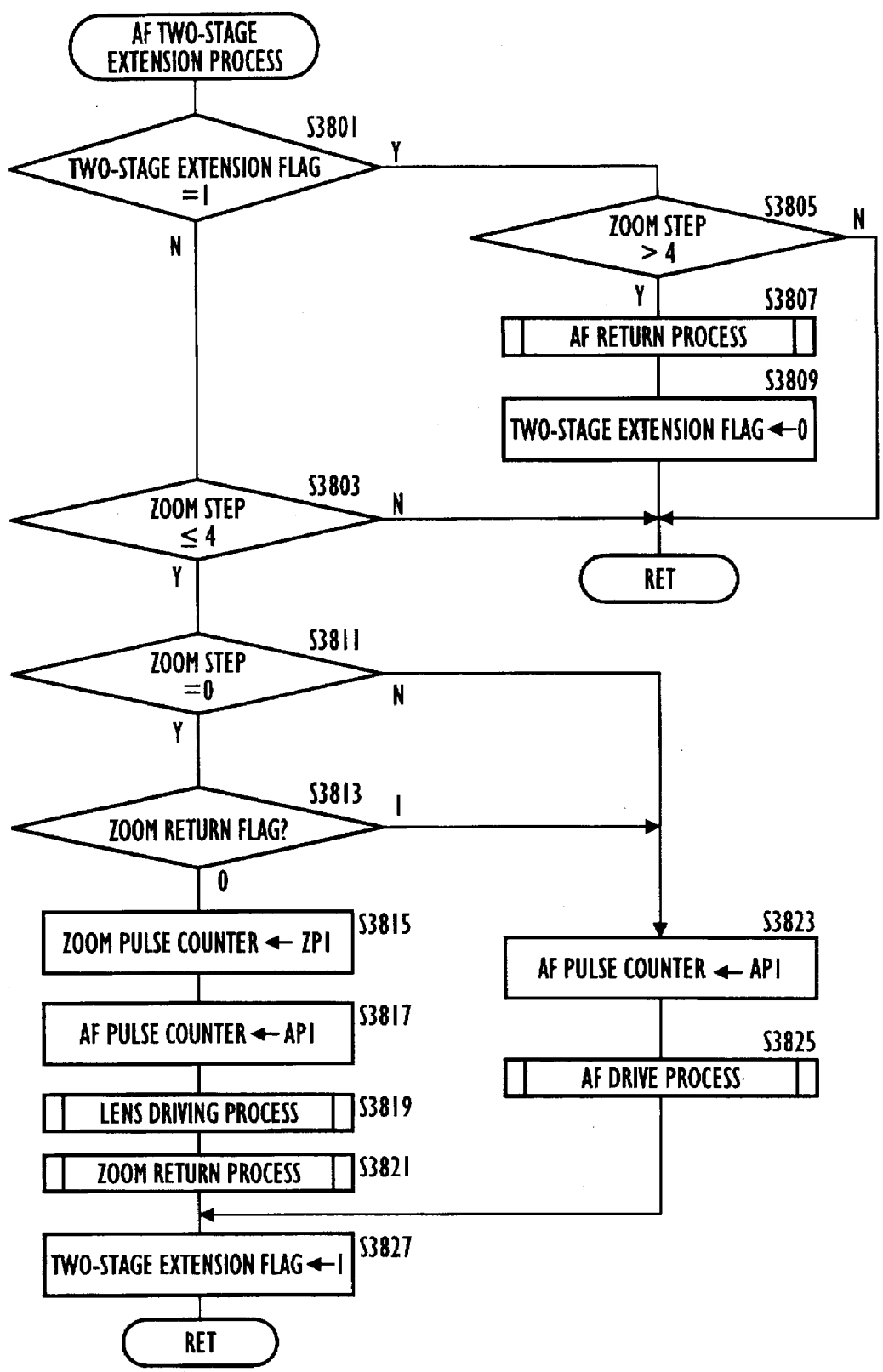
FIG. 58 is a flow chart of an AF two-stage extension process of the zoom lens camera.

FIG. 58 shows a flow chart for the AF two-stage extension process. The AF two-stage extension process is executed when the focal length of the lenses has been changed and is the process in which the rear lens group L2 is extended by a predetermined amount (AP1) from the AF home position when the lenses are positioned at the "wide" side.

When the AF two-stage extension process is called, at step S3801, the CPU 210 judges whether or not the rear lens group L2 is presently in the condition where it has been extended by a predetermined amount by the AF two-stage extension process. In the latest execution of the AF two-stage extension process, if the lenses were positioned at the "wide" end side (i.e., the zoom step was less than 4), the rear lens group L2 would have been extended by a predetermined amount and the two-stage extension flag would have been set to 1. If the zoom step was 4 or more when the previous AF two-stage extension process was executed, the rear lens group would not have been extended (would be positioned at the AF home position) and the two-stage extension flag would have been set to 0.

When the AF two-stage extension process is called with the two-stage extension flag being set to 1 at step S3801, then at step S3805, the CPU judges whether or not the zoom step corresponding to the present lens position is greater than 4. If the zoom step is greater than 4, namely the rear and the front lens groups L1 and L2 are at the "tele" side, at steps S3807 and S3809, the AF return process is called to return the already extended rear lens group L2 to the AF home position, and control is returned upon clearing the two-stage extension flag, i.e., setting the flag to 0. If the present zoom step is 4 or less, although the rear lens group L2 needs to be extended, since the rear lens group L2 has already been extended when the previous AF two-stage extension process was executed, control is returned without executing any process.

If the two-stage extension flag is not 1 at step S3801, namely, if the flag is set to 0, this would mean that the rear lens group L2 was positioned at the AF home position at the end of the previous AF two-stage extension process. In this case, at step S3803 the CPU 210 judges whether or not the zoom step is 4 or less, and if the zoom step is greater than 4 at step S3803, since it is not necessary to extend the rear lens group L2, in other words, it is sufficient for the rear lens group L2 to remain at the AF home position, the extension of the rear lens group L2 is not executed, and control is returned. If the zoom step is 4 or less, namely if the lenses are positioned at the "wide" side, the process of extending the rear lens group L2 is executed. However, process method will differ according to whether or not the lenses are at the "wide" end.

At step S3811, it is judged whether or not the value of the zoom step is 0, in other words, whether the lenses are positioned at the "wide" end position. If the lenses are positioned at the "wide" end position, the rear lens group driving motor 30 may be connected with the barrier opening device and is not connected to the rear lens group moving device. In other words, if the rear lens group driving motor 30 is driven in the state where the lenses are positioned at the "wide" end position, the rear lens group L2 may not be driven and the opening/closing of the barrier may be executed instead.

On the other hand, when the lenses are at the "tele" position, rather than at the "wide" position, the rear lens group driving motor 30 will always be connected to the rear lens group moving device. Therefore, when the lenses are not positioned at the "wide" end, namely the zoom step is not 0 at step S3811, the rear lens group L2 can be made to extend from the AF home position by an amount corresponding to the AF pulse number AP1 by setting the predetermined value AP1 at the AF pulse counter (step S3823) and calling the AF drive process at step S3825. After extending the rear lens group L2, the CPU 210 sets the two-stage extension flag to 1, and control is returned.

When the value of the zoom step is 0, namely when the lenses are positioned at the "wide" end at step S3811, as already described, a possibility exists that the rear lens group driving motor 30 may be connected to the barrier opening device. However, as long as the AF two-stage extension process is called during the lens return process, the rear lens group driving motor 30 is guaranteed to be connected with the rear lens group moving device. Therefore at step S3813, the process is branched according to the zoom return flag, which indicates whether or not the AF two-stage extension process being executed was called in the lens return process. If the present AF two-stage extension process was called in the lens return process, the zoom return flag would be set to 1. In such a case, at step S3823 and step S3825, only the driving of the rear lens group L2 is executed.

On the other hand, if the present AF two-stage extension process was called from a process other than the lens return process, the zoom return flag would be set to 0, and the CPU 210 will therefore execute the processes from step S3815.

At steps S3815 and S3817, the CPU 210 sets the predetermined values ZP1 and AP1 respectively in the zoom pulse counter and the AF pulse counter, and at step S3819 the lens driving process is called, and the front and rear lens groups L1 and L2 are firstly moved by an amount corresponding to the zoom pulse ZP1, by driving the whole unit driving motor 30, and simultaneously the rear lens L2 is moved by an amount corresponding to the AF pulse AP1, by driving the rear lens group driving motor 30. After that, in the zoom return process at step S3821, the front and the rear lens groups L1 and L2 are returned by an amount corresponding to the value ZP1, by driving the whole unit driving motor 25. That is, the lenses are once moved to the "tele" position by the predetermined amount so that the rear lens group driving motor 30 is surely engaged with the driving device of the rear lens group L2, the rear lens group L2 is extended by driving the rear lens group driving motor 30, and after that, by returning the front and rear lenses toward the "wide" position by the predetermined amount, eventually the rear lens group L2 is only moved toward the "wide" position.

As described above, at the point at which the AF two-stage extension process is ended, if the lenses are at the "wide" position (i.e., the zoom step is not more than 4), the rear lens group L2 would be extended by a predetermined amount and the two-stage extension flag would be set to 1. If the lenses are at the "tele" position (i.e., the zoom step is greater than 4), the rear lens group L2 would be positioned at the AF home position, and the two-stage extension flag would be set 0.

[The Zoom Return Process]

Figure 59:
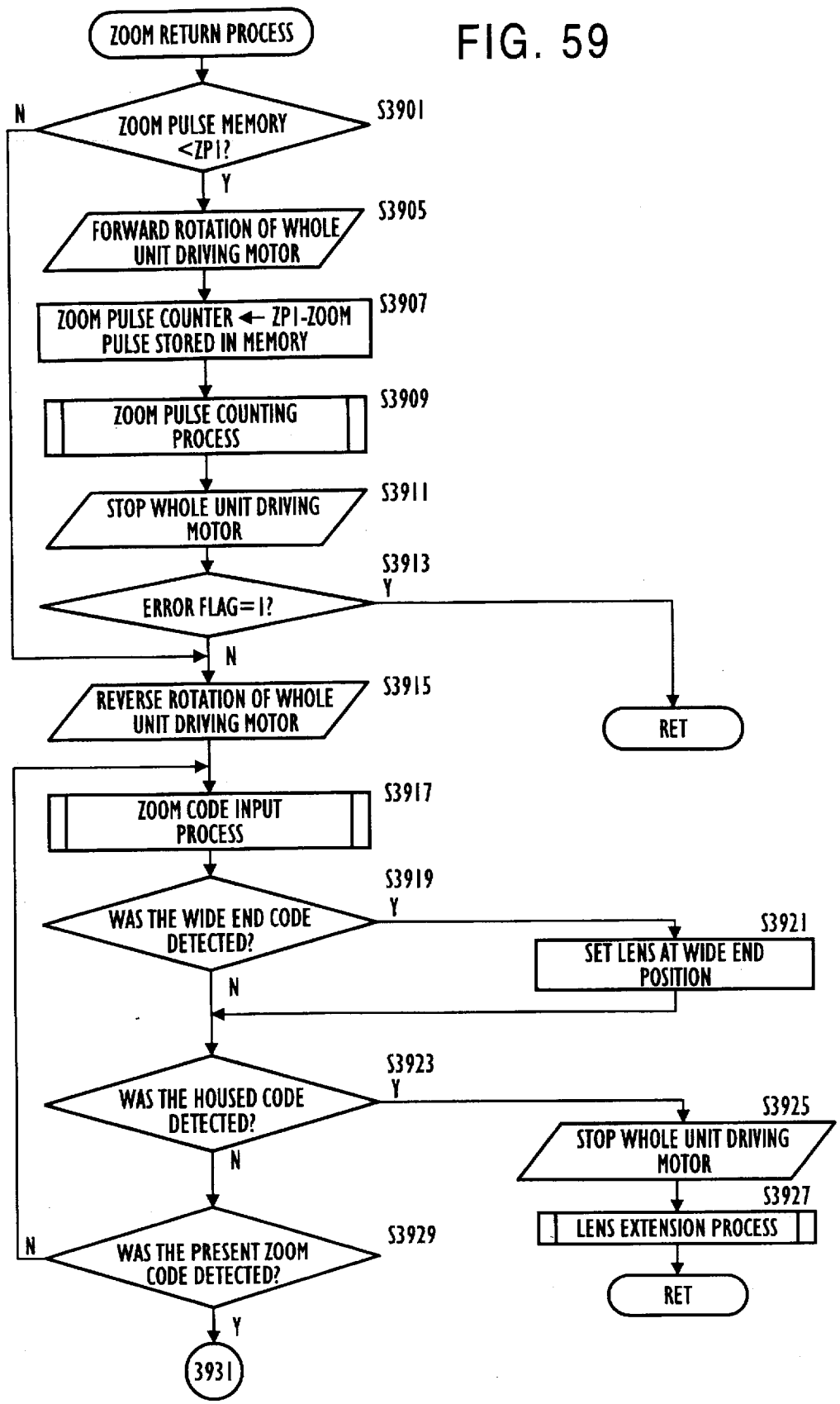
FIG. 59 is a flow chart of a zoom return process of the zoom lens camera.

FIG. 59 shows a flow chart for the zoom return process. The zoom return process is the process in which the front lens group L1 and the rear lens group L2 are returned to the standby position at which they were positioned prior to being moved in the lens driving process in the photographing process. In other words, in this process the whole unit driving motor 25 is driven in reverse (counterclockwise) by an amount corresponding to the second zoom pulse ZP2 from the switching point at the housed side of the present zoom code, in order to return the front lens group L1 and the rear lens group L2 to the standby position, and is then stopped upon being rotated forward (clockwise) by an amount corresponding to the third zoom pulse ZP3, to eliminate backlash to some degree, as shown in FIG. 34, i.e., the lens driving.

In the zoom return process at steps S3901, S3905, S3907, S3909 and S3911, it is checked whether or not the pulse number stored in the zoom pulse memory is less than the first zoom pulse value ZP1, and if it less, the whole unit driving motor 25 is driven forward (clockwise), namely driven for movement in the tele direction. Then the value of the pulse, obtained by deducting the drive pulse value stored in the zoom pulse memory from the first zoom pulse value ZP1, is set in the zoom pulse counter, and the zoom pulse counting process is executed to wait until the value of the zoom pulse counter becomes 0. When the value becomes 0, namely when the whole unit driving motor has been driven by an amount corresponding to the value of the first zoom pulse ZP1 from the switching point of the present zoom code, the whole unit driving motor 25 is stopped. In such a process, when the lenses are stopped around the "tele" position switching point of the present zoom code, the zoom code may become unstable during the initial stages of passing current to the whole unit driving motor 25, and the standby position may shift. For the purpose of avoiding such an occurrence, the whole unit driving motor 25 is driven forward (clockwise) by an amount corresponding to the value of the first zoom pulse ZP1 so that the zoom code will definitely turn OFF. Then at step S3913, if the error flag is set to 1, control is returned, and if the error flag is not set to 1 control proceeds to step S3915.

If the drive pulse number stored in the zoom pulse memory equals the first zoom pulse number ZP1, since this means that the lenses have already been moved to the position at which the present zoom code turns OFF, the process of driving the whole unit driving motor 25 is skipped.

At step S3915, the whole unit driving motor 25 is driven in reverse (counterclockwise), namely, driven for movement in the "wide" direction. Then at steps S3917, S3919, S3923 and S3929, the zoom code input process is called to detect the zoom code, and it is checked whether the "wide" code is detected, whether the housing code is detected, and whether the present zoom code is detected. If the "wide" code was detected, the lens "wide" position is set, while if the housed condition is detected, the whole unit driving motor 25 is stopped and control is returned after executing the lens extension process (steps S3919, S3921 and S3923, or at steps S3923, S3925 and S3927).

If the present zoom code is detected at step S3929, then at step S3931 the zoom code input process is executed. Waiting is then performed until the OFF code is detected, namely, until the present zoom code turns OFF (step S3933). When the OFF code is detected, the second zoom pulse value ZP2 is set at the zoom pulse counter and the zoom pulse counting process is called to perform waiting until the value at the zoom pulse counter becomes 0 (steps S3935, S3937).

At step S3939, upon returning from the zoom pulse counting process, the whole unit driving motor 25 is stopped. At steps S3941, S3943, S3945 and S3947, if the error flag was set to 1, namely, if the return was performed without the value at the zoom pulse counter becoming 0, control is returned without executing any process. While if the error flag was not set, the whole unit driving motor 25 is driven in a forward (clockwise) direction, the backlash elimination pulse number ZP3 is set at the zoom pulse counter, and the zoom pulse counting process is called to wait for the value at the zoom pulse counter to become 0. Then at step S3949, upon returning from the zoom pulse counting process, the whole unit driving motor 25 is stopped and control is returned.

Thus by the zoom return process, the front lens group L1 is moved rearwardly to the standby position, which is retracted by the value of the second zoom pulse ZP2 from the rear end edge of the present zoom code. At the standby position, backlash during a rotation of the whole unit driving motor 25 in the "tele" direction is substantially removed.

[The Zoom Standby Confirmation Process]

Figure 60:
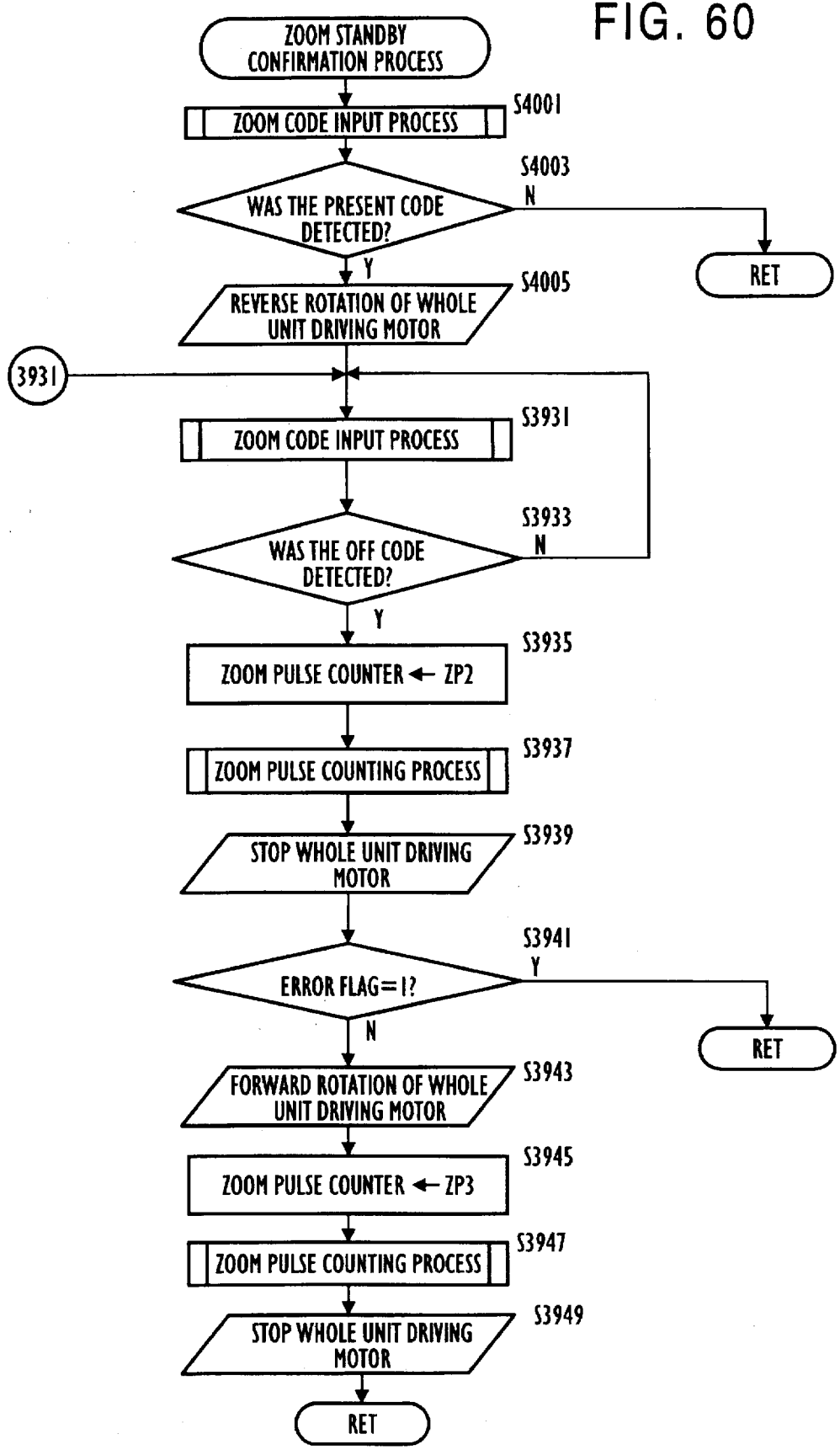
FIG. 60 is a flow chart of a zoom return process and a zoom standby confirmation process of the zoom lens camera.

FIG. 60 shows a flow chart for the zoom standby confirmation process. The zoom standby confirmation process is the process called in the photographing process, in which, when the photometering switch SWS is ON, it is confirmed whether or not the lenses are positioned at the correct standby position, and if the lenses are not at the correct standby position, the lenses are moved to the correct standby position. The processes after step S3931 of the zoom standby confirmation process, are the same as those of the zoom return process.

In the zoom standby confirmation process, at steps S4001 and S4003, the zoom code input process is called and the zoom code is input, and if the present zoom code is not detected, control is returned since it is assumed that the lenses are at the correct standby position. If the present zoom code is detected at step S4003, since this means that the lenses have moved from the standby position, at step S4005, the whole unit driving motor 25 is driven in reverse (counterclockwise), namely driven in the direction for movement to the "wide" side, and control proceeds to step S3931, and the zoom code input process is executed.

The detection of the OFF code is then waited for and when the OFF code is detected, the second zoom pulse number ZP2 is set in the zoom pulse counter, and the zoom pulse counting process is called to wait for the value at the zoom pulse counter to become 0 (steps S3933, S3935 and S3937).

At step S3939, upon returning from the zoom pulse counting process, the whole unit driving motor 25 is stopped. At steps S3941, S3943, S3945 and S3947, if the error flag was set to 1, namely if control was returned without the value at the zoom pulse counter becoming 0, the control is returned without executing any process. While if the error flag was not set, the whole unit driving motor 25 is driven in a forward (clockwise) direction, the backlash elimination pulse number ZP3 is set at the zoom pulse counter, and the zoom pulse counting process is called to wait for the value at the zoom pulse counter to become 0. Then at step S3949, upon returning from the zoom pulse counting process, the whole unit driving motor 25 is stopped and control is returned.

As above described, in the zoom standby confirmation process, the front lens group L1 and the rear lens group L2 are moved to the standby position, which is retracted by a predetermined distance from the switching position at the "wide" side of the present zoom code. when the present zoom code corresponding to the zoom step is detected.

[The Photographing Charging Process]

Figure 61:
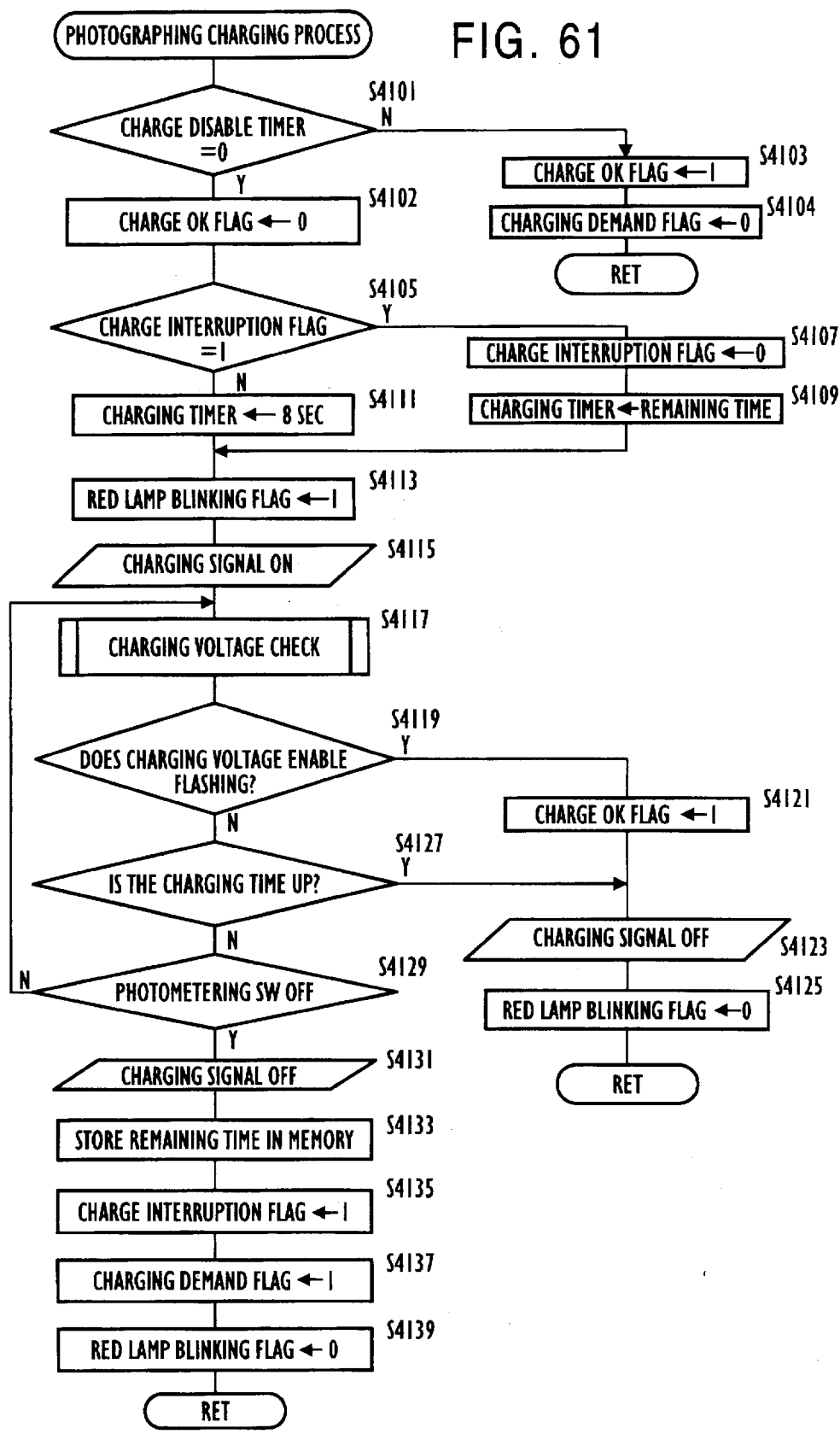
FIG. 61 is a flow chart of a photographing charging process of the zoom lens camera.

FIG. 61 shows a flow chart for the photographing charging process. The photographing charging process is the process executed when the photometering switch SWS is ON, and is the charging process called when it is judged in the photographing process that strobe flashing is necessary.

When the photographing charging process is called, at step S4101 the CPU 210 judges whether or not the charge disable timer is set to 0. The charge disable timer is the timer that times the period during which charging is disabled and a charge time of three seconds is set at this timer when the flash capacitor 530 of the strobe device 231 becomes fully charged in the main charging process shown in FIG. 41. In such a manner, if the time of the charge disable timer is not up (i.e., the timer value is not 0), although the charging of the flash capacitor 530 will be disabled, strobe flashing will be enabled since the capacitor 530 is almost fully charged. Therefore if the time is not up at the charge disable timer at step S4101, then at step S4103 the charge-OK flag is set to 1 to indicate that the strobe can be flashed, and at step S4104 the charging demand flag is set to 0, and control is returned upon ending the photographing charging process.

The time will not be up at the charge disable timer at step S4101, if the strobe device 231 is not fully charged or if three or more seconds have passed since the strobe device 231 was fully charged. In such cases, since charging is not disabled, and the CPU 210 sets the charge-OK flag to 0 at step S4102, and the processes for charging after step S4105 are executed.

At step S4105, the CPU 210 judges whether or not the charge interruption flag is set to 1. When a switch operation is performed while the main charging process is being executed, the charging process is interrupted and the process corresponding to the operated switch is executed, and in this process the charge interruption flag is set to 1.

If the charge interruption flag is set to 0, that is if the main charging process was not interrupted at step S4105, a predetermined limit time (8 seconds) is set at the charging timer in order to restrict the charging time. If the charge interruption flag is set to 1 at step S4105, since the charging will be resumed, the charge interruption flag is cleared (set to 0) and the amount of the charge limiting time remaining at the point at which charging was interrupted is set at the charging timer (steps S4107 and S4109). In such a manner, even if charging is interrupted, a part of the predetermined charging limit time (8 seconds) will already have been spent in charging in the charging process prior to the interruption. Since the charging time for the charging process after interruption is set to the part of the predetermined charging limit time (8 seconds) remaining after the above mentioned spent time, charging will have been performed for the predetermined charging time when the charging is ended with the time becoming up at the timer.

After the charging timer is set at step S4111 or S4109, the CPU 210 sets the red lamp blinking flag to 1, and the red lamp 227 is blinked. Although the charging of the strobe flash capacitor 530 is executed in the main charging process, without being recognized thereof by the photographer, since the charging in the photographing charging process is executed while the photographer is pressing the shutter button 217 halfway down, it is preferred to notify the photographer that charging is in progress. For this purpose, in the photographing charging process, the red lamp 227 is blinked so that the photographer may recognize that charging is in progress.

When the charging timer is set, at step S4115 the charging signal is set to ON, namely the level at the terminal CHEN of the strobe device 231 is set to be H, and charging is started. The output of the terminal RLS of the strobe device 231, which corresponds to the charging voltage, is input to the CPU 210 upon undergoing the A/D conversion. At step S4117 the CPU 210 checks the A/D converted charging voltage. If the charging voltage has reached the level enabling strobe flashing at step S4119, then at step S4121 the CPU 210 sets the charge-OK flag to 1 to indicate that strobe flashing is enabled, and at step S4123 the charging is stopped by setting the level at the terminal CHEN of the strobe circuit 500 to low (L), and at step S4125 the red lamp blinking flag is set to 0, and the blinking of the red lamp is stopped. In such a manner, the photographer may recognize that the charging process is complete, namely that the condition is no longer that in which the strobe cannot be flashed, in other words, photographing is now possible.

At step S4119, if the CPU 210 judges that the charging voltage has not reached the value enabling strobe flashing, then at step S4127 it is judged whether or not the time at the charging timer is up. If the time at the charging timer is up, then at step S4123 the level at the terminal CHEN of the strobe circuit 500 is set to low (L) to stop charging, and at step S4125 the red lamp blinking flag is set to 0 to end the blinking of the red lamp. If the time is up at step S4127, the charge-OK flag will not be set to 1, since the charging voltage will not have reached the level at which flashing is enabled.

If the time of the charging timer is not up at step S4127, then at step S4129 the CPU 210 judges whether or not the photometering switch SWS is OFF. If the photometering switch SWS is ON, the processes from steps S4117 through S4127 are repeated. In such a manner, as long as the shutter button 217 is at least pressed halfway, charging is executed until the charging voltage reaches the level enabling flashing or until the charging time (eight seconds) has elapsed.

At step S4129, if the photometering switch SWS is judged to be OFF, namely if the half-pressed condition of the shutter button is canceled during charging, then at step S4131 the CPU 210 makes the charging signal OFF, namely the CPU 210 turns OFF the charging signal, i.e., sets the level at the terminal CHEN of the strobe circuit 500 to low, and at step S4133 the remaining time, indicated by the charging timer, is stored in the memory, and at step S4135 the charge interruption flag is set to 1 to indicate that the charging has been interrupted. Then in order to resume the execution of the remaining charging process canceled in the main charging process, at step S4137 the charging demand flag is set to 1, and then at step S4139 the red lamp blinking flag is set 0 to stop the blinking of the red lamp 227, and the photographing charging process is ended. As above described, the remaining time stored in the memory at step S4133, and the charge interruption flag and the charging demand flag, are referenced during the execution of the main charging process.

[The Focusing Process]

Figure 62:
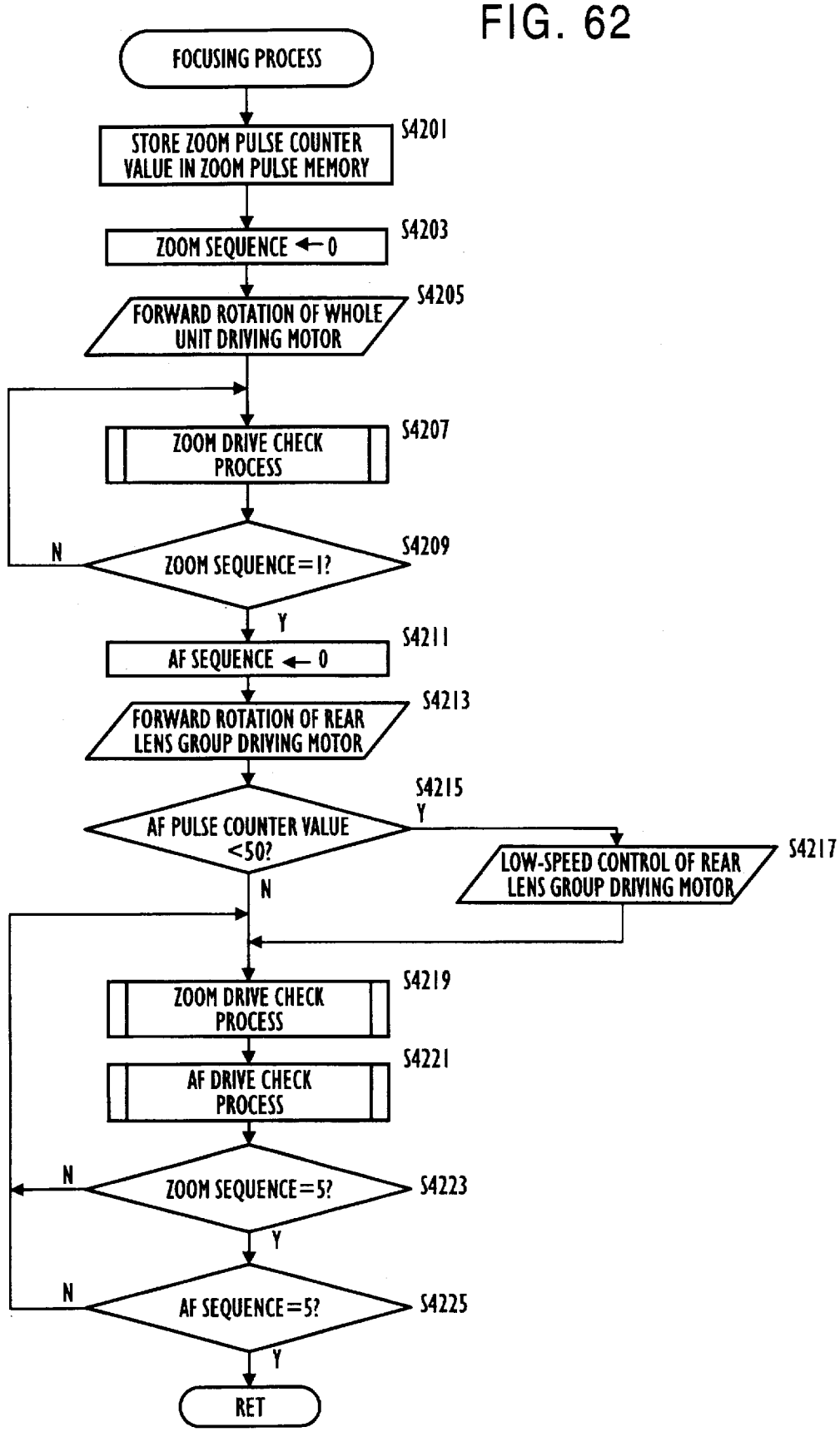
FIG. 62 is a flow chart of a focusing process of the zoom lens camera.

FIG. 62 shows a flow chart for the focusing process. In the focusing process, the whole unit driving motor 25 is driven forward (clockwise) (i.e., in the direction in which the lenses are extended), and the rear lens group driving motor 30 is driven forward (clockwise) (i.e., in the retracting direction in which the rear lens group L2 is retracted) based on the whole unit driving motor drive pulse number and the rear lens group driving motor drive pulse number calculated in the lens drive calculation process, to thereby move the front lens group L1 and the rear lens group L2 to the focused position, (see lens drive of FIG. 34). The present focusing process is characterized in that both the whole unit driving motor 25 and the rear lens group driving motor 30 are driven at the same time, i.e., driven in parallel.

In the focusing process, the zoom pulse counter value, namely, the number of pulses, calculated in the lens drive calculation process, by which the whole unit driving motor 25 is driven from the switching point at the housed side of the present zoom code, is written into of the zoom pulse memory at step S4201. The zoom sequence is then set to 0, and the whole unit driving motor 25 is driven forward (clockwise), and the driving check process is executed to wait for the zoom sequence to become 1, namely for the present zoom code to be detected (i.e., turned from OFF to ON), and when the zoom sequence becomes 1, the AF sequence is set to 0 (steps S4203, S4205, S4207, S4209 and S4211).

The rear lens group driving motor 30 is then driven forward (clockwise), and it is checked whether or not the value at the AF pulse counter is less than 50. If the value is less than 50, the control of the rear lens group driving motor 30 is changed to low-speed control (i.e., pulse width modulation (PWM) controlling), while if the value is not less than 50, control proceeds to the zoom drive check process (steps S4213, S4215, S4217 and S4219, or at steps S4213, S4215 and S4219).

Waiting is then performed for both the zoom sequence and the AF sequence to become 5, and when both become 5, namely when both the whole unit driving motor 25 and the rear lens group driving motor 30 stop, control is returned (steps S4219, S4221, S4223 and S4225).

In the focusing process, since both the whole unit driving motor 25 and the rear lens group driving motor 30 are driven at the same time, the time required for focusing by moving the front lens group L1 and the rear lens group L2 to the focused position is shortened.

[The Exposure Process]

Figure 63:
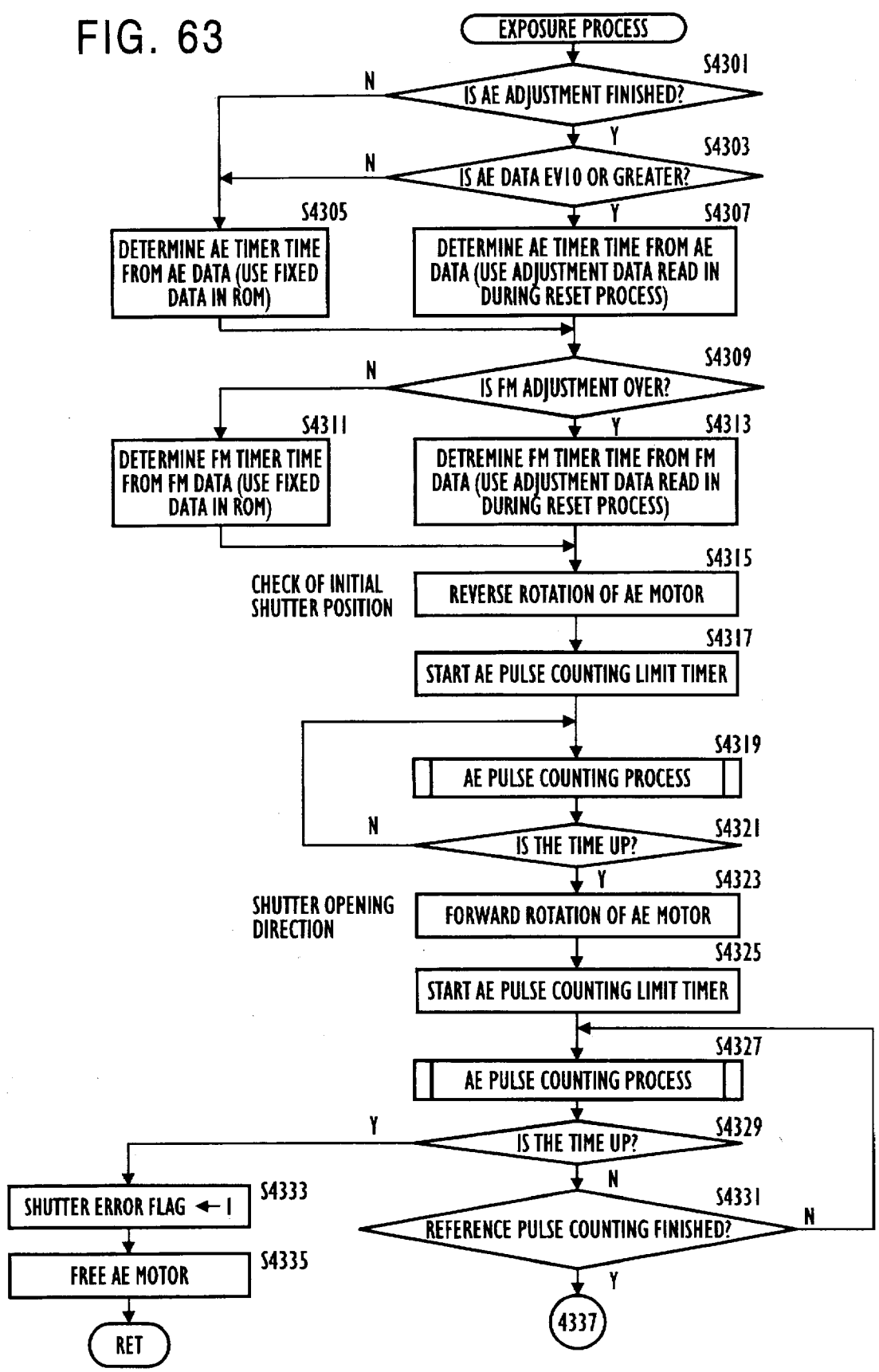
FIGS. 63, 64 and 65 show a flow chart of an exposure process of the zoom lens camera.
Figure 64:
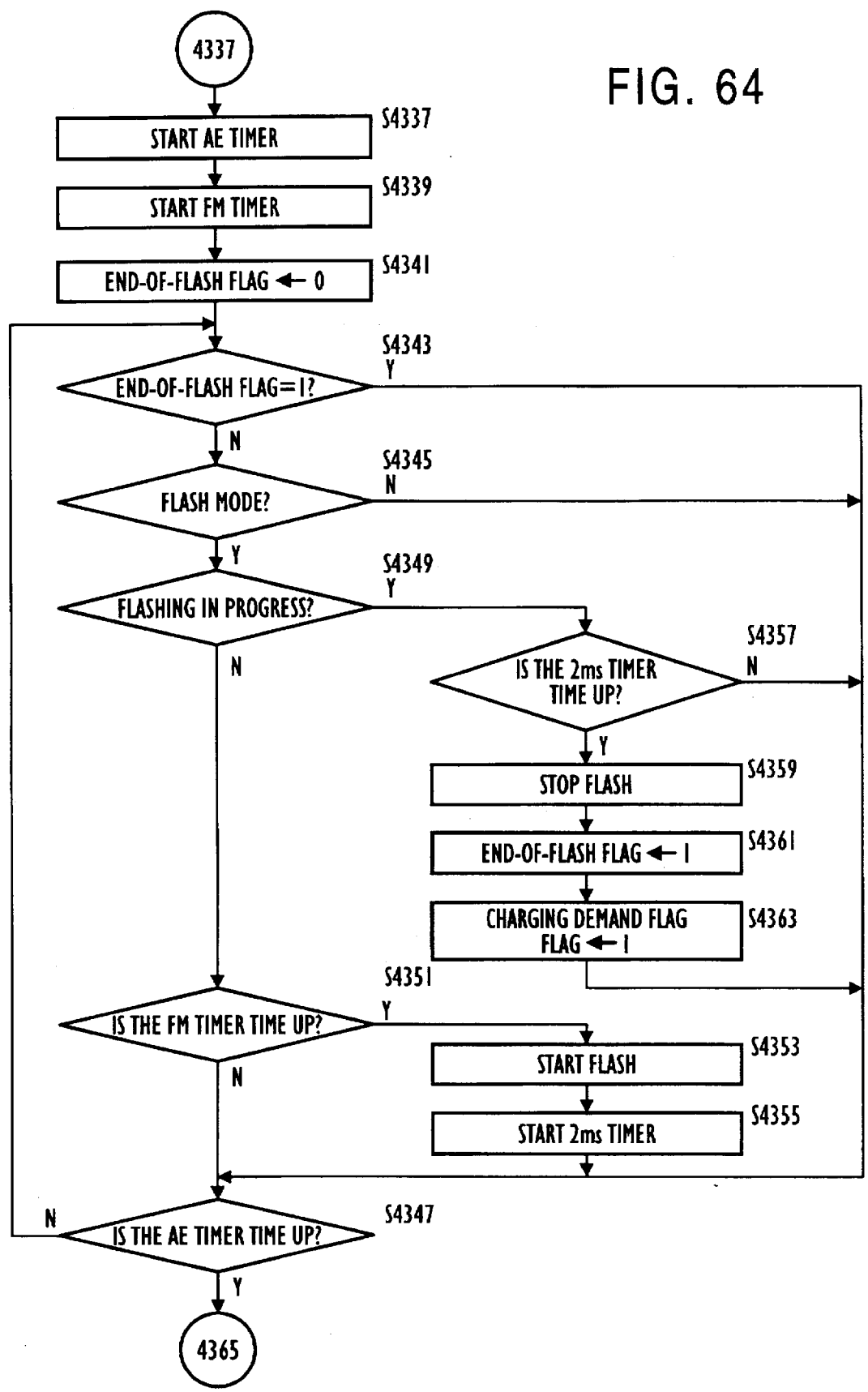
Figure 65:
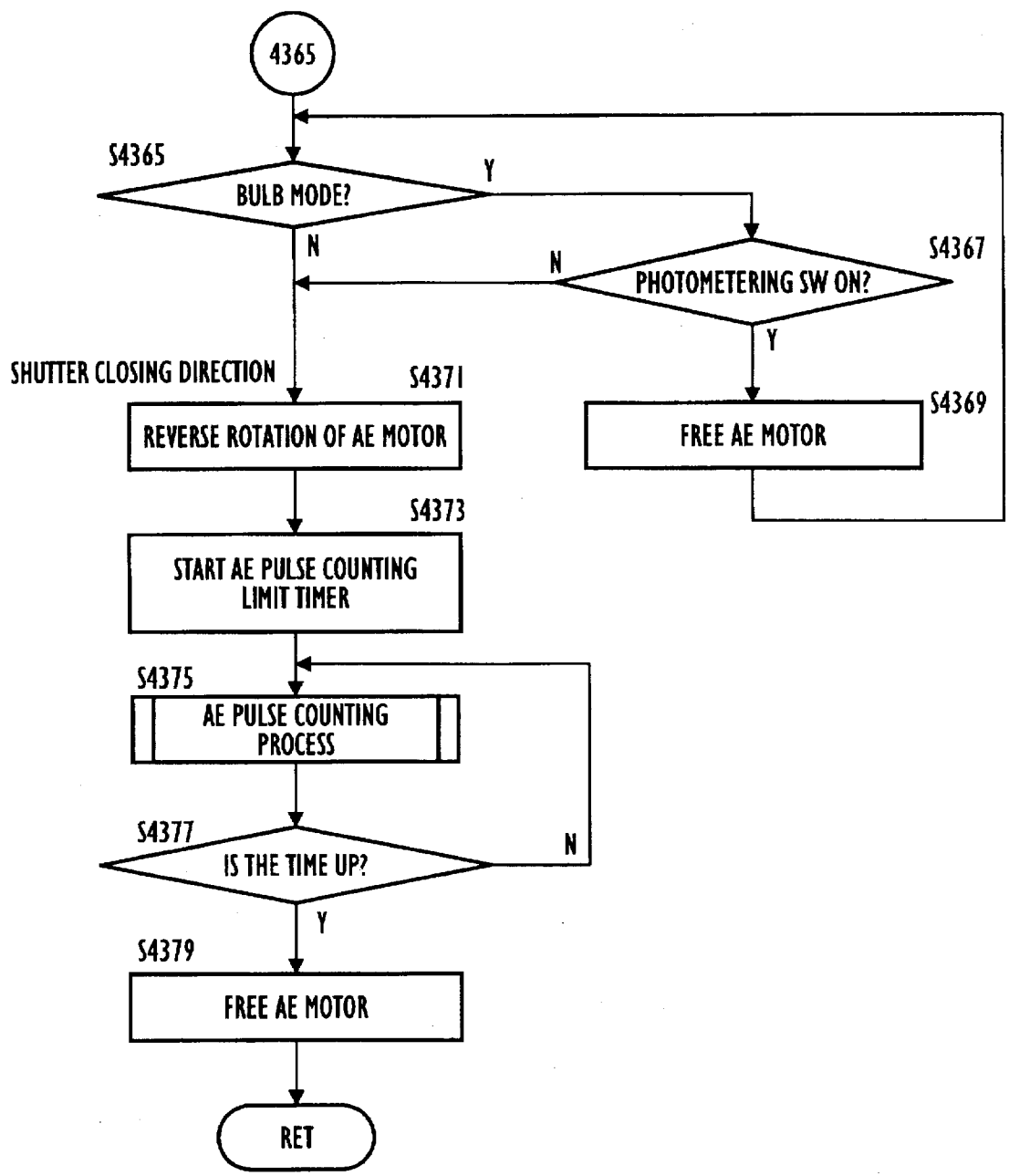

FIGS. 63 through 65 show a flow chart for the exposure process. The exposure process is called, namely executed, when the release switch SWR is turned ON. In the exposure process, the compensation process in regard to the shutter, and the shutter initial position confirmation process, etc., are executed, and the shutter is thereafter released to perform exposure.

Firstly, whether or not the AE adjustment has finished is checked, and if the AE adjustment has not finished or if the AE data is less than 10 Ev even if the AE adjustment has finished, the AE timer time is selected from among the fixed data stored in the ROM based on the AE data obtained during the AE calculation process (steps S4301 and S4305, or at S4301, steps S4303 and S4305). If the AE adjustment has finished and the AE data is 10 Ev or more, at steps S4301, S4303 and S4307, based on the AE data obtained during the AE calculation process, the AE timer time is determined from among the adjustment data read during the reset process. The fixed data in the ROM is used when the AE data is less than 10 Ev since the shutter release time will be long when the AE data is less than 10 Ev and the influence of errors will therefore be small, and since the process can be executed in a shorter time by using the data in the ROM.

Then at steps S4309 and S4311, or at steps S4309 and S4313, whether the FM adjustment has completed or not is checked. If the FM adjustment has not completed, the FM timer time is selected from among the fixed data in the ROM based on the FM data, while if the FM adjustment has completed, the data that was read in the adjustment data reading process during the reset process is used.

When the setting of the timers is completed, at steps S4315, S4317, S4319 and S4321, the shutter initial position confirmation process is executed. In the process, namely at steps S4315, S4317, S4319 and S4321, the AE motor 29 is driven in reverse (counterclockwise) to drive the shutter blades 27a in the shutting direction, the AE pulse counting limit timer is started, and the AE pulse counting process is executed to wait until the timer time is up. When the shutter blades 27a are completely shut, and become immovable, the time becomes up since the AE motor 29 becomes incapable of rotating.

When the time is up, at steps S4323 and S4325, the AE motor 29 is driven forward (clockwise) and the shutter is driven in the opening direction, and the AE pulse counting limit timer time is started. Then at steps S4327, S4329 and S4331, the AE pulse counting process is executed and waiting is performed until the reference pulse number is counted up in the AE pulse counting process, while checking whether or not the time is up at the AE pulse counting limit timer time.

At steps S4329, S4333 and S4335, if the time becomes up at the AE pulse counting limit timer time, it means that the rotation of the AE motor 29 is impeded due to some reason, the shutter error flag is set, the AE motor 29 is freed, namely the passage of current is stopped, and control is returned.

At the moment when the counting of the reference pulse is ended, since the shutter blades 27a start to be opened, the AE timer and the FM timer are started, and the end-of-flash flag is cleared (steps S4335, 4337, S4339 and S4341).

Although it is checked whether or not the end-of-flash flag is set, and whether or not the flash mode is set, in the case where the strobe is not to be flashed, since the end-of-flash flag will remain cleared and the flash mode will not be set, waiting is performed for the time to be up at the AE timer (steps S4343, S4345 and S4347).

When the time of the AE timer is up and if the bulb mode is not set, the AE motor 29 is driven in reverse (counterclockwise) (i.e., in the direction in which the shutter is closed) to start the shutter blade shutting operation and the AE pulse counting limit timer time is started (steps S4371 and S4373). Then while executing the AE pulse counting process, waiting is performed for the time to be up at the AE pulse counter, namely, that the shutter blades 27a are shut and the AE motor 29 is stopped, and when the time is up, the AE motor is freed, and control is returned (steps S4375, S4377 and S4379). In the case of the bulb mode, the AE motor 29 is freed while the photometering switch SWS is ON, in order to prevent the AE motor 29 from overloading, and waiting is performed for the photometering switch SWS to be turned OFF (steps S4365, S4367 and S4369).

If the strobe flashing mode is set, since this means that a flashing mode is set, control proceeds to step S4349, and it is checked whether or not flashing is in progress, and since flashing will not be in progress initially, waiting is performed for the time to be up at the FM timer (steps S4349, S4351, S4347, S4313 and S4345). Since the FM timer time is normally shorter than the AE timer time, the time will normally be up at the FM timer first. When the time is up at the FM timer, flashing is started and the 2 ms timer is started (steps S4351, S4353 and S4355). The 2 ms timer is a timer for waiting for the complete ending of the flashing of the strobe, and this waiting time is not limited to 2 ms and may differ according to the characteristics of the strobe.

When flashing is started, since flashing will be in progress, waiting is performed until the time is up at the 2 ms timer (steps S4349, S4357, S4347, S4343 and S4345). When the time of the 2 ms timer is up, the flashing is stopped, the end-of-flash flag is set, and the charging demand flag is set (steps S4357, S4359, S4361 and S4363). Then at steps S4343 and S4347, since the end-of-flash flag has already been set, waiting is performed until the time is up at the AE timer.

[The Lens Return Process]

Figure 66:
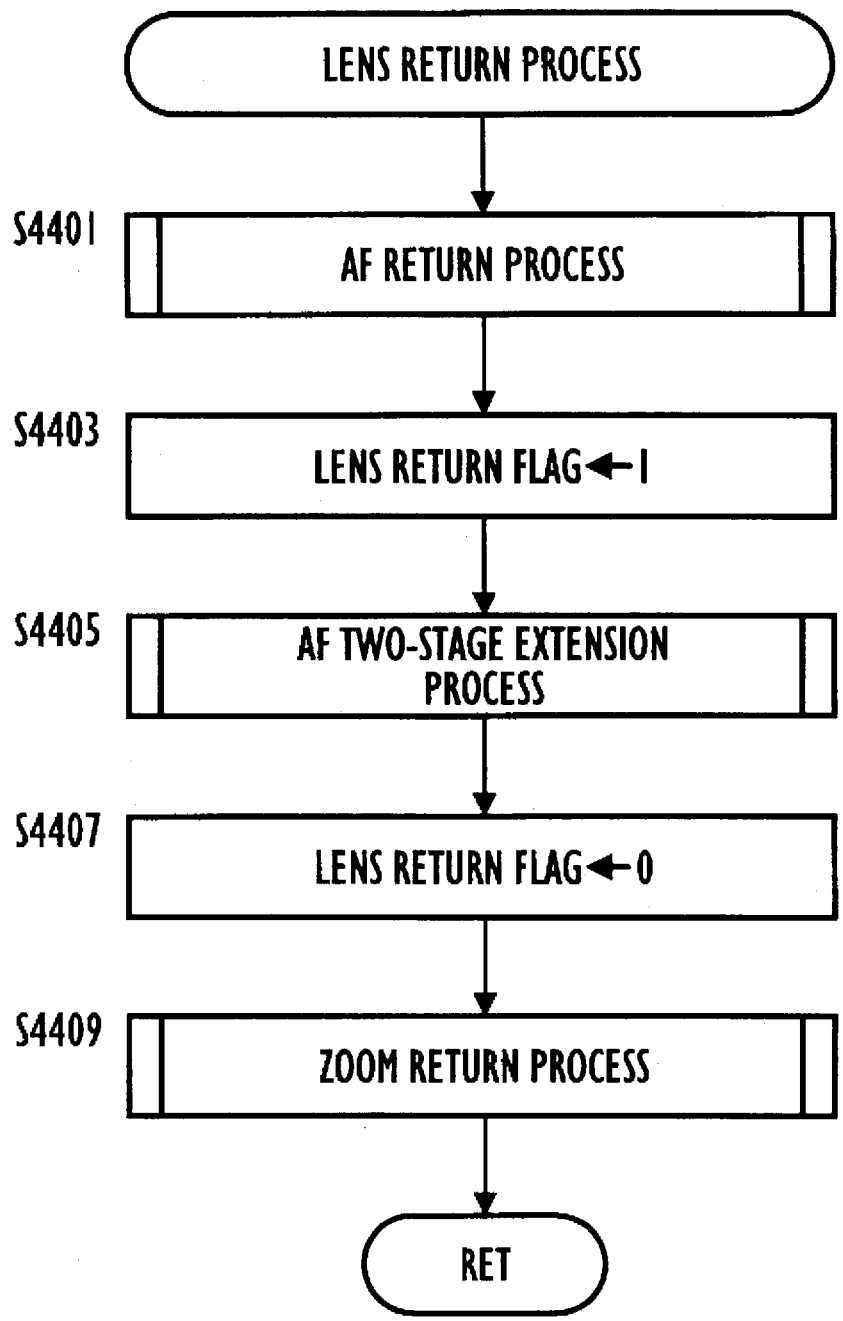
FIG. 66 is a flow chart of a lens return process of the zoom lens camera.

FIG. 66 shows a flow chart for the lens return process. The lens return process is a process in which the front lens group L1 and the rear lens group L2, which been moved to the focused positions during the photographing process, are returned to the positions prior to the photographing process. The front lens group L1 is returned to the standby position, retracted in the direction of the housing position by an amount corresponding to the second zoom pulse ZP2 from the "wide" side switching point of the zoom code corresponding to the zoom step which identifies the present focal length. The rear lens group L2 is returned to the AF home position if the zoom step is 5 or greater, or moved to a position extended (i.e., retracted) from the AF home position by an amount corresponding to the value of the AF pulse AP1, when the zoom step is between 0 and 4.

Firstly, in the lens return process, the AF return process is called, the rear lens group L2 is returned to the AF home position, and the lens return flag is set. Then the AF two-stage extension process is called, and if the zoom code is 5 or greater, the rear lens group L2 is left as it is. If the zoom code is 4 or less, the rear lens group L2 is extended (i.e., retracted) by an amount corresponding to the value of the AP pulse AP1, and then the zoom return flag is cleared, i.e., set to 0. Then the zoom return process is called, and the front lens group L1 is moved to the standby position of the present zoom code, and control is returned (steps S4401, S4403, S4405, S4407 and S4409).

[The Lens Drive Calculation Process]

Figure 67:
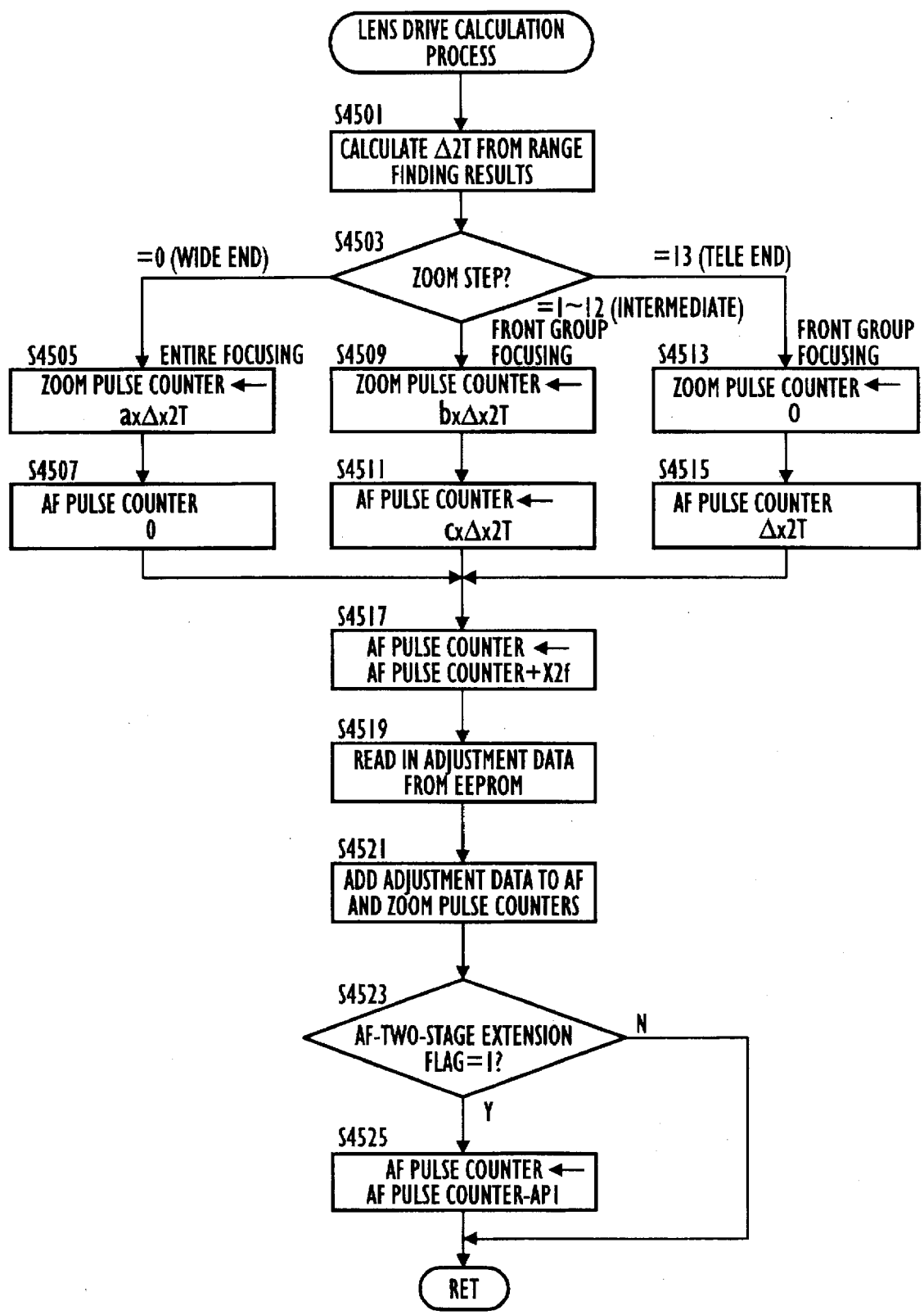
FIG. 67 is a flow chart of a lens driving operation process of the zoom lens camera.

FIG. 67 shows a flow chart for the lens drive calculation process. The lens drive calculation process is the process in which the pulse numbers, by which the whole unit driving motor 25 and the rear lens group driving motor 30 are to be driven, are determined based on the subject distance (or the photographing distance) obtained in the focusing processing and the present zoom step, as the zoom pulse number from the "wide" side switching point (i.e., the ON/OFF point) corresponding to the present zoom step and the AF pulse value. In the focusing process in the present embodiment, the direction in which the whole unit driving motor 25 is driven is the direction in which the front lens group L1 is advanced (extended), and the direction in which the rear lens group driving motor 30 is driven is the direction in which the rear lens group L2 is retracted from the AF home position, namely, moved away from the front lens group L1.

In the present embodiment, three modes of focusing are performed. At the "wide" end, whole focusing (first mode) is performed in which the front lens group L1 and the rear lens group L2 are moved as a whole by the whole unit driving motor 25. At the "tele" end, rear lens group focusing (third mode) is performed in which only the rear lens group L2 is moved by the rear lens group driving motor 30, and between the "wide" end and the "tele" end, the front lens group focusing (second mode) is performed in which the front lens group L1 and the rear lens group L2 are moved by the whole unit driving motor 25, and the rear lens group L2 is moved by the rear lens group driving motor 30, so that the absolute position of the rear lens group L2 with respect to the camera will not be changed.

In the lens drive calculation process, at step S4501, the reference amount of lens movement (i.e., the pulse number) 2T is calculated based on the present zoom step and the subject distance obtained through the focusing processing. Then at steps S4503, S4505, S4507, S4509, S4511, S4513 and S4515, it is judged whether the present zoom step is 0 (i.e., the "wide" end), between 1 and 12 (i.e., intermediate position between the "wide" end and the "tele" end), or 13 (i.e., the "tele" end), and the pulse calculation process corresponding to the zoom step is executed. At steps S4505 and S4507, if the present zoom step is at the "wide" end, the whole focusing will be performed, and the value $(a*\Delta AX2T)$ is set in the zoom pulse counter, and the value 0 is set in the AF pulse counter. If the present zoom step corresponds to an intermediate position, the front lens group focusing will be performed, and at steps S4509 and S4511, the value $(b*\Delta AX2T)$ is set in the zoom pulse counter, and the value $(c*\Delta AX2T)$ is set in the AF pulse counter. If the present zoom step corresponds to the "tele" end, the rear lens group focusing will be performed, and at steps S4513 and S4515, the value 0 is set in the zoom pulse counter, and the value $(\Delta AX2T)$ is set in the AF pulse counter. The symbols a, b, c and $\Delta X$ are predetermined compensation factors.

When the setting of the pulse counter is complete, at step S4517, the correction value X2f, according to the focal length, is added to the value of the AF pulse counter. Then at steps S4519 and S4521, the adjustment data is read from the EEPROM 230, and are further added to the values at the AF pulse counter and the zoom pulse counter. At steps S4523 and S4525 it is checked whether or not the AF two-stage extension flag is set, and if it is set, since the rear lens group L2 has already been extended (retracted) by the value of the AF pulse AP1 from the AF home position, the value AP1 is deducted from the AF pulse counter.

In the above processing, the setting of the drive pulse number of the whole unit driving motor 25 and the drive pulse number of the rear lens group driving motor 30, for moving the front lens group L1 and the rear lens group L2 to lens positions at which the lenses will be in focus with the subject at the present focal length, are completed.

[The Test Function Process]

Figure 68:
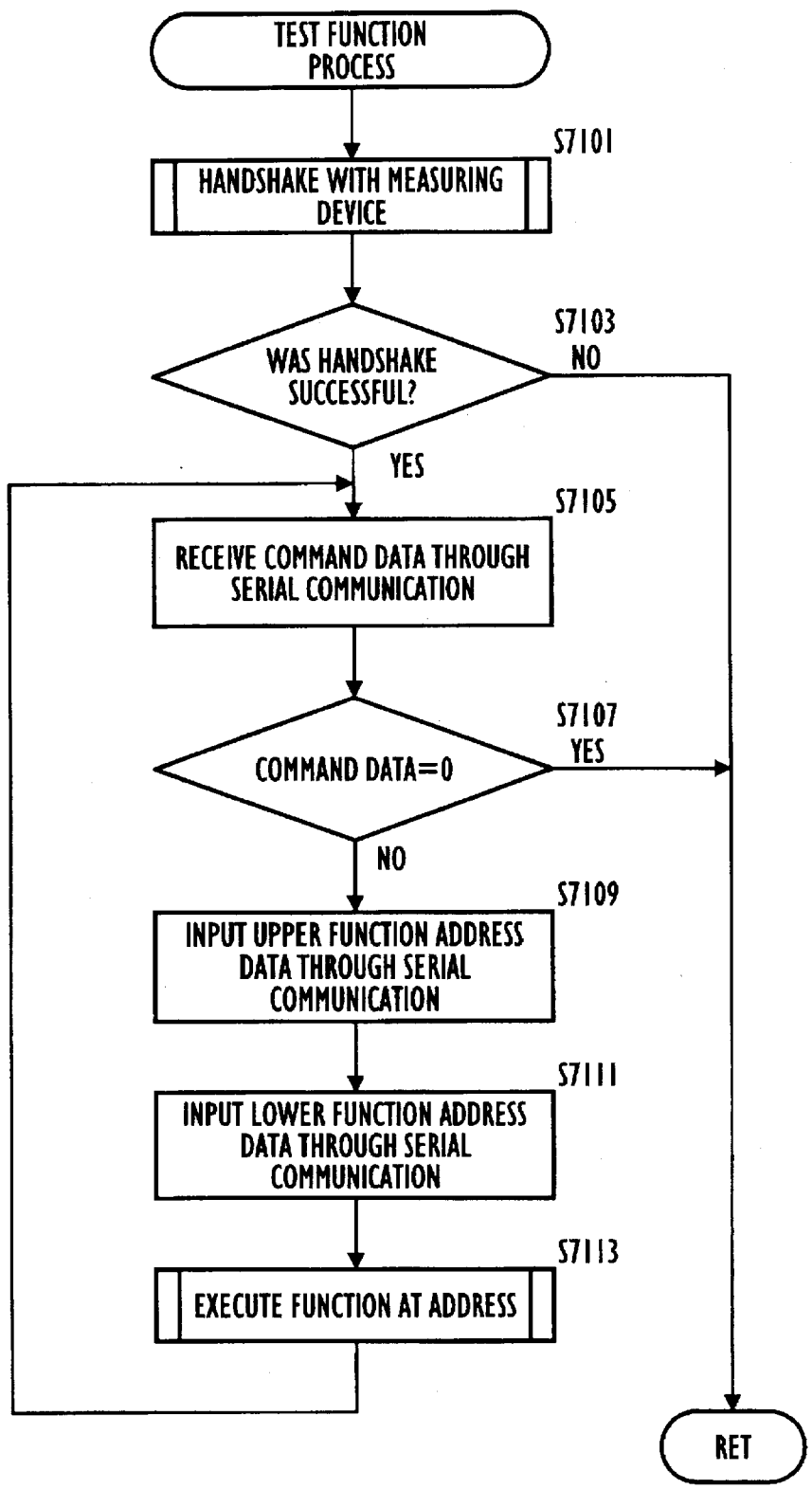
FIG. 68 is a flow chart of a test function process of the zoom lens camera.

FIG. 68 shows a flow chart for the test function process. The test function process is the process for testing the functions of the camera, and is called to execute the various functions of the camera with the camera being connected to a measuring device.

In the prior art cases of performing tests upon connecting a measuring device to a camera, the commands to be input into the camera from the measuring device are determined in advance and predetermined processes are executed at the camera side according to the various commands input from the measuring device. However, when tests are performed by such a method, only predetermined operations can be executed and other operations cannot be executed. Test operations can only be performed for test items that are considered at the time of preparation of the program and test items cannot be added later. With the camera of the present embodiment, programs for controlling the camera can be designed one function at a time from the measuring device and caused to be executed by the camera.

The test function process is called during the reset process, when the reset process is executed. Therefore, the test function process is executed by connecting the measuring device (not shown) to the camera, when the battery is loaded into the camera.

When the test function process is called, at step S7101 a handshake between the CPU 210 of the camera and the measuring device, connected to the camera, is executed, and the communication condition is set. If an error occurs during the handshake, or if the measuring apparatus is not connected to the camera, it is deemed that the handshake was unsuccessful at step S7103, and the test function process is canceled, and control is returned. If the handshake is successful and communication is enabled at step S7103, the input of commands from the measuring device to the CPU 210 is enabled (step S7105).

If the command data has a value 0, which indicates the end of the test function process at step S7107, control is returned upon ending the test function process. If the value of the command data is not 0, the upper address and the lower address of the function to be called are received through serial communication from the measuring device (steps S7109, S7111) and the function stored in the address is executed at step S7113. The processes related to the test items necessary, are executed by repeating the above until the command data with a value of 0 is received.

As described above, detailed tests can be performed with the camera of the present embodiment, since the camera controlling programs can be designed and executed in function units by means of data input from the measuring device.

[The AF Pulse Counting Process]

Figure 69:
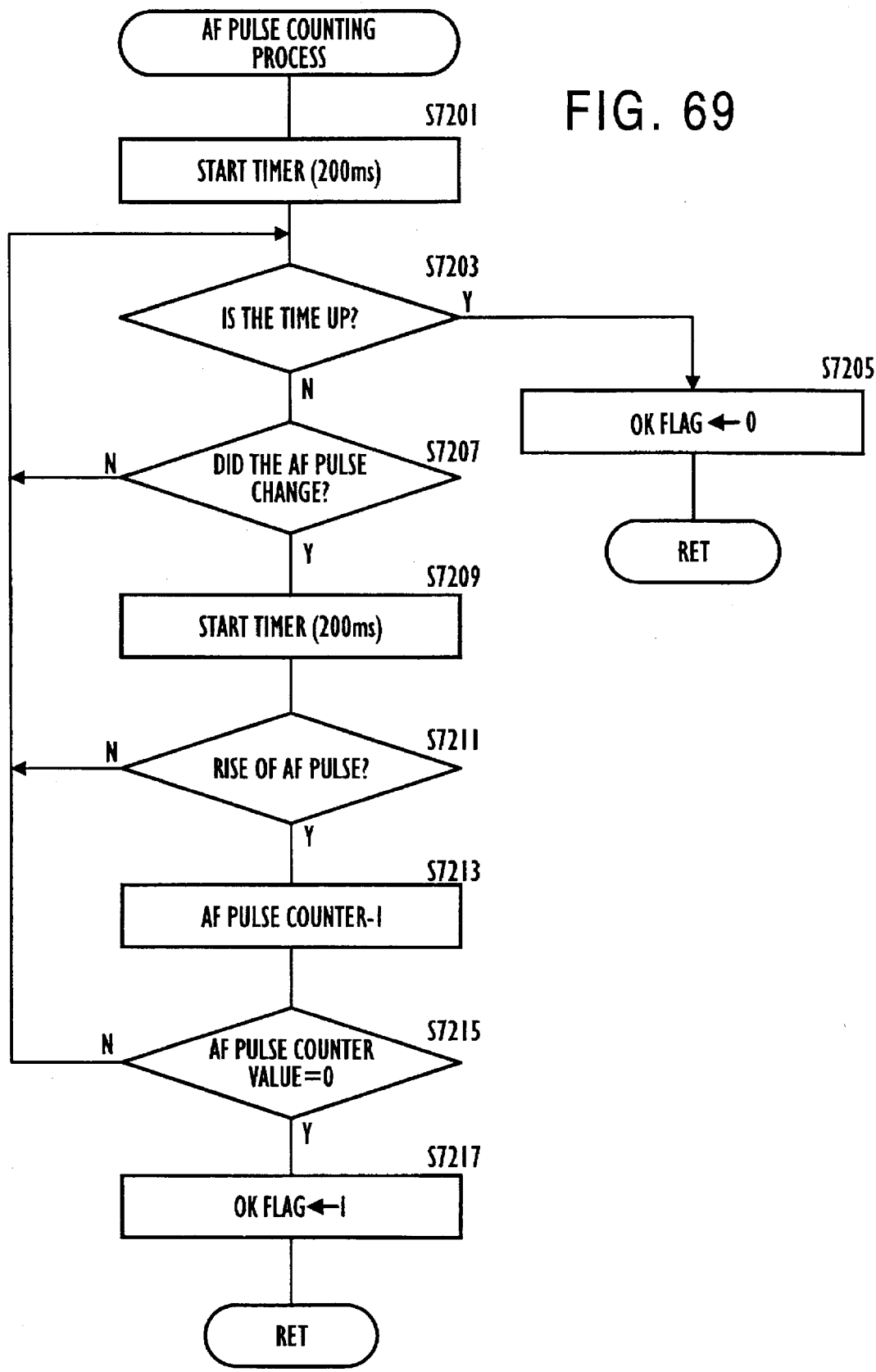
FIG. 69 is a flow chart of an AF pulse counting process of the zoom lens camera.

FIG. 69 shows a flow chart for the AF pulse counting process. The AF pulse counting process is the process in which the priority set AF pulse counter is decremented by one each time a change in the AF pulse is detected within a predetermined time period, and the OK flag is set to 1 when the value at the AF pulse counter becomes 0. The OK flag is set to 0 if the value at the pulse counter does not become 0 within the predetermined period.

At step S7201, the CPU 210 first sets a time of 200 ms at a timer as the period during which the changes in the AF pulse are to be monitored. In the following processes, if there is no change in the AF pulse within 200 ms period, the CPU 210 sets the OK flag to 0, as above described.

At step S7203, the CPU 210 judges whether or not the time is up at the 200 ms timer. If the time is not up, then at step S7207, whether or not there was a change in the AF pulse is judged based on the output signal from the AF pulse input circuit 222 to the CPU 210. The judgment as to whether or not there is a change in the AF pulse is made by detecting the change of the pulse from both H (high) level to L (low) level and vice versa.

If there is no change in the AF pulse at step S7207, the CPU 210 returns the process to step S7203. Therefore, if no changes in the AF pulse are detected within the 200 ms, it is judged that the time is up at step S7203, and the process is ended upon setting the OK flag to 0 at step S7205. In other words, the OK flag is set to 0 if the same number of pulses as the value set at the AF pulse counter before the AF pulse counting process was called is not detected during the execution of the AF pulse counting process.

When the CPU 210 detects a change in the AF pulse at step S7207, then at step S7209 the timer is reset, and the period of 200 ms is set again and restarted. If the detected change in the AF pulse is a rise of the AF pulse at step S7211, then at step S7213 the AF pulse counter is decremented by one. Here, the value to be counted, that is, the value corresponding to the amount by which the rear lens group L2 is to be driven by the rear lens group driving motor 30, is set at the AF pulse counter before the AF pulse counting process is executed. If the value at the decremented AF pulse counter is 0 at step S7215, the CPU 210 sets the OK flag to 1 and ends the process. That is, the OK flag is set to 1 if the same number of pulses as the value set at the AF pulse counter before the AF pulse counting process was called has been counted.

As described above, in the AF pulse counting process, the OK flag is set to 1 if the same number of pulses as the value set previously at the AF pulse counter are output from the AF pulse input circuit 222 to the CPU 210, and the OK flag is set to 0 if the output of pulses is stopped before the AF pulse input circuit 222 outputs the same number of pulses to the CPU 210 as the value set at the AF pulse counter.

[The Zoom Drive Check Process]

Figure 70:
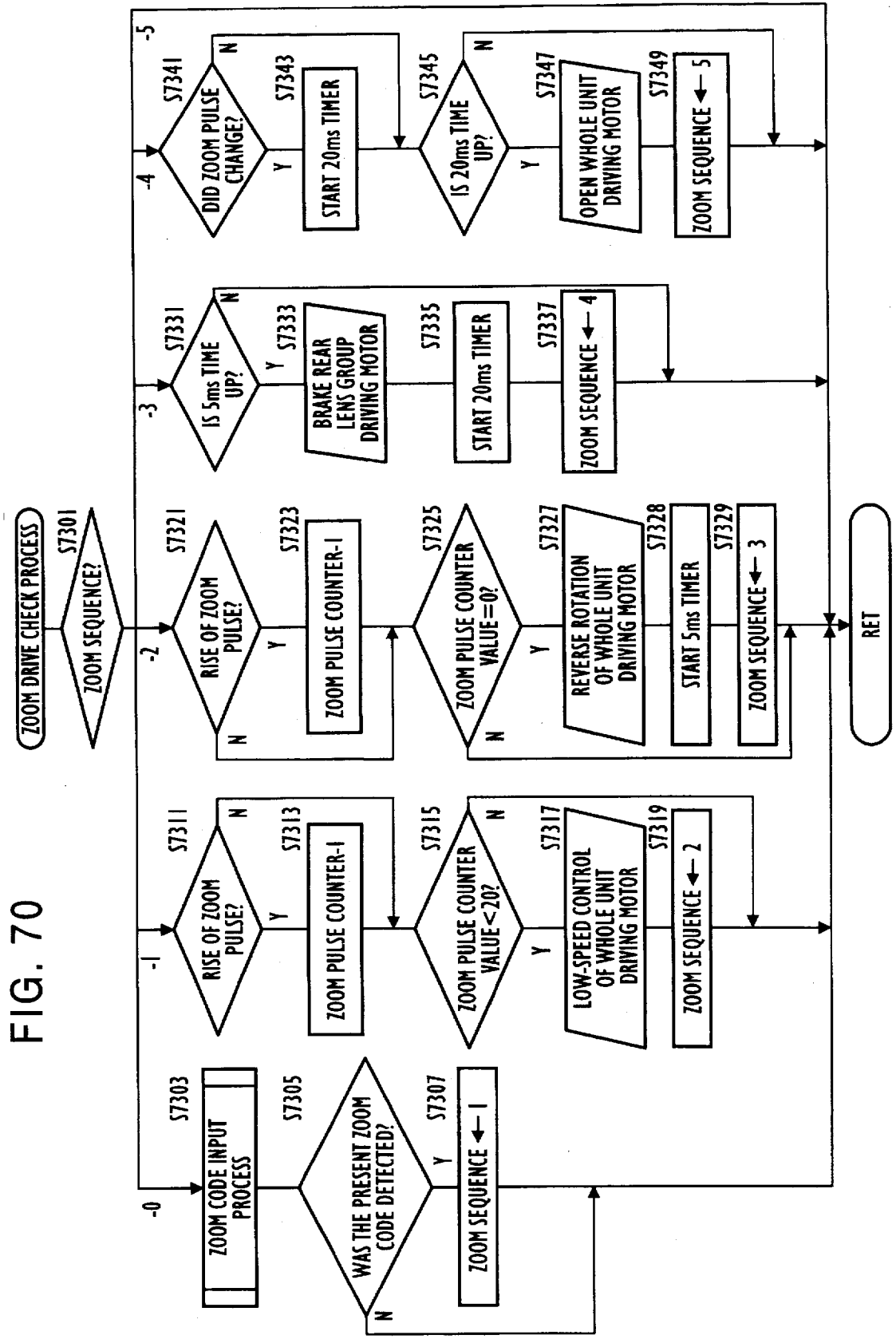
FIG. 70 is a flow chart of a zoom driving check process of the zoom lens camera.

FIG. 70 shows a flow chart for the zoom drive check process. In addition, the relationship between the driving state of the whole unit driving motor 25 and the zoom sequence is shown in the form of a timing chart in FIG. 35. The zoom drive check process is a process in which it is judged at which stage the driving of the lenses by the whole unit driving motor 25 for focusing on the subject distance is at, and in which stage the driving control of the whole unit driving motor 25 is carried out.

When the zoom drive check process is executed, according to the value of the zoom sequence (0 through 5), which is the index that indicates the state of driving of the whole unit driving motor 25, namely, the state of operation of the whole unit driving motor controlling circuit 60, the process branches at step S7301. When the zoom drive check process is called, the condition will be one in which the whole unit driving motor 25 is driven forward (clockwise), and the zoom sequence is set to 0.

At step S7303, if the value of the zoom sequence is 0, the CPU 210 calls the zoom code input process, and the value of the zoom code is input. When the lenses are stopped, the terminal for zoom code detection is positioned to the "wide" side of the zoom code. When the whole unit driving motor 25 is driven forward (clockwise), the zoom code detection terminal first contacts the zoom code corresponding to the preset lens position. If the zoom code input in the zoom code input process equals to the value stored in the memory as the present zoom code at step S7305, then at step S7307 the zoom sequence is set to 1. If the zoom code set in the zoom code input process differs from the value stored in memory as the present zoom code at step S7305, the zoom sequence remains at 0, and the zoom drive check process is ended.

When the value of the zoom sequence is 1, namely, after the present zoom code is detected, at step S7311 the CPU 210 monitors the rise of the zoom pulse output by the zoom pulse input circuit 220. At steps S7311 and S7313, the zoom pulse is then only decremented if the rise of the zoom pulse is detected. When the zoom pulse counter becomes less than 20 at step S7315, then at step S7317 the CPU 210 switches the whole unit driving motor 25 to the low-speed control, and at step S7319, the value of the zoom sequence is set at 2. If the value at the zoom pulse counter is equal to or greater than 20 at step S7315, the zoom sequence remains at 1, and the zoom drive check process is ended.

Therefore, when the whole unit driving motor 25 is started to drive, the zoom pulse counter is decremented on the basis of the present zoom code, and according to the pulses output by the zoom pulse input circuit 220 to the CPU 210. The whole unit driving motor 25 is driven by the normal DC drive until the count at the zoom pulse counter becomes 20. The zoom sequence will be 1 while the whole unit driving motor 25 is being driven at normal speed. If the driving in the DC drive condition is continued, the lenses may be moved by more than the amount corresponding to the desired number of pulses due to inertia, etc., when the whole unit driving motor 25 stops. Therefore, when the zoom pulse counter becomes less than 20, the whole unit driving motor 25 is put under low speed control. The low-speed control is executed by means of PWM control. When the driving of the whole unit driving motor 25 is switched to low-speed control, the zoom sequence is set to 2.

When the zoom sequence is 2, namely during the low-speed control of the whole unit driving motor 25, if the zoom drive check process is called, the processes from step S7321 are executed. In such processes, at step S7321 the CPU monitors a rise of the zoom pulse, and decrements the zoom pulse when a rise is detected at step S7323. If a rise of the zoom pulse is not detected at step S7321, the process at step S7323 is skipped.

Until the zoom pulse count, which is decremented by one at a time while the lenses are being driven with the whole unit driving motor 25 being under low-speed control, become 0, the processes at steps S7321 and S7323 are executed each time the zoom drive check process is called. The zoom sequence will remain at 2 during this period. When the zoom pulse becomes 0 at step S7325, the whole unit driving motor 25 is driven in reverse (counterclockwise) at step S7327, to perform the braking process (i.e., reverse brake). After starting the reverse (counterclockwise) driving of the whole unit driving motor 25, at step S7328, the time of 5 ms, which is the reverse driving period, is set at the timer, and the zoom sequence is set to 3 at step S7329. In such a manner, when the zoom sequence is 3, the whole unit driving motor 25 is driven in reverse (counterclockwise) for braking.

When the zoom sequence is 3, if the zoom drive check process is called, at step S7331 the CPU 210 judges whether the period of 5 ms, which is the period of the reverse (counterclockwise) driving of the whole unit driving motor 25, has elapsed or not. If 5 ms has not elapsed, control is returned with the zoom sequence remaining at 3. After 5 ms have elapsed, at steps S7333, S7335 and S7337, braking is performed by short-circuiting the terminals of the whole unit driving motor 25, and the 20 ms timer is started, and the zoom sequence is set to 4, and control is returned.

If the zoom driving check processing is called when the zoom sequence is 4, at step S7341 the CPU 210 monitors whether or not the zoom pulse changes. That is, whether or not the whole unit driving motor 25 is rotating under the condition where the brakes are acting is judged according to whether or not the zoom pulse changes within 20 ms.

If the CPU 210 judges, that there is no change in the zoom pulse at step S7341, and that the time is up at the 20 ms timer at step S7345, then at steps S7347 and S7349, the control of the whole unit driving motor 25 is stopped, and the terminals of the motor are brought in to the open condition (i.e., undriven condition), and the zoom sequence is set at 5. If it is detected at step S7341 that the zoom pulse has changed, the 20 ms timer is restarted at step S7343, and it is monitored whether or not the next change in the zoom pulse is detected within the 20 ms after the previous change in the zoom pulse. A return is performed with the brake acting on the whole unit driving motor 25 and with the zoom sequence remaining at 4 until it is judged at step S7345 that the time is up at the 20 ms timer.

If the zoom drive check process is called when the zoom sequence is 5, as shown in the flow chart, control is returned without executing any processes in the zoom drive check process.

As above described, in the zoom drive check process, the lenses are firstly moved to the position of the present zoom code, which is the reference position (zoom sequence=0). The lenses are then moved at the normal speed while the counter at the zoom pulse counter is 20 or more (zoom sequence=1), and then moved at a low speed when the count at the zoom pulse counter becomes less than 20 (zoom sequence=2). When the count at the zoom pulse counter becomes 0, the whole unit driving motor 25 is driven in reverse (counterclockwise) for 5 ms (zoom sequence=3), and thereafter, braking is performed by making the terminals of the whole unit driving motor 25 short-circuit (zoom sequence=4). When the whole unit driving motor 25 comes to a complete stop, its control is ended (zoom sequence=5), and thereafter, the whole unit driving motor 25 is not controlled, namely, the undriven condition is maintained, until a new value is set at the zoom pulse counter and the zoom sequence is set to 0.

[The AF Drive Process]

Figure 71:
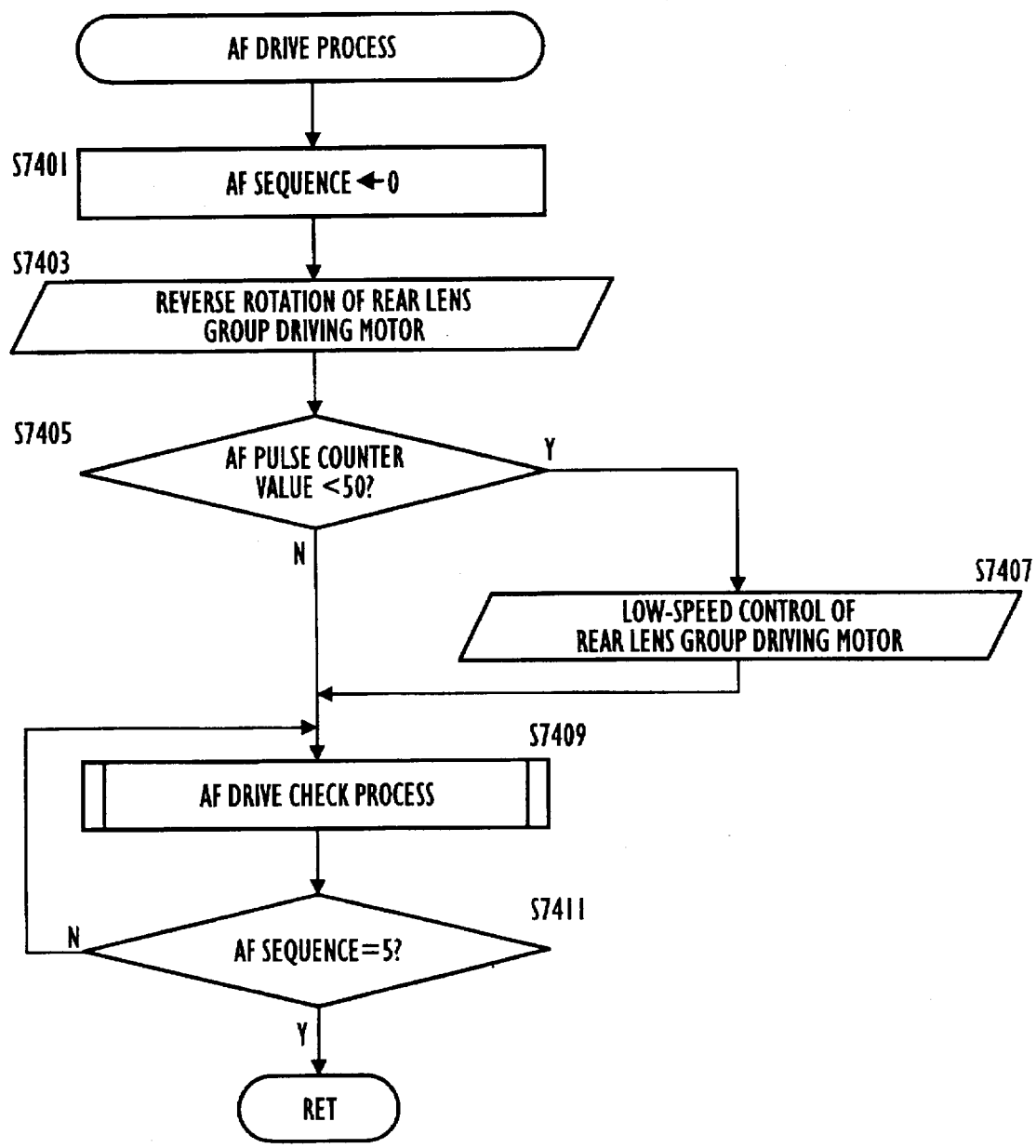
FIG. 71 is a flow chart of an AF driving process of the zoom lens camera.

FIG. 71 shows a flow chart for the AF drive process. The AF drive process is a process in which the rear lens group motor 30 is driven and controlled so as to move the rear lens group rearwardly, i.e., towards the film plane, in the lens retracting direction, in which the rear lens group L2 is moved rearwardly in order to set the focus on the subject distance.

At step S7401 the AF sequence is first set to 0. At steps S7403 and S7405 the rear lens group driving motor 30 is driven forward (clockwise), namely, driven in the retracting direction, and it is checked whether or not the count at the AF pulse counter is less than 50. If the count is less than 50, the control of the rear lens group driving motor 30 is switched to low-speed control (i.e., the PWM control), while if the count is 50 or greater, the AF drive check process is called without switching the control (steps S7405, S7407 and S7409, or at steps S7405 and S7409). Then at steps S7409 and S7411, it is then waited for the AF sequence to become 5 while performing the AF drive check process and a return is performed when the sequence becomes 5.

Figure 35:
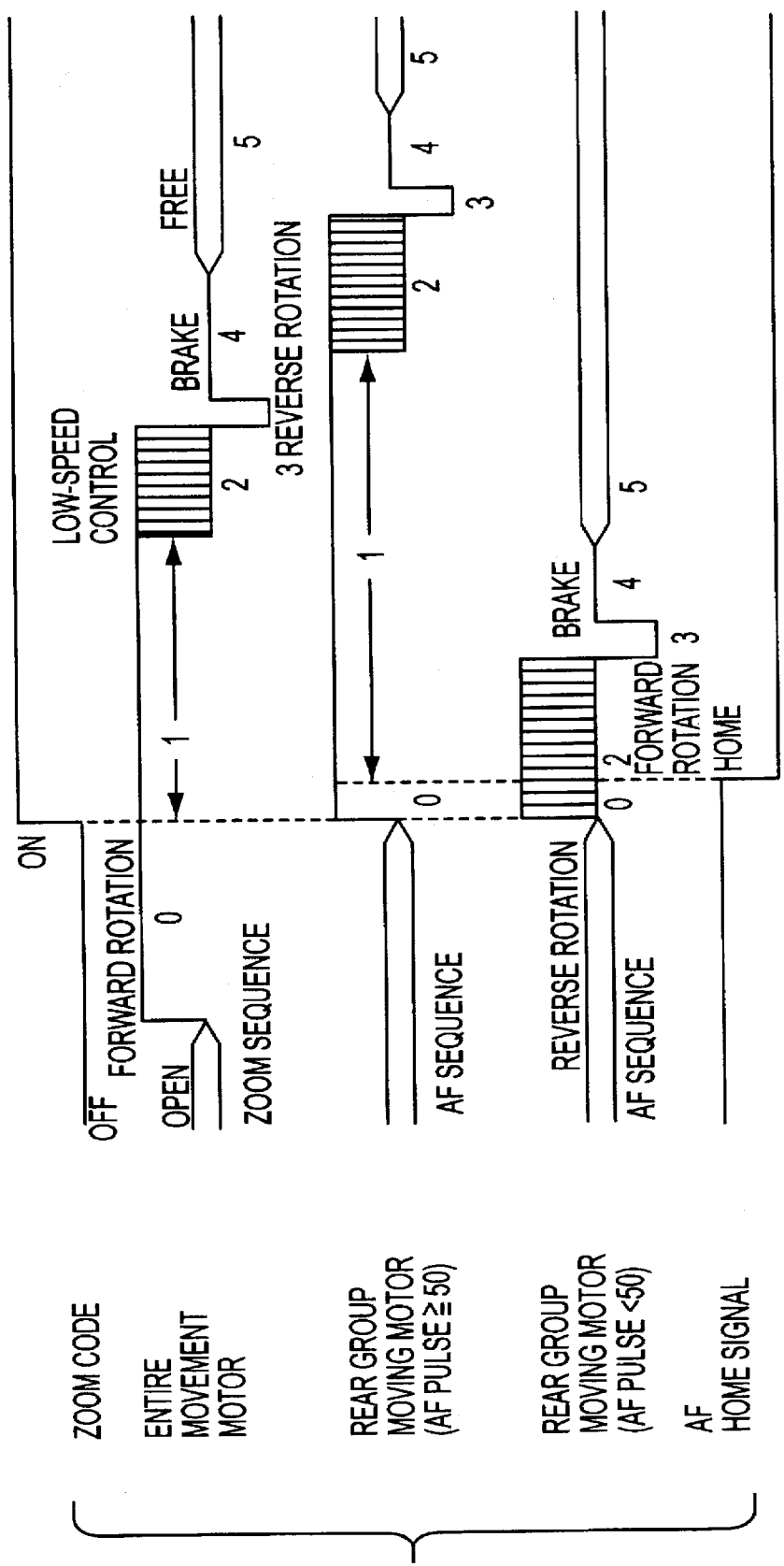
FIG. 35 is a schematic view illustrating movement sequences of a whole unit driving motor and a rear lens group driving motor during exposure (i.e., during focusing) of the zoom lens camera.
Figure 36:
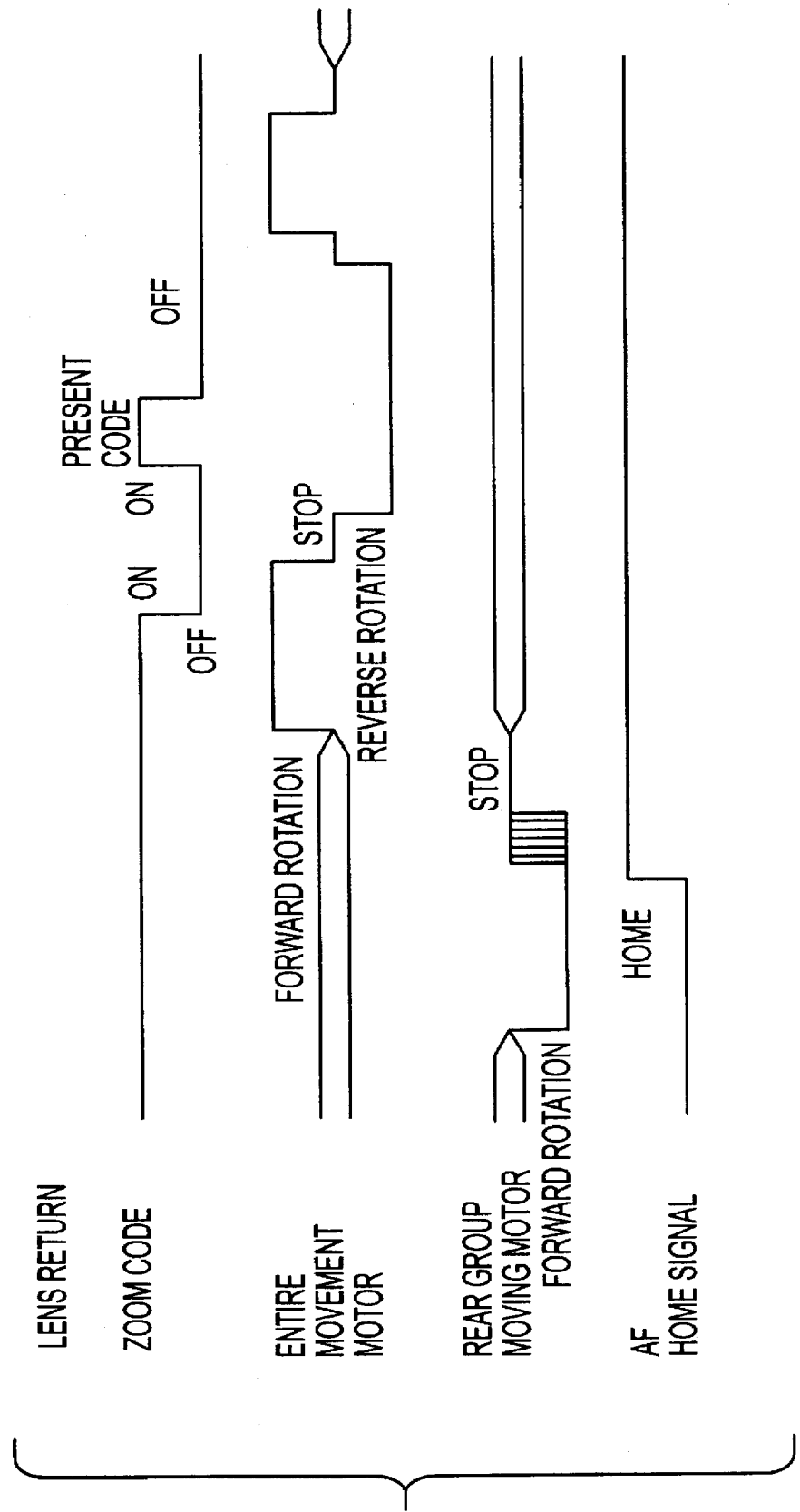
FIG. 36 is a schematic view illustrating movement sequences of the whole unit driving motor and the rear lens group driving motor during lens return of the zoom lens camera.
Figure 37:
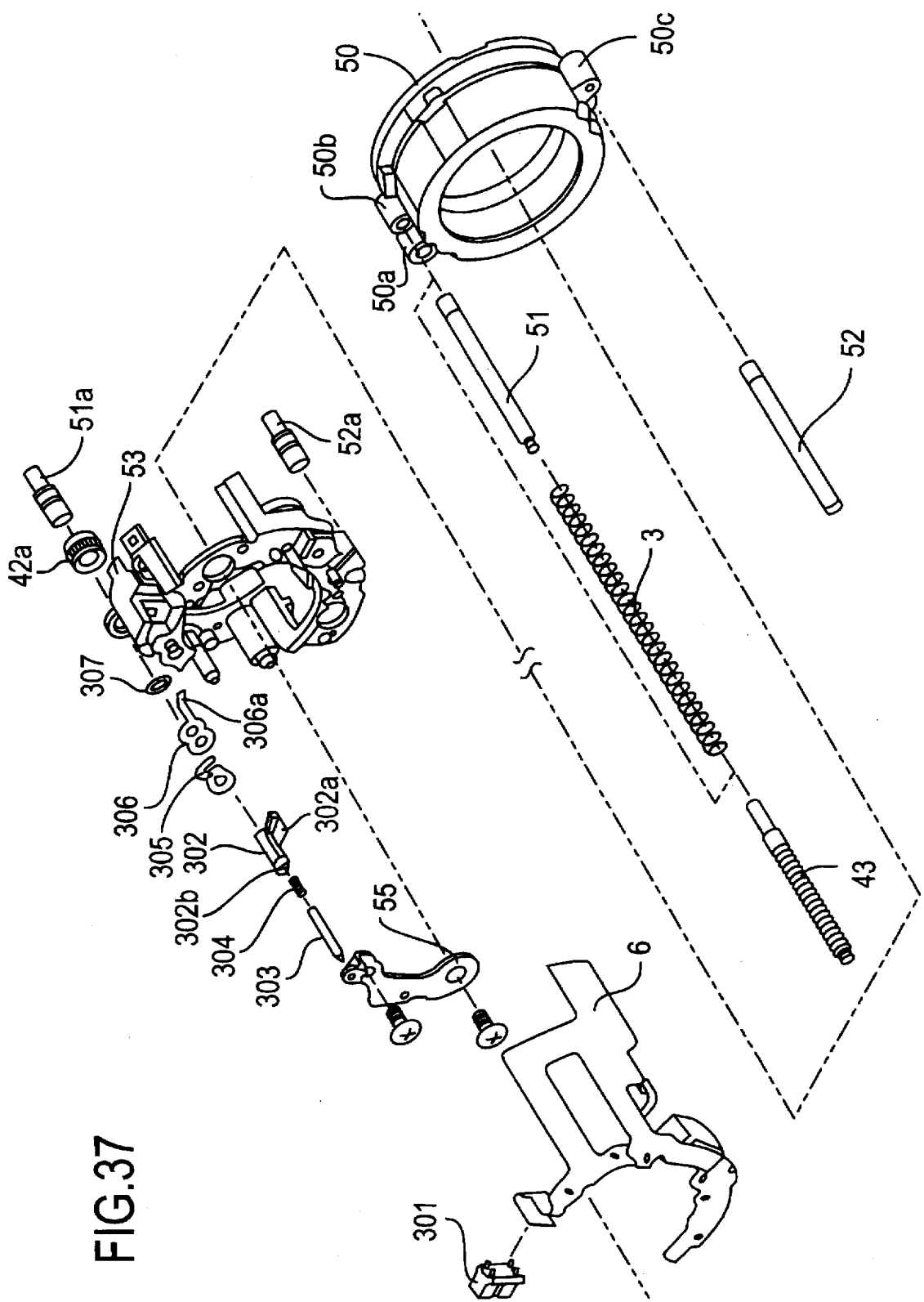
FIG. 37 is an exploded perspective view of a peripheral structure of the rear lens group of the zoom lens barrel.
Figure 38:
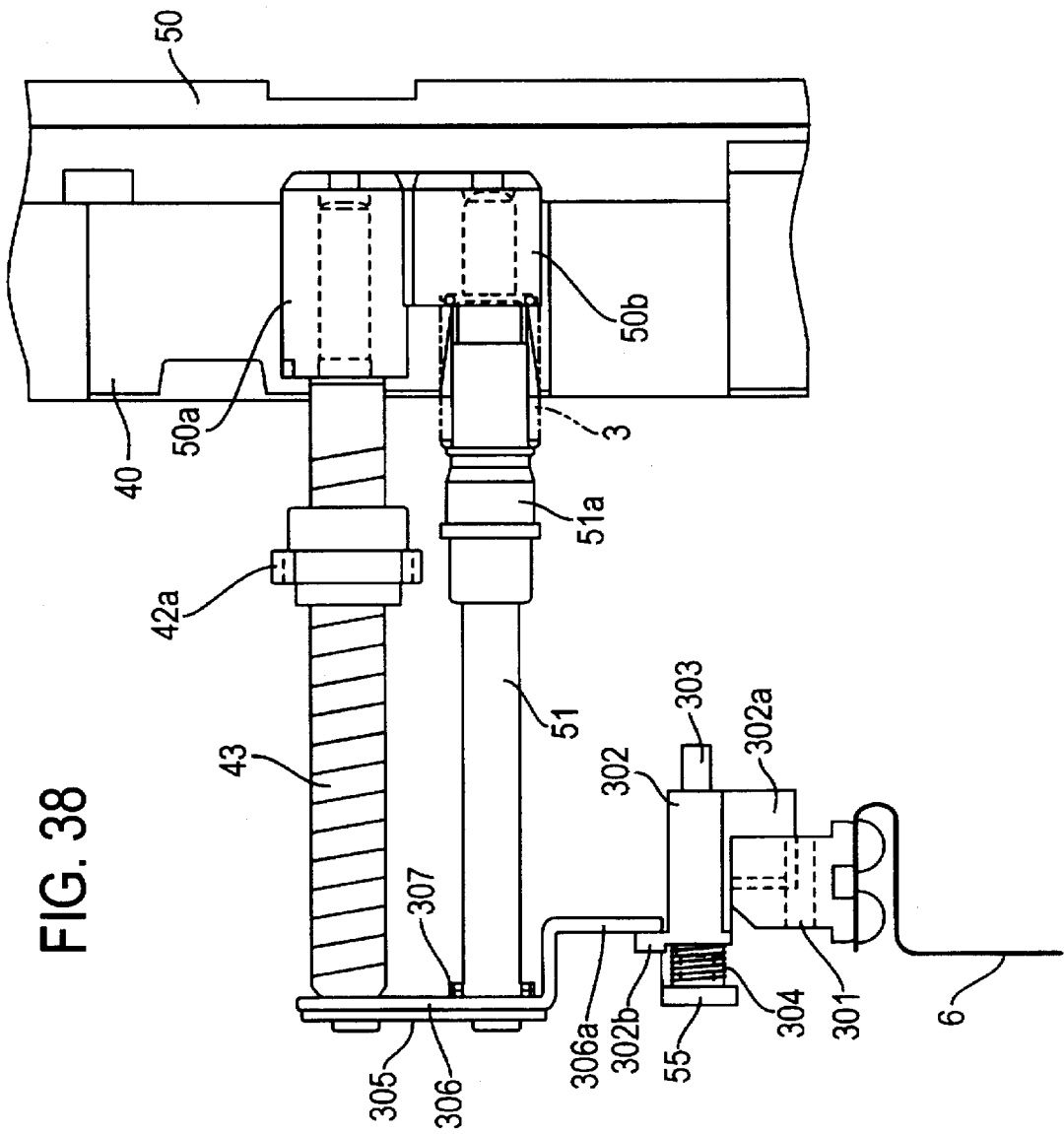
FIG. 38 is a plan view of the main parts of an example of an initial position detecting device of the rear lens group of the present embodiment.
Figure 39:
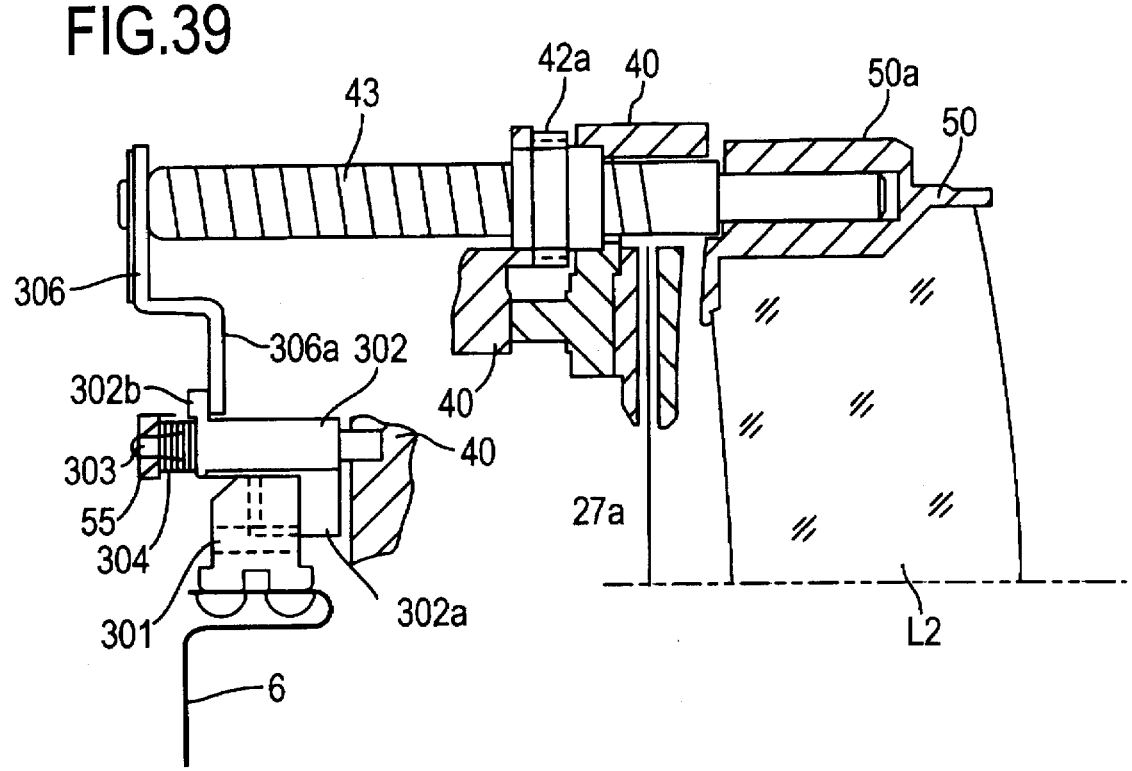
FIG. 39 is a sectional view of the initial position detecting device of the rear lens group, at a state when the rear lens group is at the initial position.
Figure 40:
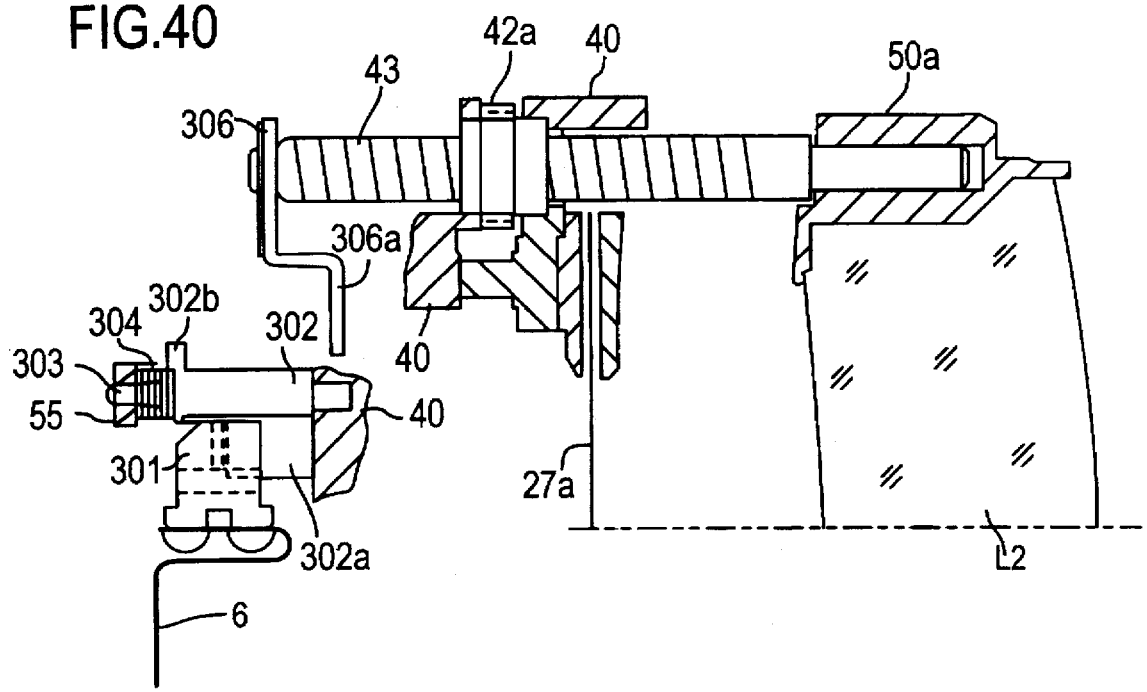
FIG. 40 is a sectional view of the initial position detecting device of the rear lens group, at a state when the rear lens group is not at the initial position.

The AF sequence is an identifier which identifies the state of the operation sequence of the rear lens group driving motor controlling circuit 61, and as shown in FIG. 35 and FIG. 36, an AF sequence of 0 indicates the condition where the switching of the AF home signal, basis for the counting of AF pulses, has been detected, 1 and 2 indicate the condition in which the AF pulses are being counted with 1 indicating the DC drive condition and 2 indicating the low-speed control condition, 3 indicates the reverse braking condition, 4 indicates the short-circuit braking condition, and 5 indicates the open terminal condition (inactivated condition) and thus the ending of the series of sequences.

If the rear lens group driving motor 30 is driven by the DC drive when the AF pulse number by which the rear group moving motor 30 is to be driven is small, the rear lens group driving motor 30 may be driven, due to inertia, etc., by more than the AF pulse number by which it is supposed to be driven. Thus when the AF pulse number is less than 50, the start-up and driving are performed from the beginning at the same low speed as in AF sequence 2.

[The Zoom Pulse Counting Process]

Figure 72:
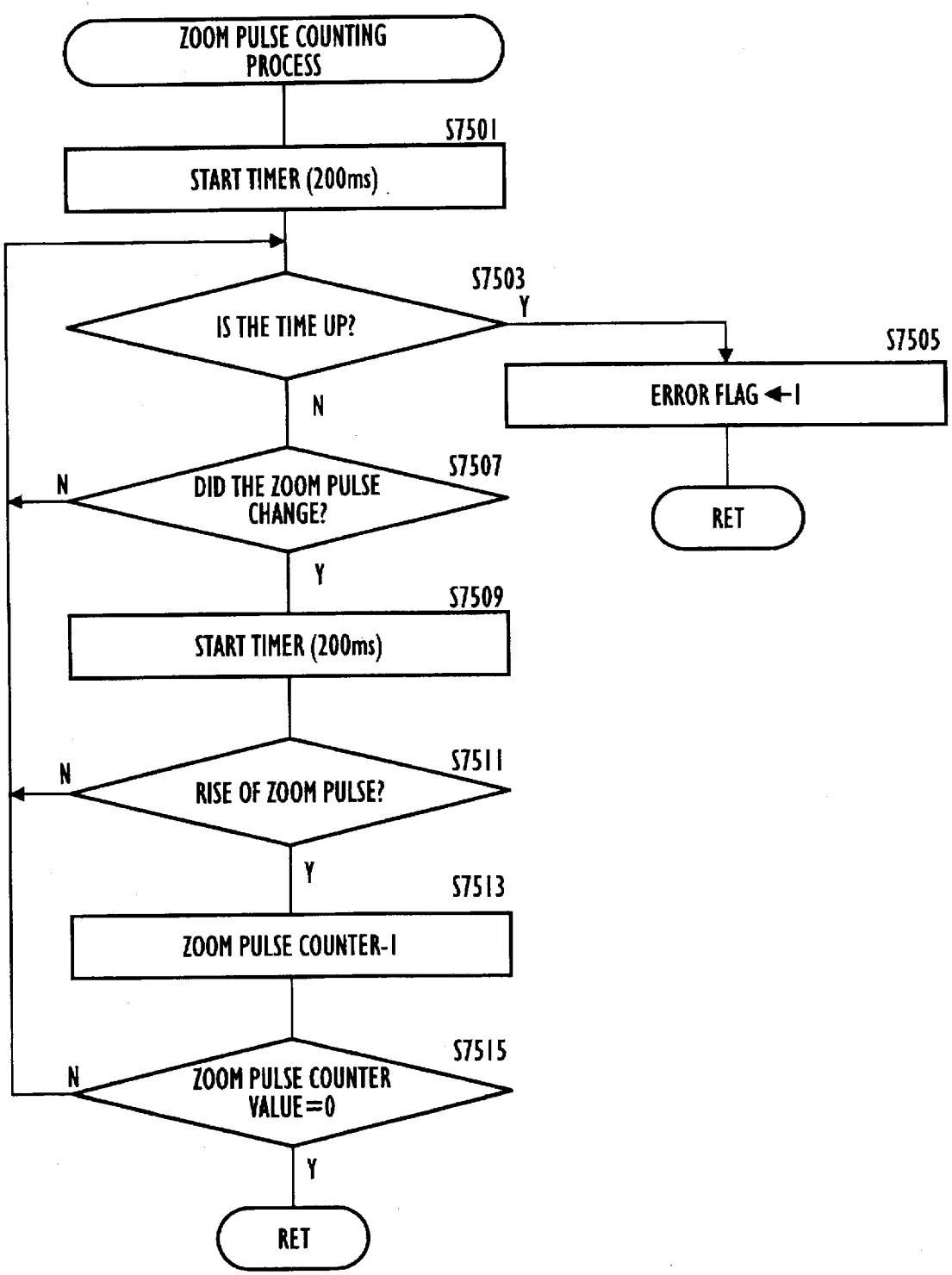
FIG. 72 is a flow chart of a zoom pulse counting process of the zoom lens camera.

FIG. 72 shows a flow chart for the zoom pulse counting process. The zoom pulse counting process is a process in which the previously set zoom pulse counter is decremented by one each time a change in the zoom pulse output from the zoom pulse input circuit 220, is detected within a predetermined period, and which is ended when the count at the zoom pulse counter becomes 0. If a change in the zoom pulse is not detected within the above-mentioned predetermined period, the error flag is set to 1.

At step S7501, the CPU 210 first sets the period of 200 ms at the timer as the period during which the change in the zoom pulse is to be monitored. In the following processes, if there is no change in the zoom pulse within 200 ms, the CPU 210 sets the error flag to 1.

At step S7503, the CPU 210 judges whether or not the time is up at the 200 ms timer. If the time is not up, then at step S7507, it is judged whether or not there was a change in the zoom pulse based on the output pulse from the zoom pulse input circuit 220 to the CPU 210. Whether or not the zoom pulse changed is judged hereby detecting the change in the pulse both from the H (high) level to the L (low) level and vice versa.

If there is no change in the zoom pulse at step S7507, the CPU 210 returns to the process at step S7503. Therefore, if the change in the zoom pulse is not detected within 200 ms, at step S7503 it is judged that the time is up, and at step S7505 the error flag is set to 1 and control is returned. In other words, a return is performed upon setting the error flag to 1, if the same number of pulses as the value set at the zoom pulse counter before the zoom pulse counting process was called is not detected within the interval during which the zoom pulse counting process is executed.

When the CPU 210 detects a change in the zoom pulse at step S7507, then at step S7509 the timer is reset to 200 ms. If the detected change in the zoom pulse is a rise of the zoom pulse at step S7511, then at step S7513 the zoom pulse counter is decremented by one. Here, the value to be counted, that is, the value corresponding to the amount by which the lenses are to be driven by means of the whole unit driving motor 25 (i.e., the count of the pulses output by the zoom pulse input circuit 220), is set at the zoom pulse counter before the zoom pulse counting process is executed. When the count at the decremented zoom pulse counter becomes 0 at step S7515, the CPU 210 ends the process. That is, the process is ended normally if the same number of pulses as the value set at the zoom pulse counter before the zoom pulse counting process was called has been counted.

As described above, in the zoom pulse counting process, a return is performed without setting the error flag if the same number of pulses as the value set previously at the zoom pulse counter are counted while a return is performed upon setting the error flag to 1, if the same number of pulses as the value set at the zoom pulse counter by the zoom pulse input circuit 220 could not be counted.

[The AF Drive Check Process]

Figure 73:
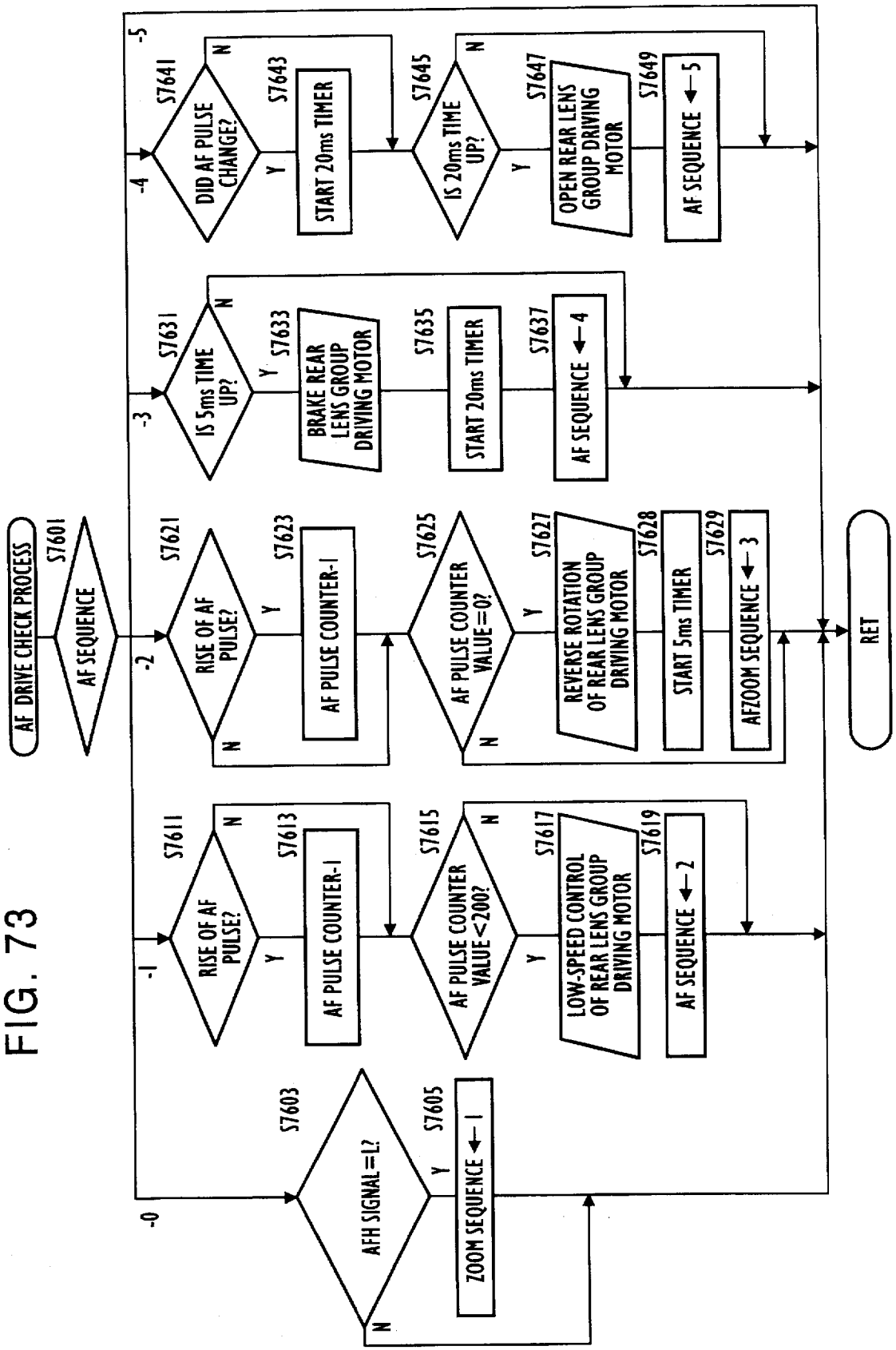
FIG. 73 is a flow chart of an AF driving check process of the zoom lens camera.

FIG. 73 shows a flow chart for the AF drive check process. The AF drive check process is a process in which the rear lens group driving motor 30 is controlled so that the rear lens group L2 will be driven based on the value set at the AF pulse counter.

Upon execution the AF drive check process branches at step S7601 according to the value of the AF sequence (0 through 5), which is an identifier that identifies the state of the operation sequence of the rear lens group driving motor controlling circuit 61. When the AF drive check process is executed for the first time, the rear lens group driving motor 30 is driven, and the AF sequence is set to 0. FIG. 35 shows the relationship between the driving state of the rear lens group driving motor 30 and the AF sequence.

At step S7603, if the value of the AF sequence is 0, the CPU 210 judges whether or not the AFH (i.e., the "AF home") signal has changed from H (high) to L (low). The AFH signal is H (high) when the rear lens group L2 is positioned at the AF home position, and changes to L (low) when the rear lens group L2 moves away from the AF home position. The movement of the rear lens group L2 based on the AF pulse counter, described below, is executed on the basis of the position at which the AFH signal changes to L. When the AFH signal changes from H to L at step S7603, then at step S7605 the CPU 210 sets the AF sequence to 1, and control is returned. While the AFH signal is H, control is returned while the AF sequence remains at 0.

If the value of the AF sequence is 1, namely, after the change of the AFH signal from H to L is detected, at step S7611 the CPU 210 monitors the rise of the AF pulse. At steps S7611 and S7613, the AF pulse counter is decremented only when the rise of the AF pulse is detected, and when the count at the AF pulse counter becomes less than 200 at step S7615, then at step S7617 the CPU 210 switches the rear lens group driving motor 30 to low-speed control, and at step S7619, the value of the AF sequence is set to 2. If the AF pulse counter is 200 or more at step S7615, the AF drive check process is ended and control is performed with the AF sequence remaining at 1. If the DC drive of the rear lens group driving motor 30 is performed from the beginning to the end, the desired AF pulse number may be exceeded due to the influence of inertia, etc. Thus, when the remaining AF pulse number becomes 200, the rear lens group driving motor 30 is driven at low speed through the PWM control.

As described above, when the rear lens group driving motor 30 is started to drive, the AF pulse counter is decremented on the basis of the point at which the AFH signal changes from H to L, and normal DC drive of the rear lens group driving motor 30 is performed until the count at the AF pulse counter becomes 200. While the normal drive of the rear lens group driving motor 30 is being performed, the AF sequence will be 1. When the count at the AF pulse counter becomes less than 200, the rear lens group driving motor 30 is driven under low-speed control. When the rear lens group driving motor 30 comes under low-speed control, the AF sequence is set to 2.

When the AF drive check process is called when the AF sequence is 2, that is, when the rear lens group driving motor 30 is under low-speed control, the processes from step S7621 are executed. In such processes, at step S7621 the CPU 210 monitors the rise of the AF pulse, and if a rise of the AF pulse is detected, at step S7623 the zoom pulse counter is decremented. If the rise of the AF pulse is not detected at step S7621, the process at step S7623 is skipped.

Before the AF pulse count, which is decremented by one at a time while the rear lens group L2 is being driven with the rear lens group driving motor 30 being under low-speed control, becomes 0, the processes at steps S7621 and S7623 are executed each time the AF drive check process is called. In such a case, the AF sequence will remain at 2. When the AF pulse count becomes 0, by driving the whole rear lens group driving motor 30 in reverse (counterclockwise) at step S7627, the braking processing (i.e., reverse brake) is executed. After starting the reverse (counterclockwise) driving of the rear lens group driving motor 30, at step S7628, the time of 5 ms, which is the reverse (counterclockwise) driving period, is set at the timer, and the AF sequence is set to 3 at step S7629. In such a manner, when the AF sequence is 3, the rear lens group driving motor 30 is driven in reverse (counterclockwise) for braking.

When the AF sequence is 3, if the AF driving check processing is called, at step S7631 the CPU 210 judges whether or not the period of 5 ms has elapsed, and if 5 ms has not elapsed control is returned with the AF sequence remaining at 3. After 5 ms has elapsed, then at step S7633, step S7635 and step S7637, the braking is activated by short-circuiting the terminals of the rear lens group driving motor 30, and the 20 ms timer is started, and the AF sequence is set to 4, and control is returned.

If the AF drive check process is called when the AF sequence is 4, at step S7641 the CPU 210 monitors whether or not the AF pulse changes. That is, whether or not the rear lens group driving motor 30 is rotating under the condition where the brake is acting, is judged according to whether or not the AF pulse changes within 20 ms.

If the CPU 210 judges, that there is no change in the AF pulse at step S7641, and that the time is up at the 20 ms timer at step S7645, at steps S7647 and S7649, the control of the rear lens group driving motor 30 is stopped, and the terminals of the motor are brought into the open condition (i.e., undriven condition), and the AF sequence is set to 5. If the change of the AF pulse is detected at step S7641, the 20 ms timer is restarted at step S7643, and it is monitored whether or not the next change in the AF pulse is detected within 20 ms after the previous change in the AF pulse. At step S7645, a return is performed with the brake acting on the rear lens group driving motor 30 and with the AF sequence remaining at 4 until it is judged that the time is up at the 20 ms timer.

If the AF drive check process is called when the AF sequence is 5, as shown in the flow chart, the control is returned without executing any processes in the AF drive check process.

As above described, in the AF drive check process, the lenses are firstly moved to the reference position at which the AFH signal becomes L (the AF sequence=0). The rear lens group is then moved by the normal DC drive while the count at the AF pulse counter is 200 or more (the AF sequence=1), and then moved at low speed by PWM when the count at the AF pulse counter becomes less than 200 (the AF sequence=2). When the count at the AF pulse counter becomes 0, the rear lens group driving motor 30 is driven in reverse (counterclockwise) for 5 ms (the AF sequence=3), and thereafter, braking is performed by making the terminals of the rear lens group driving motor 30 short-circuit (the AF sequence=4). When the rear lens group driving motor 30 comes to a complete stop, its control is ended (the AF sequence=5), and thereafter, the rear lens group driving motor 30 is not controlled (undriven condition is entered), until a new value is set at the AF pulse counter and the AF sequence is set 0.

As shown in FIG. 33, by transmitting the H level signal (high level) to the terminal CHEN, strobe circuit 500 charges the condenser 530. Further, by transmitting the H level signal to the terminal CHEN, the transistors 573 and 576 are both turned ON, and therefore the terminal RLS is electrically connected to the strobe circuit 500. In other words, terminal CHEN functions as an input terminal for the charging control signal, and also functions as an input terminal of the control signal for electrically connecting and disconnecting the terminal RLS to and from strobe circuit 500.

When charging is not performed, the terminal CHEN is set to the OFF condition (in other words, the L (low level) signal is applied to the terminal CHEN). In this condition, terminal RLS is electrically disconnected from the strobe circuit 500. In order to check the charging voltage of the capacitor 530, the H (high level) signal is applied to the terminal CHEN. However, as described above, when the H signal is applied to the terminal CHEN, charging is also performed. That is, charging will be performed every time the charging voltage of the capacitor 530 is checked.

In the embodiment, when charging is not performed, the capacitor 530 is fully charged. Accordingly, checking of the voltage is not necessary when charging is not being performed. Therefore, checking of the charging voltage is prohibited when charging is not performed.

Specifically, in the embodiment, as shown in FIG. 50, and discussed previously herein, when the charging voltage of the capacitor 530 reaches the upper limit (Y:S1817), the charge disable timer is set to three seconds (S1819), and charging is disabled, or prohibited at S1821. Until it is judged that time set in the charge disable timer has elapsed at S1825, charging signal is maintained at an OFF state (S1821). Unless the charge disable timer indicates zero (0), charging will not be performed in the main charging process (FIG. 50:S1801) and in the photography charging process (FIG. 61:S4101). Accordingly, charging is prohibited for three seconds from the point of time when the charge-disable timer is set (i.e., when the charged voltage has reached the upper limit).

In other words, checking of the charged condition of the capacitor 530 is prohibited for three seconds after the capacitor 530 is fully charged. As described above, the charging voltage can be checked (at S1815) by setting terminal CHEN to the ON state. However, by setting the terminal CHEN to ON state, charging of the capacitor 530 will also be executed. Thus when capacitor 530 is fully charged, the checking of the charging voltage is prohibited in order to avoid further charging of the capacitor 530.

Since the checking of the charging voltage is enabled when the capacitor 530 is being charged, and when the capacitor 530 is fully charged checking of the charging voltage and charging of the capacitor 530 are prohibited, the same single terminal can be used as the control terminal for both operations and the number of control terminals of a strobe circuit can thereby be reduced.

The present disclosure relates to subject matters contained in Japanese Patent Applications Nos. HEI 8-12317, filed on Jan. 26, 1996 and HEI 8-58337, filed on Feb. 21, 1996, which are expressly incorporated herein by reference in their entireties.

What is claimed is:

1. A strobe charging system, comprising:
    a charging circuit, said charging circuit being actuated to charge a capacitor;
    a voltage detecting system which detects a charged voltage of said capacitor; and
    a controller which enables said voltage detecting system to detect said charged voltage when said voltage is increasing.

2. The strobe charging system according to claim 1, wherein said voltage detecting system detects said charged voltage when said charged voltage exceeds a predetermined voltage value.

3. The strobe charging system according to claim 2, wherein said charging circuit continues charging if said voltage detected by said voltage detecting system is less than a predetermined threshold value.

4. The strobe charging system according to claim 3, wherein said charging circuit stops charging for a predetermined duration of time if said voltage detected by said voltage detecting system reaches said predetermined threshold value.

5. A strobe charging system, comprising:
    a charging circuit, said charging circuit being actuated to charge a capacitor;
    a voltage detecting system which detects a charged voltage of said capacitor; and
    a controller which enables said voltage detecting system to detect said charged voltage only when said charging circuit charges said capacitor.

6. The strobe charging system according to claim 5, wherein said voltage detecting system detects said charged voltage when said charged voltage exceeds a predetermined voltage value.

7. The strobe charging system according to claim 6, wherein said charging circuit continues charging if said voltage detected by said voltage detecting system is less than a predetermined threshold value.

8. The strobe charging system according to claim 7, wherein said charging circuit stops charging for a predetermined duration of time if said voltage detected by said voltage detecting system reaches said predetermined threshold value.

9. A camera, comprising:
    a strobe circuit having a capacitor to be charged;
    a charging voltage detection system, said charging voltage detection system detecting a charging voltage of said capacitor; and
    a control system, said control system prohibiting said charging voltage detection system from detecting said charging voltage for a predetermined period of time when said charging voltage has reached a predetermined value.

10. The camera according to claim 9, wherein said capacitor is charged when said charging voltage detection system is allowed to detect said charging voltage of said capacitor, and wherein said control system prohibits said strobe circuit from charging said capacitor for said predetermined period of time when said charging voltage has reached said predetermined value.

11. The camera according to claim 10, wherein the predetermined value is a maximum value of the charging voltage of said capacitor.

12. The camera according to claim 10, wherein said control system judges whether the charging voltage has reached said predetermined value when charging is executed while said camera is not being operated.

13. The camera according to claim 10, wherein said control system judges whether the charging voltage has reached said predetermined value when charging is executed while a predetermined operable member of said camera is being operated.

14. The camera according to claim 13, further comprising:
    a shutter button;
    a photometry system, said photometry system performing a photometry operation when the shutter button is operated; and
    a strobe judging system, said judging system judging whether flashing of said strobe during exposure is necessary based on photometry results obtained by said photometry system, and
    wherein when said strobe judging system judges that strobe flashing is necessary, said charging voltage detection system judges whether said capacitor has been charged to a voltage sufficient for strobe flashing but is less than said predetermined value, and said control system stops charging if said charging voltage exceeds said predetermined value.

15. A camera, comprising:
    a strobe circuit having a capacitor to be charged;
    a charging voltage detector which detects a charging voltage of said capacitor;
    a control system, said control system allowing detection of said charging voltage of said capacitor and effecting the charging of said capacitor simultaneously, said control system prohibiting:
        detection of said charging voltage; and charging of said capacitor simultaneously when said charging voltage has reached a predetermined voltage.

16. The camera according to claim 15, wherein said strobe circuit comprises a first terminal into which a charging signal indicating whether charging is to be performed is input, a second terminal which outputs the charging voltage, a switch circuit which electrically connects and disconnects the strobe circuit to and from said second terminal, a third terminal into which a voltage detection enabling signal for controlling said switch circuit is input, and a fourth terminal into which a trigger signal for starting the flashing of the strobe is input, and wherein a signal terminal comprises said first terminal and said third terminal.

17. A camera, comprising:
    a strobe circuit having a capacitor to be charged;
    means for electrically connecting an output terminal to said capacitor;
    means for detecting a charging voltage of said capacitor through said output terminal;
    an input terminal which receives a predetermined signal, said predetermined signal having at least two different status, a first status indicating that said capacitor is to be charged and a second status indicating that said capacitor is not to be charged;

means for executing charging of said capacitor in response to said first status of said predetermined signal; and means for controlling said connecting means to electrically connect said terminal with said capacitor in response to said first status of said predetermined signal, wherein when said detecting means detects that said charging voltage has reached a predetermined voltage value, said predetermined signal is controlled to be in said second status for a predetermined period of time.

18. A camera, comprising:

a strobe circuit having a capacitor to be charged;

means for electrically connecting and disconnecting an output terminal to and from said capacitor through which a charging voltage of said capacitor is detected;

means for charging said capacitor;

a terminal which receives a predetermined signal having at least a first status and a second status which is different from said first status;

means for controlling said connecting means to connect said output terminal to said capacitor in response to said first status of said predetermined signal;

means for charging said capacitor in response to said first status of said predetermined signal;

means for controlling said connecting means to disconnect said output terminal from said capacitor in response to said second status of said predetermined signal; and means for prohibiting said charging means from charging said capacitor in response to said second status of said predetermined signal.

19. A strobe system for a camera, comprising:

a capacitor to be charged;

a charging circuit;

a first terminal, a predetermined signal having at least a first status and a second status which is different from said first status being input to said first terminal;

a second terminal, a charging voltage of said capacitor being output from said second terminal;

a first circuit, said first circuit enabling said charging circuit to charge said capacitor;

a second circuit, said second circuit electrically connecting and disconnecting said second terminal to and from said capacitor, wherein said first circuit enables said charging circuit to charge said capacitor and said second circuit electrically connects said second terminal to said capacitor when said first status of said predetermined signal is input to said first terminal, and wherein said first circuit disables said charging circuit to charge said capacitor and said second circuit electrically disconnects said second terminal from said capacitor when said second status of said predetermined signal is input to said first terminal.

20. The strobe system according to claim 19, wherein said camera comprises a voltage detector which detects a charging voltage output through said second terminal, and a controller which outputs said predetermined signal to said first terminal, wherein said controller outputs said first status of said predetermined signal when said charging voltage is less than a predetermined value, and wherein said controller outputs said second status of said predetermined signal when said charging voltage has reached said predetermined value for a predetermined period of time.

21. A strobe system, comprising:

a charging circuit, said charging circuit being actuated to charge a capacitor;

a charging voltage output terminal, said charging voltage of said capacitor being output through said output terminal;

a control system, said control system connecting said output terminal to said capacitor while said charging system charges said capacitor, said control system prohibiting said charging system from charging of said capacitor for a predetermined period of time when said charging voltage of said capacitor has reached a predetermined voltage, said controller disconnecting said output terminal from said capacitor while said charging system is prohibited from charging.

\* \* \* \* \*